(12) United States Patent
Yamazaki et al.

(10) Patent No.: US 12,550,332 B2
(45) Date of Patent: Feb. 10, 2026

(54) FERROELECTRIC DEVICE AND SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yasuhiro Jinbo, Kanagawa (JP); Hitoshi Kunitake, Kanagawa (JP); Kazuaki Ohshima, Kanagawa (JP); Masashi Oota, Kanagawa (JP); Kazuma Furutani, Kanagawa (JP); Takeshi Aoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 322 days.

(21) Appl. No.: 18/245,757

(22) PCT Filed: Sep. 9, 2021

(86) PCT No.: PCT/IB2021/058179
§ 371 (c)(1),
(2) Date: Mar. 17, 2023

(87) PCT Pub. No.: WO2022/064306
PCT Pub. Date: Mar. 31, 2022

(65) Prior Publication Data
US 2023/0363174 A1 Nov. 9, 2023

(30) Foreign Application Priority Data

Sep. 22, 2020 (JP) .................. 2020-158057
Sep. 22, 2020 (JP) .................. 2020-158058
Sep. 26, 2020 (JP) .................. 2020-161542

(51) Int. Cl.
*H10B 51/30* (2023.01)
*H10B 53/30* (2023.01)
(Continued)

(52) U.S. Cl.
CPC ............. *H10B 51/30* (2023.02); *H10B 53/30* (2023.02); *H10D 30/6729* (2025.01);
(Continued)

(58) Field of Classification Search
CPC .... H10B 51/30; H10B 53/30; H10D 30/6729; H10D 30/6755; H10D 30/6757;
(Continued)

(56) References Cited

U.S. PATENT DOCUMENTS 6,812,510 B2   11/2004  Horii et al.
9,691,973 B2    6/2017  Ino. et al.
(Continued)

FOREIGN PATENT DOCUMENTS

JP    11-251535 A    9/1999
JP   2003-086776 A   3/2003
(Continued)

OTHER PUBLICATIONS

International Search Report (Application No. PCT/IB2021/058179) Dated Nov. 30, 2021.

(Continued)

*Primary Examiner* — Monica D Harrison
(74) *Attorney, Agent, or Firm* — Fish & Richardson P.C.

(57) ABSTRACT

A ferroelectric device including a metal oxide film having favorable ferroelectricity is provided. The ferroelectric device includes a first conductor, a metal oxide film over the first conductor, and a second conductor over the metal oxide film. The metal oxide film has ferroelectricity. The metal oxide film has a crystal structure. The crystal structure includes a first layer and a second layer. The first layer (Continued)

contains first oxygen and hafnium. The second layer contains second oxygen and zirconium. The hafnium and the zirconium are bonded to each other through the first oxygen. The second oxygen is bonded to the zirconium.

19 Claims, 67 Drawing Sheets

(51) Int. Cl.
*H10D 30/67* (2025.01)
*H10D 30/69* (2025.01)

(52) U.S. Cl.
CPC ..... *H10D 30/6755* (2025.01); *H10D 30/6757* (2025.01); *H10D 30/701* (2025.01)

(58) Field of Classification Search
CPC ............. H10D 30/701; H10D 30/6734; H10D 84/0149; H10D 84/038; H10D 84/83; H10D 88/01; H10D 1/684; H01L 21/31; H01L 21/3205; H01L 21/768; H01L 23/532
USPC ......................................................... 257/295
See application file for complete search history.

(56) References Cited

U.S. PATENT DOCUMENTS

| | | | |
|---|---|---|---|
| 10,020,374 | B2 | 7/2018 | Sone et al. |
| 10,242,989 | B2 | 3/2019 | Pandey et al. |
| 10,403,815 | B2 | 9/2019 | Ino |
| 10,923,500 | B2 | 2/2021 | Ino et al. |
| 10,978,563 | B2 | 4/2021 | Tochibayashi et al. |
| 11,271,085 | B2 | 3/2022 | Sone et al. |
| 11,476,339 | B2 * | 10/2022 | Yamaguchi .......... H10D 64/689 |
| 2003/0230773 | A1 | 12/2003 | Horii et al. |
| 2006/0166379 | A1 | 7/2006 | Kobayashi |
| 2012/0248451 | A1 | 10/2012 | Sone et al. |
| 2015/0340372 | A1 | 11/2015 | Pandey et al. |
| 2016/0005961 | A1 | 1/2016 | Ino |
| 2019/0189627 | A1 | 6/2019 | Pandey et al. |
| 2020/0091160 | A1 | 3/2020 | Ino et al. |
| 2020/0203489 | A1 | 6/2020 | Tochibayashi et al. |
| 2022/0157817 | A1 * | 5/2022 | Yamazaki .......... H10D 30/6734 |
| 2022/0157986 | A1 | 5/2022 | Yamazaki et al. |
| 2023/0269949 | A1 | 8/2023 | Yamazaki et al. |

FOREIGN PATENT DOCUMENTS

| | | |
|---|---|---|
| JP | 2004-022702 A | 1/2004 |
| JP | 2006-210436 A | 8/2006 |
| JP | 2011-124478 A | 6/2011 |
| JP | 2011-151370 A | 8/2011 |
| JP | 2015-015334 A | 1/2015 |
| JP | 2017-518639 | 7/2017 |
| JP | 2020-047796 A | 3/2020 |
| JP | 2020-102623 A | 7/2020 |
| JP | 2022-035884 A | 3/2022 |
| WO | WO-2011/078398 | 6/2011 |
| WO | WO-2015/002206 | 1/2015 |
| WO | WO-2015/045592 | 4/2015 |
| WO | WO-2015/179062 | 11/2015 |
| WO | WO-2019/235092 | 12/2019 |
| WO | WO-2022/049459 | 3/2022 |

OTHER PUBLICATIONS

Written Opinion (Application No. PCT/IB2021/058179) Dated Nov. 30, 2021.
Okuno.J et al., "SoC compatible 1T1C FeRAM memory array based on ferroelectric Hf0.5Zr0.5O2", 2020 Symposium On VLSI Technology : Digest of Technical Papers, Jun. 16, 2020, pp. 1-2.
Boscke.T et al., "Ferroelectricity in hafnium oxide thin films", Appl. Phys. Lett. (Applied Physics Letters) , Sep. 8, 2011, vol. 99, No. 10, pp. 102903-1-102903-3.
Fan.Z et al., "Ferroelectric HfO2-based materials for next-generation ferroelectric memories", Journal of Advanced Dielectrics, May 3, 2016, vol. 6, No. 2, pp. 1630003-1-1630003-11.
Toriumi.A, "Ferroelectric properties of thin HfO2 films", Oyobuturi , Sep. 10, 2019, vol. 88, No. 9, pp. 586-596, JSAP(The Japan Society of Applied Physics).
Francois.T et al., "Demonstration of BEOL-compatible ferroelectric Hf0.5Zr0.5O2 scaled FeRAM co-integrated with 130nm CMOS for embedded NVM applications", IEDM 19: Technical Digest of International Electron Devices Meeting, Dec. 7, 2019, pp. 362-365.
Taiwanese Office Action (Application No. 110133092) Dated Sep. 19, 2025.

* cited by examiner

FIG. 1A1
FIG. 1B1
FIG. 1C1
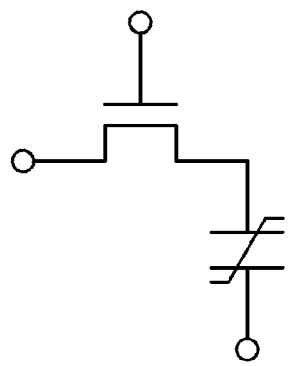
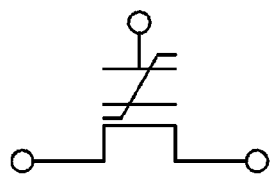
FIG. 1A2
FIG. 1B2
FIG. 1C2
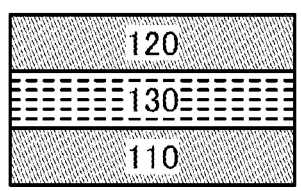
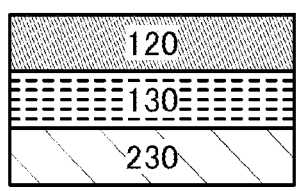
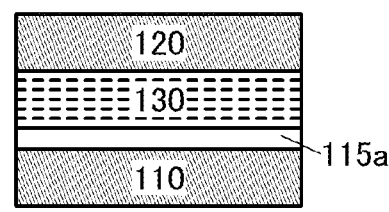
FIG. 1C3
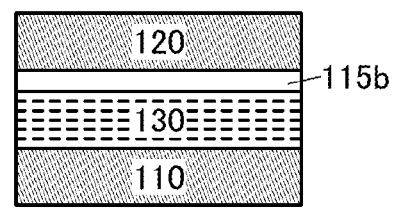
FIG. 1C4
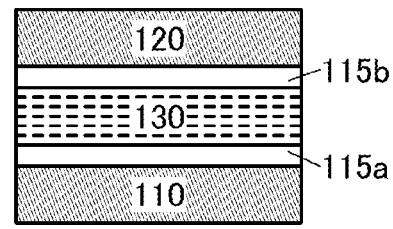

FIG. 13A
| Amorphous | Intermediate state New crystalline phase  Crystalline | Crystal |
|---|---|---|
| • completely amorphous | • CAAC<br>• nc<br>• CAC<br><br>excluding single crystal and poly crystal | • single crystal<br>• poly crystal |
FIG. 13B
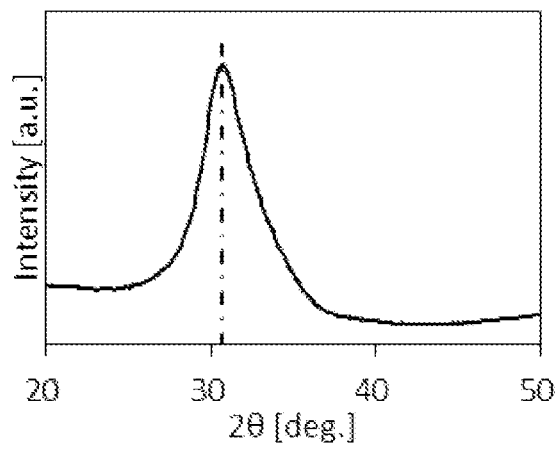
FIG. 13C
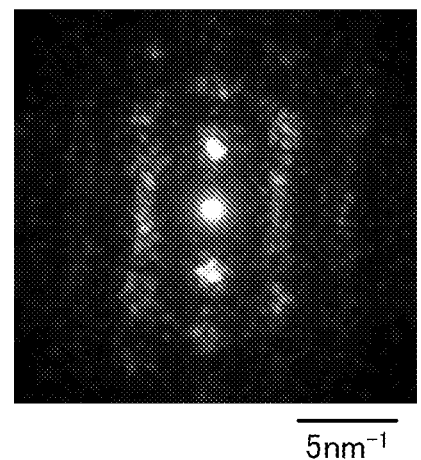

FIG. 29A
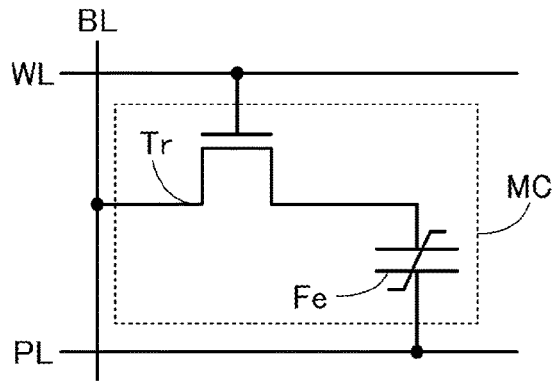
FIG. 29B1
FIG. 29B2
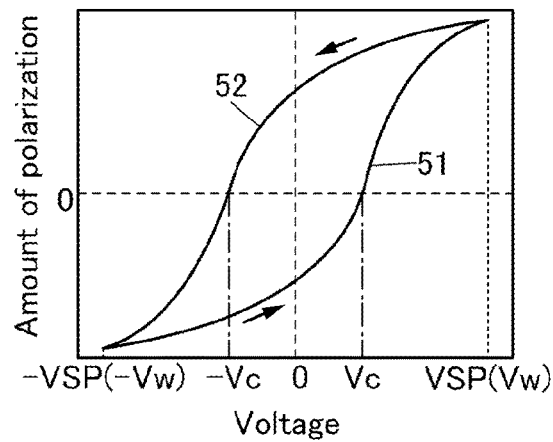
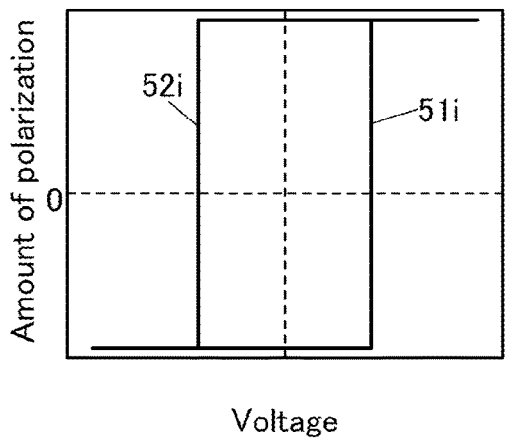
FIG. 29C
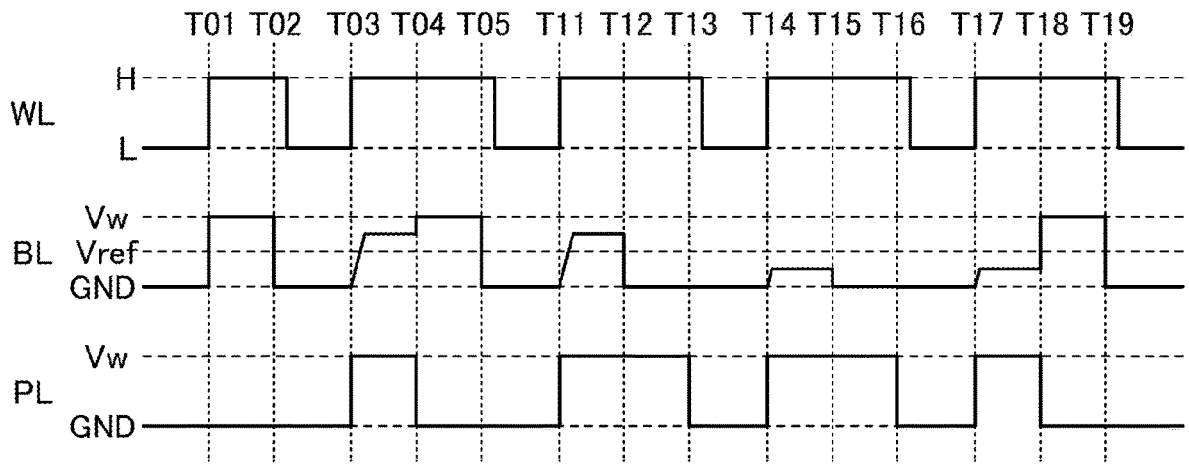

FIG. 62A
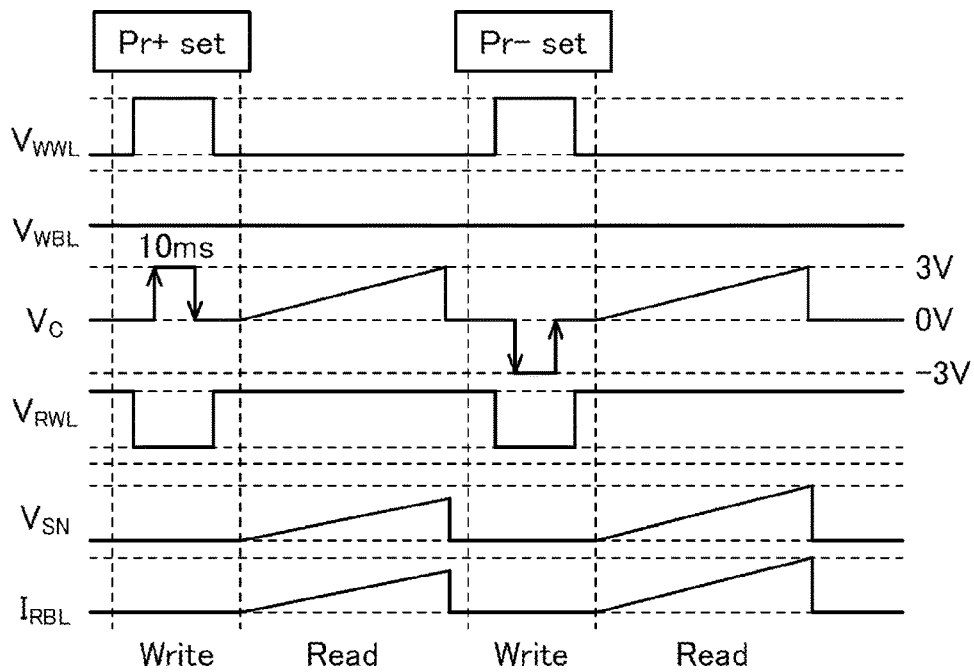
FIG. 62B1
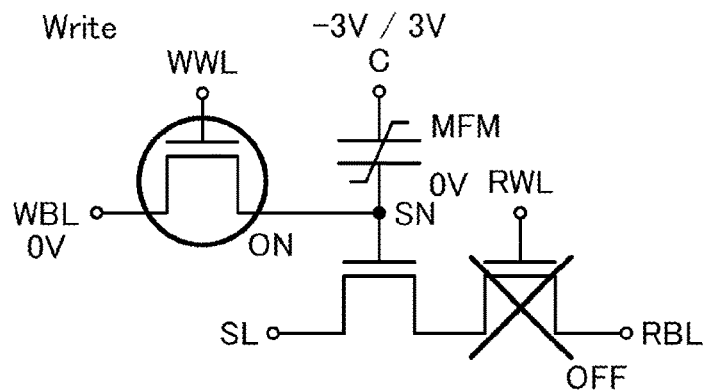
FIG. 62B2
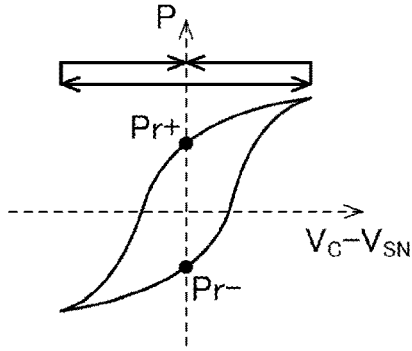
FIG. 62C1
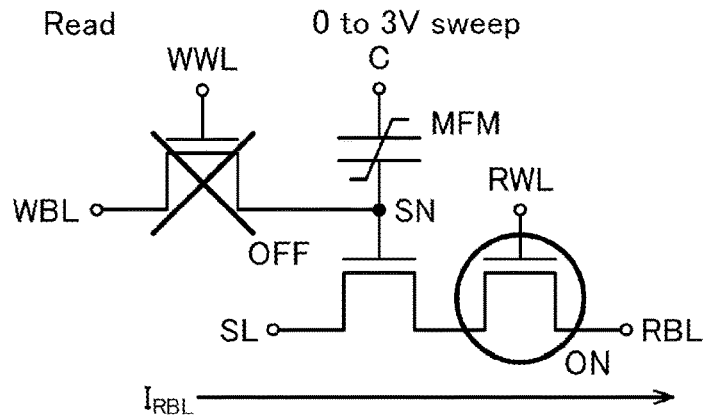
FIG. 62C2
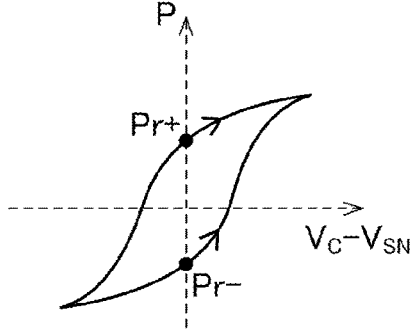

FIG. 66A
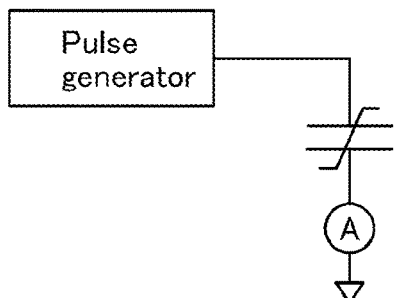
FIG. 66B
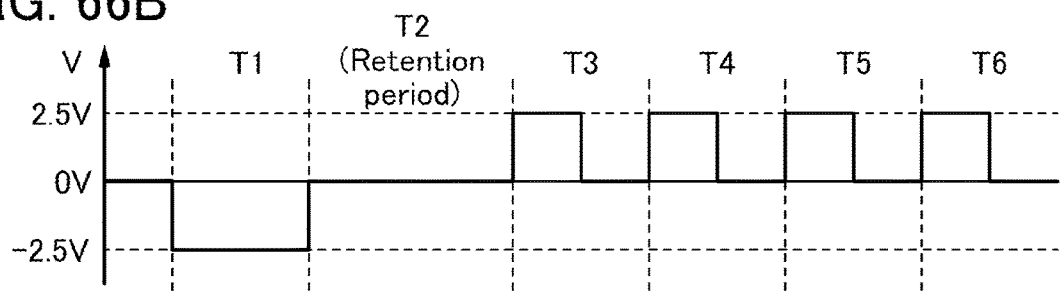
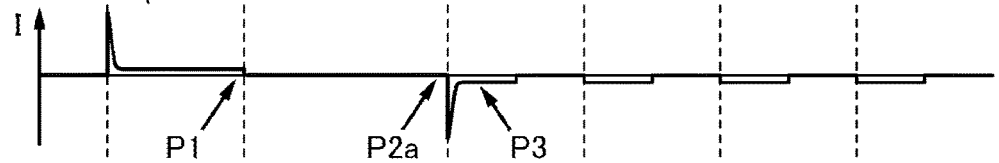
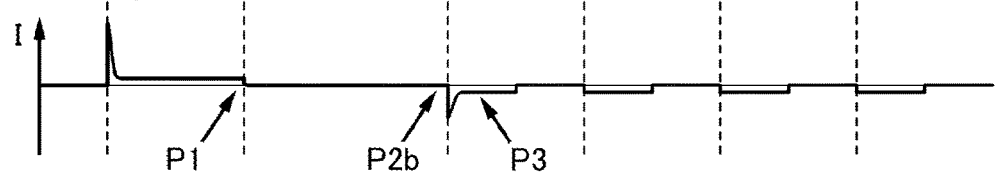
FIG. 66C
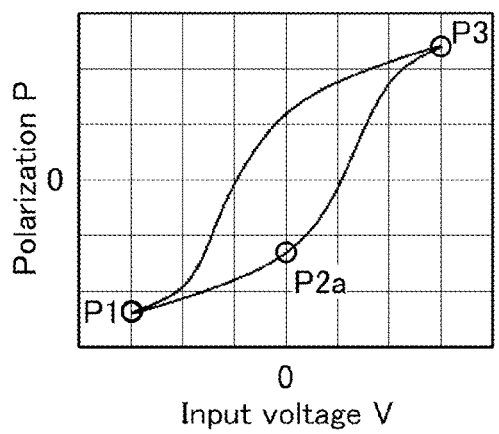
FIG. 66D
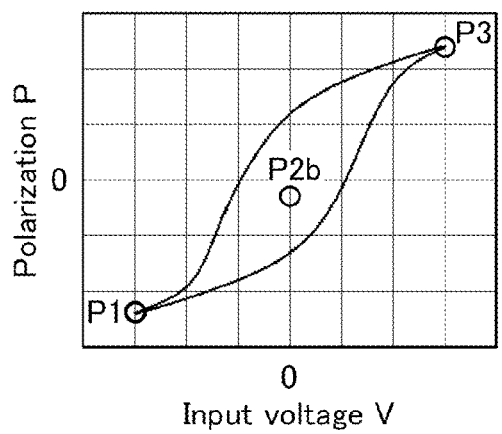

FERROELECTRIC DEVICE AND SEMICONDUCTOR DEVICE

CROSS REFERENCE TO RELATED APPLICATIONS

This application is a U.S. National Phase Application under 35 U.S.C. § 371 of International Application PCT/IB2021/058179, filed on Sep. 9, 2021, which is incorporated by reference and claims the benefit of foreign priority applications filed in Japan on Sep. 22, 2020, as Application No. 2020-158057, on Sep. 22, 2020, as Application No. 2020-158058, and on Sep. 26, 2020, as Application No. 2020-161542.

TECHNICAL FIELD

One embodiment of the present invention relates to a metal oxide, a ferroelectric device utilizing the metal oxide, and a manufacturing method thereof. Another embodiment of the present invention relates to a transistor, a semiconductor device, and an electronic device. Another embodiment of the present invention relates to a method for fabricating a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed, and LSIs, CPUs, memories, and the like are mainly used as the semiconductor devices. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). As known semiconductor thin films which can be used for transistors, a silicon-based semiconductor material, an oxide semiconductor, and the like are used.

As described in Non-Patent Document 1, a memory array using a ferroelectric is actively researched and developed. For the next-generation ferroelectric memories, researches on hafnium oxide, such as a research on ferroelectric $HfO_2$-based materials (Non-Patent Document 2); a research on ferroelectricity of a hafnium oxide thin film (Non-Patent Document 3); ferroelectricity of a $HfO_2$ thin film (Non-Patent Document 4); and demonstration of integration of an FeRAM using a ferroelectric $Hf_{0.5}Zr_{0.5}O_2$ and a CMOS (Non-Patent Document 5) have been actively carried out.

REFERENCES

Non-Patent Documents

[Non-Patent Document 1] T. S. Boescke, et al, "Ferroelectricity in hafnium oxide thin films", APL99, 2011

[Non-Patent Document 2] Zhen Fan, et al, "Ferroelectric $HfO_2$-based materials for next-generation ferroelectric memories", JOURNAL OF ADVANCED DIELECTRICS, Vol. 6, No. 2, 2016

[Non-Patent Document 3] Jun Okuno, et al, "SoC compatible 1T1C FeRAM memory array based on ferroelectric $Hf_{0.5}Zr_{0.5}O_2$", VLSI 2020

[Non-Patent Document 4] Akira Toriumi, "Ferroelectricity of $HfO_2$ thin film", The Japan Society of Applied Physics, Vol. 88, No. 9, 2019

[Non-Patent Document 5] T. Francois, et al, "Demonstration of BEOL-compatible ferroelectric $Hf_{0.5}Zr_{0.5}O_2$ scaled FeRAM co-integrated with 130 nm CMOS for embedded NVM applications", IEDM 2019

SUMMARY OF THE INVENTION

Problems to be Solved by the Invention

As described in Non-Patent Document 1 to Non-Patent Document 5, various researches and developments on ferroelectrics have been carried out. For example, Non-Patent Document 1 has reported that the sign of polarization (P) changes due to oxygen atom movement at the time of "Orthorhombic phase Ferroelectric" as illustrated in FIG. 8A. Furthermore, Non-Patent Document 2 has reported that the magnitude of polarization and the permittivity ($\varepsilon_r$) change depending on the proportions of Hf and Zr as illustrated in FIG. 8B.

Non-Patent Document 3 has reported a writing endurance, which is a reliability test of ferroelectrics, of approximately $10^9$ cycles as shown in FIG. 9. Non-Patent Document 4 has reported $HfO_2$'s diffraction intensity, polarization, and crystal structures, which are as shown in FIG. 10A, FIG. 10B, and FIG. 10C.

Although various researches and developments on ferroelectrics have been carried out as described above, ferroelectric characteristics still have room for improvement, and improvement in characteristics such as reliability is being demanded.

In view of this, an object of one embodiment of the present invention is to provide a material having favorable ferroelectricity, that is, a metal oxide film having ferroelectricity. Another object of one embodiment of the present invention is to provide a capacitor utilizing a material that can have ferroelectricity. Another object of one embodiment of the present invention is to provide a transistor utilizing a material that can have ferroelectricity. Another object of one embodiment of the present invention is to provide a capacitor and a diode each utilizing a material that can have ferroelectricity. Another object of one embodiment of the present invention is to provide an element utilizing a material that can have ferroelectricity and utilizing tunnel junction.

Note that the description of these objects does not preclude the existence of other objects. In one embodiment of the present invention, there is no need to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a ferroelectric device including a first conductor, a metal oxide film over the first conductor, and a second conductor over the metal oxide film. The metal oxide film has ferroelectricity. The metal oxide film has a crystal structure. The crystal structure includes a first layer and a second layer. The first layer contains first oxygen and hafnium. The second layer contains second oxygen and zirconium. The hafnium and the zirconium are bonded to each other through the first oxygen. The second oxygen is bonded to the zirconium.

Another embodiment of the present invention is a ferroelectric device including a first conductor, a metal oxide film over the first conductor, a second conductor over the metal oxide film, and a sealing film over the second conductor. The metal oxide film has ferroelectricity. The metal oxide film has a crystal structure. The crystal structure includes a first layer and a second layer. The first layer contains first oxygen and hafnium. The second layer contains second oxygen and zirconium. The hafnium and the zirconium are bonded to each other through the first oxygen. The second oxygen is bonded to the zirconium.

In the above, it is preferable that the sealing film include a first sealing film and a second sealing film over the first sealing film, the first sealing film contain oxygen and aluminum, the second sealing film contain nitrogen and silicon, and the first sealing film have a function of adsorbing or capturing hydrogen.

Another embodiment of the present invention is a semiconductor device including a transistor and a capacitor electrically connected to the transistor. The capacitor includes a first conductor, a metal oxide film over the first conductor, and a second conductor over the metal oxide film. The metal oxide film has ferroelectricity. The metal oxide film has a crystal structure. The crystal structure includes a first layer and a second layer. The first layer contains first oxygen and hafnium. The second layer contains second oxygen and zirconium. The hafnium and the zirconium are bonded to each other through the first oxygen. The second oxygen is bonded to the zirconium.

In the above embodiment, the transistor preferably contains silicon in a channel formation region.

In the above embodiment, the transistor preferably includes an oxide semiconductor in a channel formation region.

One embodiment of the present invention is a semiconductor device including a semiconductor film, a metal oxide film over the semiconductor film, and a second conductor over the metal oxide film. The metal oxide film has ferroelectricity. The metal oxide film has a crystal structure. The crystal structure includes a first layer and a second layer. The first layer contains first oxygen and hafnium. The second layer contains second oxygen and zirconium. The hafnium and the zirconium are bonded to each other through the first oxygen. The second oxygen is bonded to the zirconium.

In the above embodiment, it is preferable that the semiconductor film contain silicon or an oxide semiconductor and the semiconductor device include a source electrode and a drain electrode each of which is electrically connected to the semiconductor film.

Another embodiment of the present invention is a semiconductor device including a first conductor, a metal oxide film over the first conductor, a second conductor over the metal oxide film, and an insulator positioned at one or both of a top surface of the first conductor and a bottom surface of the second conductor. The metal oxide film has ferroelectricity. The metal oxide film has a crystal structure. The crystal structure includes a first layer and a second layer. The first layer contains first oxygen and hafnium. The second layer contains second oxygen and zirconium. The hafnium and the zirconium are bonded to each other through the first oxygen. The second oxygen is bonded to the zirconium.

In the above embodiment, the insulator preferably contains nitrogen and silicon.

In each of the above embodiments, a concentration of at least one or more of hydrogen and carbon contained in the metal oxide film is preferably lower than or equal to $5 \times 10^{20}$ atoms/cm$^3$ by SIMS analysis. In each of the above embodiments, a concentration of at least one or more of hydrogen and carbon contained in the metal oxide film is further preferably lower than or equal to $1 \times 10^{20}$ atoms/cm$^3$ by SIMS analysis. In each of the above embodiments, a concentration of chlorine contained in the metal oxide film is preferably lower than or equal to $5 \times 10^{21}$ atoms/cm$^3$ by SIMS analysis. In each of the above embodiments, a concentration of chlorine contained in the metal oxide film is further preferably lower than or equal to $1 \times 10^{21}$ atoms/cm$^3$ by SIMS analysis.

Effect of the Invention

According to one embodiment of the present invention, a material having favorable ferroelectricity, that is, a metal oxide film having ferroelectricity can be provided. According to another embodiment of the present invention, a capacitor utilizing a material that can have ferroelectricity can be provided. According to another embodiment of the present invention, a transistor utilizing a material that can have ferroelectricity can be provided. According to another embodiment of the present invention, a capacitor and a diode each utilizing a material that can have ferroelectricity can be provided. According to another embodiment of the present invention, an element utilizing a material that can have ferroelectricity and utilizing tunnel junction can be provided.

Note that the description of these effects does not preclude the existence of other effects. One embodiment of the present invention does not have to have all these effects. Note that other effects will be apparent from the description of the specification, the drawings, the claims, and the like and other effects can be derived from the description of the specification, the drawings, the claims, and the like.

BRIEF DESCRIPTION OF THE DRAWINGS

FIG. 1A1, FIG. 1B1, and FIG. 1C1 are circuit diagrams of semiconductor devices of one embodiment of the present invention. FIG. 1A2, FIG. 1B2, FIG. 1C2, FIG. 1C3, and FIG. 1C4 are diagrams illustrating cross-sectional structures of the semiconductor devices of one embodiment of the present invention.

FIG. 13A is a diagram showing classification of crystal structures of IGZO. FIG. 13B is a diagram showing an XRD spectrum of a CAAC-IGZO film. FIG. 13C is a diagram showing nanobeam electron diffraction patterns of a CAAC-IGZO film.

FIG. 29A is a circuit diagram illustrating a structure example of a memory cell. FIG. 29B1 is a graph showing an example of hysteresis characteristics of a ferroelectric layer. FIG. 29B2 is a graph showing an example of ideal hysteresis characteristics of a ferroelectric layer. FIG. 29C is a timing chart showing an example of a method for driving the memory cell.

FIG. 62A is a diagram showing a timing chart, FIG. 62B1 is a circuit diagram showing a writing operation (Write), FIG. 62B2 is a diagram showing hysteresis characteristics for explaining the writing operation, FIG. 62C1 is a circuit diagram showing a reading operation (Read), and FIG. 62C2 is a diagram showing hysteresis characteristics for explaining the reading operation.

FIG. 66A, FIG. 66B, FIG. 66C, and FIG. 66D are diagrams showing a retention measurement method.

MODE FOR CARRYING OUT THE INVENTION

Figure 2A:
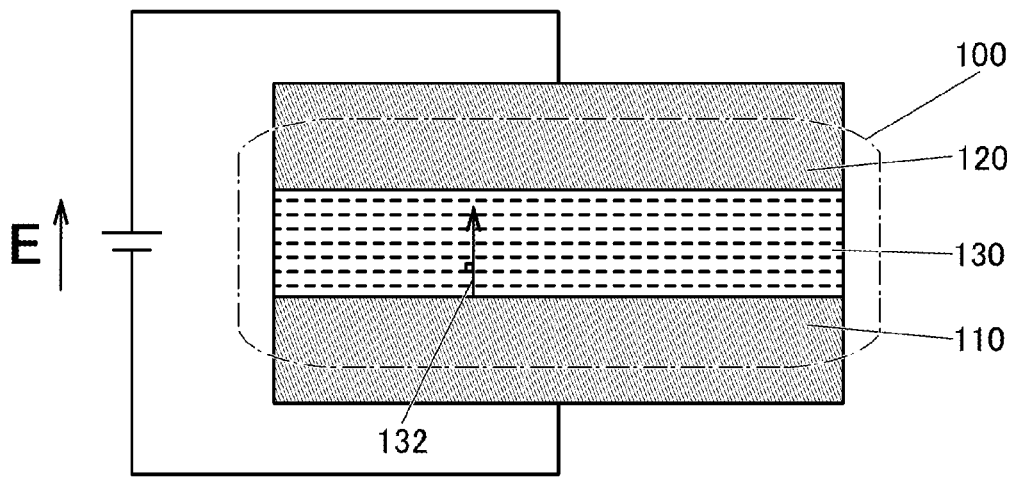
FIG. 2A and FIG. 2B are schematic views of a capacitor of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

Moreover, in this specification and the like, terms for describing arrangement, such as "over" and "under", are used for convenience for describing the positional relationship between components with reference to drawings. The positional relationship between components is changed as appropriate in accordance with the direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of a current is changed in a circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where a current flows in a semiconductor when a transistor is in an on state) and a gate electrode overlap each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, the length of a channel formation region in a direction perpendicular to a channel length direction in a region where a semiconductor (or a portion where a current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as Vo) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be referred to as a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

In this embodiment, a metal oxide film and a semiconductor device of one embodiment of the present invention are described with reference to FIG. 1A1, FIG. 1A2, FIG. 1B1, FIG. 1B2, FIG. 1C1, FIG. 1C2, FIG. 1C3, and FIG. 1C4.

FIG. 1A1, FIG. 1B1, and FIG. 1C1 are circuit diagrams of semiconductor devices of one embodiment of the present invention. The circuit diagram in FIG. 1A1 includes one transistor (a field-effect transistor, also referred to as FET) and one capacitor, and the one capacitor contains a material that can have ferroelectricity. The circuit diagram in FIG. 1B1 includes one transistor, and a gate insulating film of the transistor contains a material that can have ferroelectricity. The circuit diagram in FIG. 1C1 includes one capacitor and one diode, and the capacitor contains a material that can have ferroelectricity. Although the one capacitor and the one diode are separately illustrated in the circuit diagram in FIG.

1C1, the present invention is not limited thereto. For example, in the case where one element has functions of both the one capacitor and the one diode, there is no need to separate the functions. As a structure corresponding to the circuit diagram in FIG. 1C1, for example, it is possible to employ an element structure where an insulator is included between a pair of electrodes and tunnel junction between the insulator and the electrodes is utilized.

Note that the circuit diagram in FIG. 1A1 can be regarded as a 1Tr1C (one transistor and one capacitor) element structure, and may be referred to as an FeRAM (Ferroelectric Random Access Memory) or Type 1 structure. The circuit diagram in FIG. 1B1 can be regarded as a 1Tr (one transistor) element structure, and may be referred to as an FeFET (Ferroelectric Field Effect Transistor) or Type 2 structure. The circuit diagram in FIG. 1C1 can be regarded as one capacitor element structure utilizing tunnel junction, and may be referred to as an FTJ (Ferroelectric Tunnel Junction) or Type 3 structure.

Next, examples of a semiconductor device of one embodiment of the present invention applicable to the structures illustrated in the circuit diagrams in FIG. 1A1, FIG. 1B1, and FIG. 1C1 are described with reference to FIG. 1A2, FIG. 1B2, FIG. 1C2, FIG. 1C3, and FIG. 1C4. FIG. 1A2, FIG. 1B2, FIG. 1C2, FIG. 1C3, and FIG. 1C4 are cross-sectional views illustrating examples of the semiconductor device of one embodiment of the present invention. Note that white circles in the circuit diagrams in FIG. 1A1, FIG. 1B1, and FIG. 1C1 represent terminals.

FIG. 1A2 is a cross-sectional view corresponding to the capacitor illustrated in FIG. 1A1, FIG. 1B2 is a cross-sectional view corresponding to the transistor containing a material that can have ferroelectricity in FIG. 1B1, and FIG. 1C2, FIG. 1C3, and FIG. 1C4 are each a cross-sectional view corresponding to the capacitor and the diode illustrated in FIG. 1C1.

FIG. 1A2 includes a conductor 110, an insulator 130 over the conductor 110, and a conductor 120 over the insulator 130. Note that the insulator 130 is preferably formed using a material that can have ferroelectricity. The insulator 130 may be rephrased as a dielectric or a ferroelectric. Although not illustrated in FIG. 1A2, a structure where the conductor 120 is connected to a source or a drain of the transistor as illustrated in FIG. 1A1 is employed.

FIG. 1B2 includes an oxide 230, the insulator 130 over the oxide 230, and the conductor 120 over the insulator 130. Note that the insulator 130 is preferably formed using a material that can have ferroelectricity. FIG. 1B2 can also be regarded as a structure where the oxide 230 is in contact with the insulator 130, i.e., the material that can have ferroelectricity.

FIG. 1C2 includes the conductor 110, an insulator 115a over the conductor 110, the insulator 130 over the insulator 115a, and the conductor 120 over the insulator 130. Note that FIG. 1C2 can be regarded as a structure where the insulator 115a is included between the conductor 110 and the insulator 130 in FIG. 1A2. FIG. 1C3 includes the conductor 110, the insulator 130 over the conductor 110, an insulator 115b over the insulator 130, and the conductor 120 over the insulator 115b.

FIG. 1C4 includes the conductor 110, the insulator 115a over the conductor 110, the insulator 130 over the insulator 115a, the insulator 115b over the insulator 130, and the conductor 120 over the insulator 115b. Note that in the structure of the circuit diagram in FIG. 1C1, certain polarization is preferably obtained in the P-E (Polarization density-Electric field) characteristics. For example, in the case where a first section is set from 0 (V) to 3 (V), a second section is set from 3 (V) to 0 (V), a third section is set from −Va (V) to Va (V), a fourth section is set from 0 (V) to −3 (V), a fifth section is set from −3 (V) to 0 (V), and a sixth section is set from −Va (V) to Va (V) in the I-V characteristics, the current value preferably differs between the third section and the sixth section. In addition, Va is preferably a voltage lower than or equal to a coercive electric field (Ec) in this circuit diagram. In order to satisfy the characteristics, at least one of the film kind, the film quality, and the film thickness is made to be different between the insulator 115a and the insulator 115b, for example.

Next, the components are described.

<<Conductor (Lower Electrode)>>

The conductor 110 has a function of a lower electrode. The conductor 110 can be deposited by a sputtering method, a chemical vapor deposition (CVD) method, a molecular beam epitaxy (MBE) method, a pulsed laser deposition (PLD) method, an atomic layer deposition (ALD) method, or the like. Examples of an ALD method include a thermal ALD method, in which a precursor and a reactant react with each other only by a thermal energy, and a PEALD (Plasma Enhanced ALD) method, in which a reactant excited by plasma is used.

By using the ALD method, a conductive film with high planarity can easily be deposited as the conductor 110 in some cases. For example, titanium nitride is deposited by a thermal ALD method. The conductor 110 is formed into a pattern by a lithography method or the like as appropriate.

A surface over which the conductor 110 is formed (also referred to as a formation surface) or the top surface of the conductor 110 preferably has high planarity. For example, the surface over which the conductor 110 is formed or the top surface of the conductor 110 may be planarized by planarization treatment using a chemical mechanical polishing (CMP) method or the like to improve planarity. In the case where the planarity of the surface over which the conductor 110 is formed or the top surface of the conductor 110 is improved, the crystallinity of the component above the surface, specifically the crystallinity of the insulator 130, can be improved.

<<Insulator>>

The insulator 130 is preferably formed using a material that can have ferroelectricity. The details of the insulator 130 will be described later.

<<Conductor (Upper Electrode)>>

The conductor 120 has a function of an upper electrode. The conductor 120 is placed so as to be separated from the conductor 110 with the insulator 130 therebetween. The details of the conductor 120 will be described later.

<Oxide>

The details of the oxide 230 will be described later (refer to Embodiment 2).

<Insulator>

The insulator 115a and the insulator 115b are each a paraelectric material; for example, silicon oxide, silicon nitride, silicon oxynitride, silicon nitride, aluminum oxide, aluminum nitride, or aluminum oxynitride can be used. It is particularly preferable that the insulators 115a and 115b each be a silicon nitride film. The insulator 115a and the insulator 115b can each be deposited by a sputtering method, a CVD method, an MBE method, a PLD method, an ALD method, or the like. It is particularly preferable that the insulator 115a and the insulator 115b be deposited by a PEALD method. For example, in the case where a silicon nitride film is deposited by a PEALD method, a precursor containing halogen such as fluorine, chlorine, bromine, or iodine is suitably used. After the precursor is introduced, plasma treatment is performed in an atmosphere to which a nitriding agent such as $N_2$, $N_2O$, $NH_3$, NO, $NO_2$, or $N_2O_2$ is introduced, so that a high-quality silicon nitride film can be deposited.

According to one embodiment of the present invention, a material that can have ferroelectricity, that is, a metal oxide film having ferroelectricity can be provided. According to another embodiment of the present invention, a ferroelectric device utilizing a material that can have ferroelectricity can be provided. According to another embodiment of the present invention, a capacitor utilizing a material that can have ferroelectricity can be provided. According to another embodiment of the present invention, a transistor utilizing a material that can have ferroelectricity can be provided. According to another embodiment of the present invention, a capacitor and a diode each utilizing a material that can have ferroelectricity can be provided.

In other words, a metal oxide film of one embodiment of the present invention can be used for one or more of semiconductor devices selected from a capacitor, a transistor, and a diode.

Next, a capacitor of one embodiment of the present invention and the fabrication method thereof are specifically described. Note that the structure illustrated in FIG. 1A1 and FIG. 1A2 is described as an example below; however, the structure illustrated in FIG. 1B1 and FIG. 1B2 and the structures illustrated in FIG. 1C1, FIG. 1C2, FIG. 1C3, and FIG. 1C4 can also be employed when some of the components (e.g., the oxide 230, the insulator 115a, and the insulator 115b) are changed.

Structure Example of Capacitor

In this section, structure examples of a capacitor of one embodiment of the present invention are described with reference to FIG. 2A to FIG. 4C and FIG. 6.

As illustrated in FIG. 2A, a capacitor 100 of one embodiment of the present invention includes the conductor 110, the conductor 120, and the insulator 130 interposed between the conductor 110 and the conductor 120. For example, the conductor 110 is placed over a substrate (not illustrated), the insulator 130 is placed over the conductor 110, and the conductor 120 is placed over the insulator 130. Here, the conductor 110 functions as a lower electrode of the capacitor 100, the conductor 120 functions as an upper electrode of the capacitor 100, and the insulator 130 functions as a dielectric of the capacitor 100.

The insulator 130 is preferably formed using a material that can have ferroelectricity. Examples of the material that can have ferroelectricity include hafnium oxide, zirconium oxide, and $HfZrO_X$ (X is a real number greater than 0). Another example of the material that can have ferroelectricity is a material obtained by adding an element J1 (the element J1 here is one or more selected from zirconium (Zr), silicon (Si), aluminum (Al), gadolinium (Gd), yttrium (Y), lanthanum (La), strontium (Sr), and the like) to hafnium oxide. The atomic ratio of hafnium to the element J1 can be appropriately set here; for example, the atomic ratio of hafnium to the element J1 is 1:1 or the neighborhood thereof. Another example of the material that can have ferroelectricity is a material obtained by adding an element J2 (the element J2 here is one or more selected from hafnium (Hf), silicon (Si), aluminum (Al), gadolinium (Gd), yttrium (Y), lanthanum (La), strontium (Sr), and the like) to zirconium oxide. The atomic ratio of zirconium to the element J2 can be appropriately set; for example, the atomic ratio of zirconium to the element J2 is 1:1 or the neighborhood thereof. Alternatively, as the material that can have ferroelectricity, a piezoelectric ceramic having a perovskite structure such as PbTiOx, barium strontium titanate (BST), strontium titanate, lead zirconate titanate (PZT), strontium bismuth tantalate (SBT), bismuth ferrite (BFO), or barium titanate may be used. As the material that can have ferroelectricity, a mixture or compound containing a plurality of materials selected from the above-described materials can be used, for example. Alternatively, the insulator 130 can have a stacked-layer structure of a plurality of materials selected from the above-described materials. Note that since the crystal structures (properties) of hafnium oxide, zirconium oxide, $HfZrO_X$, the material obtained by adding the element J1 to hafnium oxide, and the like can be changed depending on the processes as well as the deposition conditions, a material that exhibits ferroelectricity is referred to as a material that can have ferroelectricity as well as a ferroelectric in this specification or the like.

Hafnium oxide or a material containing hafnium oxide and zirconium oxide is especially preferable as the material that can have ferroelectricity because of being able to have ferroelectricity even when processed into a several-nanometer-thick thin film. When the ferroelectric layer that can be thin is used, the capacitor 100 can be combined with a miniaturized semiconductor element such as a transistor to form a semiconductor device. Note that in this specification and the like, a layer of the material that can have ferroelectricity is referred to as a ferroelectric layer or a metal oxide film, in some cases. In this specification and the like, a device including such a ferroelectric layer (metal oxide film) is sometimes referred to as a ferroelectric device.

Figure 2B:
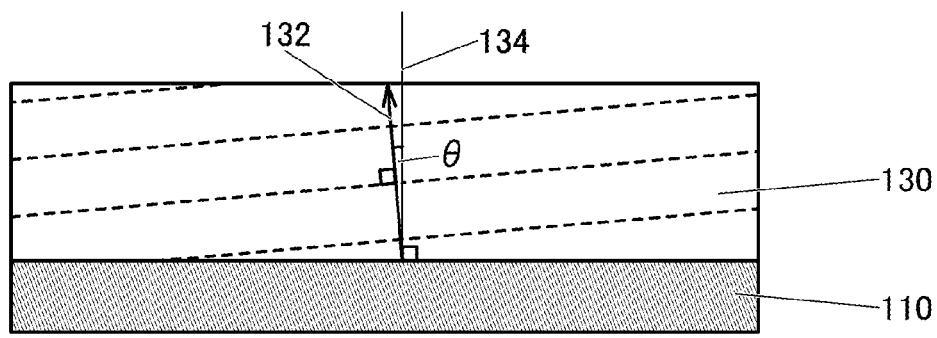
Figure 2C:
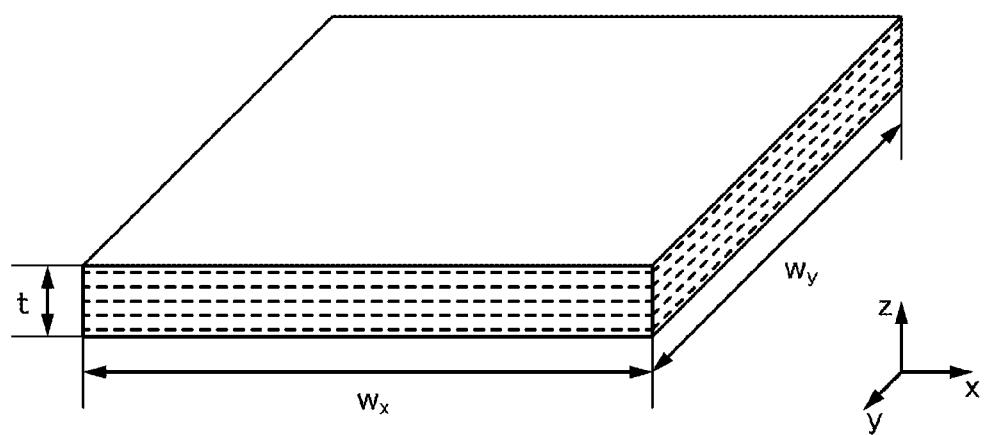
FIG. 2C is a schematic view of a ferroelectric included in the capacitor of one embodiment of the present invention.

Here, the insulator 130 preferably has a film-like shape as illustrated in FIG. 2C. In FIG. 2C, the x-axis and the y-axis are parallel to the film surface of the insulator 130, and the z-axis is parallel to the film thickness direction of the insulator 130. Since the insulator 130 preferably has a film-like shape, a width w, of the insulator 130 in the x-direction and a width $w_y$ in the y-direction are preferably greater than a thickness t, further preferably three times or more the thickness t. For example, in the case where the thickness t of the insulator 130 is 3 nm, at least one of the width w, and the width $w_y$ of the insulator 130 is preferably greater than or equal to 3 nm, further preferably greater than or equal to 10 nm. The thickness t of the insulator 130 can be less than or equal to 100 nm, preferably less than or equal to 50 nm, further preferably less than or equal to 20 nm, still further preferably less than or equal to 10 nm (typically greater than or equal to 2 nm and less than or equal to 9 nm). For example, the thickness t is preferably greater than or equal to 8 nm and less than or equal to 12 nm.

Although the insulator 130 illustrated in FIG. 2C has a shape such that the top surface and the bottom surface are parallel to each other in the entire region, the present invention is not limited thereto. For example, the insulator 130 sometimes has unevenness reflecting the shape of the formation surface. In this case, when a groove portion is formed in the formation surface, a region of the insulator 130 overlapping with the groove portion has a depressed shape in some cases.

The material that can have ferroelectricity is an insulator and has a property in which application of an electric field from the outside causes internal polarization and the polarization remains even after the electric field is made zero. Thus, with a capacitor using such a material as a dielectric (the capacitor may be referred to as a ferroelectric capacitor below), a nonvolatile storage element can be formed. A nonvolatile storage element using a ferroelectric capacitor is sometimes referred to as an FeRAM (Ferroelectric Random Access Memory), a ferroelectric memory, or the like. For example, a ferroelectric memory can have a structure including a transistor and a ferroelectric capacitor, where one of a source and a drain of the transistor is electrically connected to one terminal of the ferroelectric capacitor. Thus, the semiconductor device using the capacitor 100 and the transistor described in this embodiment can function as a ferroelectric memory.

Figure 6:
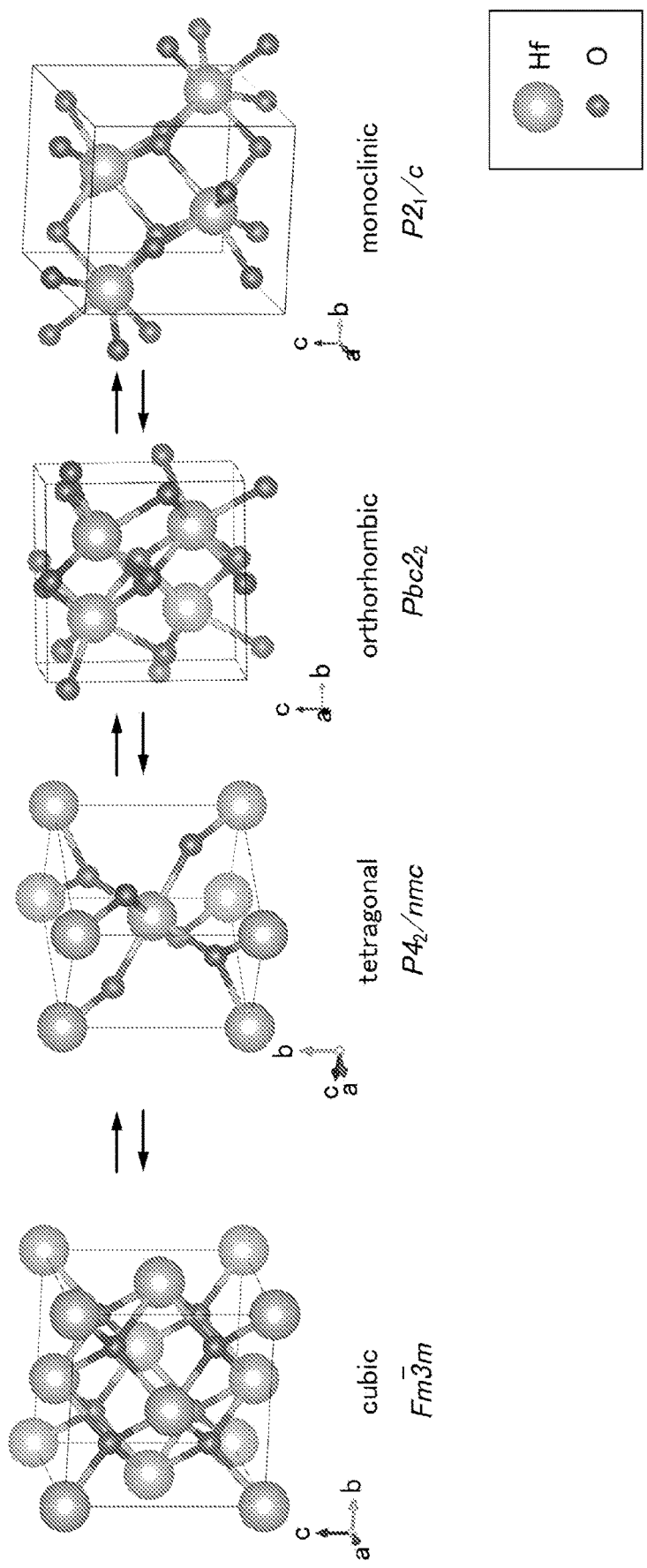
FIG. 6 shows model diagrams illustrating crystal structures of hafnium oxide of one embodiment of the present invention.

Crystal structures of hafnium oxide, which is a material that can be used as the insulator 130, are described with reference to FIG. 6. FIG. 6 is a model diagram illustrating crystal structures of hafnium oxide ($HfO_2$ in this embodiment). Hafnium oxide is known to take on various crystal structures and, for example, can take on crystal structures illustrated in FIG. 6 such as cubic (space group: Fm-3m), tetragonal (space group: $P4_2/nmc$), orthorhombic (space group: $Pbc2_1$), and monoclinic (space group: $P2_1/c$) crystal structures. As illustrated in FIG. 6, phase transition can occur between the above-described crystal structures. For example, the crystal structure of hafnium oxide can be changed from a crystal structure mainly formed of monoclinic crystals to a crystal structure mainly formed of orthorhombic crystals when the hafnium oxide is doped with zirconium to form a composite material.

In the case where hafnium oxide and zirconium oxide are alternately deposited by an ALD method or the like so as to achieve a composition ratio of hafnium oxide to zirconium oxide of approximately 1:1 as the above-described composite material, the composite material has an orthorhombic crystal structure. Alternatively, the composite material has an amorphous structure. Alternatively, the composite material has an amorphous structure, and the application of heat treatment or the like to the composite material can change the crystal structure from the amorphous structure to an orthorhombic crystal structure. In some cases, the orthorhombic crystal structure change to a monoclinic crystal structure in some cases. To make the above-described composite material have ferroelectricity, an orthorhombic crystal structure is preferred to a monoclinic crystal structure.

Here, a model of an orthorhombic crystal structure of $HfZrO_X$ is described with reference to FIG. 3A.

Figure 3A:
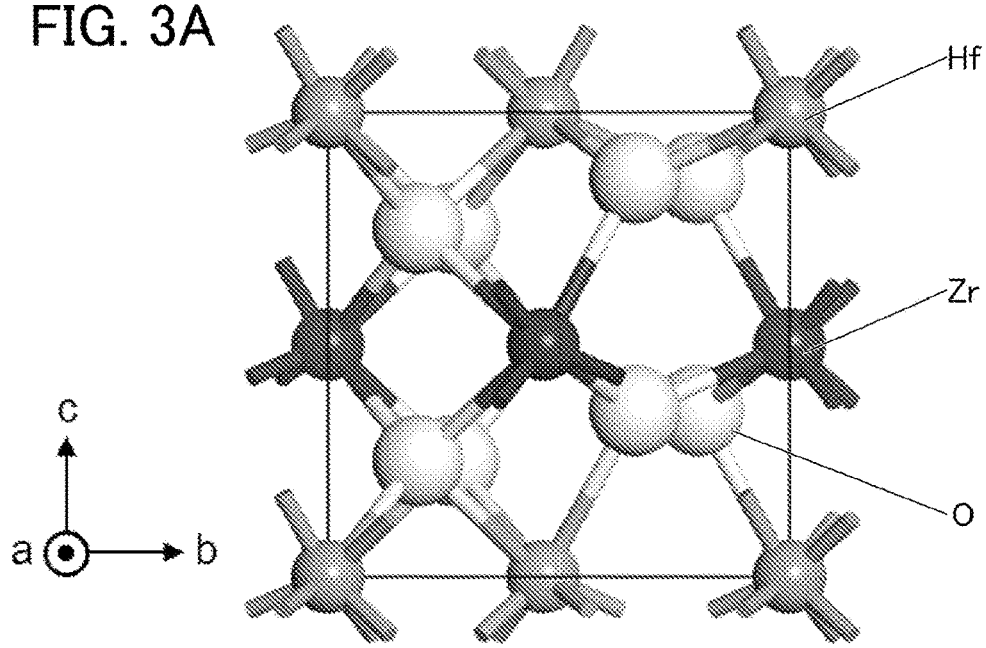
FIG. 3A to FIG. 3C are model diagrams of crystal structures of HfZrO$_X$ that is one embodiment of the present invention.

FIG. 3A is a model diagram of the crystal structure of $HfZrO_X$, which is $Hf_{0.5}Zr_{0.5}O_2$ here. In FIG. 3A, the directions of the a-axis, the b-axis, and the c-axis are also indicated. FIG. 3A illustrates a structure where Zr layers are placed in the orthorhombic structure ($Pca2_1$) of $HfO_2$ including a cell optimized by first-principles calculation.

In FIG. 3A, hafnium and zirconium are bonded to each other with oxygen therebetween. This can be formed by alternately depositing hafnium and zirconium by an ALD method as in the deposition sequence described later.

Application of an electric field from the outside displaces part of oxygen illustrated in FIG. 3A, thereby causing internal polarization. Here, part of oxygen is displaced in the c-axis direction and polarization is caused also in the c-axis direction.

Figure 3B:
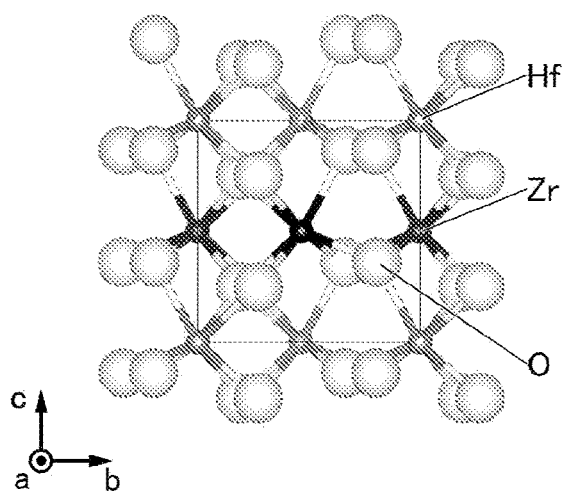
Figure 3C:
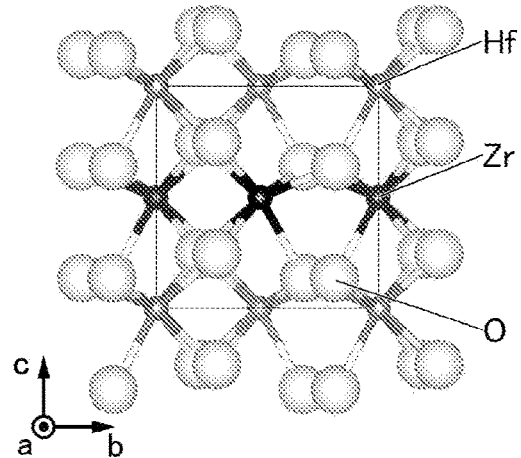

FIG. 3B and FIG. 3C are model diagrams of the crystal structure of HfZrOx, which is $Hf_{0.5}Zr_{0.5}O_2$ here. FIG. 3B and FIG. 3C each illustrate a model whose atomic arrangement is optimized by first-principles calculation. Note that the model illustrated in FIG. 3A and the model illustrated in FIG. 3B differ only in the manner of illustrating atoms and have substantially the same atomic arrangement.

Note that HfZrOx having an orthorhombic structure can take either the atomic arrangement illustrated in FIG. 3B or the atomic arrangement illustrated in FIG. 3C. Thus, an electric field applied from the outside displaces some of the oxygen atoms in HfZrOx, thereby causing internal polarization. In addition, when the direction or intensity of the electric field is changed, some of the oxygen atoms in HfZrOx move and the sign of internal polarization changes.

Figure 3D:
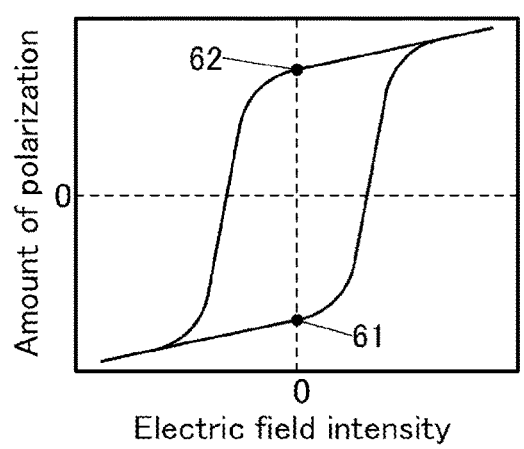
FIG. 3D is a graph showing an example of hysteresis characteristics of a ferroelectric layer.

FIG. 3D is a graph showing an example of the hysteresis characteristics of a ferroelectric layer. In FIG. 3D, the horizontal axis represents the intensity of an electric field applied to the ferroelectric layer and the vertical axis represents the amount of polarization in the ferroelectric layer. A point 61 shown in FIG. 3D represents the minimum polarization at the time when the electric field intensity is 0, and a point 62 shown in FIG. 3D represents the maximum polarization at the time when the electric field intensity is 0. For example, at the minimum polarization (the point 61 shown in FIG. 3D), atoms in HfZrOx are arranged as illustrated in FIG. 3B. At the maximum polarization (the point 62 shown in FIG. 3D), atoms in HfZrOx are arranged as illustrated in FIG. 3C.

As illustrated in FIG. 2A, the insulator 130 preferably has a crystal structure where layers each formed by crystals are stacked. Furthermore, the layers each preferably have a single crystal structure illustrated in FIG. 3A. Note that dashed lines in the insulator 130 illustrated in FIG. 2A represent crystal layers and a c-axis 132 represents the c-axis of the crystals.

As illustrated in FIG. 2A, the crystal layers included in the insulator 130 extend in the a-b plane direction. In addition, the crystal layers included in the insulator 130 grow in the c-axis direction (sometimes referred to as axial growth), and the plurality of crystal layers are stacked in the c-axis direction. The c-axis preferably faces a direction substantially perpendicular to the formation surface or top surface of the insulator 130. For example, as illustrated in FIG. 2B, an angle θ formed by a normal 134 with respect to the top surface of the conductor 110 and the c-axis 132 is preferably less than or equal to 30°, further preferably less than or equal to 5°.

FIG. 2A illustrates a state where an electric field E is applied between the lower electrode (the conductor 110) and the upper electrode (the conductor 120) of the capacitor 100. Here, it is preferable that the direction of the electric field E be substantially parallel to the c-axis 132. For example, the direction of the electric field E is preferably made parallel to the normal 134, in which case the angle θ formed by the direction of the electric field E and the c-axis 132 becomes less than or equal to 30°, preferably less than or equal to 5°.

With such a structure where the c-axis 132 of the insulator 130 is substantially parallel to the direction E of the electric field, the displacement direction of oxygen in an orthorhombic crystal is made substantially parallel to the direction E of the electric field. Thus, the electric field E can efficiently cause polarization in the insulator 130. Accordingly, polarization in the insulator 130 can be made large.

In order to form the insulator 130 including the crystal layers as described above, the top surface of the conductor 110 serving as the base of the insulator 130 preferably has favorable planarity. For example, the top surface roughness of the conductor 110 serving as the base, which is represented by arithmetic mean roughness (Ra) or root mean square roughness (RMS), is less than or equal to 2 nm, preferably less than or equal to 1 nm, further preferably less than or equal to 0.8 nm, still further preferably less than or equal to 0.5 nm, yet still further preferably less than or equal to 0.4 nm. Making the planarity of the top surface of the conductor 110 favorable as described above can improve the crystallinity of the insulator 130 and enhance the ferroelectricity of the insulator 130.

Furthermore, in order to form the insulator 130 including the crystal layers as described above, it is preferable that no different layer be formed at an interface between the insulator 130 and the conductor 110 and an interface between the insulator 130 and the conductor 120. For example, in the case where TiNx is used for the conductor 110 (the conductor 120) and HfZrOx is used for the insulator 130, oxygen contained in the insulator 130 or the like diffuses into the conductor 110 (the conductor 120) and TiOx might be formed as a different layer at the interface between the insulator 130 and the conductor 110 (the conductor 120). The thickness of such a different layer is preferably less than or equal to 1 nm, further preferably less than or equal to 0.4 nm, still further preferably less than or equal to 0.2 nm.

Figure 4A:
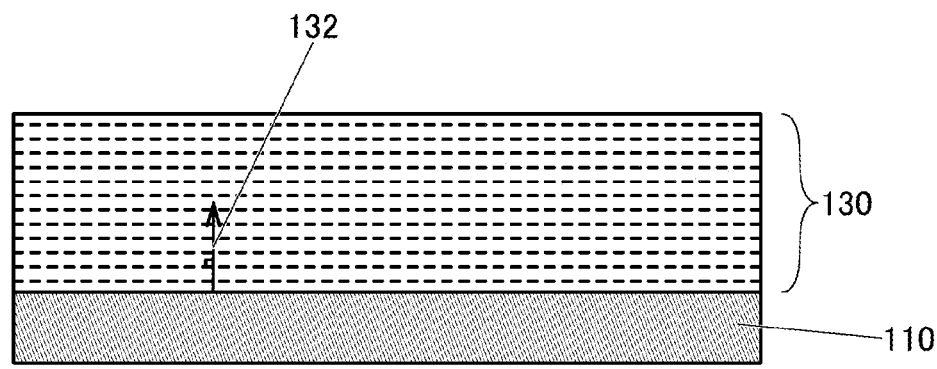
FIG. 4A to FIG. 4C are schematic views of ferroelectrics included in a capacitor.
Figure 4B:
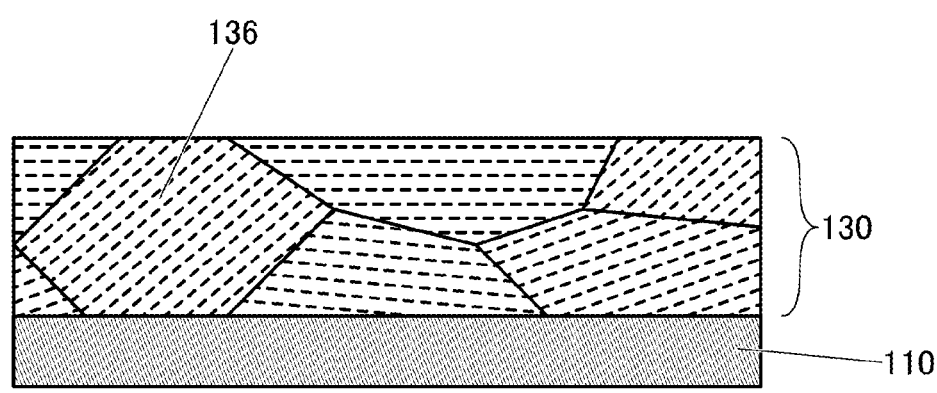
Figure 4C:
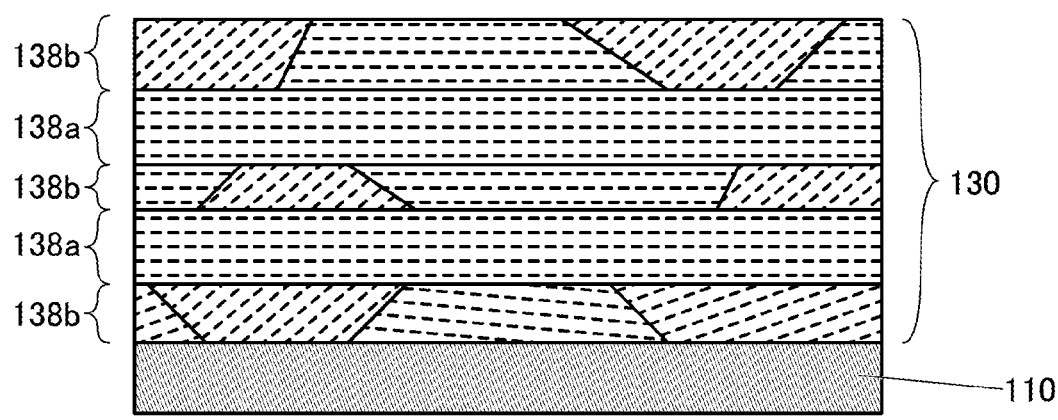

FIG. 4A to FIG. 4C are enlarged views illustrating the vicinity of the insulator 130 that functions as a ferroelectric layer and is illustrated in FIG. 2A or the like. FIG. 4A is a diagram illustrating the insulator 130 having the single crystal structure described with reference to FIG. 2A to FIG. 2C. As described above, the insulator 130 illustrated in FIG. 4A has the structure where the plurality of crystal layers are stacked. The plurality of crystal layers included in the insulator 130 are preferably aligned in the c-axis 132 direction.

Although a ferroelectric layer having a single crystal structure illustrated in FIG. 4A or the like is used as the insulator 130 in the example described above, the present invention is not limited thereto. For example, as illustrated in FIG. 4B, the insulator 130 may have a polycrystalline structure including a plurality of grains 136 with different crystallinities. Here, at least one of the plurality of grains 136 preferably has an orthorhombic crystal structure. At least one of the plurality of grains 136 preferably has an orthorhombic crystal structure, in which case the insulator 130 exhibits ferroelectricity.

The insulator 130 may include a layer 138a having a single crystal structure and a layer 138b having a polycrystalline structure. For example, as illustrated in FIG. 4C, a plurality of layers 138a having a single crystal structure and a plurality of layers 138b having a polycrystalline structure may be stacked over the conductor 110.

As described above, the insulator 130 has a single crystal structure in at least part of its crystal structure. The insulator 130 may have any one or more of crystal structures selected from cubic, tetragonal, orthorhombic, and monoclinic crystal structures. The insulator 130 especially preferably has an orthorhombic crystal structure to exhibit ferroelectricity. Alternatively, the crystal structure of the insulator 130 may be an amorphous structure. Alternatively, the insulator 130 may have a composite structure including an amorphous structure and a crystal structure.

In order to form the insulator 130 with favorable crystallinity, impurities such as hydrogen, carbon, a hydrocarbon, and chlorine in the insulator 130 are preferably reduced. When the impurities are contained in the insulator 130, crystallization of the insulator 130 is inhibited in some cases. Furthermore, the impurities might form oxygen vacancies in the crystal in the insulator 130. As described above, in the crystal structure illustrated in FIG. 3A, oxygen is displaced by an electric field from the outside and ferroelectricity is exhibited. Thus, in order to improve the ferroelectricity of the insulator 130, impurities such as hydrogen, carbon, a hydrocarbon, and chlorine are preferably reduced so that oxygen vacancies are reduced.

Therefore, the insulator 130 is preferably formed using a material that contains no or an extremely small amount of impurities such as hydrogen, carbon, a hydrocarbon, and chlorine. For example, the concentration of hydrogen contained in the insulator 130 is preferably lower than or equal to $5\times10^{20}$ atoms/cm$^3$, further preferably lower than or equal to $1\times10^{20}$ atoms/cm$^3$. For example, the concentration of a hydrocarbon contained in the insulator 130 is preferably lower than or equal to $5\times10^{20}$ atoms/cm$^3$, further preferably lower than or equal to $1\times10^{20}$ atoms/cm$^3$, still further preferably lower than or equal to $5\times10^{19}$ atoms/cm$^3$. For example, the concentration of carbon contained in the insulator 130 is preferably lower than or equal to $5\times10^{20}$ atoms/cm$^3$, further preferably lower than or equal to $1\times10^{20}$ atoms/cm$^3$, still further preferably lower than or equal to $5\times10^{19}$ atoms/cm$^3$. For example, the concentration of chlorine contained in the insulator 130 is preferably lower than or equal to $5\times10^{21}$ atoms/cm$^3$, further preferably lower than or equal to $1\times10^{21}$ atoms/cm$^3$, still further preferably lower than or equal to $5\times10^{20}$ atoms/cm$^3$.

Note that the impurities can be quantified by secondary ion mass spectrometry (SIMS), X-ray photoelectron spectroscopy (XPS), or auger electron spectroscopy (AES). For example, impurities such hydrogen, carbon, a hydrocarbon, and chlorine in the insulator 130 can be quantified by SIMS analysis.

By using a material that does not contain at least one or more of hydrogen, a hydrocarbon, carbon, and chlorine or contains an extremely small amount of at least one or more of hydrogen, a hydrocarbon, carbon, and chlorine in the insulator 130 as described above, the crystallinity of the insulator 130 can be increased and a structure with high ferroelectricity can be achieved.

For the conductor 110, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. As an alloy containing any of the above metal elements, a nitride of the alloy or an oxide of the alloy may be used. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

A conductive material that can be used for the conductor 110 can be used for the conductor 120.

<Fabrication Method of Capacitor>

In this section, a method for fabricating a capacitor of one embodiment of the present invention is described with reference to FIG. 5A to FIG. 5C.

Figure 5A:
FIG. 5A to FIG. 5C are cross-sectional views illustrating a method for fabricating a capacitor of one embodiment of the present invention.

As illustrated in FIG. 5A, the conductor 110 is deposited over a substrate (not illustrated). The conductor 110 can be deposited by a sputtering method, a CVD method, an MBE method, a PLD method, an ALD method, or the like. By using the ALD method, a conductive film with high planarity can easily be deposited as the conductor 110, in some cases. For example, titanium nitride may be deposited by a thermal ALD method. The conductor 110 may be formed into a pattern by a lithography method or the like as appropriate.

Figure 5B:
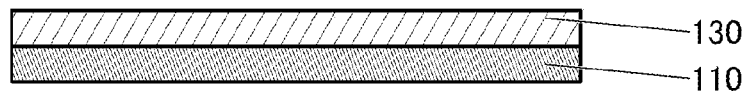

Next, as illustrated in FIG. 5B, the insulator 130 is deposited over the conductor 110. The insulator 130 can be deposited by a sputtering method, a CVD method, an ALD method, or the like. For example, the insulator 130 can be deposited over the conductor 110 with good coverage by using an ALD method. This can inhibit the occurrence of a leakage current between the upper electrode and the lower electrode of the capacitor 100.

A material that can have ferroelectricity is preferably used for the insulator 130. As the material that can have ferroelectricity, any of the above materials can be used. Here, the thickness of the insulator 130 can be less than or equal to 100 nm, preferably less than or equal to 50 nm, further preferably less than or equal to 20 nm, still further preferably less than or equal to 10 nm (typically greater than or equal to 2 nm and less than or equal to 9 nm).

In the case where a material containing hafnium oxide and zirconium oxide ($HfZrO_x$) is used for the insulator 130, a thermal ALD method is preferably used for the deposition.

Furthermore, in the case where the insulator 130 is deposited by a thermal ALD method, a material that does not contain a hydrocarbon (also referred to as Hydro Carbon or HC) is suitably used as a precursor. In the case where one or both of hydrogen and carbon are contained in the insulator 130, crystallization of the insulator 130 might be inhibited. Thus, using a precursor that does not contain a hydrocarbon in the above-described manner is preferable in order to reduce the concentration of one or both of hydrogen and carbon in the insulator 130. For example, as the precursor that does not contain a hydrocarbon, a chlorine-based material can be given. Note that in the case where a material containing hafnium oxide and zirconium oxide ($HfZrO_x$) is used for the insulator 130, $HfCl_4$ and $ZrCl_4$ can be used as the precursor.

In the case where the insulator 130 is deposited by a thermal ALD method, $H_2O$ or $O_3$ can be used as an oxidizer. As the oxidizer in the thermal ALD method, $O_3$ is more suitably used than $H_2O$ to reduce the concentration of hydrogen in the film. However, the oxidizer in the thermal ALD method is not limited thereto. For example, the oxidizer in the thermal ALD method may contain any one or more selected from $O_2$, $O_3$, $N_2O$, $NO_2$, $H_2O$, and $H_2O_2$.

Figure 5C:
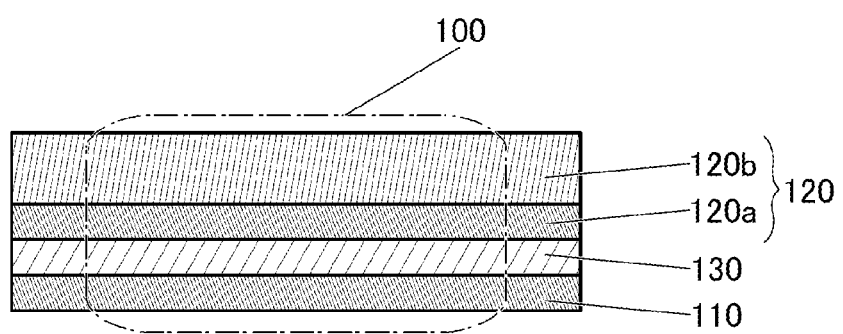

Next, as illustrated in FIG. 5C, the conductor 120 is deposited over the insulator 130. Here, the conductor 120 is placed so as to be separated from the conductor 110 with the insulator 130 therebetween. The conductor 120 may have a stacked-layer structure of a conductor 120a provided over and in contact with the insulator 130 and a conductor 120b provided over and in contact with the conductor 120a.

The conductor 120a may be deposited by an ALD method, a CVD method, or the like. For example, titanium nitride can be deposited by a thermal ALD method. Here, the conductor 120a is preferably deposited by a method in which deposition is performed while the substrate is heated, such as a thermal ALD method. For example, the substrate temperature during the deposition is higher than or equal to room temperature, preferably higher than or equal to 300° C., further preferably higher than or equal to 325° C., still further preferably higher than or equal to 350° C. Furthermore, the substrate temperature during the deposition is lower than or equal to 500° C., preferably lower than or equal to 450° C., for example. For example, the substrate temperature is approximately 400° C.

The deposition of the conductor 120a within the above-described temperature range enables the insulator 130 to have ferroelectricity even without high-temperature baking treatment (e.g., baking treatment at a heat treatment temperature of 400° C. or higher or 500° C. or higher) after the formation of the conductor 120a.

When the conductor 120a is deposited by an ALD method, which causes relatively little damage to a base, as described above, the crystal structure of the insulator 130 can be inhibited from being broken excessively, which leads to higher ferroelectricity of the insulator 130.

For example, in the case where the conductor 120a is formed by a sputtering method or the like, a base film, i.e., the insulator 130 here can be damaged. For example, in the case where a material containing hafnium oxide and zirconium oxide ($HfZrO_x$) is used as the insulator 130 and the conductor 120a is formed by a sputtering method, $HfZrO_x$, which is the base film, is damaged by a sputtering method and the crystal structure of $HfZrO_x$ (typically, an orthorhombic crystal structure or the like) can be broken. Therefore, the conductor 120a is preferably deposited by an ALD method, which causes relatively little damage to a base.

When heat treatment is performed after the conductor 120a is deposited by a sputtering method, the damage of the $HfZrO_x$ crystal structure can be repaired.

Here, in some cases, a dangling bond (e.g., O*) in $HfZrO_x$ is bonded to hydrogen contained in $HfZrO_x$, making it impossible to repair the damage of the $HfZrO_x$ crystal structure. The dangling bond in $HfZrO_x$ is formed, for example, by damage due to deposition of the conductor 120a by a sputtering method.

Thus, a material that does not contain hydrogen or contains an extremely small amount of hydrogen is suitably used as the insulator 130, which is $HfZrO_x$ here. For example, the concentration of hydrogen contained in the insulator 130 is preferably lower than or equal to $5\times10^{20}$ atoms/cm$^3$, further preferably lower than or equal to $1\times10^{20}$ atoms/cm$^3$.

Furthermore, as described above, in order to reduce the concentration of hydrogen in the insulator 130, the material that does not contain a hydrocarbon is suitably used as the precursor. This may make the insulator 130 a film that does not contain a hydrocarbon as a main component or contains an extremely small amount of hydrocarbon. For example, the concentration of hydrocarbon contained in the insulator 130 is preferably lower than or equal to $5\times10^{20}$ atoms/cm$^3$, further preferably lower than or equal to $1\times10^{20}$ atoms/cm$^3$, still further preferably lower than or equal to $5\times10^{19}$ atoms/cm$^3$.

Moreover, in the case where the material that does not contain a hydrocarbon is used as the precursor in depositing the insulator 130, the insulator 130 may be a film that does not contain carbon as a main component or contains an extremely small amount of carbon. For example, the concentration of carbon contained in the insulator 130 is preferably lower than or equal to $5\times10^{20}$ atoms/cm$^3$, further preferably lower than or equal to $1\times10^{20}$ atoms/cm$^3$, still further preferably lower than or equal to $5\times10^{19}$ atoms/cm$^3$.

As the insulator 130, a material that contains an extremely small amount of at least one or more of hydrogen, a hydrocarbon, and carbon is suitably used, and it is especially important to reduce the amount of hydrocarbon and carbon. Hydrocarbon molecules and carbon atoms, which are heavier than hydrogen, are difficult to remove in a subsequent step. Therefore, it is suitable to thoroughly remove a hydrocarbon and carbon when the insulator 130 is deposited.

By using a material that does not contain at least one or more of hydrogen, a hydrocarbon, and carbon or contains an extremely small amount of at least one or more of hydrogen, a hydrocarbon, and carbon as the insulator 130 as described above, the crystallinity of the insulator 130 can be increased and a structure with high ferroelectricity can be achieved.

Note that the amount of chlorine contained in the insulator 130 is also preferably reduced. For example, the concentration of chlorine contained in the insulator 130 is preferably lower than or equal to $5\times10^{21}$ atoms/cm$^3$, further preferably lower than or equal to $1\times10^{21}$ atoms/cm$^3$, still further preferably lower than or equal to $5\times10^{20}$ atoms/cm$^3$.

When impurities in the film of the insulator 130, which are at least one or more of hydrogen, a hydrocarbon, carbon, and chlorine here, are thoroughly removed in the above-described manner, a highly purified intrinsic film having ferroelectricity, which is a highly purified intrinsic capacitor here, can be formed. Note that the highly purified intrinsic capacitor having ferroelectricity and a highly purified intrinsic oxide semiconductor described in a later embodiment are highly compatible with each other in the manufacturing process. Thus, a method for fabricating a semiconductor device with high productivity can be provided.

As described above, in one embodiment of the present invention, as the insulator 130, a ferroelectric material is formed by a thermal ALD method using a precursor that does not contain a hydrocarbon (typically, a chlorine-based precursor) and an oxidizer (typically O$_3$), for example. Then, the conductor 120a is formed by deposition by a thermal ALD method (typically, deposition at 400° C. or higher). Without performing annealing after the deposition, in other words, by utilizing the temperature during the deposition of the conductor 120a, the crystallinity or ferroelectricity of the insulator 130 can be increased. Note that increasing the crystallinity or ferroelectricity of the insulator 130 by utilizing the temperature during the deposition of the conductor 120a without performing annealing after the deposition of the conductor 120a is referred to as self-annealing, in some cases.

Note that the conductor 120b can be deposited by a sputtering method, an ALD method, a CVD method, or the like. For example, tungsten can be deposited by a metal CVD method.

In the above-described manner, the capacitor 100 illustrated in FIG. 5C, which includes the insulator 130 between the conductor 110 and the conductor 120, can be fabricated. As described above, in the capacitor 100 of this embodiment, the ferroelectricity of the insulator 130 can be increased even when high-temperature baking treatment is not performed after formation of the conductor 120a. Thus, the step of manufacturing a ferroelectric capacitor can be eliminated, which increases productivity of a ferroelectric capacitor and a semiconductor device including the ferroelectric capacitor.

Although the example where high-temperature baking treatment is not performed after fabrication of the conductor 120a is described above, the present invention is not limited thereto. For example, in the case where the conductor 120a and the conductor 120b are formed without substrate heating or with low-temperature substrate heating, heat treatment may be performed after formation of the conductor 120. For example, the substrate temperature during the heat treatment is set to be higher than or equal to room temperature, preferably higher than or equal to 300° C., further preferably higher than or equal to 325° C., still further preferably higher than or equal to 350° C. Furthermore, for example, the substrate temperature during the deposition is set to be lower than or equal to 500° C., preferably lower than or equal to 450° C. For example, the substrate temperature is set at approximately 400° C. The heat treatment can be performed in an atmosphere containing an oxygen gas, a nitrogen gas, or an inert gas.

<Deposition by ALD Method>

A method for depositing the insulator 130 by an ALD method and a deposition apparatus used for the deposition are described below with reference to FIG. 7A and FIG. 7B.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition.

In an ALD method, a first source gas (also referred to as a precursor) and a second source gas (also referred to as an oxidizing gas), both of which are for reaction, are alternately introduced into a chamber and repetitive introduction of these source gases forms a film. When the precursor or the oxidizing gas is introduced, N$_2$, Ar, or the like may be introduced into a reaction chamber as a carrier purge gas, together with the precursor or the oxidizing gas. By using the carrier purge gas, the precursor or the oxidizing gas can be prevented from being adsorbed onto an inner side of a pipe or an inner side of a valve and can be introduced into the reaction chamber (also referred to as a carrier gas). Furthermore, the precursor or the oxidizing gas remaining in the reaction chamber can be exhausted quickly (also referred to as a purge gas). Thus, the carrier purge gas can be so called because the gas has two functions of introduction (carrier) and exhaustion (purge). Using the carrier purge gas is preferable to improve the uniformity of the formed film.

Figure 7A:
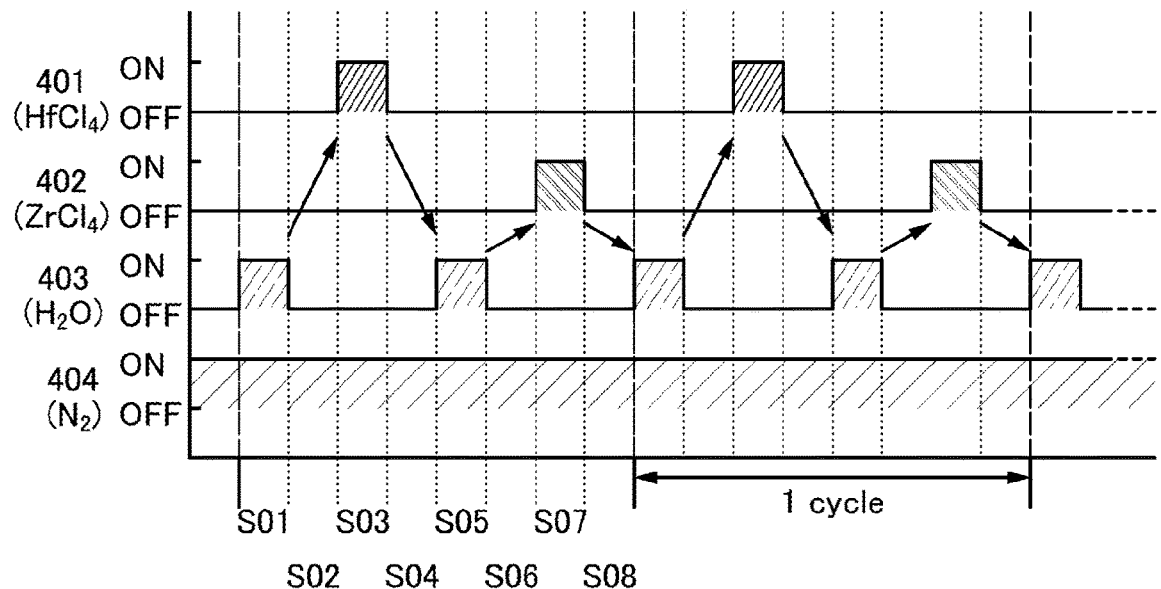
FIG. 7A is a diagram showing a deposition sequence of a metal oxide film of one embodiment of the present invention.

FIG. 7A shows a deposition sequence of a film of the material that can have ferroelectricity (hereinafter referred to as a ferroelectric layer) by an ALD method. An example of depositing a ferroelectric layer containing hafnium oxide and zirconium oxide as the insulator 130 is described below.

As a precursor 401, a precursor that contains hafnium and any one or more selected from chlorine, fluorine, bromine, iodine, and hydrogen can be used. Furthermore, as a precursor 402, a precursor that contains zirconium and any one or more selected from chlorine, fluorine, bromine, iodine, and hydrogen can be used. Here, HfCl$_4$ is used as the precursor 401 containing hafnium, and ZrCl$_4$ is used as the precursor 402 containing zirconium.

Note that the precursor 401 and the precursor 402 are formed by gasifying a liquid source material or a solid source material by heating. The precursor 401 is formed of a solid source material of HfCl$_4$, and the precursor 402 is formed of a solid source material of ZrCl$_4$. Impurities are preferably reduced in the precursor 401 and the precursor 402 and also in the solid source materials thereof. Examples of the impurities include Ba, Cd, Co, Cr, Cu, Fe, Ga, Li, Mg, Mn, Na, Ni, Sr, V, and Zn. In the solid source material of $HfCl_4$ and the solid source material of $ZrCl_4$, the above-described impurities preferably exist at less than 1000 wppb. Here, wppb is a unit representing the concentration of impurities converted by mass in parts per billion.

As an oxidizing gas 403, any one or more selected from $O_2$, $O_3$, $N_2O$, $NO_2$, $H_2O$, and $H_2O_2$ can be used. In this section, a gas containing $H_2O$ is used as the oxidizing gas 403. Furthermore, as a carrier purge gas 404, any one or more selected from $N_2$, He, Ar, Kr, and Xe can be used. In this section, $N_2$ is used as the carrier purge gas 404.

First, the oxidizing gas 403 is introduced into a reaction chamber (Step S01). Next, the introduction of the oxidizing gas 403 is stopped, so that only the carrier purge gas 404 is left to purge the oxidizing gas 403 remaining in the reaction chamber (Step S02). Next, the precursor 401 and the carrier purge gas 404 are introduced into the reaction chamber, and the pressure in the reaction chamber is kept constant (Step S03). In this way, the precursor 401 is adsorbed onto the formation surface. Next, the introduction of the precursor 401 is stopped, so that and only the carrier purge gas 404 is left to purge the precursor 401 remaining in the reaction chamber (Step S04). Next, the oxidizing gas 403 is introduced into the reaction chamber. The introduction of the oxidizing gas 403 causes oxidation of the precursor 401 to form hafnium oxide (Step S05).

Next, the introduction of the oxidizing gas 403 is stopped, so that only the carrier purge gas 404 is left to purge the oxidizing gas 403 remaining in the reaction chamber (Step S06).

Next, the precursor 402 and the carrier purge gas 404 are introduced into the reaction chamber, and the pressure in the reaction chamber is kept constant (Step S07). In this way, the precursor 402 is adsorbed onto an oxygen layer of the hafnium oxide. Next, the introduction of the precursor 402 is stopped, so that only the carrier purge gas 404 is left to purge the precursor 402 remaining in the reaction chamber (Step S08). Next, the process returns to Step S01, and the oxidizing gas 403 is introduced into the reaction chamber. The introduction of the oxidizing gas 403 causes oxidation of the precursor 402 to form zirconium oxide on hafnium oxide.

Step S01 to Step S08 described above is defined as one cycle, and the cycle is repeated until a desired thickness is obtained. Note that Step S01 to Step S08 are each performed within a temperature range of higher than or equal to 250° C. and lower than or equal to 450° C., preferably a temperature range of higher than or equal to 350° C. and lower than or equal to 400° C.

By the deposition by an ALD method in the above-described manner, a layered crystal structure where a hafnium layer, an oxygen layer, and a zirconium layer are repeated as illustrated in FIG. 4 can be formed. Furthermore, by the deposition using the precursors with reduced impurities in the above-described manner, hindrance to the formation of the layered crystal structure due to impurity entry during the deposition can be inhibited. Thus, when the insulator 130 has a layered crystal structure with high crystallinity, the insulator 130 can have high ferroelectricity.

Note that the insulator 130 does not necessarily exhibit ferroelectricity right after being deposited. As described above, the insulator 130 exhibits ferroelectricity not right after being deposited but after the conductor 120 is formed over the insulator 130, in some cases.

Next, a manufacturing apparatus used for the above-described deposition by an ALD method is described with reference to FIG. 7B. FIG. 7B is a schematic diagram of a manufacturing apparatus 900 used for deposition by the ALD method.

Figure 7B:
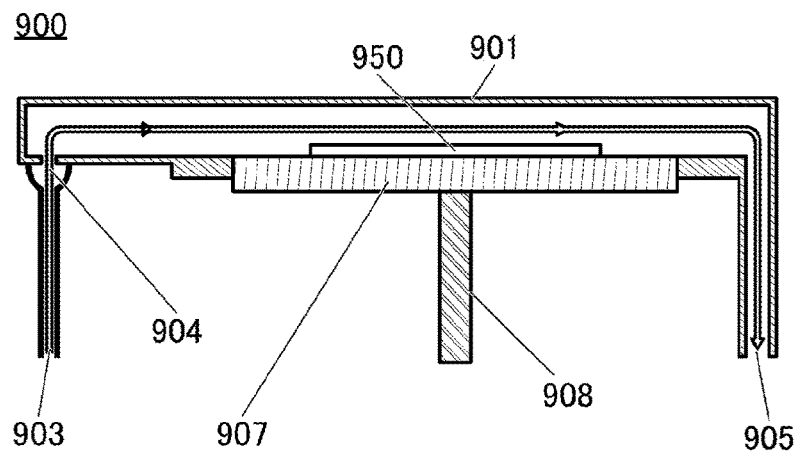
FIG. 7B is a cross-sectional view of a manufacturing apparatus for the metal oxide film of one embodiment of the present invention.

As illustrated in FIG. 7B, the manufacturing apparatus 900 includes a reaction chamber 901, a gas inlet 903, a reaction chamber entrance 904, an exhaust port 905, a wafer stage 907, and a shaft 908. In FIG. 7B, a wafer 950 is placed over the wafer stage 907.

A heater system for heating the precursor 401, the precursor 402, the oxidizing gas 403, and the carrier purge gas 404 may be placed in the reaction chamber 901. Furthermore, the wafer stage 907 may be provided with a heater system for heating the wafer 950. Moreover, the wafer stage 907 may be provided with a rotation mechanism which rotates horizontally with the shaft 908 as a rotation axis. Although not illustrated, a gas supply system for introducing each of the precursor 401, the precursor 402, the oxidizing gas 403, and the carrier purge gas 404 into the gas inlet 903 with an appropriate timing for an appropriate time at an appropriate flow rate is placed upstream from the gas inlet. Furthermore, although not illustrated, an exhaust system including a vacuum pump is placed downstream from the exhaust port 905.

The manufacturing apparatus 900 illustrated in FIG. 7B is what is called a crossflow ALD apparatus. The flow of the precursor 401, the precursor 402, the oxidizing gas 403, and the carrier purge gas 404 in the crossflow type is described below. The precursor 401, the precursor 402, the oxidizing gas 403, and the carrier purge gas 404 flow from the gas inlet 903 to the reaction chamber 901 through the reaction chamber entrance 904, reach the wafer 950, and are exhausted through the exhaust port 905. Arrows shown in FIG. 7B schematically indicate the directions of gas flow.

As described above, in Step S05 of introducing the oxidizing gas 403 into the reaction chamber 901, which is shown in FIG. 7A, the precursor 401 adsorbed on the wafer 950 is oxidized by the oxidizing gas 403 to form hafnium oxide. Owing to the structure of the crossflow manufacturing apparatus 900, the oxidizing gas 403 reaches the wafer 950 after being exposed to a heated component in the reaction chamber for a long time. Thus, in the case of using $O_3$ as the oxidizing gas 403, for example, the oxidizing gas 403 reacts with the high-temperature solid surface before reaching the wafer 950 and is decomposed to have lower oxidizability. For this reason, the deposition rate of hafnium oxide depends on the distance the oxidizing gas 403 flows to reach the wafer 950 from the reaction chamber entrance 904. In the case where the wafer stage 907 is rotated horizontally with the shaft 908 as a center, the periphery of the wafer 950 first reaches the oxidizing gas 403; therefore, the thickness of hafnium oxide becomes larger toward the periphery of the wafer 950 and smaller in the center portion than in the periphery.

Thus, to inhibit the oxidizing gas 403 from being decomposed and having reduced oxidizability, the heating temperature of the reaction chamber needs to be set at an appropriate temperature. Note that although the description has been made by giving oxidation of the precursor 401 as an example, the same applies to oxidation of the precursor 402.

In the above-described manner, a ferroelectric layer with excellent thickness uniformity over the substrate plane can be formed. The uniformity over the substrate plane is preferably less than or equal to ±1.5%, further preferably less than or equal to ±1.0%. Furthermore, when (the maximum thickness over the substrate plane)−(the minimum thickness over the substrate plane) is defined as RANGE and the thickness uniformity over the substrate plane is defined as ±PNU (Percent Non Uniformity) (%), the thickness uniformity over the substrate plane can be calculated from ±PNU (%)=(RANGE×100)/(2×the average thickness over the substrate plane).

Furthermore, when an oxygen layer with excellent uniformity is formed with the use of the oxidizing gas 403 in the above-described manner, a layered crystal structure with higher regularity can be formed. Thus, when the insulator 130 has a layered crystal structure with high regularity, the insulator 130 can have high ferroelectricity.

By using the above-described method, the insulator 130 formed of the material that can have ferroelectricity can be formed. By forming the capacitor 100 using such an insulator 130, the capacitor 100 can be a ferroelectric capacitor.

According to one embodiment of the present invention, a capacitor containing a material that can have ferroelectricity can be provided. According to another embodiment of the present invention, the above capacitor can be provided with favorable productivity. According to another embodiment of the present invention, a capacitor that can be miniaturized or highly integrated can be provided.

At least part of the structure, method, and the like described in this embodiment can be implemented in appropriate combination with any of those in the other embodiments, the other examples, and the like described in this specification.

Embodiment 2

In this embodiment, an example of a semiconductor device including the transistor 200 and the capacitor 100, which is one embodiment of the present invention, and a fabrication method thereof are described with reference to FIG. 11A to FIG. 17C. Here, the description of the capacitor 100 in Embodiment 1 can be referred to for the capacitor 100 used in the above semiconductor device.

Structure Example of Semiconductor Device

Figure 11A:
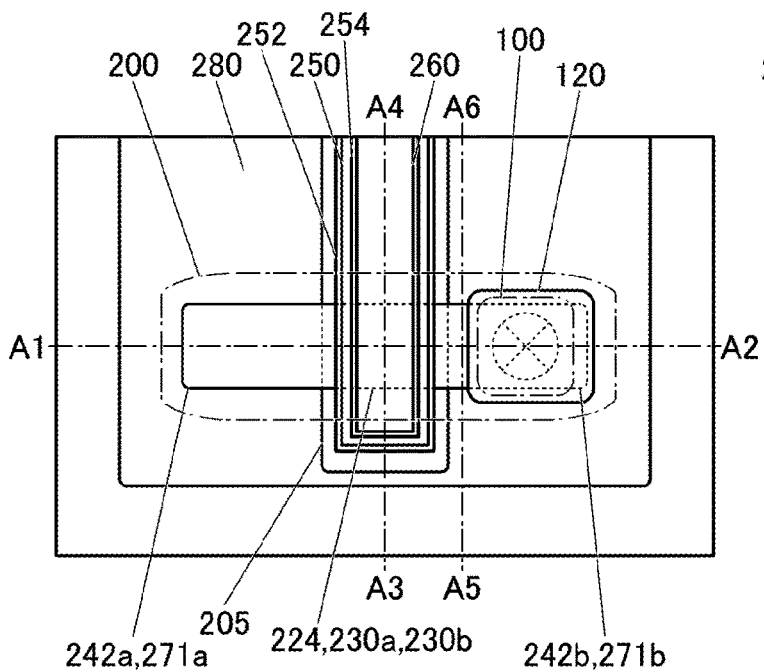
FIG. 11A is a top view of a semiconductor device of one embodiment of the present invention.
Figure 11C:
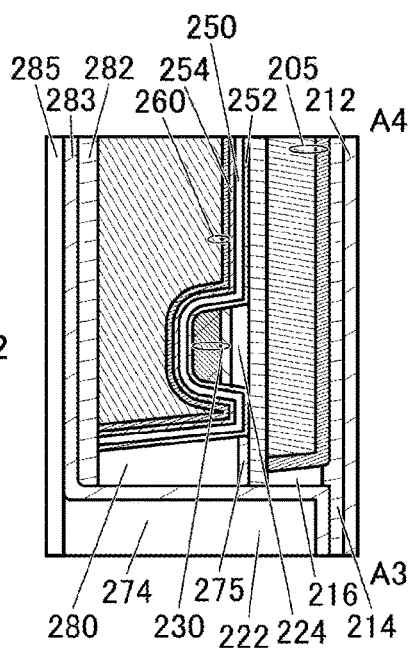
FIG. 11B to FIG. 11D are cross-sectional views of the semiconductor device of one embodiment of the present invention.
Figure 11B:
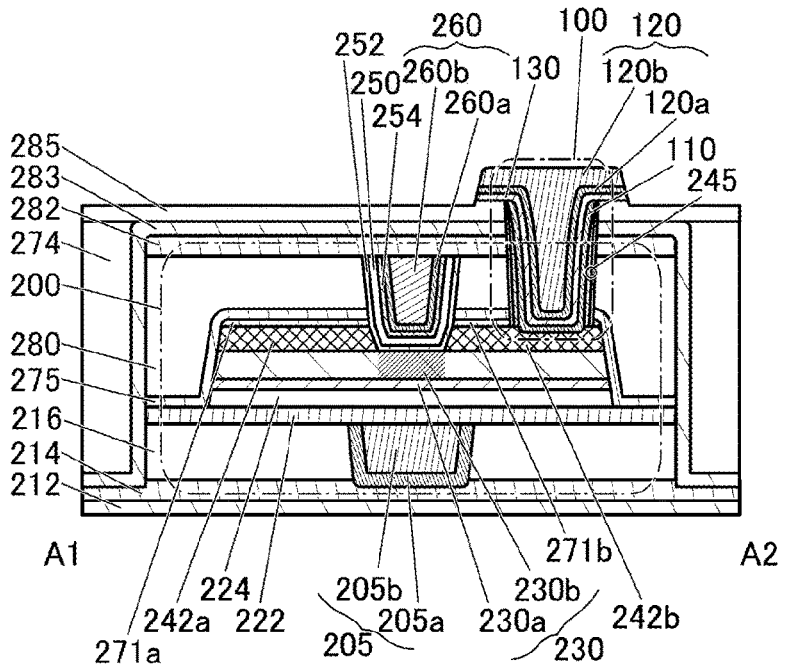
Figure 11D:
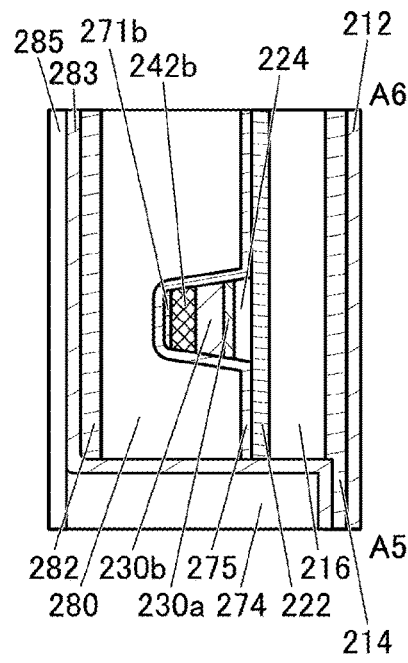

FIG. 11A to FIG. 11D are a top view and cross-sectional views of the semiconductor device including the transistor 200 and the capacitor 100. FIG. 11A is a top view of the semiconductor device. FIG. 11B to FIG. 11D are cross-sectional views of the semiconductor device. Here, FIG. 11B is a cross-sectional view of a portion indicated by dashed-dotted line A1-A2 in FIG. 11A, and is a cross-sectional view of the transistor 200 in the channel length direction. FIG. 11C is a cross-sectional view of a portion indicated by dashed-dotted line A3-A4 in FIG. 11A, and is a cross-sectional view of the transistor 200 in the channel width direction. FIG. 11D is a cross-sectional view of a portion indicated by dashed-dotted line A5-A6 in FIG. 11A. Note that for clarity of the drawing, some components are not illustrated in the top view in FIG. 11A.

The semiconductor device of one embodiment of the present invention includes an insulator 212 over a substrate (not illustrated), an insulator 214 over the insulator 212, the transistor 200 over the insulator 214, an insulator 280 which is over an insulator 275 and provided in the transistor 200, an insulator 282 over the insulator 280, an insulator 283 over the insulator 282, an insulator 274 over the insulator 283, and an insulator 285 over the insulator 283 and the insulator 274. The insulator 212, the insulator 214, the insulator 216, the insulator 275, the insulator 280, the insulator 282, the insulator 283, the insulator 285, and the insulator 274 function as interlayer films. The insulator 283 is in contact with part of the top surface of the insulator 214, the side surface of the insulator 216, the side surface of the insulator 222, the side surface of the insulator 275, the side surface of the insulator 280, and the side surface and the top surface of the insulator 282.

Here, the transistor 200 includes a semiconductor layer, a first gate, a second gate, a source, and a drain. The other of the source and the drain of the transistor 200 is in contact with one electrode of the capacitor 100 at a position above the semiconductor layer. An insulator 271 (an insulator 271a and an insulator 271b) is provided over and in contact with the source and the drain of the transistor 200.

The capacitor 100 is provided in an opening that is formed in the insulator 271, the insulator 275, the insulator 280, the insulator 282, the insulator 283, and the insulator 285 and reaches one of the source and the drain of the transistor 200. The capacitor 100 includes the conductor 110 that is in contact with the top surface of the one of the source and the drain of the transistor 200 in the opening, the insulator 130 placed over the conductor 110 and the insulator 285, and the conductor 120 (the conductor 120a and the conductor 120b) placed over the insulator 130. Here, the conductor 110 is preferably placed along the side surface and the bottom surface of the opening.

An insulator 245 is preferably provided between the conductor 110 and the insulator 280. It is preferable that the insulator 245 have a function of inhibiting diffusion of hydrogen (e.g., at least one of a hydrogen atom, a hydrogen molecule, and the like). In addition, it is preferable that the insulator 245 have a function of inhibiting diffusion of oxygen (e.g., at least one of an oxygen atom, an oxygen molecule, and the like). For example, the insulator 245 preferably has lower permeability of one or both of oxygen and hydrogen than the insulator 280.

[Transistor 200]

As illustrated in FIG. 11A to FIG. 11D, the transistor 200 includes the insulator 216 over the insulator 214, a conductor 205 (a conductor 205a and a conductor 205b) placed to be embedded in the insulator 214 and/or the insulator 216, the insulator 222 over the insulator 216 and the conductor 205, an insulator 224 over the insulator 222, an oxide 230a over the insulator 224, an oxide 230b over the oxide 230a, a conductor 242a over the oxide 230b, the insulator 271a over the conductor 242a, a conductor 242b over the oxide 230b, the insulator 271b over the conductor 242b, an insulator 252 over the oxide 230b, an insulator 250 over the insulator 252, an insulator 254 over the insulator 250, a conductor 260 (a conductor 260a and a conductor 260b) being positioned over the insulator 254 and overlapping with part of the oxide 230b, and the insulator 275 placed over the insulator 222, the insulator 224, the oxide 230a, the oxide 230b, the conductor 242a, the conductor 242b, the insulator 271a, and the insulator 271b. Here, as illustrated in FIG. 11B and FIG. 11C, the insulator 252 is in contact with the top surface of the insulator 222, the side surface of the insulator 224, the side surface of the oxide 230a, the side surface and the top surface of the oxide 230b, the side surface of the conductor 242, the side surface of the insulator 271, the side surface of the insulator 275, the side surface of the insulator 280, and the bottom surface of the insulator 250. The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with at least parts of the top surfaces of the conductor 260, the insulator 252, the insulator 250, the insulator 254, and the insulator 280.

Hereinafter, the oxide 230a and the oxide 230b are collectively referred to as the oxide 230 in some cases. The conductor 242a and the conductor 242b are collectively referred to as the conductor 242 in some cases. The insulator 271a and the insulator 271b are collectively referred to as the insulator 271 in some cases.

An opening reaching the oxide 230b is provided in the insulator 280 and the insulator 275. The insulator 252, the insulator 250, the insulator 254, and the conductor 260 are placed in the opening. The conductor 260, the insulator 252, the insulator 250, and the insulator 254 are provided between the insulator 271a and the conductor 242a, and the insulator 271b and the conductor 242b in the channel length direction of the transistor 200. The insulator 254 includes a region in contact with the side surface of the conductor 260 and a region in contact with the bottom surface of the conductor 260.

The oxide 230 preferably includes the oxide 230a placed over the insulator 224 and the oxide 230b placed over the oxide 230a. Including the oxide 230a under the oxide 230b makes it possible to inhibit diffusion of impurities into the oxide 230b from components formed below the oxide 230a.

Although a structure where two layers, the oxide 230a and the oxide 230b, are stacked as the oxide 230 in the transistor 200 is described, the present invention is not limited thereto. For example, the oxide 230 may be provided as a single layer of the oxide 230b or to have a stacked-layer structure of three or more layers, or the oxide 230a and the oxide 230b may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242a functions as one of a source and a drain, and the conductor 242b functions as the other of the source and the drain. At least part of a region of the oxide 230 overlapping with the conductor 260 functions as a channel formation region.

Figure 12A:
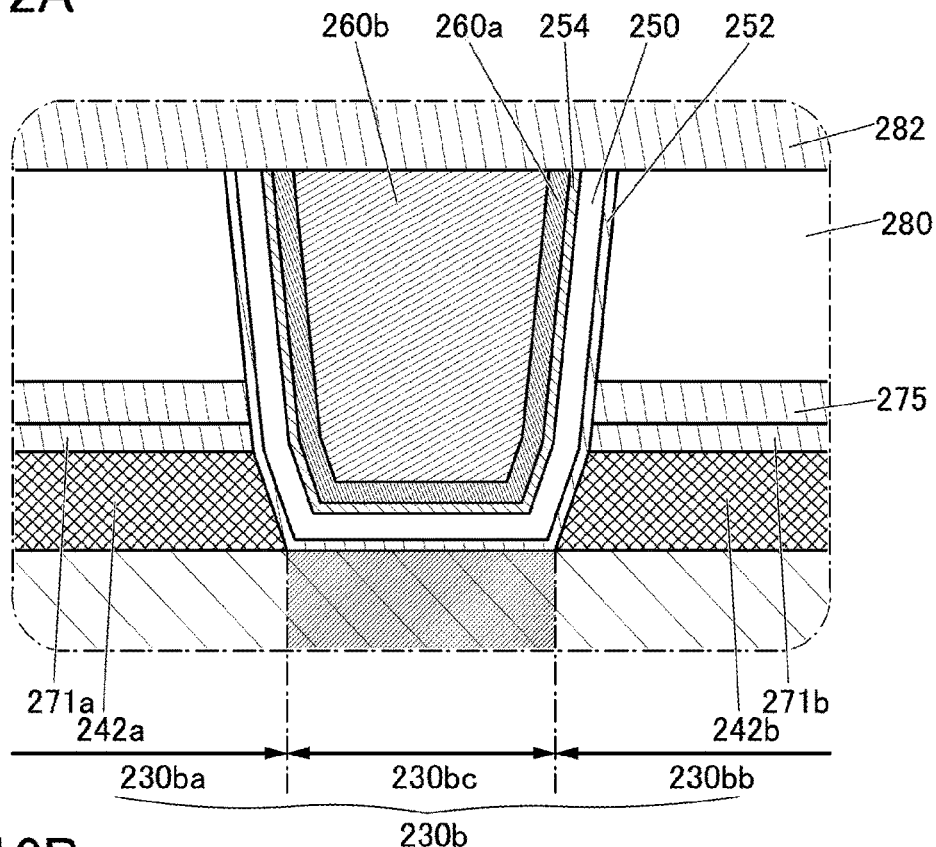
FIG. 12A and FIG. 12B are cross-sectional views of a semiconductor device of one embodiment of the present invention.

FIG. 12A is an enlarged view of the vicinity of the channel formation region in FIG. 11B. Supply of oxygen to the oxide 230b forms the channel formation region in a region between the conductor 242a and the conductor 242b. As illustrated in FIG. 12A, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

The region 230bc functioning as the channel formation region has a smaller amount of oxygen vacancies or a lower impurity concentration than the region 230ba and the region 230bb, and thus is a high-resistance region with a low carrier concentration. Thus, the region 230bc can be regarded as being i-type (intrinsic) or substantially i-type. Performing microwave treatment in an atmosphere containing oxygen facilitates formation of the region 230bc, for example. Here, the microwave treatment refers to, for example, treatment using an apparatus including a power source that generates high-density plasma with the use of a microwave. Note that in this specification and the like, a microwave refers to an electromagnetic wave having a frequency greater than or equal to 300 MHz and less than or equal to 300 GHz.

The region 230ba and the region 230bb functioning as the source region and the drain region include a large amount of oxygen vacancies or have a high concentration of an impurity such as hydrogen, nitrogen, or a metal element, and thus are each a low-resistance region with an increased carrier concentration. In other words, the region 230ba and the region 230bb are each an n-type region having a higher carrier concentration and a lower resistance than the region 230bc.

The carrier concentration in the region 230bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 230bc functioning as the channel formation region is not particularly limited and can be, for example, $1\times10^{-9}$ cm$^{-3}$.

Between the region 230bc and the region 230ba or the region 230bb, a region having a carrier concentration that is lower than or substantially equal to the carrier concentrations in the region 230ba and the region 230bb and higher than or substantially equal to the carrier concentration in the region 230bc may be formed. That is, the region functions as a junction region between the region 230bc and the region 230ba or the region 230bb. The hydrogen concentration in the junction region is lower than or substantially equal to the hydrogen concentrations in the region 230ba and the region 230bb and higher than or substantially equal to the hydrogen concentration in the region 230bc in some cases. The amount of oxygen vacancies in the junction region is smaller than or substantially equal to the amounts of oxygen vacancies in the region 230ba and the region 230bb and larger than or substantially equal to the amount of oxygen vacancies in the region 230bc in some cases.

Although FIG. 12A illustrates an example where the region 230ba, the region 230bb, and the region 230bc are formed in the oxide 230b, the present invention is not limited thereto. For example, the above regions may be formed not only in the oxide 230b but also in the oxide 230a.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 200, a metal oxide functioning as a semiconductor (such a metal oxide is hereinafter also referred to as an oxide semiconductor) is preferably used for the oxide 230 (the oxide 230a and the oxide 230b) including the channel formation region.

The metal oxide functioning as a semiconductor preferably has a band gap of 2 eV or more, further preferably 2.5 eV or more. With the use of such a metal oxide having a large band gap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The atomic ratio of In to the element M in the metal oxide used as the oxide 230b is preferably greater than the atomic ratio of In to the element M in the metal oxide used as the oxide 230a.

The oxide 230a is placed under the oxide 230b in this manner, whereby impurities and oxygen can be inhibited from diffusing into the oxide 230b from components formed below the oxide 230a.

When the oxide 230a and the oxide 230b contain a common element (as the main component) besides oxygen, the density of defect states at an interface between the oxide 230a and the oxide 230b can be made low. Since the density of defect states at the interface between the oxide 230a and the oxide 230b can be made low, the influence of interface scattering on carrier conduction is small, and a high on-state current can be obtained.

The oxide 230b preferably has crystallinity. It is particularly preferable to use a CAAC-OS (c-axis aligned crystalline oxide semiconductor) as the oxide 230b.

The CAAC-OS is a metal oxide having a dense structure with high crystallinity and a small amount of impurities and defects (for example, oxygen vacancies (e.g., Vo). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and a current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 200. Furthermore, a variation of oxygen supplied to the source region or the drain region in the substrate plane leads to a variation in characteristics of the semiconductor device including the transistor.

Therefore, the region 230bc functioning as the channel formation region in the oxide semiconductor is preferably an i-type or substantially i-type region with reduced carrier concentration, whereas the region 230ba and the region 230bb functioning as the source region and the drain region are preferably n-type regions with high carrier concentrations. That is, it is preferable that oxygen vacancies and VoH in the region 230bc of the oxide semiconductor be reduced and the region 230ba and the region 230bb not be supplied with an excess amount of oxygen.

Thus, in this embodiment, microwave treatment is performed in an oxygen-containing atmosphere in a state where the conductor 242a and the conductor 242b are provided over the oxide 230b so that oxygen vacancies and VoH in the region 230bc can be reduced.

The microwave treatment in an oxygen-containing atmosphere converts an oxygen gas into plasma using a high-frequency wave such as a microwave or RF and activates the oxygen plasma. At this time, the region 230bc can be irradiated with the high-frequency wave such as a microwave or RF. By the effect of the plasma, the microwave, or the like, VoH in the region 230bc can be cut; thus, hydrogen H can be removed from the region 230bc and an oxygen vacancy Vo can be filled with oxygen. That is, the reaction "VoH→H+Vo" occurs in the region 230bc, so that the hydrogen concentration in the region 230bc can be reduced. As a result, oxygen vacancies and VoH in the region 230bc can be reduced to lower the carrier concentration.

In the microwave treatment in an oxygen-containing atmosphere, the high-frequency wave such as the microwave or RF, the oxygen plasma, or the like is blocked by the conductor 242a and the conductor 242b and does not affect the region 230ba nor the region 230bb. In addition, the effect of the oxygen plasma can be reduced by the insulator 271 and the insulator 280 that are provided to cover the oxide 230b and the conductor 242. Hence, a reduction in VoH and supply of an excess amount of oxygen do not occur in the region 230ba or the region 230bb in the microwave treatment, preventing a decrease in carrier concentration.

In particular, microwave treatment is preferably performed in an oxygen-containing atmosphere after formation of an insulating film to be the insulator 252 or after formation of an insulating film to be the insulator 250. By performing the microwave treatment in an oxygen-containing atmosphere through the insulator 252 or the insulator 250 in such a manner, oxygen can be efficiently supplied into the region 230bc. In addition, the insulator 252 is placed to be in contact with the side surface of the conductor 242 and the surface of the region 230bc, thereby inhibiting oxygen more than necessary from being supplied to the region 230bc and inhibiting the side surface of the conductor 242 from being oxidized. Furthermore, the side surface of the conductor 242 can be inhibited from being oxidized when the insulating film to be the insulator 250 is formed.

The oxygen supplied into the region 230bc has any of a variety of forms such as an oxygen atom, an oxygen molecule, an oxygen radical (an O radical, an atom or a molecule having an unpaired electron, or an ion). Note that the oxygen supplied into the region 230*bc* has any one or more of the above forms, particularly preferably an oxygen radical. Furthermore, the film quality of the insulator 252 and the insulator 250 can be improved, leading to higher reliability of the transistor 200.

In the above-described manner, oxygen vacancies and VoH can be selectively removed from the region 230*bc* in the oxide semiconductor, whereby the region 230*bc* can be an i-type or substantially i-type region. Furthermore, supply of an excess amount of oxygen to the region 230*ba* and the region 230*bb* functioning as the source region and the drain region can be inhibited and the n-type conductivity can be maintained. As a result, a change in the electrical characteristics of the transistor 200 can be inhibited, and thus a variation in the electrical characteristics of the transistors 200 in the substrate plane can be inhibited.

As illustrated in FIG. 11C, a curved surface may be provided between the side surface of the oxide 230*b* and the top surface of the oxide 230*b* in a cross-sectional view of the transistor 200 in the channel width direction. In other words, an end portion of the side surface and an end portion of the top surface may be curved (hereinafter referred to as rounded).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230*b* with the insulator 252, the insulator 250, the insulator 254, and the conductor 260.

The oxide 230 preferably has a stacked-layer structure of a plurality of oxide layers with different chemical compositions. Specifically, the atomic ratio of the element M to a metal element that is a main component of the metal oxide used as the oxide 230*a* is preferably greater than the atomic ratio of the element M to a metal element that is a main component of the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. Furthermore, the atomic ratio of In to the element M in the metal oxide used as the oxide 230*b* is preferably greater than the atomic ratio of In to the element M in the metal oxide used as the oxide 230*a*.

The oxide 230*b* is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230*b* by the source electrode or the drain electrode. This can reduce oxygen extraction from the oxide 230*b* even when heat treatment is performed; thus, the transistor 200 is stable with respect to high temperatures in a manufacturing process (what is called thermal budget).

Here, the conduction band minimum gradually changes at a junction portion of the oxide 230*a* and the oxide 230*b*. In other words, the conduction band minimum at the junction portion of the oxide 230*a* and the oxide 230*b* continuously changes or is continuously connected. To achieve this, the density of defect states in a mixed layer formed at the interface between the oxide 230*a* and the oxide 230*b* is preferably made low.

Specifically, when the oxide 230*a* and the oxide 230*b* contain a common element as a main component besides oxygen, a mixed layer with a low density of defect states can be formed. For example, in the case where the oxide 230*b* is an In-M-Zn oxide, an In-M-Zn oxide, an M-Zn oxide, an oxide of the element M, an In—Zn oxide, indium oxide, or the like may be used as the oxide 230*a*.

Specifically, as the oxide 230*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230*b*, a metal oxide with a composition of In:M:Zn=1:1:1 [atomic ratio] or in the neighborhood thereof, a composition of In:M:Zn=1:1:2 [atomic ratio] or in the neighborhood thereof, or a composition of In:M:Zn=4:2:3 [atomic ratio] or in the neighborhood thereof can be used. Note that a composition in the neighborhood includes the range of ±30% of an intended atomic ratio. Gallium is preferably used as the element M Here, the oxide 230*a* and the oxide 230*b* are preferably formed using a sputtering method. Oxygen or a mixed gas of oxygen and a rare gas is used as the sputtering gas. Increasing the proportion of oxygen contained in the sputtering gas can increase the amount of oxygen in the deposited film. The deposition method of the oxide 230*a* and the oxide 230*b* is not limited to a sputtering method, and a CVD method, an MBE method, a PLD method, an ALD method, or the like can be used as appropriate.

When the metal oxide is deposited by a sputtering method, the above atomic ratio is not limited to the atomic ratio of the deposited metal oxide and may be the atomic ratio of a sputtering target used for depositing the metal oxide.

The oxide 230 may be formed by an ALD method. Here, a method for depositing the oxide 230 by an ALD method is described. Note that a deposition method by an ALD method is described in the above embodiment; thus, different portions are mainly described and the description in the above embodiment can be referred to for common portions.

An In-M-Zn oxide that can be used as the oxide 230 tends to have a layered crystal structure where a layer containing indium (In) and oxygen (hereinafter, an In layer) and a layer containing the element M, zinc (Zn), and oxygen (hereinafter, an (M,Zn) layer) are stacked. Note that the number of the (M,Zn) layers interposed between two In layers correlates with the composition of the In-M-Zn oxide. For example, in the case where the composition is In:M:Zn=1:1:m, the number of the (M,Zn) layers interposed between two In layers is likely to be (m+1).

Figure 7C:
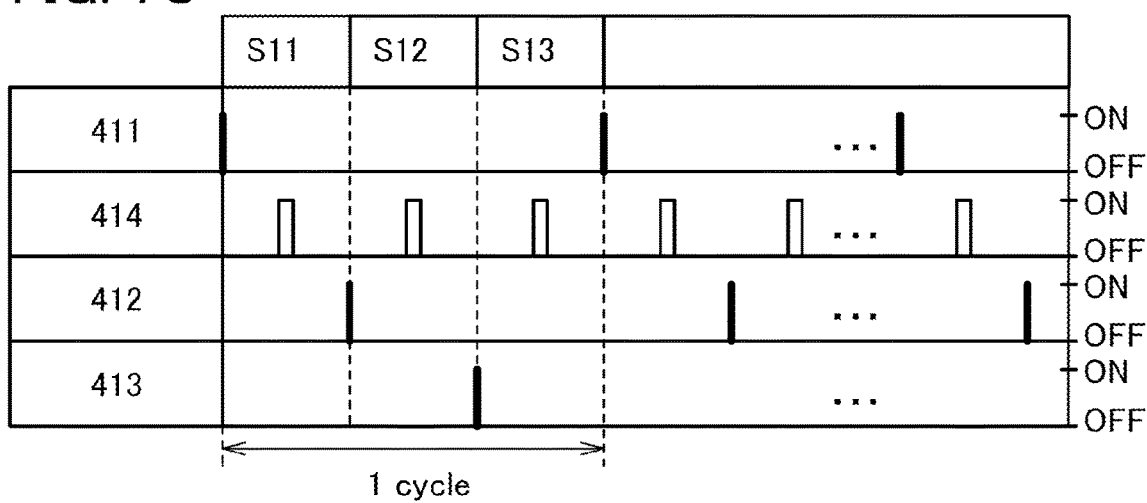
FIG. 7C is a diagram showing a deposition sequence of an oxide.
Figure 8A:
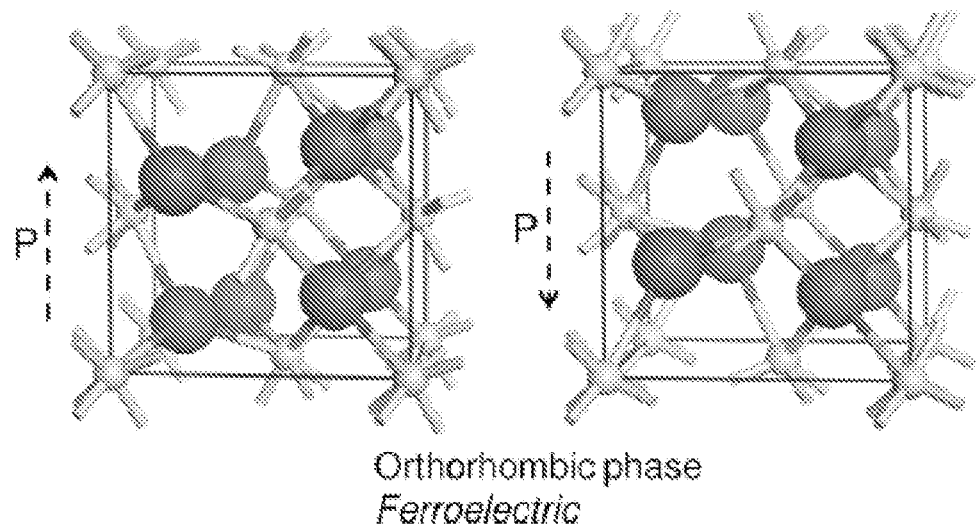
FIG. 8A is a diagram illustrating polarization in a ferroelectric which is disclosed in Non-Patent Document 1.
Figure 8B:
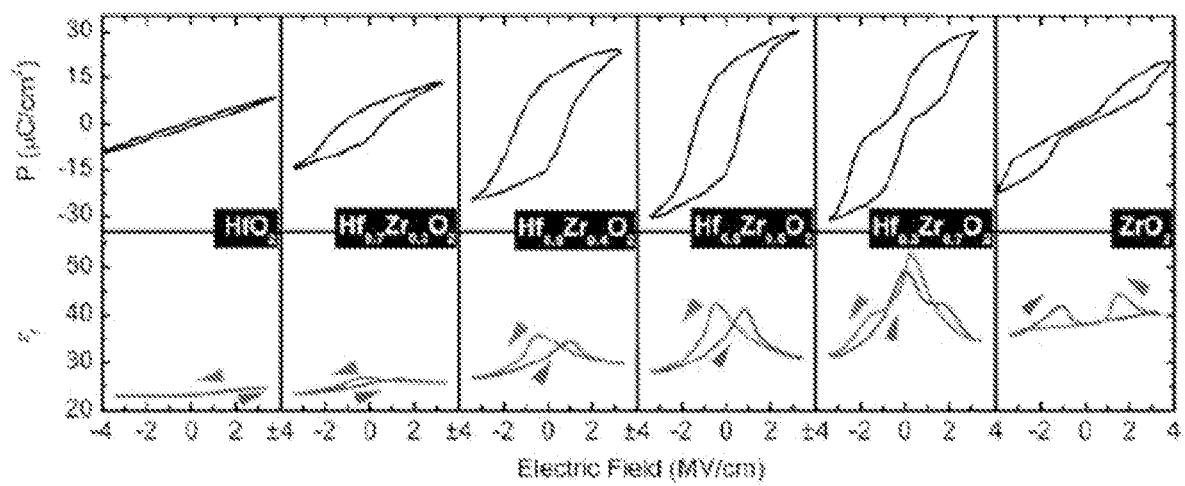
FIG. 8B is a diagram showing a change in the magnitude of polarization and permittivity due to proportions of Hf and Zr, which is disclosed in Non-Patent Document 2.

As an example of the method for depositing the oxide 230 by an ALD method, a method for depositing the In-M-Zn oxide is described with reference to FIG. 7C. FIG. 7C shows an example of a deposition sequence in which deposition is performed using a precursor 411 to a precursor 413 and an oxidizing gas 414. Note that the deposition sequence includes Step S11 to Step S13.

As the precursor 411, a precursor containing indium can be used. As the precursor 412, a precursor containing the element M can be used. As the precursor 413, a precursor containing zinc can be used. As each of the precursor 411 to the precursor 413, a precursor formed of an inorganic substance (sometimes referred to as an inorganic precursor) may be used, or a precursor formed of an organic substance (sometimes referred to as an organic precursor) may be used. As the oxidizing gas 414, a gas that can be used as the oxidizing gas 403 described in the above embodiment can be used.

First, Step S11 is performed. In Step S11, a step of introducing the precursor 411 to make a precursor containing indium be adsorbed on the formation surface, a step of stopping the introduction of the precursor 411 to purge the excess precursor 411 in a chamber, a step of introducing the oxidizing gas 414 to oxidize the precursor 411 and form an In layer, and a step of stopping the introduction of the oxidizing gas 414 to purge the excess oxidizing gas 414 in the chamber are performed in this order.

Next, Step S12 is performed. In Step S12, a step of introducing the precursor 412 to make a precursor containing the element M be adsorbed on a surface of the In layer, a step of stopping the introduction of the precursor 413 to purge the excess precursor 412 in the chamber, a step of introducing the oxidizing gas 414 to oxidize the precursor 412 and form an M layer, and a step of stopping the oxidizing gas 414 to purge the excess oxidizing gas in the chamber are performed in this order.

Next, Step S13 is performed. In Step S13, a step of introducing the precursor 413 to make a precursor containing zinc be adsorbed on a surface of the M layer, a step of stopping the introduction of the precursor 413 to purge the excess precursor 413 in the chamber, a step of introducing the oxidizing gas 414 to oxidize the precursor 413 and form a Zn layer, and a step of stopping the introduction of the oxidizing gas 414 to purge the excess oxidizing gas 414 in the chamber are performed in this order.

Step S11 to Step S13 are defined as one cycle and the cycle is repeated, so that an In-M-Zn oxide with a desired thickness can be formed. Note that the element M or Zn enters the In layer due to heat treatment during the deposition or after the deposition, in some cases. Alternatively, In or Zn enters the M layer in some cases. Alternatively, In or Ga enters the Zn layer in some cases.

Note that the number of times each of Step S11 to Step S13 is performed in one cycle is not limited to one. The number of each of Step S11 to Step S13 in one cycle is preferably set so that an In-M-Zn oxide with a desired composition is obtained. For example, in the case where an In-M-Zn oxide with In:M:Zn=1:1:2 [atomic ratio] is deposited, it is preferable that Step S11, Step S13, Step S12, and Step S13 be defined as one cycle and the cycle be repeated. As another example, an In—Zn oxide can be deposited by repeating a cycle composed of Step S11 and Step S12. In the step of introducing the precursor 412 in Step S12, the precursor 413 may also be introduced to form an (M,Zn) layer in Step S12. In the step of introducing the precursor 411 in Step S11, the precursor 412 or the precursor 413 may also be introduced to form an In layer containing the element M or Zn in Step S11. With such an appropriate combination, the desired oxide 230 can be deposited.

The description of the above embodiment can be referred to for a manufacturing apparatus used for the deposition by an ALD method. When the oxide 230 and the ferroelectric layer are deposited by an ALD method, the same manufacturing apparatus can be used. Furthermore, in the case where the element illustrated in FIG. 1B2 is fabricated, the insulator 130 can be successively deposited over the oxide 230 by changing a precursor and an oxidizing gas after deposition of the oxide 230. This enables the oxide 230 and the insulator 130 to be deposited without exposure to the air, so that the vicinity of an interface between the oxide 230 and the insulator 130 can be kept clean.

Two or more manufacturing apparatuses used for the deposition by an ALD method may be incorporated into a multi-chamber deposition apparatus. In this case, setting is made such that the oxide 230 and the ferroelectric layer are deposited by different manufacturing apparatuses, whereby the oxide 230 and the ferroelectric layer can be successively deposited without changing the precursor and the oxidizing gas.

As illustrated in FIG. 11C or the like, the insulator 252 formed using aluminum oxide or the like is provided in contact with the top surface and the side surface of the oxide 230, whereby indium contained in the oxide 230 is unevenly distributed, in some cases, at the interface between the oxide 230 and the insulator 252 and in its vicinity. Accordingly, the vicinity of the surface of the oxide 230 comes to have an atomic ratio close to that of an indium oxide or that of an In-Zn oxide. Such an increase in the atomic ratio of indium in the vicinity of the surface of the oxide 230, especially the vicinity of a surface of the oxide 230b, can increase the field-effect mobility of the transistor 200.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 275, the insulator 282, the insulator 283, and the insulator 285, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283. For example, aluminum oxide or magnesium oxide, which has a function of capturing or fixing hydrogen well, is preferably used for the insulator 214, the insulator 271, the insulator 282, and the insulator 285. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to above the transistor 200 through the insulator 282 and the like. In this manner, it is preferable that the transistor 200 be surrounded by the insulator 212, the insulator 214, the insulator 271, the insulator 275, the insulator 282, the insulator 283, and the insulator 285, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. The metal oxide having an amorphous structure is used as the component of the transistor 200 or provided around the transistor 200, whereby the transistor 200 and a semiconductor device which have favorable characteristics and high reliability can be fabricated.

Although each of the insulator 212, the insulator 214, the insulator 271, the insulator 275, the insulator 282, the insulator 283, and the insulator 285 preferably has an amorphous structure, a region having a polycrystalline structure may be partly formed. Alternatively, each of the insulator 212, the insulator 214, the insulator 271, the insulator 275, the insulator 282, the insulator 283, and the insulator 285 may have a multilayer structure where a layer having an amorphous structure and a layer having a polycrystalline structure are stacked. For example, a stacked-layer structure where a layer having a polycrystalline structure is formed over a layer having an amorphous structure may be employed.

The insulator 212, the insulator 214, the insulator 271, the insulator 275, the insulator 282, the insulator 283, and the insulator 285 can be deposited by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 212, the insulator 275, and the insulator 283 are preferably low in some cases. For example, by setting the resistivities of the insulator 212, the insulator 275, and the insulator 283 to approximately $1 \times 10^{13}$ $\Omega$cm, the insulator 212, the insulator 275, and the insulator 283 can sometimes reduce charge up of the conductor 205, the conductor 242, the conductor 260, or the conductor 110 in treatment using plasma or the like in the fabrication process of a semiconductor device. The resistivities of the insulator 212, the insulator 275, and the insulator 283 are preferably higher than or equal to $1 \times 10^{10}$ $\Omega$cm and lower than or equal to $1 \times 10^{15}$ $\Omega$cm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205a and the conductor 205b. The conductor 205a is provided in contact with the bottom surface and the sidewall of the opening. The conductor 205b is provided to be embedded in a depressed portion formed by the conductor 205a. Here, the top surface of the conductor 205b is substantially level with the top surface of the conductor 205a and the top surface of the insulator 216.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a is formed using a conductive material having a function of inhibiting diffusion of hydrogen, impurities such as hydrogen contained in the conductor 205b can be prevented from diffusing into the oxide 230 through the insulator 224 and the like. When the conductor 205a is formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or stacked layers of the above conductive materials. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, thereby reducing the amount of the impurities to be diffused into the oxide 230.

As illustrated in FIG. 11A, the conductor 205 is preferably provided to be larger than a region of the oxide 230 not overlapping with the conductor 242a or the conductor 242b. As illustrated in FIG. 11C, it is particularly preferable that the conductor 205 extend to a region outside end portions of the oxide 230a and the oxide 230b in the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure where a channel formation region is electrically surrounded by electric fields of a first gate and a second gate is referred to as a surrounded channel (S-channel) structure.

In this specification and the like, a transistor having the S-channel structure refers to a transistor having a structure where a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 11C, the conductor 205 is extended to function as a wiring as well. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure where the conductor 205 is a stack of the conductor 205a and the conductor 205b is illustrated, the present invention is not limited thereto. For example, the conductor 205 may be provided to have a single-layer structure or a stacked-layer structure of three or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. Alternatively, an oxide containing hafnium and zirconium, e.g., a hafnium-zirconium oxide is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 222.

For example, a single layer or stacked layers of an insulator(s) containing what is called a high-k material such as aluminum oxide, hafnium oxide, tantalum oxide, zirconium oxide, or hafnium-zirconium oxide may be used for the insulator 222. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 222.

Silicon oxide or silicon oxynitride, for example, can be used as appropriate for the insulator 224 that is in contact with the oxide 230.

In a fabrication process of the transistor 200, heat treatment is preferably performed with a surface of the oxide 230 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies (Vo). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 230 can promote a reaction in which oxygen vacancies in the oxide 230 are repaired with supplied oxygen, i.e., a reaction of "$V_O+O \rightarrow null$". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230a. In this case, the insulator 275 is in contact with the side surface of the insulator 224 and the top surface of the insulator 222.

The conductor 242a and the conductor 242b are provided in contact with the top surface of the oxide 230b. Each of the conductor 242a and the conductor 242b functions as the source electrode or the drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230b or the like diffuses into the conductor 242a or the conductor 242b in some cases. In particular, when a nitride containing tantalum is used for the conductor 242a and the conductor 242b, hydrogen contained in the oxide 230b or the like is likely to diffuse into the conductor 242a or the conductor 242b, and the diffused hydrogen is bonded to nitrogen contained in the conductor 242a or the conductor 242b in some cases. That is, hydrogen contained in the oxide 230b or the like is absorbed by the conductor 242a or the conductor 242b in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 11D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. As the insulator 271, an insulator such as aluminum oxide or magnesium oxide is used, for example.

The insulator 275 is provided to cover the insulator 224, the oxide 230a, the oxide 230b, the conductor 242, and the insulator 271. The insulator 275 preferably has a function of capturing and fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275.

When the above insulator 271 and the insulator 275 are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 252 functions as part of the gate insulator. As the insulator 252, a barrier insulating film against oxygen is preferably used. As the insulator 252, an insulator that can be used as the insulator 282 described above may be used. An insulator containing an oxide of one or both of aluminum and hafnium is preferably used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

As illustrated in FIG. 11C, the insulator 252 is provided in contact with the top surface and the side surface of the oxide 230b, the side surface of the oxide 230a, the side surface of the insulator 224, and the top surface of the insulator 222. That is, the regions of the oxide 230a, the oxide 230b, and the insulator 224 that overlap with the conductor 260 are covered with the insulator 252 in the cross section in the channel width direction. With this structure, the insulator 252 having a barrier property against oxygen can prevent release of oxygen from the oxide 230a and the oxide 230b at the time of heat treatment or the like. This can inhibit formation of oxygen vacancies (Vo) in the oxide 230a and the oxide 230b. Therefore, oxygen vacancies (Vo) and VoH formed in the region 230bc can be reduced. Thus, the transistor 200 can have favorable electrical characteristics and higher reliability.

Even when an excess amount of oxygen is contained in the insulator 280, the insulator 250 and the like, oxygen can be inhibited from being excessively supplied to the oxide 230a and the oxide 230b. Thus, the region 230ba and the region 230bb are inhibited from being excessively oxidized by oxygen through the region 230bc; a reduction in on-state current or field-effect mobility of the transistor 200 can be inhibited.

As illustrated in FIG. 11B, the insulator 252 is provided in contact with the side surfaces of the conductor 242, the insulator 271, the insulator 275, and the insulator 280. This can inhibit formation of an oxide film on the side surface of the conductor 242 by oxidization of the side surface. Accordingly, a reduction in on-state current or field-effect mobility of the transistor 200 can be inhibited.

Furthermore, the insulator 252 needs to be provided in an opening formed in the insulator 280 and the like, together with the insulator 254, the insulator 250, and the conductor 260. The thickness of the insulator 252 is preferably small for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 252 preferably includes a region having the above-described thickness. The thickness of the insulator 252 is preferably smaller than that of the insulator 250. In this case, at least part of the insulator 252 preferably includes a region having a thickness smaller than that of the insulator 250.

To deposit the insulator 252 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 252 can be deposited on the side surface of the opening formed in the insulator 280 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS), X-ray photoelectron spectroscopy (XPS), or auger electron spectroscopy (AES).

The insulator 250 functions as part of the gate insulator. The insulator 250 is preferably placed to be in contact with the top surface of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 250 in this case is an insulator containing at least oxygen and silicon.

As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, it is acceptable that at least part of the insulator 250 has a region with a thickness like the above-described thickness.

Although FIG. 11A to FIG. 11D and the like illustrate a single-layer structure of the insulator 250, the present invention is not limited to this structure, and a stacked-layer structure of two or more layers may be employed. For example, as illustrated in FIG. 12B, the insulator 250 may have a stacked-layer structure including two layers of an insulator 250a and an insulator 250b over the insulator 250a.

Figure 12B:
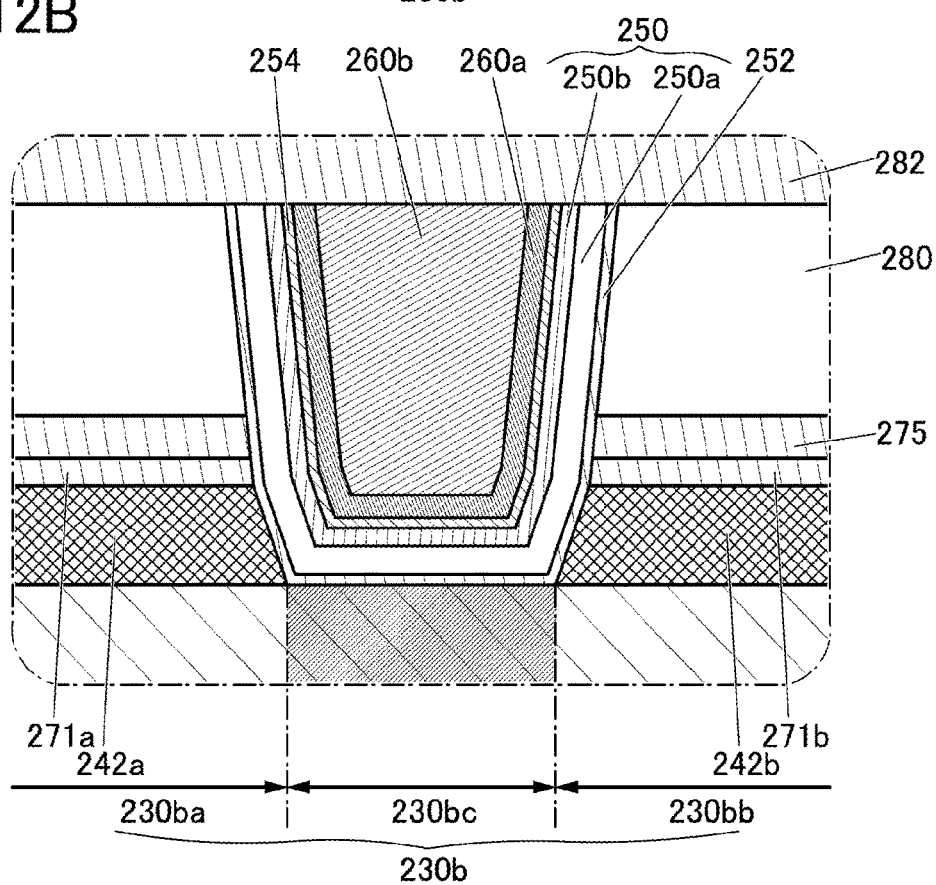

In the case where the insulator 250 has a stacked-layer structure of two layers as illustrated in FIG. 12B, it is preferable that the insulator 250a in a lower layer be formed using an insulator that is likely to transmit oxygen and the insulator 250b in an upper layer be formed using an insulator having a function of inhibiting oxygen diffusion. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, it is preferable that the insulator 250a be provided using any of the above-described materials that can be used for the insulator 250 and the insulator 250b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250b. In this case, the insulator 250b is an insulator containing at least oxygen and hafnium. The thickness of the insulator 250b is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In this case, at least part of the insulator 250b may include a region having a thickness like the above-described thickness.

In the case where silicon oxide, silicon oxynitride, or the like is used for the insulator 250a, the insulator 250b may be formed using an insulating material that is a high-k material having a high dielectric constant. The gate insulator having a stacked-layer structure of the insulator 250a and the insulator 250b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250 can be increased.

The insulator 254 functions as part of a gate insulator. As the insulator 254, a barrier insulating film against hydrogen is preferably used. This can prevent diffusion of impurities such as hydrogen contained in the conductor 260 into the insulator 250 and the oxide 230b. As the insulator 254, an insulator that can be used as the insulator 283 described above can be used. For example, silicon nitride deposited by a PEALD method may be used as the insulator 254. In this case, the insulator 254 is an insulator containing at least nitrogen and silicon.

Furthermore, the insulator 254 may have a barrier property against oxygen. Thus, diffusion of oxygen contained in the insulator 250 into the conductor 260 can be inhibited.

Furthermore, the insulator 254 needs to be provided in an opening formed in the insulator 280 and the like, together with the insulator 252, the insulator 250, and the conductor 260. The thickness of the insulator 254 is preferably small for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 254 preferably includes a region having the above-described thickness. The thickness of the insulator 254 is preferably smaller than that of the insulator 250. In this case, at least part of the insulator 254 preferably includes a region having a thickness that is smaller than that of the insulator 250.

The conductor 260 functions as the first gate electrode of the transistor 200. The conductor 260 preferably includes the conductor 260a and the conductor 260b placed over the conductor 260a. For example, the conductor 260a is preferably placed to cover the bottom surface and the side surface of the conductor 260b. Moreover, as illustrated in FIG. 11B and FIG. 11C, the top surface of the conductor 260 is substantially level with the top surface of the insulator 250. Although the conductor 260 has a two-layer structure of the conductor 260a and the conductor 260b in FIG. 11B and FIG. 11C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the above conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242a and the conductor 242b without alignment.

As illustrated in FIG. 11C, in the channel width direction of the transistor 200, with reference to the bottom surface of the insulator 222, the level of the bottom surface of the conductor 260 in a region where the conductor 260 and the oxide 230b do not overlap is preferably lower than the level of the bottom surface of the oxide 230b. When the conductor 260 functioning as the gate electrode covers the side surface and the top surface of the channel formation region of the oxide 230b with the insulator 250 and the like therebetween, the electric field of the conductor 260 can easily act on the entire channel formation region of the oxide 230b. Thus, the on-state current of the transistor 200 can be increased and the frequency characteristics of the transistor 200 can be improved. With a reference to the bottom surface of the insulator 222, the difference between the level of the bottom surface of the conductor 260 in a region where the conductor 260 do not overlap with the oxide 230a or the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The insulator 280 preferably includes an excess-oxygen region or excess oxygen. The concentration of impurities such as water and hydrogen in the insulator 280 is preferably reduced. Silicon oxide, silicon oxynitride, or the like may be used as appropriate for the insulator 280, for example. When an insulator containing excess oxygen is provided in contact with the oxide 230, oxygen vacancies in the oxide 230 can be reduced and the reliability of the transistor 200 can be improved. When the insulator 280 is formed by a sputtering method in an oxygen-containing atmosphere, the insulator 280 containing excess oxygen can be formed. By a sputtering method that does not need to use hydrogen as a deposition gas, the concentration of hydrogen in the insulator 280 can be reduced. The insulator 282 in contact with the top surface of the insulator 280 may be formed by a sputtering method in an atmosphere containing oxygen so that oxygen can be supplied to the insulator 280. In the case where oxygen is supplied to the insulator 280 by depositing the insulator 282, the deposition method of the insulator 280 is not limited to a sputtering method, and a CVD method, an MBE method, a PLD method, an ALD method, or the like may be employed. For example, the insulator 280 may have a stacked-layer structure of silicon oxide deposited by a sputtering method and silicon oxynitride deposited thereover by a CVD method. Furthermore, silicon nitride may be stacked thereover.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be constant. It is preferable to use, in particular, aluminum oxide having an amorphous structure for the insulator 282, because hydrogen can be captured or fixed more effectively in some cases. Accordingly, the transistor 200 and a semiconductor device which have favorable characteristics and high reliability can be fabricated.

The insulator 282 is preferably formed by a sputtering method. When the insulator 282 is deposited by a sputtering method, oxygen can be added to the insulator 280. The deposition method of the insulator 282 is not limited to a sputtering method; a CVD method, an MBE method, a PLD method, an ALD method, or the like may be used as appropriate.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is deposited by a sputtering method, a high-density silicon nitride film can be formed. To obtain the insulator 283, silicon nitride deposited by a PEALD method or a CVD method may be stacked over silicon nitride deposited by a sputtering method.

[Capacitor 100]

The capacitor 100 is placed in the opening that is formed in the insulator 271, the insulator 275, the insulator 280, the insulator 282, the insulator 283, and the insulator 285 and includes the conductor 110 in contact with the top surface of the conductor 242b, the insulator 130 over the conductor 110 and the insulator 283, and the conductor 120 over the insulator 130. Note that the conductor 120 has a stacked-layer structure of the conductor 120a over the insulator 130 and the conductor 120b over the conductor 120a. Here, at least parts of the conductor 110, the insulator 130, and the conductor 120 are placed in the opening that is formed in the insulator 271, the insulator 275, the insulator 280, the insulator 282, the insulator 283, and the insulator 285.

The conductor 110 functions as a lower electrode of the capacitor 100, the conductor 120 functions as an upper electrode of the capacitor 100, and the insulator 130 functions as a dielectric of the capacitor 100. In the capacitor 100, the upper electrode and the lower electrode face each other with the dielectric therebetween on the side surface as well as the bottom surface of the opening that is formed in the insulator 271, the insulator 275, the insulator 280, the insulator 282, the insulator 283, and the insulator 285; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

The shape of the opening that is formed in the insulator 271, the insulator 275, the insulator 280, the insulator 282, the insulator 283, and the insulator 285 when seen from above may be a quadrangular shape, a polygonal shape other than a quadrangular shape, a polygonal shape with rounded corners, or a circular shape including an elliptical shape. Here, the area where the opening and the transistor 200 overlap each other is preferably large in the top view. For example, as illustrated in FIG. 11A, the capacitor 100 is preferably provided so that the capacitor 100 can fit in the area of the conductor 242b in the top view. In this case, the length of the conductor 110 in the channel width direction is smaller than the length of the conductor 242b in the channel width direction. Such a structure can reduce the area occupied by the semiconductor device including the capacitor 100 and the transistor 200. The structure is not limited thereto and the length of the conductor 110 in the channel width direction can be larger than the length of the conductor 242b in the channel width direction.

The conductor 110 is placed along the opening that is formed in the insulator 271, the insulator 275, the insulator 280, the insulator 282, the insulator 283, and the insulator 285. Here, the opening preferably has a shape in which the side surface and the bottom surface of the opening is connected with a curved surface. With this structure, the conductor 110 can be deposited in the opening with favorable coverage.

Furthermore, part of the top surface of the conductor 110 is preferably substantially level with the top surface of the insulator 285. The top surface of the conductor 242b is in contact with the bottom surface of the conductor 110. The conductor 110 is preferably deposited by an ALD method, a CVD method, or the like and a conductor described in the above embodiment can be used. For example, titanium nitride deposited by a thermal ALD method can be used as the conductor 110.

The insulator 130 is placed to cover the conductor 110, the insulator 245, and part of the insulator 285. Here, the top surface of the insulator 285 becomes higher in a region where the insulator 285 overlaps with the insulator 130 than in a region where the insulator 285 does not overlap with the insulator 130, in some cases. The insulator 130 is preferably deposited by an ALD method, a CVD method, or the like. The insulator 130 is preferably formed using a material that can have ferroelectricity.

As examples of the material that can have ferroelectricity, hafnium oxide, zirconium oxide, $HfZrO_X$ (X is a real number greater than 0), a material obtained by adding the element J1 (the element J1 here is zirconium (Zr), silicon (Si), aluminum (Al), gadolinium (Gd), yttrium (Y), lanthanum (La), or strontium (Sr), for example) to hafnium oxide, and a material obtained by adding the element J2 (the element J2 here is hafnium (Hf), silicon (Si), aluminum (Al), gadolinium (Gd), yttrium (Y), lanthanum (La), or strontium (Sr), for example) to zirconium oxide can be given. As the material that can have ferroelectricity, a piezoelectric ceramic having a perovskite structure such as $PbTiO_x$, barium strontium titanate (BST), strontium titanate, lead zirconate titanate (PZT), strontium bismuth tantalate (SBT), bismuth ferrite (BFO), or barium titanate may be used. As the material that can have ferroelectricity, a mixture or compound containing a plurality of materials selected from the above-described materials can be used, for example. Alternatively, the insulator 130 can have a stacked-layer structure of a plurality of materials selected from the above-described materials. Note that since the crystal structures (properties) of hafnium oxide, zirconium oxide, $HfZrO_X$, the material obtained by adding the element J1 to hafnium oxide, and the like can be changed depending on the processes as well as the deposition conditions, a material that exhibits ferroelectricity is referred to as a material that can have ferroelectricity as well as a ferroelectric in this specification or the like.

Hafnium oxide or a material containing hafnium oxide and zirconium oxide is especially preferable as the material that can have ferroelectricity because of being able to have ferroelectricity even when processed into a several-nanometer-thick thin film. Here, the thickness of the insulator 130 can be less than or equal to 100 nm, preferably less than or equal to 50 nm, further preferably less than or equal to 20 nm, still further preferably less than or equal to 10 nm. When the ferroelectric layer that can be thin is used, the capacitor 100 can be combined with the miniaturized transistor 200 to form a semiconductor device. Note that in this specification and the like, a layer of the material that can have ferroelectricity is referred to as a ferroelectric layer or a metal oxide film, in some cases.

The material that can have ferroelectricity is an insulator and has a property in which application of an electric field from the outside causes internal polarization and the polarization remains even after the electric field is made zero. Thus, with a capacitor using such a material as a dielectric (the capacitor may be referred to as a ferroelectric capacitor below), a nonvolatile storage element can be formed. A nonvolatile storage element using a ferroelectric capacitor is sometimes referred to as an FeRAM (Ferroelectric Random Access Memory), a ferroelectric memory, or the like. For example, a ferroelectric memory can have a structure including a transistor and a ferroelectric capacitor, where one of a source and a drain of the transistor is electrically connected to one terminal of the ferroelectric capacitor. Thus, the semiconductor device including the capacitor 100 and the transistor 200 described in this embodiment can function as a ferroelectric memory.

Note that the insulator 130 can have a stacked-layer structure of the above-described material that can have ferroelectricity and a material having high dielectric strength, in some cases. Examples of the material having high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. The use of such an insulator having high dielectric strength in the stacked-layer structure can increase the dielectric strength and inhibit a leakage current of the capacitor 100 in some cases.

The conductor 120 is placed to fill the opening that is formed in the insulator 271, the insulator 275, the insulator 280, the insulator 282, the insulator 283, and the insulator 285. Here, the conductor 120 preferably has a region overlapping with the insulator 285 with the insulator 130 therebetween. With such a structure, the conductor 120 can be insulated from the conductor 110 with the insulator 130 therebetween. Furthermore, a portion above the insulator 283 of the conductor 120 may be extended and formed as a wiring.

The conductor 120 preferably includes the conductor 120a and the conductor 120b over the conductor 120a, as illustrated in FIG. 11B. In this case, as the conductor 120a, a thin conductive film with favorable coverage may be provided over the insulator 130. The conductor 120b may be placed so as to fill the opening over the conductor 120a. The conductor 120a is preferably deposited by an ALD method, a CVD method, or the like and a conductor described in the above embodiment can be used. For example, titanium nitride deposited by an ALD method can be used as the conductor 120a. The conductor 120b is preferably deposited by an ALD method, a CVD method, a sputtering method, or the like and a conductor described in the above embodiment can be used. As the conductor 120b, tungsten deposited by a sputtering method can be used. Note that the conductor 120 is not limited to the two-layer structure, and may have a single-layer structure or a stacked-layer structure of three or more layers.

A conductor functioning as a wiring may be placed in contact with the top surface of the conductor 120. For the conductor, a conductive material containing tungsten, copper, or aluminum as its main component is preferably used. Furthermore, the conductor may have a stacked-layer structure and may be stacked layers of the above conductive material and titanium or titanium nitride, for example. Note that the conductor may be formed to be embedded in an opening provided in an insulator.

The insulator 245 is preferably placed in contact with the side surface of the opening that is formed in the insulator 271, the insulator 275, the insulator 280, the insulator 282, the insulator 283, and the insulator 285. The conductor 110 is provided in contact with the inner side surface of the insulator 245, the insulator 130 is provided in contact with the inner side surface of the conductor 110, and the conductor 120 is provided in contact with the inner side surface of the insulator 130.

As the insulator 245, a barrier insulating film that can be used for the insulator 275 or the like can be used. For example, an insulator such as silicon nitride, aluminum oxide, or silicon nitride oxide can be used for the insulator 245. Since the insulator 245 is provided in contact with the insulator 283, the insulator 282, the insulator 275, and the insulator 271, impurities such as water and hydrogen contained in the insulator 280, the insulator 285, or the like can be inhibited from entering the oxide 230 through the conductor 110. In particular, silicon nitride is suitable because of its high blocking property against hydrogen. Moreover, oxygen contained in the insulator 280 can be prevented from being absorbed by the conductor 110.

In the case where the insulator 245 has a stacked-layer structure illustrated in FIG. 11B, a first insulator in contact with an inner wall of the opening in the insulator 280 and the like and a second insulator on the inner side of the first insulator are preferably formed using a combination of a barrier insulating film against oxygen and a barrier insulating film against hydrogen. For example, aluminum oxide deposited by an ALD method can be used as the first insulator and silicon nitride deposited by a PEALD method can be used as the second insulator. With such a structure, oxidation of the conductor 110 can be inhibited, and hydrogen can be prevented from entering the conductor 110.

Although the structure where the first insulator and the second insulator are stacked as the insulator 245 is illustrated, the present invention is not limited thereto. For example, the insulator 245 may have a single-layer structure or a stacked-layer structure of three or more layers.

<Component Materials of Semiconductor Device>

Component materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed where silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is preferable to use, in particular, a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M.

Note that in this specification and the like, a metal oxide containing nitrogen is also collectively referred to as a metal oxide in some cases. A metal oxide containing nitrogen may be referred to as a metal oxynitride.

<Classification of Crystal Structure>

First, the classification of the crystal structures of an oxide semiconductor will be described with reference to FIG. 13A. FIG. 13A is a diagram showing the classification of crystal structures of an oxide semiconductor, typically IGZO (a metal oxide containing In, Ga, and Zn).

As shown in FIG. 13A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and polycrystal). Note that "Crystalline" excludes single crystal, poly crystal, and completely amorphous. "Crystal" includes single crystal and poly crystal.

Note that the structures in the thick frame in FIG. 13A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. Here, FIG. 13B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 13B and obtained by GIXD measurement may be hereinafter simply referred to as an XRD spectrum in this specification. The CAAC-IGZO film in FIG. 13B has a composition in the neighborhood of In:Ga:Zn=4:2:3 [atomic ratio]. The CAAC-IGZO film in FIG. 13B has a thickness of 500 nm.

In FIG. 13B, the horizontal axis represents 2θ [deg.], and the vertical axis represents intensity [a.u.]. As shown in FIG. 13B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 13B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 13C shows a diffraction pattern of the CAAC-IGZO film. FIG. 13C shows a diffraction pattern obtained by the NBED method in which an electron beam is incident in the direction parallel to the substrate. The composition of the CAAC-IGZO film in FIG. 13C is In:Ga:Zn=4:2:3 [atomic ratio] or the neighborhood thereof. In the nanobeam electron diffraction method, electron diffraction is performed with a probe diameter of 1 nm.

As shown in FIG. 13C, a plurality of spots indicating c-axis alignment are observed in the diffraction pattern of the CAAC-IGZO film.

<Structure of Oxide Semiconductor>

Oxide semiconductors might be classified in a manner different from one shown in FIG. 13A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC- OS can tolerate distortion owing to a low density of arrangement of oxygen atoms in the a-b plane direction, an interatomic bond distance changed by substitution of a metal atom, and the like.

A crystal structure where a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has [In] higher than [In] in the second region and has [Ga] lower than [Ga] in the second region. Moreover, the second region has [Ga] higher than [Ga] in the first region and has [In] lower than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (µ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region in the oxide semiconductor and the concentration of silicon or carbon in the vicinity of an interface with the channel formation region in the oxide semiconductor (the concentrations obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to have normally-on characteristics. Thus, the concentration of an alkali metal or an alkaline earth metal in the channel formation region in the oxide semiconductor, which is obtained by SIMS, is set lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region in the oxide semiconductor is preferably reduced as much as possible. Specifically, the hydrogen concentration in the channel formation region in the oxide semiconductor, which is obtained by SIMS, is set lower than $1 \times 10^{20}$ atoms/cm$^3$, preferably lower than $5 \times 10^{19}$ atoms/cm$^3$, further preferably lower than $1 \times 10^{19}$ atoms/cm$^3$, still further preferably lower than $5 \times 10^{18}$ atoms/cm$^3$, yet still further preferably lower than $1 \times 10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Variation Example of Semiconductor Device

Examples of the semiconductor device of one embodiment of the present invention will be described below with reference to FIG. 14A to FIG. 16B.

A of each figure is a top view of the semiconductor device. Moreover, B of each figure is a cross-sectional view corresponding to a portion indicated by dashed-dotted line A1-A2 in A of each figure. Note that for clarity of the drawing, some components are omitted in the top view of A of each figure.

Note that in the semiconductor device illustrated in A and B of each figure, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

Variation Example 1 of Semiconductor Device

Figure 14A:
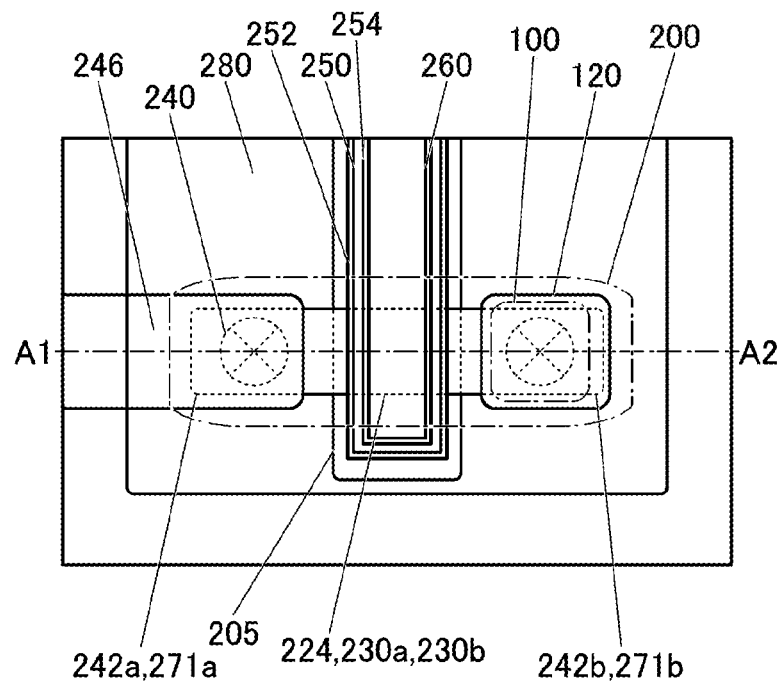
FIG. 14A is a top view of a semiconductor device of one embodiment of the present invention.
Figure 14B:
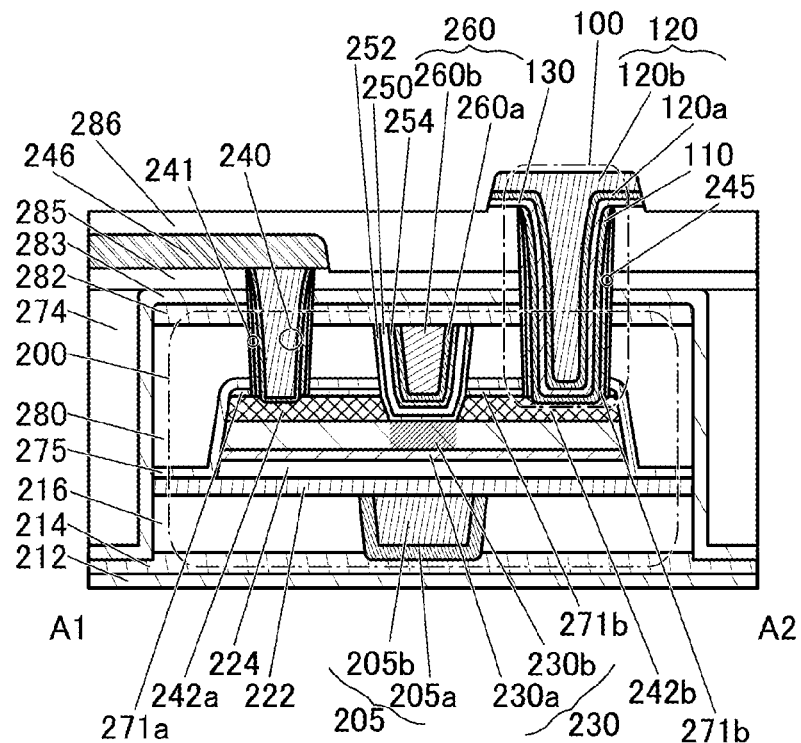
FIG. 14B is a cross-sectional view of the semiconductor device of one embodiment of the present invention.

The semiconductor device illustrated in FIG. 14A and FIG. 14B is a variation example of the semiconductor device illustrated in FIG. 11A to FIG. 11D. The semiconductor device illustrated in FIG. 14A and FIG. 14B is different from the semiconductor device illustrated in FIG. 11A to FIG. 11D in being provided with a conductor 240 and a conductor 246. Here, the conductor 240 functions as a plug electrically connected to one of the source and the drain of the transistor 200, and the conductor 246 functions as a wiring connected to the plug.

The conductor 240 is provided so as to be embedded in an opening formed in the insulator 271, the insulator 275, the insulator 280, the insulator 282, the insulator 283, and the insulator 285. The bottom surface of the conductor 240 is in contact with the top surface of the conductor 242a. For the conductor 240, a conductive material containing tungsten, copper, or aluminum as its main component is preferably used, for example. The conductor 240 may have a stacked-layer structure of a thin first conductor provided along the side surface and the bottom surface of the opening and a second conductor over the first conductor.

In the case where the conductor 240 has a stacked-layer structure, a conductive material having a function of inhibiting passage of impurities such as water and hydrogen is preferably used as the first conductor placed in the vicinity of the insulator 285 and the insulator 280. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240. As the second conductor, the above-described conductive material containing tungsten, copper, or aluminum as its main component is used, for example.

Although the conductor 240 illustrated in FIG. 14B is a stack of the first conductor and the second conductor, the present invention is not limited thereto. For example, the conductor 240 may be provided to have a single-layer structure or a stacked-layer structure of three or more layers.

The conductor 246 may be placed in contact with the top surface of the conductor 240. The conductor 246 is preferably formed using a conductive material containing tungsten, copper, or aluminum as its main component. The conductor 246 may have a stacked-layer structure; for example, stacked layers of titanium or titanium nitride and the above-described conductive material may be employed. As illustrated in FIG. 14B, the top surface of the insulator 285 is higher in a region where the insulator 285 overlaps with the conductor 246 than in a region where the insulator 285 does not overlap with the conductor 246, in some cases. The conductor 246 may be formed to be embedded in an opening provided in an insulator.

An insulator 241 functioning as a barrier insulating film is preferably provided between the conductor 240 and the insulator 280. The insulator 245 is preferably placed in contact with the side surface of the opening that is formed in the insulator 271, the insulator 275, the insulator 280, the insulator 282, the insulator 283, and the insulator 285. The insulator 241 preferably has a structure similar to that of the above-described insulator 245.

In this variation example, an insulator 286 covering the conductor 246 and the insulator 285 is provided. The insulator 286 may be formed using an insulating material that can be used for the insulator 285.

In this variation example, the capacitor 100 is formed after the conductor 240 and the conductor 246 are formed. Thus, unlike the semiconductor device illustrated in FIG. 11A to FIG. 11D, part of the bottom surface of the insulator 130 and part of the side surface of the insulator 245 are in contact with the insulator 286. That is, the depth of the opening in which the capacitor 100 is embedded is increased in accordance with the thickness of the insulator 286. This can increase the capacitance of the capacitor 100 without increasing the area of the semiconductor device.

Variation Example 2 of Semiconductor Device

Figure 15A:
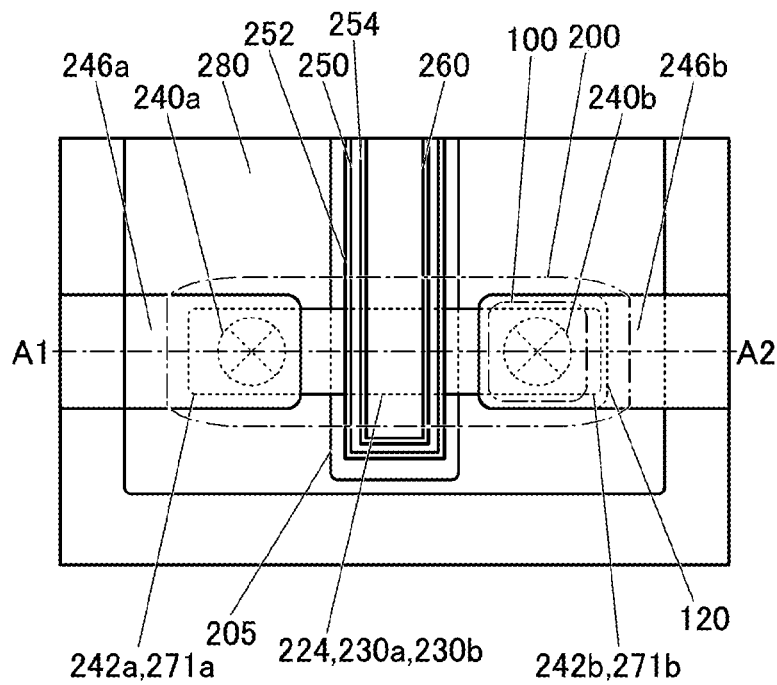
FIG. 15A is a top view of a semiconductor device of one embodiment of the present invention.
Figure 15B:
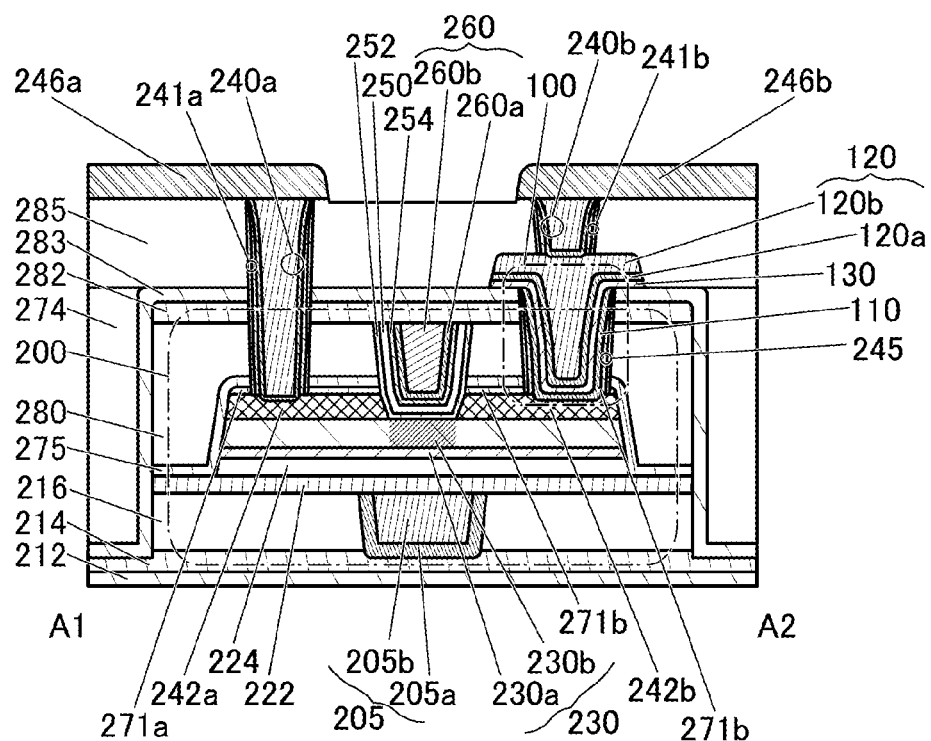
FIG. 15B is a cross-sectional view of the semiconductor device of one embodiment of the present invention.

The semiconductor device illustrated in FIG. 15A and FIG. 15B is a variation example of the semiconductor device illustrated in FIG. 11A to FIG. 11D. The semiconductor device illustrated in FIG. 15A and FIG. 15B includes an insulator 241a, a conductor 240a, and a conductor 246a over the conductor 242a in a manner similar to that of a semiconductor device illustrated in FIG. 16A and FIG. 16B.

Furthermore, an insulator 241b, a conductor 240b, and a conductor 246b are included over the conductor 120. Here, the conductor 240b functions as a plug electrically connected to one of terminals of the capacitor 100, and the conductor 246b functions as a wiring connected to the plug.

Note that a conductive material similar to that for the above-described insulator 241 can be used for the insulator 241a and the insulator 241b. A conductive material similar to that for the above-described conductor 240 can be used for the conductor 240a and the conductor 240b. A conductive material similar to that for the above-described conductor 246 can be used for the conductor 246a and the conductor 246b.

Figure 16A:
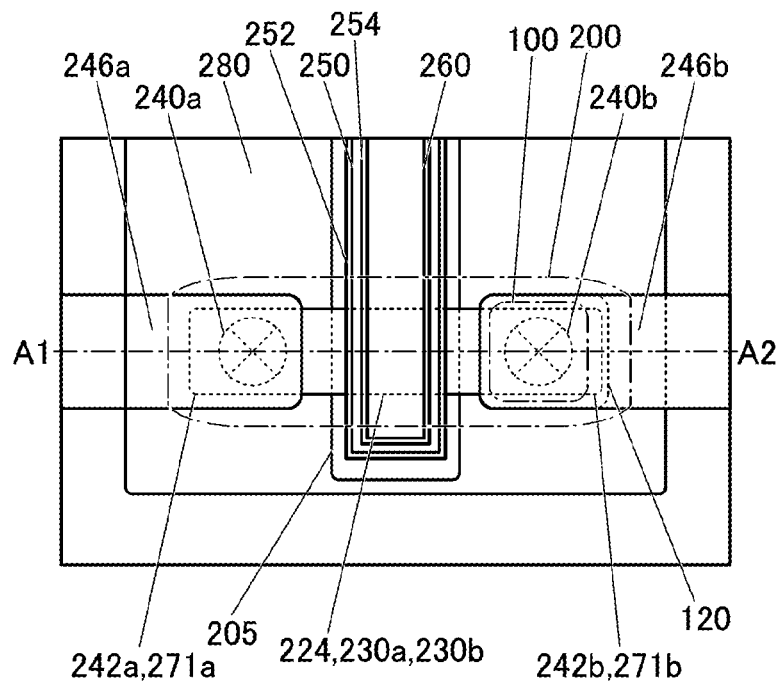
FIG. 16A is a top view of a semiconductor device of one embodiment of the present invention.
Figure 16B:
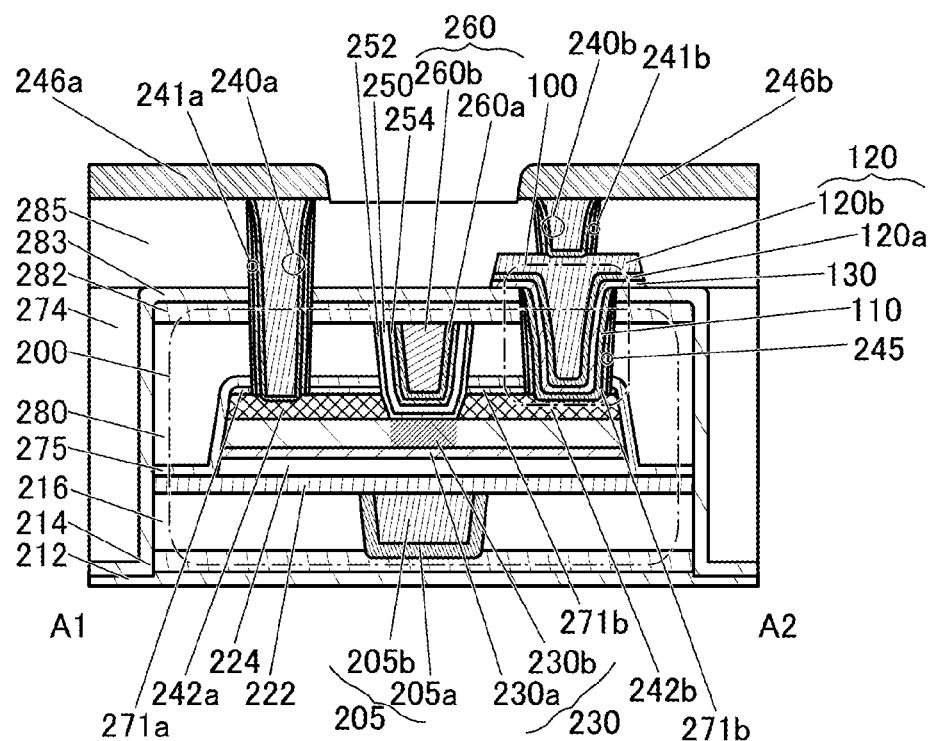
FIG. 16B is a cross-sectional view of the semiconductor device of one embodiment of the present invention.

Unlike the semiconductor device illustrated in FIG. 16A and FIG. 16B, the semiconductor device illustrated in FIG. 15A and FIG. 15B has a structure where the conductor 240a and the conductor 240b are formed after the capacitor 100 is formed. Thus, the bottom surfaces of the conductor 246a and the conductor 246b are in contact with the top surface of the insulator 285 that is formed to cover the conductor 120.

Unlike the semiconductor device illustrated in FIG. 11A to FIG. 11D, the semiconductor device illustrated in FIG. 15A and FIG. 15B has a structure where an interlayer insulating film is not provided between the insulator 283 and the insulator 130 and the bottom surface of the insulator 130 is in contact with the top surface of the insulator 283.

Variation Example 3 of Semiconductor Device

The semiconductor device illustrated in FIG. 16A and FIG. 16B is a variation example of the semiconductor device illustrated in FIG. 15A and FIG. 15B. The semiconductor device illustrated in FIG. 16A and FIG. 16B is different from the semiconductor device illustrated in FIG. 15A and FIG. 15B in that the insulator 283 is in contact with part of the top surface of the insulator 212. Accordingly, the transistor 200 is placed in a region sealed with the insulator 283 and the insulator 212. With the above structure, entry of hydrogen contained in a region outside the sealed region into the sealed region can be inhibited. Although FIG. 16A and FIG. 16B illustrate the transistor 200 having a structure where the insulator 212 and the insulator 283 are each provided to have a single-layer structure, the present invention is not limited thereto. For example, the insulator 212 and the insulator 283 may each be provided to have a stacked-layer structure of two or more layers.

Application Example of Semiconductor Device

An example of the semiconductor device of one embodiment of the present invention will be described below with reference to FIG. 17.

Figure 17A:
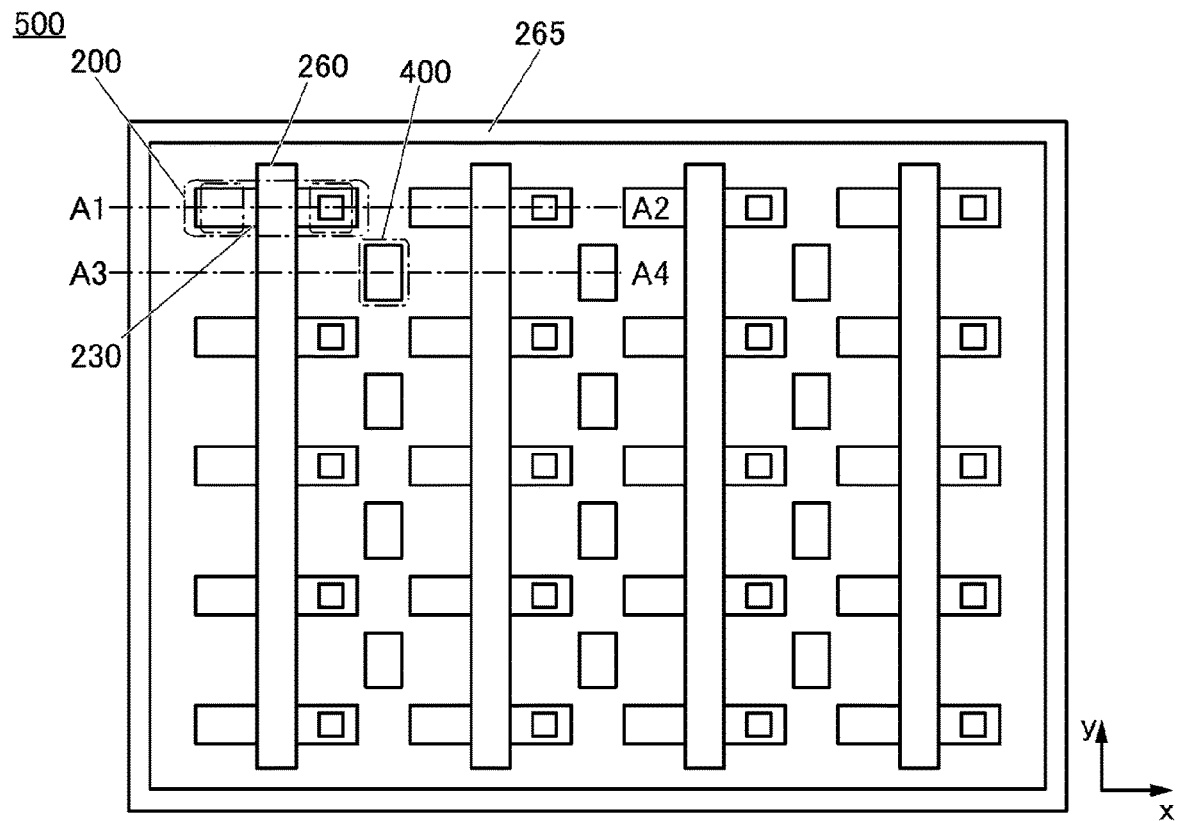
FIG. 17A is a plan view of a semiconductor device of one embodiment of the present invention.
Figure 17B:
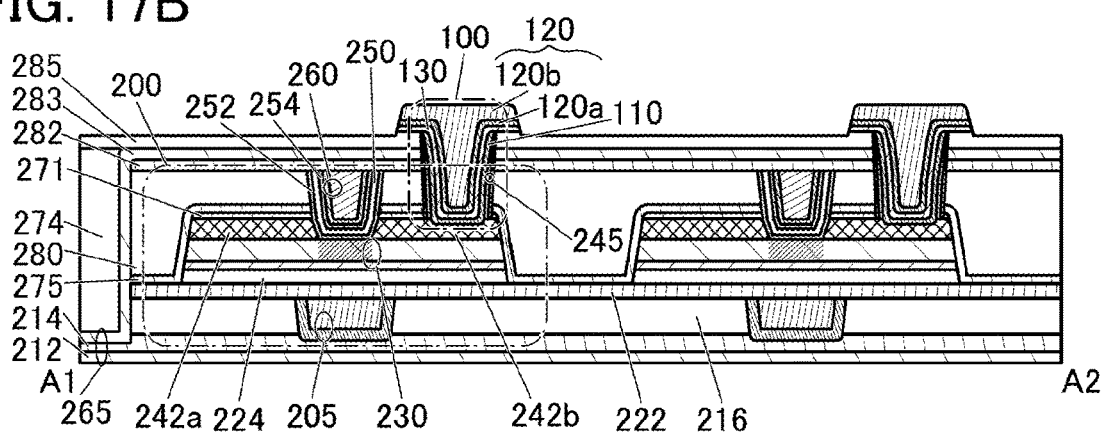
FIG. 17B and FIG. 17C are cross-sectional views of the semiconductor device of one embodiment of the present invention.
Figure 17C:
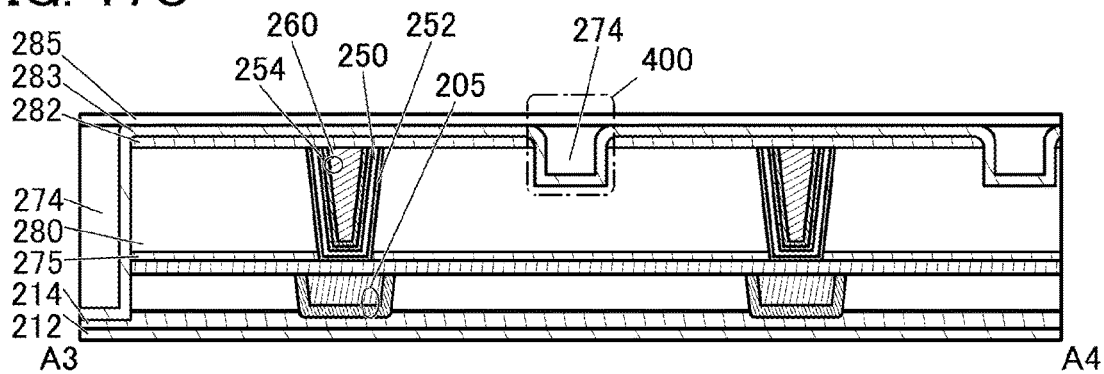

FIG. 17A is a top view of a semiconductor device 500. In FIG. 17A, the x-axis is parallel to the channel length direction of the transistor 200, and the y-axis is perpendicular to the x-axis. FIG. 17B is a cross-sectional view corresponding to a portion indicated by the dashed-dotted line A1-A2 in FIG. 17A, and is also a cross-sectional view of the transistor 200 in the channel length direction. FIG. 17C is a cross-sectional view corresponding to a portion indicated by the dashed-dotted line A3-A4 in FIG. 17A, and is also a cross-sectional view of an opening region 400 and its vicinity. Note that for clarity of the drawing, some components are not illustrated in the top view of FIG. 17A.

Note that in the semiconductor device illustrated in FIG. 17A to FIG. 17C, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

The semiconductor device 500 illustrated in FIG. 17A to FIG. 17C is a variation example of the semiconductor device illustrated in FIG. 11A to FIG. 11D. The semiconductor device 500 illustrated in FIG. 17A to FIG. 17C is different from the semiconductor device illustrated in FIG. 11A to FIG. 11D in that the opening region 400 is formed in the insulator 282 and the insulator 280. Moreover, a sealing portion 265 is formed to surround a plurality of transistors 200 and a plurality of capacitors 100, which is a different point from the semiconductor device illustrated in FIG. 11A to FIG. 11D.

The semiconductor device 500 includes a plurality of transistors 200, a plurality of capacitors 100, and a plurality of opening regions 400 arranged in a matrix. In addition, a plurality of conductors 260 functioning as gate electrodes of the transistors 200 are provided to extend in the y-axis direction. The opening regions 400 are provided in regions not overlapping with the oxide 230 or the conductor 260. The sealing portion 265 is formed so as to surround the plurality of transistors 200, the plurality of capacitors 100, the plurality of conductors 260, and the plurality of opening regions 400. Note that the number, the position, and the size of the transistors 200, the capacitors 100, the conductors 260, and the opening regions 400 are not limited to those illustrated in FIG. 17 and may be set as appropriate in accordance with the design of the semiconductor device 500.

As illustrated in FIG. 17B and FIG. 17C, the sealing portion 265 is provided to surround the plurality of transistors 200, the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with the top surface of the insulator 214. In the sealing portion 265, the insulator 274 is provided between the insulator 283 and the insulator 285. The top surface of the insulator 274 is substantially level with the uppermost surface of the insulator 283. As the insulator 274, an insulator similar to the insulator 280 can be used.

Such a structure enables the plurality of transistors 200 to be surrounded (sealed) by the insulator 283, the insulator 214, and the insulator 212. One or more of the insulator 283, the insulator 214, and the insulator 212 preferably function as a barrier insulating film against hydrogen. Accordingly, entry of hydrogen contained in the region outside the sealing portion 265 into a region in the sealing portion 265 can be inhibited. The insulator 283, the insulator 214, and the insulator 212 having such a function are referred to as sealing films in some cases.

As illustrated in FIG. 17C, the insulator 282 has an opening portion in the opening region 400. In the opening region 400, the insulator 280 may have a groove to overlap with the opening portion in the insulator 282. The depth of the groove portion of the insulator 280 is less than or equal to the depth at which the top surface of the insulator 275 is exposed and is, for example, approximately greater than or equal to ¼ and less than or equal to ½ of the maximum thickness of the insulator 280.

As illustrated in FIG. 17C, the insulator 283 is in contact with the side surface of the insulator 282, the side surface of the insulator 280, and the top surface of the insulator 280 inside the opening region 400. Part of the insulator 274 is formed in the opening region 400 to fill the depressed portion formed in the insulator 283, in some cases. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to diffuse outwardly from the opening region 400 while oxygen is supplied to the oxide 230. This enables oxygen to be sufficiently supplied to the region functioning as the channel formation region and its vicinity in the oxide semiconductor from the insulator 280 containing oxygen to be released by heating, and also prevents an excess amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and hydrogen contained in the insulator 280 can be prevented from entering the oxide 230.

In FIG. 17A, the shape of the opening region 400 in the top view is substantially rectangular; however, the present invention is not limited to this. For example, the shape of the opening region 400 in the top view can be a rectangular shape, an elliptical shape, a circular shape, a rhombus shape, or a shape obtained by combining any of the above shapes. The area and arrangement interval of the opening regions 400 can be set as appropriate in accordance with the design of the semiconductor device including the transistor 200. For example, in the region where the density of the transistors 200 is low, the area of the opening region 400 may be increased or the arrangement interval of the opening regions 400 may be narrowed. For example, in the region where the density of the transistors 200 is high, the area of the opening region 400 may be decreased, or the arrangement interval of the opening regions 400 may be increased.

According to one embodiment of the present invention, a novel transistor can be provided. According to another embodiment of the present invention, a semiconductor device with a small variation in transistor characteristics can be provided. According to another embodiment of the present invention, a semiconductor device with favorable electrical characteristics can be provided. According to another embodiment of the present invention, a highly reliable semiconductor device can be provided. According to another embodiment of the present invention, a semiconductor device with a high on-state current can be provided. According to another embodiment of the present invention, a semiconductor device with a high field-effect mobility can be provided. According to another embodiment of the present invention, a semiconductor device with favorable frequency characteristics can be provided. According to another embodiment of the present invention, a semiconductor device that can be miniaturized or highly integrated can be provided. According to another embodiment of the present invention, a semiconductor device with low power consumption can be provided.

According to another embodiment of the present invention, a capacitor containing a material that can have ferroelectricity can be provided. According to another embodiment of the present invention, the above-described capacitor can be provided with favorable productivity. According to another embodiment of the present invention, a semiconductor device including the above-described capacitor and a transistor can be provided. According to another embodiment of the present invention, the above-described semiconductor device that can be miniaturized or highly integrated can be provided.

At least part of the structure, method, and the like described in this embodiment can be implemented in appropriate combination with any of those in the other embodiments, the other examples, and the like described in this specification.

Embodiment 3

In this embodiment, one mode of a semiconductor device will be described with reference to FIG. 18.

Structure Example of Storage Device

Figure 18:
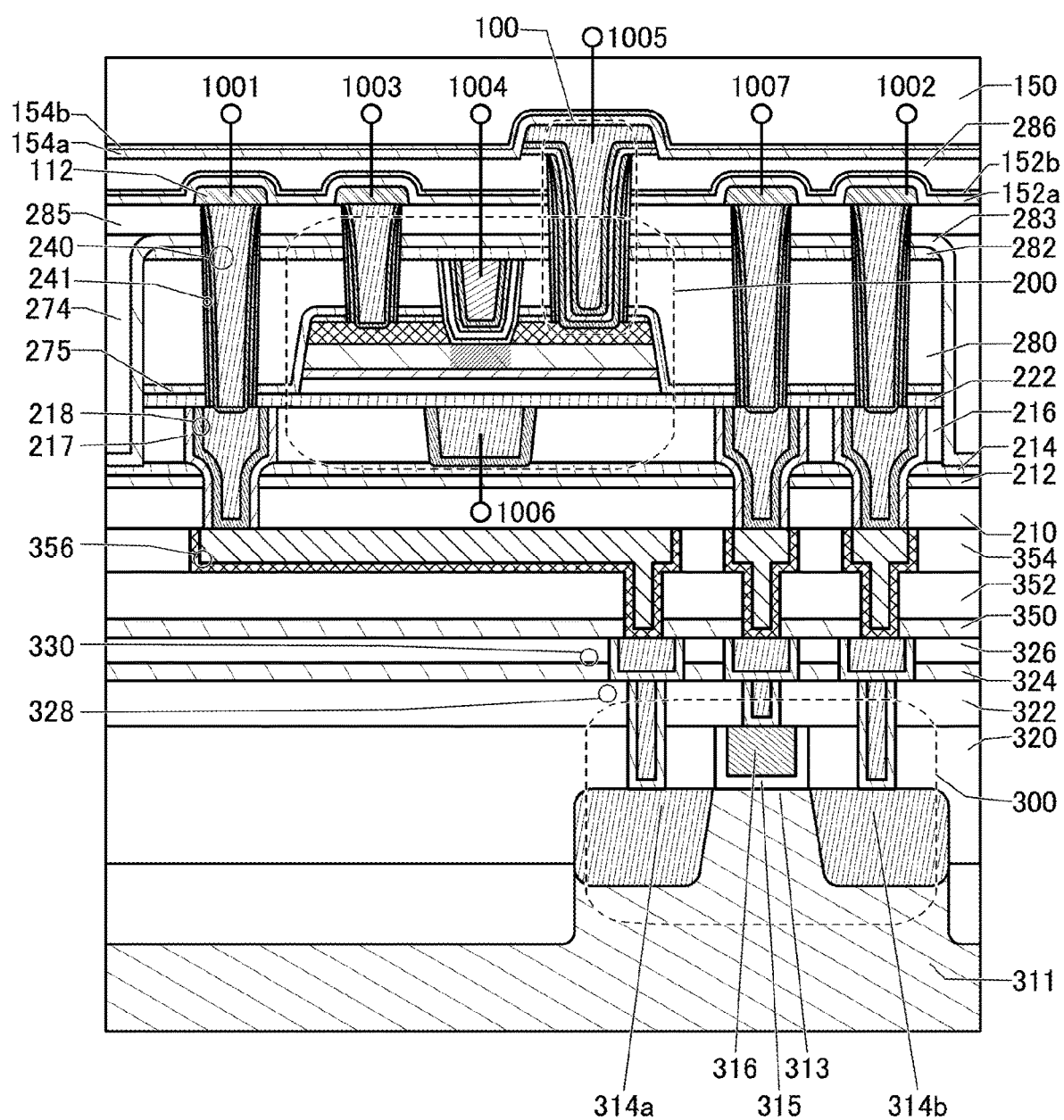
FIG. 18 is a cross-sectional view illustrating a structure of a storage device of one embodiment of the present invention.

FIG. 18 illustrates an example of a semiconductor device (storage device) of one embodiment of the present invention. In the semiconductor device of one embodiment of the present invention, the transistor 200 is provided above a transistor 300, and the capacitor 100 is provided above the transistor 300 and the transistor 200. Note that the transistor 200 described in the above embodiment can be used as the transistor 200. The capacitor 100 described in the above embodiment can be used as the capacitor 100. Although FIG. 18 illustrates an example where the capacitor 100 and the transistor 200 illustrated in FIG. 14 are used, the present invention is not limited thereto; the capacitor 100 and the transistor 200 can be selected as appropriate.

A material that can have ferroelectricity, in which polarization internally occurs due to an electric field supplied from the outside and the polarization remains even when the electric field is reduced to zero, is used in the capacitor 100. Thus, a nonvolatile storage element can be formed using the capacitor 100. In other words, a one-transistor one-capacitor ferroelectric memory can be formed using the capacitor functioning as a ferroelectric capacitor and the transistor 200.

The transistor 200 is a transistor in which a channel is formed in a semiconductor layer including an oxide semiconductor. The transistor 200 has a feature of a high withstand voltage. Accordingly, a high voltage can be applied to the transistor 200 formed using an oxide semiconductor even when the transistor 200 is miniaturized. The miniaturization of the transistor 200 can reduce the area occupied by the semiconductor device.

In the semiconductor device illustrated in FIG. 18, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to a first gate of the transistor 200, a wiring 1005 is electrically connected to one electrode of the capacitor 100, a wiring 1006 is electrically connected to a second gate of the transistor 200, and a wiring 1007 is electrically connected to a gate of the transistor 300.

The storage device illustrated in FIG. 18 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 18, the semiconductor region 313 (part of the substrate 311) in which a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 18 is an example and the structure is not limited thereto; an appropriate transistor is used in accordance with a circuit structure or a driving method.

<Wiring Layer>

Wiring layers provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, an insulator 350, an insulator 352, and an insulator 354 are sequentially stacked in FIG. 18. Furthermore, a conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in an insulator 210, the insulator 212, the insulator 214, and the insulator 216. Note that the conductor 218 has a function of a plug or a wiring that is electrically connected to the capacitor 100 or the transistor 300.

Here, like the insulator 241 described in the above embodiment, an insulator 217 is provided in contact with the side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and each of the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used, for example. Since the insulator 217 is provided in contact with the insulator 210, the insulator 212, the insulator 214, and the insulator 222, entry of impurities such as water and hydrogen into the oxide 230 through the conductor 218 from the insulator 210, the insulator 216, or the like can be inhibited. In particular, silicon nitride is suitable because of its high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride can be deposited by a PEALD method and an opening reaching the conductor 356 can be formed by anisotropic etching.

Above the transistor 200, a conductor 112 is provided over the insulator 285 and the conductor 240. Note that the conductor 112 functions as a plug or a wiring that is electrically connected to the transistor 200 or the transistor 300. The insulator 286 is provided to cover the insulator 285 and the conductor 112. An insulator 150 is provided to cover the insulator 286 and the capacitor 100.

In addition, a barrier insulating film against hydrogen may be provided to cover the insulator 285 and the conductor 112. As illustrated in FIG. 18, as barrier insulating films against hydrogen, an insulator 152*a* covering the insulator 285 and the conductor 112 and an insulator 152*b* over the insulator 152*a* are preferably provided. As the insulator 152*a* and the insulator 152*b*, a barrier insulating film that can be used for the above-described insulator 283 or the like may be used. With the insulator 152*a* and the insulator 152*b* provided in the above manner, impurities such as hydrogen which are contained in the insulator 286 and the like can be inhibited from diffusing into the transistor 200 through the conductor 112 and the conductor 240.

The insulator 152*a* is deposited by a sputtering method. For example, silicon nitride deposited by a sputtering method can be used as the insulator 152*a*. Since a sputtering method does not need to use a molecule containing hydrogen as a deposition gas, the hydrogen concentration in the insulator 152*a* can be reduced. Since the hydrogen concentration in the insulator 152*a* in contact with the conductor 112 and the insulator 285 is reduced in this manner, hydrogen can be inhibited from diffusing from the insulator 152*a* into the conductor 112 and the insulator 285.

The insulator 152*b* is preferably deposited by an ALD method, particularly a PEALD method. For example, silicon nitride deposited by a PEALD method can be used as the insulator 152*b*. Thus, the insulator 152*b* can be deposited with good coverage; therefore, even when a pinhole, disconnection, or the like is generated in the insulator 152*a* owing to unevenness of the base, the insulator 152*b* covers it, whereby hydrogen can be inhibited from diffusing into the conductor 112 and the insulator 285.

Note that the methods for depositing the insulator 152*a* and the insulator 152*b* are not limited only to a sputtering method and an ALD method; a CVD method, an MBE method, a PLD method, or the like can also be used as appropriate. Although the two-layer structure of the insulator 152*a* and the insulator 152*b* is described above, the present invention is not limited thereto; a single-layer structure or a stacked-layer structure of three or more layers may be used.

The insulator 283 and the insulator 212 may be a barrier insulating film with a stacked-layer structure, as in the case of the insulator 152a and the insulator 152b.

Furthermore, similarly, a barrier insulating film against hydrogen may be provided to cover the insulator 286 and the capacitor 100. As illustrated in FIG. 18, an insulator 154a covering the insulator 286 and the capacitor 100 and an insulator 154b over the insulator 154a are preferably provided as barrier insulating films against hydrogen. Here, the capacitor 100 is sealed with the insulator 154a and the insulator 154b, and the insulator 154a and the insulator 154b function as sealing films. A barrier insulating film similar to the insulator 152a and a barrier insulating film similar to the insulator 152b can be used as the insulator 154a and the insulator 154b, respectively. Providing the insulator 154a and the insulator 154b in this manner can inhibit impurities such as hydrogen contained in the insulator 150 and the like from diffusing into the transistor 200 through the capacitor 100.

Examples of an insulator that can be used as an interlayer film include insulating oxide, insulating nitride, insulating oxynitride, insulating nitride oxide, insulating metal oxide, insulating metal oxynitride, and insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, as the insulator 150, the insulator 210, the insulator 352, the insulator 354, and the like, an insulator having a low dielectric constant is preferably included. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used as the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance. Furthermore, as described in the above embodiment, the conductor 120a in the capacitor 100 is deposited by a method with substrate heating, such as a thermal ALD method, whereby the ferroelectricity of the insulator 130 can be enhanced even without performing high-temperature baking after the formation. Therefore, since the semiconductor device can be fabricated without performing high-temperature baking, it is possible to use a low-resistance conductive material with a low melting point, such as copper.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 18, the insulator 241 is preferably provided between the conductor 240 and the insulator 224 and the insulator 280 that contain excess oxygen. Since the insulator 241 is provided in contact with the insulator 222, the insulator 282, and the insulator 283, the insulator 224 and the transistor 200 can be sealed with the insulators having a barrier property.

That is, providing the insulator 241 can inhibit excess oxygen contained in the insulator 224 and the insulator 280 from being absorbed by the conductor 240. In addition, providing the insulator 241 can inhibit diffusion of hydrogen, which is an impurity, into the transistor 200 through the conductor 240.

For the insulator 241, an insulating material having a function of inhibiting diffusion of oxygen and impurities such as water and hydrogen is preferably used. For example, silicon nitride, silicon nitride oxide, aluminum oxide, hafnium oxide, or the like is preferably used. In particular, silicon nitride is preferable because of its high blocking property against hydrogen. Alternatively, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 274, the insulator 285, the insulator 150, and the like into the insulator 280 and the like. In this case, the insulator 212, the insulator 214, the insulator 282, and the insulator 283 function as sealing films.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside. Note that although one transistor 200 is illustrated in the region sealed with the insulator 212, the insulator 283, and the like in FIG. 18, the structure is not limited thereto; a plurality of transistors 200 can be provided in the sealed region.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 18, a region in which the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of a memory cell including the plurality of transistors 200.

That is, in the opening provided in the insulator 282, the insulator 280, the insulator 275, the insulator 222, and the insulator 216, the insulator 214 is in contact with the insulator 283.

For example, an opening may be provided in the insulator 282, the insulator 280, the insulator 275, the insulator 222, the insulator 216, and the insulator 214. With such a structure, in the opening provided in the insulator 282, the insulator 280, the insulator 275, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate into the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Variation Example 1 of Storage Device

Figure 19:
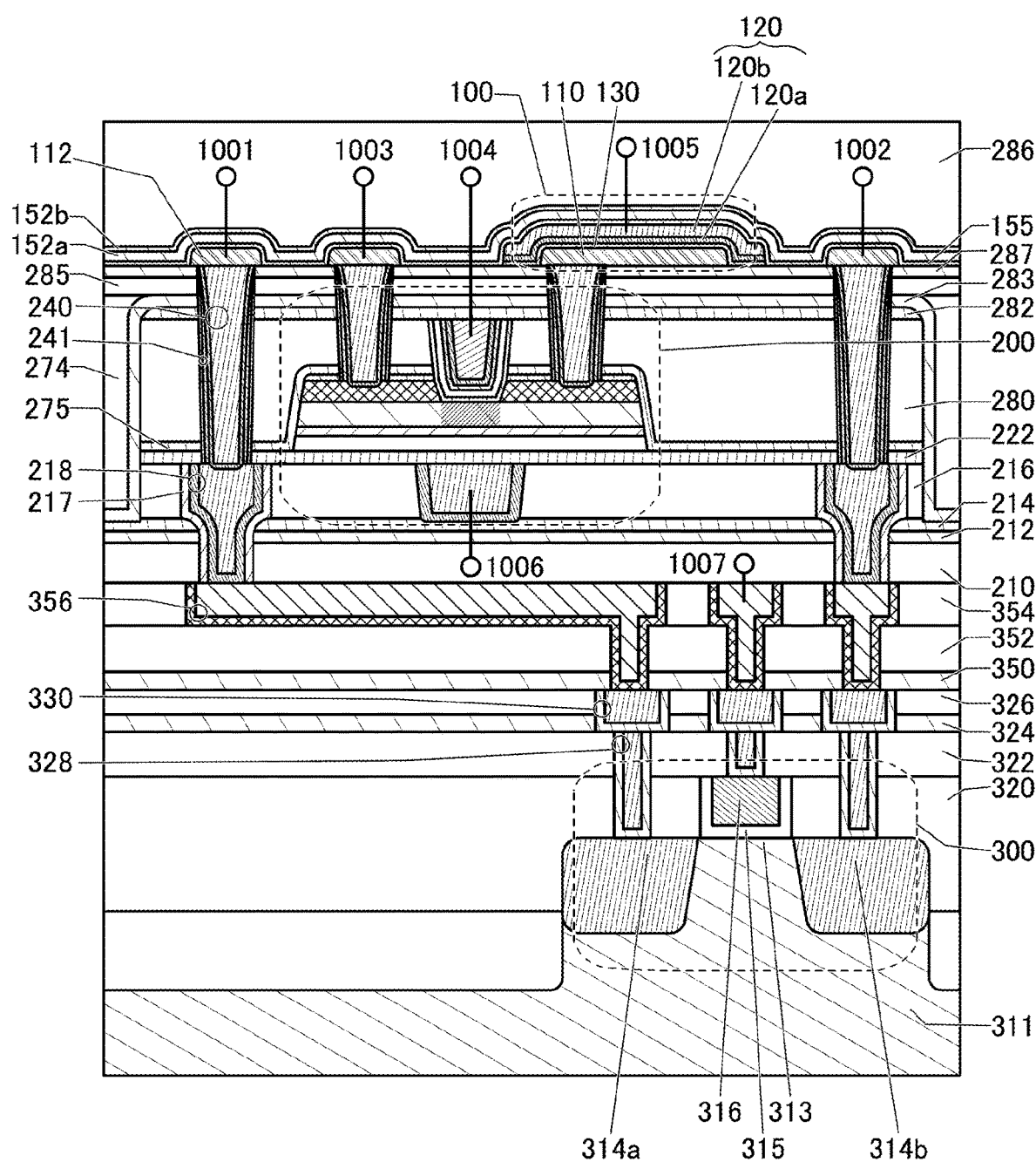
FIG. 19 is a cross-sectional view illustrating a structure of a storage device of one embodiment of the present invention.

Although the capacitor 100 is formed to be embedded in the insulator 285, the insulator 280, and the like in the storage device illustrated in FIG. 18, the present invention is not limited thereto. As illustrated in FIG. 19, a planar capacitor 100 may be provided over the insulator 285.

The capacitor 100 includes the conductor 110, the insulator 130 covering the conductor 110, and the conductor 120 (the conductor 120a and the conductor 120b) covering the insulator 130. Here, the insulator 130 preferably covers the top surface and the side surface of the conductor 110 to separate the conductor 110 and the conductor 120. The descriptions of [Structure example of storage device] and the above embodiments can be referred to for the details of the conductor 110, the insulator 130, and the conductor 120.

The conductor 110 is formed in the same layer as the conductor 112 and is in contact with the top surface of the conductor 240. The conductor 110 is electrically connected to one of the source and the drain of the transistor 200 through the conductor 240.

An insulator 155 is preferably provided to cover the conductor 120, the insulator 130, and the conductor 112. As the insulator 155, an insulator that can be used as the insulator 214, the insulator 282, or the like and has a function of capturing and fixing hydrogen is preferably used. For example, aluminum oxide ($AlO_x$ (x is a given number greater than 0)) is preferably used. The $AlO_x$ preferably has an amorphous structure. In such a metal oxide having an amorphous structure, an oxygen atom has a dangling bond and sometimes has a property of capturing or fixing hydrogen with the dangling bond.

For example, aluminum oxide deposited by an ALD method or an aluminum oxide film deposited by a sputtering method can be used for the insulator 155. Alternatively, the insulator 155 may be a stacked-layer film of aluminum oxide deposited by an ALD method and aluminum oxide thereover deposited by a sputtering method.

Providing the insulator 155 covering the capacitor 100 in this manner makes it possible to capture and fix hydrogen contained in the insulator 130 of the capacitor 100 to reduce the hydrogen concentration in the insulator 130. This can improve the crystallinity of the insulator 130 and enhance the ferroelectricity of the insulator 130. Moreover, a leakage current between the conductor 110 and the conductor 120 can be reduced. Note that the structure is not limited thereto, and a structure where the insulator 155 is not provided may be employed.

As in the storage device illustrated in FIG. 18, the insulator 152a and the insulator 152b that function as barrier insulating films against hydrogen are preferably provided over the conductor 112 and the conductor 120. The insulator 152*a* and the insulator 152*b* are provided over the insulator 155. Providing the insulator 152*a* and the insulator 152*b* in this manner can inhibit impurities such as hydrogen contained in the insulator 286 over the insulator 152*b* from diffusing into the transistor 200 through the capacitor 100, the conductor 112, and the conductor 240.

As illustrated in FIG. 19, an insulator 287 functioning as a barrier insulating film against hydrogen is preferably provided over the insulator 285. The conductor 112, the conductor 110, and the insulator 155 are provided over and in contact with the insulator 287. Here, as the insulator 287, a barrier insulating film similar to the insulator 283 can be used.

With such a structure, the insulator 155 and the insulator 287 are in contact with each other in a region not overlapping with the capacitor 100. That is, the capacitor 100 is sealed with the insulator 155, the insulator 152*a*, the insulator 152*b*, and the insulator 287. The insulator 155, the insulator 152*a*, the insulator 152*b*, and the insulator 287 function as sealing films. Thus, hydrogen diffusion from the outside of the insulator 152*b* and the insulator 287 into the capacitor 100 can be inhibited, and furthermore, hydrogen in the insulator 152*b* and the insulator 287 can be captured and fixed, so that the hydrogen concentration in the insulator 130 of the capacitor 100 can be reduced. Therefore, the ferroelectricity of the insulator 130 can be enhanced.

Note that in the case where the insulator 155 is not used, the insulator 287 and the insulator 152*a* are in contact with each other in a region not overlapping with the capacitor 100, and the capacitor 100 is sealed with the insulator 152*a*, the insulator 152*b*, and the insulator 287.

Furthermore, as illustrated in FIG. 19, the transistor 200 is also sealed with the insulator 283, the insulator 214, and the insulator 212 that function as barrier insulating films against hydrogen. Accordingly, diffusion of hydrogen into the transistor 200 from the outside of the insulator 283 and the insulator 212 can be inhibited to reduce the hydrogen concentration in the oxide semiconductor film included in the transistor 200. Therefore, the electrical characteristics and reliability of the transistor 200 can be improved.

Figure 20A:
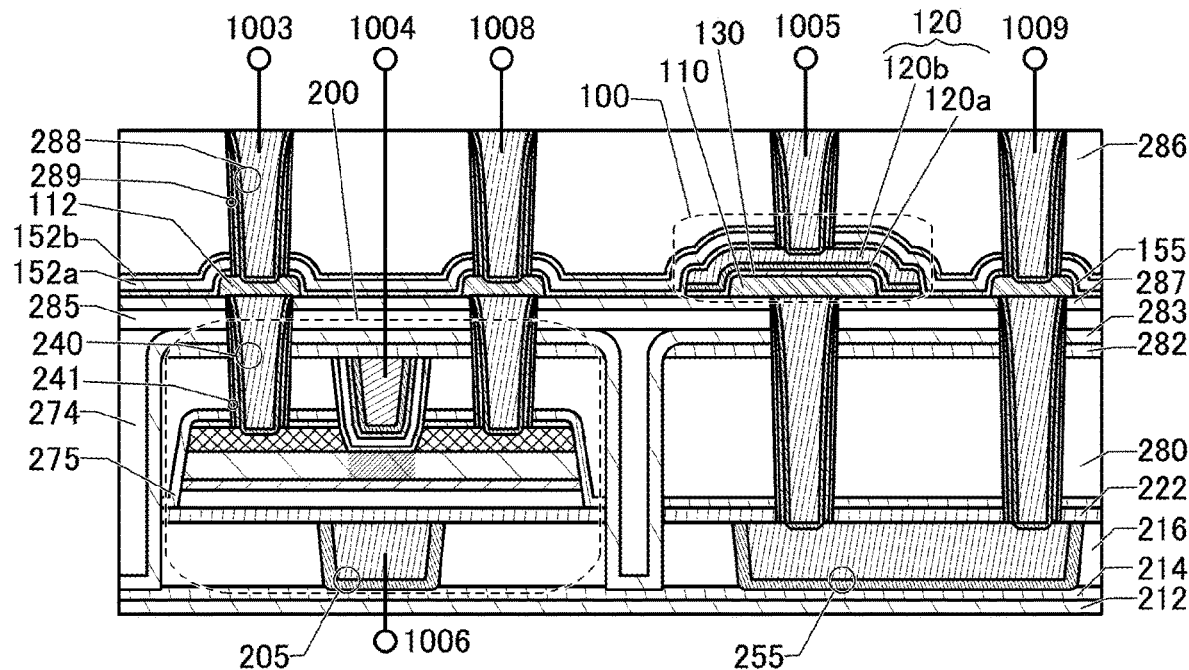
FIG. 20A and FIG. 20B are cross-sectional views illustrating structures of a storage device of one embodiment of the present invention.

Although the storage device illustrated in FIG. 19 has a structure where the transistor 200 and the capacitor 100 are electrically connected to each other, the present invention is not limited thereto. As illustrated in FIG. 20A, a structure may be employed in which the transistor 200 and the capacitor 100 are not electrically connected to each other. Here, in the storage device illustrated in FIG. 20A, the transistor 200 and the capacitor 100 that are above the insulator 212 have structures similar to those in the storage device illustrated in FIG. 19. The structure below the insulator 212 may be similar to that in the storage device illustrated in FIG. 19, or may be a structure where the substrate 311 is provided below and in contact with the insulator 212.

Furthermore, as illustrated in FIG. 20A, an opening may be formed in the insulator 286, the insulator 152*b*, the insulator 152*a*, and the insulator 155, and a conductor 288 and an insulator 289 may be provided to fill the opening. The conductor 288 has a structure similar to that of the conductor 240, and the insulator 289 has a structure similar to that of the insulator 241. Here, one of the source and the drain of the transistor 200 is electrically connected to the wiring 1003 through the conductor 288, and the other of the source and the drain of the transistor 200 is electrically connected to a wiring 1008 through the conductor 288. One electrode (the conductor 120) of the capacitor 100 is electrically connected to the wiring 1005 through the conductor 288. The other electrode (the conductor 110) of the capacitor 100 is electrically connected to a wiring 1009 through the conductor 240, the conductor 255 in the same layer as the conductor 205, the conductor 112, and the conductor 288.

As illustrated in FIG. 20A, the transistor 200 and the capacitor 100 may be individually sealed with a sealing film. In the storage device illustrated in FIG. 20A, the transistor 200 is sealed with the insulator 283, the insulator 214, and the insulator 212. As illustrated in FIG. 20A, the conductor 240 and the conductor 255 functioning as wirings or plugs connected to the capacitor 100 may be sealed separately from the transistor 200. In this case, a region in which the insulator 283 and the insulator 214 are in contact with each other is formed between the transistor 200 and each of the conductor 240 and the conductor 255.

Figure 20B:
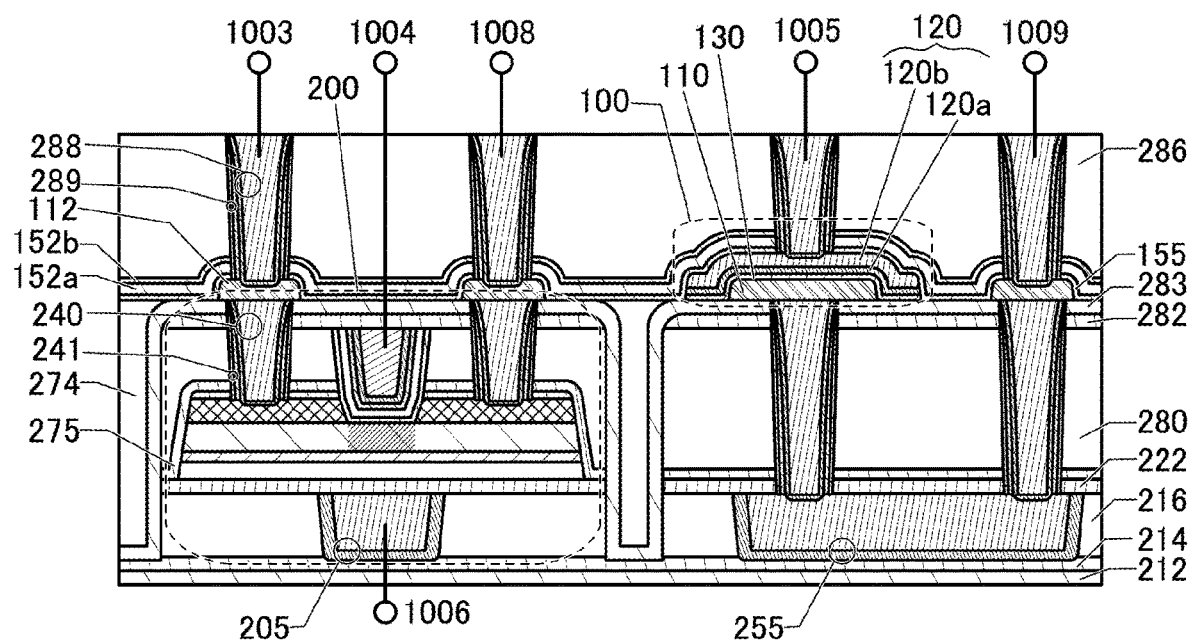

Although FIG. 20A illustrates a structure where the insulator 285 and the insulator 287 are provided between the transistor 200 and the capacitor 100, the present invention is not limited thereto. For example, as illustrated in FIG. 20B, a structure may be employed in which the insulator 285 and the insulator 287 are not provided and the bottom surfaces of the conductor 112, the conductor 110, and the insulator 155 are in contact with the insulator 283. In this case, the capacitor 100 is sealed with the insulator 152*a*, the insulator 152*b*, the insulator 155, and the insulator 283. Thus, the insulator 285 and the insulator 287 does not need to be provided, so that the productivity of the storage device can be improved.

Figure 21A:
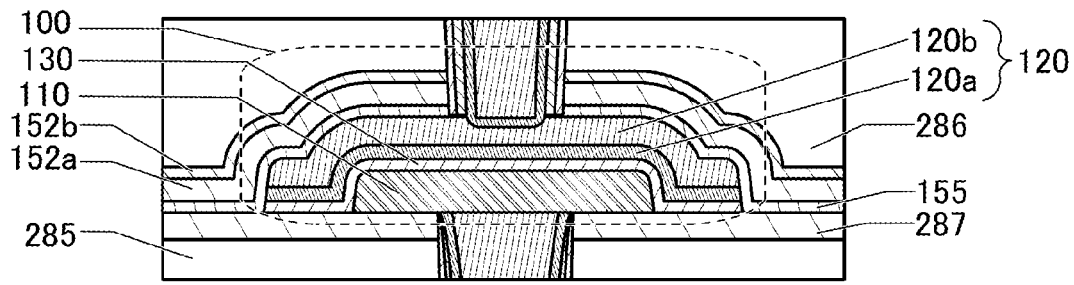
FIG. 21A to FIG. 21C are cross-sectional views illustrating structures of a storage device of one embodiment of the present invention.

FIG. 21A is an enlarged view of the capacitor 100 illustrated in FIG. 20A. As illustrated in FIG. 21A, the capacitor 100 is sealed with the insulator 287, the insulator 152*a*, the insulator 152*b*, and the insulator 155, like the capacitor 100 illustrated in FIG. 19. Here, the insulator 155, the insulator 152*a*, the insulator 152*b*, and the insulator 287 function as sealing films. Thus, hydrogen diffusion from the outside of the insulator 152*b* and the insulator 287 into the capacitor 100 can be inhibited, and furthermore, hydrogen in the insulator 152*b* and the insulator 287 can be captured and fixed, so that the hydrogen concentration in the insulator 130 of the capacitor 100 can be reduced. Therefore, the ferroelectricity of the insulator 130 can be enhanced.

Figure 21B:
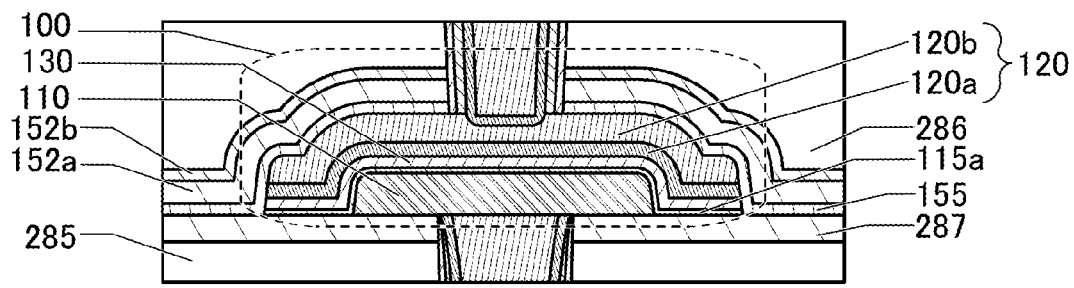

Although the capacitor 100 illustrated in FIG. 21A has a structure where the insulator 130 is in contact with the top surface of the insulator 287 and the top surface and the side surface of the conductor 110, the present invention is not limited thereto. As illustrated in FIG. 21B, the insulator 115*a* may be provided between the insulator 130, and the insulator 287 and the conductor 110. That is, the insulator 130 is in contact with the top surface of the insulator 115*a*, and the insulator 287 and the conductor 110 are in contact with the bottom surface of the insulator 115*a*. The insulator 115*a* illustrated in FIG. 1C2 or the like in the above embodiment can be used as the insulator 115*a* here. The thickness of the insulator 115*a* is greater than or equal to 0.2 nm and less than or equal to 2 nm, preferably greater than or equal to 0.5 nm and less than or equal to 1 nm. Such a structure allows the capacitor 100 illustrated in FIG. 21B to function as an FTJ illustrated in FIG. 1C1 and FIG. 1C2, in which a capacitor and a diode are connected to each other.

Figure 21C:
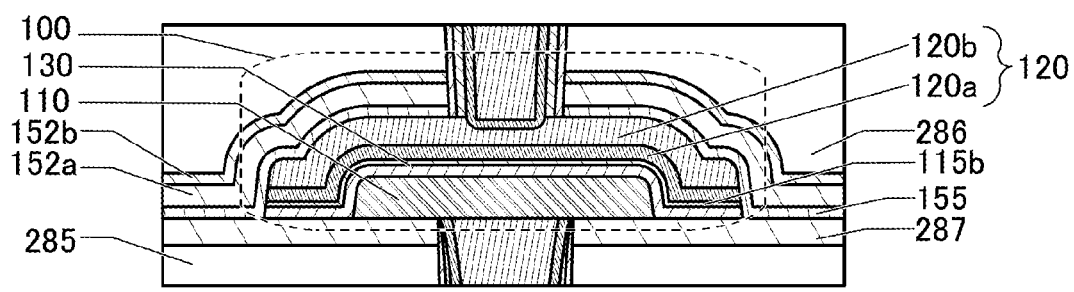

Although the capacitor 100 illustrated in FIG. 21A has a structure where the insulator 130 is in contact with the bottom surface of the conductor 120, the present invention is not limited thereto. As illustrated in FIG. 21C, the insulator 115*b* may be provided between the insulator 130 and the conductor 120. That is, the insulator 130 is in contact with the bottom surface of the insulator 115b, and the conductor 120 is in contact with the top surface of the insulator 115b. The insulator 115b illustrated in FIG. 1C3 or the like in the above embodiment can be used as the insulator 115b here. The thickness of the insulator 115b is greater than or equal to 0.2 nm and less than or equal to 2 nm, preferably greater than or equal to 0.5 nm and less than or equal to 1 nm. Such a structure allows the capacitor 100 illustrated in FIG. 21C to function as an FTJ illustrated in FIG. 1C1 and FIG. 1C3, in which a capacitor and a diode are connected to each other.

Figure 22A:
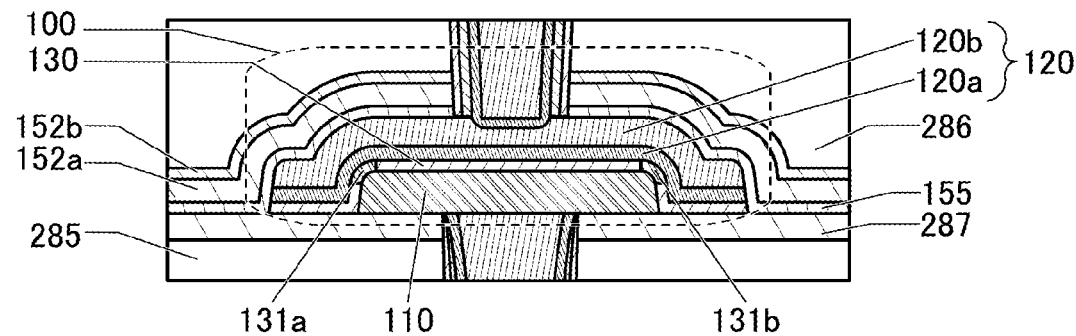
FIG. 22A to FIG. 22C are cross-sectional views illustrating structures of a storage device of one embodiment of the present invention.

As illustrated in FIG. 22A, a polycrystalline region is sometimes formed in the insulator 130 of the capacitor 100. FIG. 22A illustrates an example where a polycrystalline region 131a and a polycrystalline region 131b are formed in upper sides of side end portions of the conductor 110. The insulator 130 illustrated in FIG. 22A is deposited along a step of a formation surface formed by the conductor 110, and the polycrystalline region 131a and the polycrystalline region 131b are formed in the vicinity of upper portions of the step in some cases. The polycrystalline region 131a and the polycrystalline region 131b are regions where many grains or crystal grain boundaries illustrated in FIG. 4B are formed. For example, in the insulator 130, the polycrystalline region 131a and the polycrystalline region 131b include more grains than a region where the insulator 130 is in contact with the top surface of the conductor 110 with high planarity (the region can also be regarded as a region interposed between the polycrystalline region 131a and the polycrystalline region 131b). In other words, in the insulator 130, the region interposed between the polycrystalline region 131a and the polycrystalline region 131b include more single crystals illustrated in FIG. 3 than the polycrystalline region 131a and the polycrystalline region 131b.

Figure 22B:
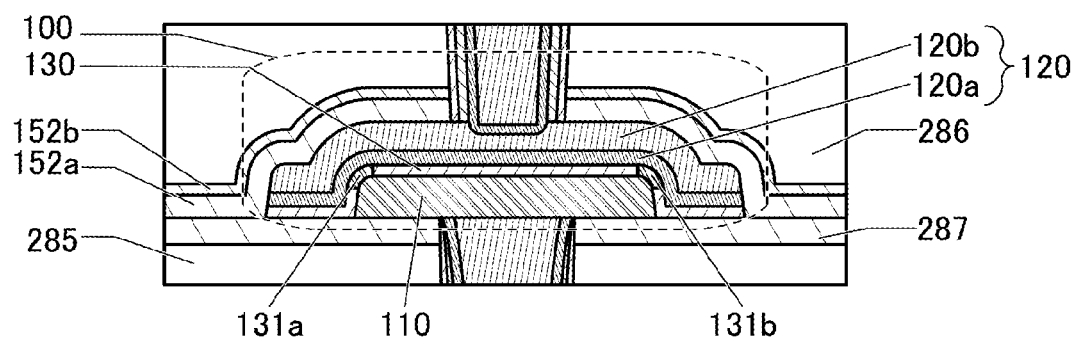

Although the capacitor 100 illustrated in FIG. 22A has a structure where the insulator 155 is provided to be in contact with the bottom surface of the insulator 152a, the present invention is not limited thereto. For example, as illustrated in FIG. 22B, a structure may be employed in which the insulator 155 is not provided and the bottom surface of the insulator 152a is in contact with the top surface of the insulator 287, the side surface of the insulator 130, the side surface of the conductor 120, and the top surface of the conductor 120.

Figure 22C:
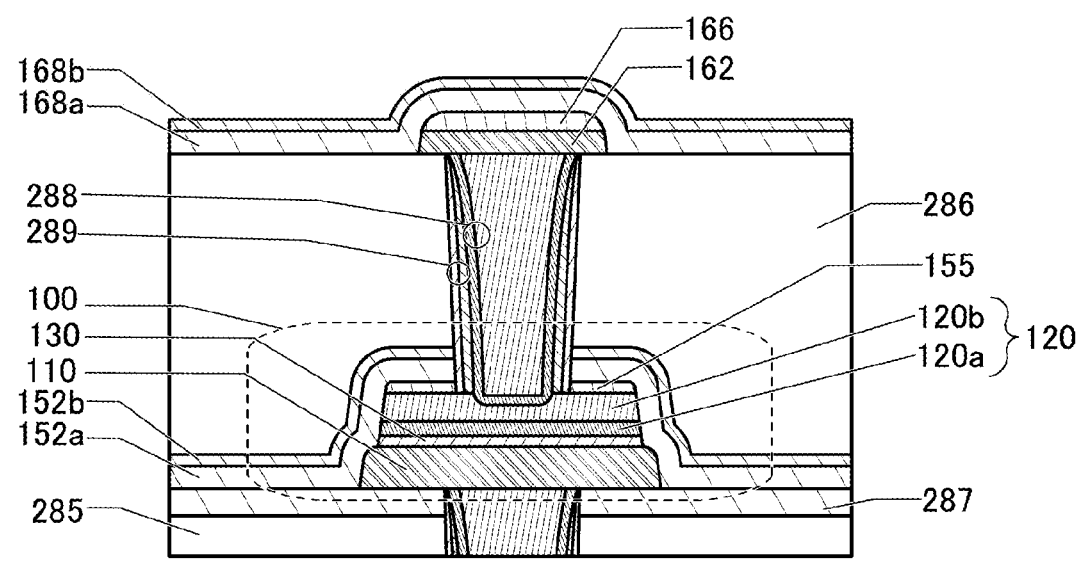

In addition, although the insulator 130 and the conductor 120 cover the side surface of the conductor 110 in FIG. 22A or the like, the present invention is not limited thereto. As illustrated in FIG. 22C, the side surface of the insulator 130 and the side surface of the conductor 120 may be positioned on the inner side of the side surface of the conductor 110. In this case, in the top view, the peripheries of the insulator 130 and the conductor 120 are positioned on the inner side of the periphery of the conductor 110.

In the above structure, the insulator 130 and the conductor 120 are not formed in the vicinity of the step of the formation surface formed by the conductor 110, so that the polycrystalline region 131a and the polycrystalline region 131b illustrated in FIG. 22A are not formed in the insulator 130 illustrated in FIG. 22C. Thus, the insulator 130 illustrated in FIG. 22C is entirely in contact with the top surface of the conductor 110 with high planarity, and includes many single crystals illustrated in FIG. 3. The insulator 130 in FIG. 22C accordingly has a structure where a plurality of crystal layers are stacked in the c-axis direction as illustrated in FIG. 4A, and sometimes can have large polarization. In the above manner, the insulator 130 illustrated in FIG. 22C can have favorable ferroelectricity and the capacitor 100 can function as a ferroelectric device.

As illustrated in FIG. 22C, the insulator 155 may be formed such that its side surface is positioned on the inner side of the side surface of the conductor 110. In this case, the side surfaces of the insulator 130, the conductor 120, and the insulator 155 are preferably aligned with each other. In addition, the insulator 152a is provided to cover the conductor 110, the insulator 130, the conductor 120, and the insulator 155. The insulator 152b is provided over the insulator 152a.

In FIG. 22C, as in FIG. 20A, the insulator 286 is provided over the insulator 152b, and an opening reaching the conductor 120 is formed in the insulator 155, the insulator 152a, the insulator 152b, and the insulator 286. As in FIG. 20A, the conductor 288 and the insulator 289 are placed in the opening.

Although not illustrated in FIG. 20A, a conductor 162 is provided over and in contact with the conductor 288, an insulator 166 is provided over the conductor 162, an insulator 168a is provided to cover the conductor 162 and the insulator 166, and an insulator 168b is provided over the insulator 168a in FIG. 22C. Although the capacitor 100, the conductor 288, the conductor 162, and the like are illustrated in the same cross section in FIG. 22C, the present invention is not limited thereto. In some cases, contact between the conductor 162 and the conductor 120 is formed in a place other than a place where the capacitor 100 and the conductor 162 overlap with each other.

The conductor 162 is a conductor functioning as a wiring, and may be electrically connected to the wiring 1005 like the conductor 288 illustrated in FIG. 20A. For the conductor 162, a conductive material that can be used for the conductor 112 is used.

An insulator similar to the insulator 155 can be used as the insulator 166, an insulator similar to the insulator 152a can be used as the insulator 168a, and an insulator similar to the insulator 152b can be used as the insulator 168b. With such a structure, the insulator 286, the conductor 288, and the conductor 162 can be interposed between the insulator 168a and the insulator 152b that function as barrier insulating films against hydrogen. Furthermore, the insulator 166 having a function of capturing and fixing hydrogen is placed in the region interposed between the insulator 168a and the insulator 152b. Accordingly, hydrogen diffusion from the outside of the insulator 168b and the insulator 152a can be inhibited, hydrogen in the insulator 168b and the insulator 152a can be captured and fixed, and the hydrogen concentration in the insulator 286, the conductor 288, the conductor 162, and the like can be reduced. By reducing the hydrogen concentration in the insulator 286, the conductor 288, the conductor 162, and the like in this manner, hydrogen diffusion into the insulator 130 can be inhibited, and therefore the ferroelectricity of the insulator 130 can be enhanced.

Next, a method for fabricating the structure illustrated in FIG. 22C is described with reference to FIG. 23A to FIG. 23B. Note that the description in the above embodiment, for example, can be referred to for the details of the device and the process.

First, the conductor 110 is deposited over the insulator 287. The conductor 110 can be deposited by a sputtering method, a CVD method, an MBE method, a PLD method, an ALD method, or the like. Titanium nitride can be used for the conductor 110, for example. Here, CMP treatment or the like is preferably performed on the top surface of the conductor 110 to improve the planarity of the conductor 110.

For example, the top surface roughness of the conductor 110 represented by arithmetic mean roughness (Ra) or root mean square roughness (RMS) is less than or equal to 2 nm, preferably less than or equal to 1 nm, more preferably less than or equal to 0.8 nm, further preferably less than or equal to 0.5 nm, still further preferably less than or equal to 0.4 nm, yet still further preferably less than or equal to 0.2 nm. Improving the planarity of the top surface of the conductor 110 in this manner can improve the crystallinity of the insulator 130 formed in a later step.

Figure 23A:
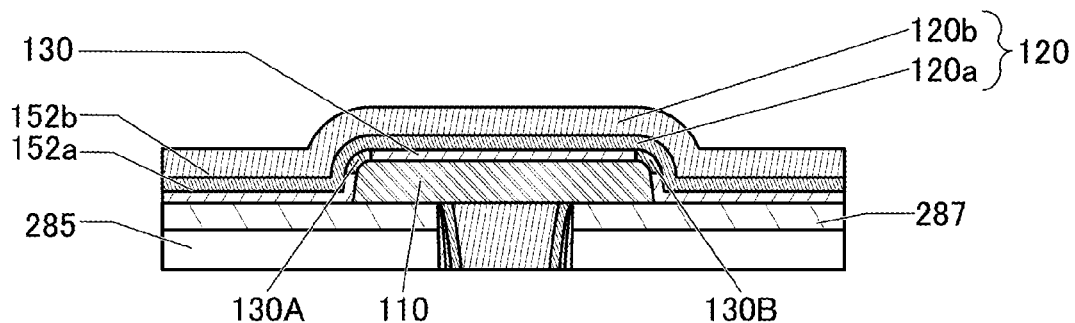
FIG. 23A to FIG. 23D are cross-sectional views illustrating a method for fabricating a storage device of one embodiment of the present invention.

Next, the conductor 110 is formed into a pattern by a photolithography method or the like (see FIG. 23A). Here, the conductor 110 is preferably formed into a pattern to cover the conductor 288.

Then, the insulator 130 is deposited to cover the conductor 110 (see FIG. 23A). The insulator 130 can be deposited by a sputtering method, a CVD method, an ALD method, or the like. For example, the deposition is performed by a thermal ALD method. For example, $HfZrO_x$ can be used for the insulator 130. Here, a material not containing a hydrocarbon is suitably used as a precursor. With the use of such a precursor, hydrogen, carbon, a hydrocarbon, or the like in the insulator 130 can be reduced. For example, $HfCl_4$ and/or $ZrCl_4$ can be used as the precursor. In the case where the insulator 130 is deposited by a thermal ALD method, $H_2O$, $O_3$, or the like can be used as an oxidizer.

In the case where a precursor contains chlorine, chlorine contained in the insulator 130 is preferably reduced as much as possible. For example, chlorine contained in the insulator 130 can be reduced by setting the substrate temperature during the thermal ALD at higher than or equal to 400° C. In the case where deposition is performed according to the deposition sequence shown in FIG. 7A, the introduction time of an oxidizer $H_2O$ is preferably long. This can sufficiently make chlorine bonded to a formation surface be detached therefrom, and thus can sufficiently reduce the concentration of chlorine contained in the insulator 130.

As illustrated in FIG. 23A, in the insulator 130, the polycrystalline region 131a and the polycrystalline region 131b are formed in the upper sides of the side end portions of the conductor 110 in some cases.

Next, the conductor 120a is deposited over the insulator 130 (see FIG. 23A). The conductor 120a can be deposited by a sputtering method, a CVD method, an MBE method, a PLD method, an ALD method, or the like. Titanium nitride deposited by an ALD method or a sputtering method can be used as the conductor 110, for example.

Next, the conductor 120b is deposited over the conductor 120a (see FIG. 23A). The conductor 120b can be deposited by a sputtering method, a CVD method, an MBE method, a PLD method, an ALD method, or the like. Tungsten deposited by a metal CVD method can be used for the conductor 110, for example. Note that the conductor 120b is not necessarily deposited, and the conductor 120 may have a single-layer structure of only the conductor 120a, for example.

Furthermore, heat treatment is preferably performed after formation of the conductor 120. For example, the substrate temperature during the heat treatment is set to be higher than or equal to 300° C., preferably higher than or equal to 325° C., further preferably higher than or equal to 350° C. Furthermore, the substrate temperature during the deposition is set to be lower than or equal to 600° C., preferably lower than or equal to 500° C., further preferably lower than or equal to 450° C., for example. For example, the substrate temperature is set at approximately 500° C. In addition, the heat treatment time is approximately longer than or equal to 30 seconds and shorter than or equal to 120 seconds, for example. The heat treatment can be performed in an atmosphere containing at least one of an oxygen gas, a nitrogen gas, and an inert gas.

Such heat treatment promotes crystallization of the insulator 130 and can improve the crystallinity. In other words, a single crystal region in the insulator 130 can be made large. In the case where a deposition method with substrate heating, such as a thermal ALD method, is used for the deposition of the conductor 120, the insulator 130 can be sufficiently crystallized even without the above heat treatment in some cases.

Figure 23B:
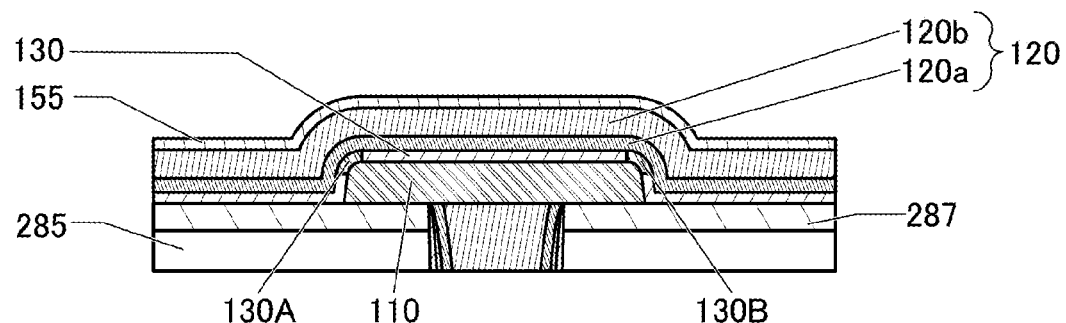

Then, the insulator 155 is deposited over the conductor 120b (see FIG. 23B). The insulator 155 can be deposited by a sputtering method, a CVD method, an MBE method, a PLD method, an ALD method, or the like. As the insulator 155, an insulator that can be used as the insulator 214, the insulator 282, or the like and has a function of capturing and fixing hydrogen is preferably used. For example, aluminum oxide deposited by an ALD method or a sputtering method can be used as the insulator 155. The thickness of the insulator 155 is approximately greater than or equal to 20 nm and less than or equal to 40 nm, for example.

Providing the insulator 155 over the conductor 120 in this manner makes it possible to capture and fix hydrogen contained in the insulator 130 of the capacitor 100 to reduce the hydrogen concentration in the insulator 130. Accordingly, the crystallinity of the insulator 130 can be improved and the ferroelectricity of the insulator 130 can be enhanced.

Figure 23C:
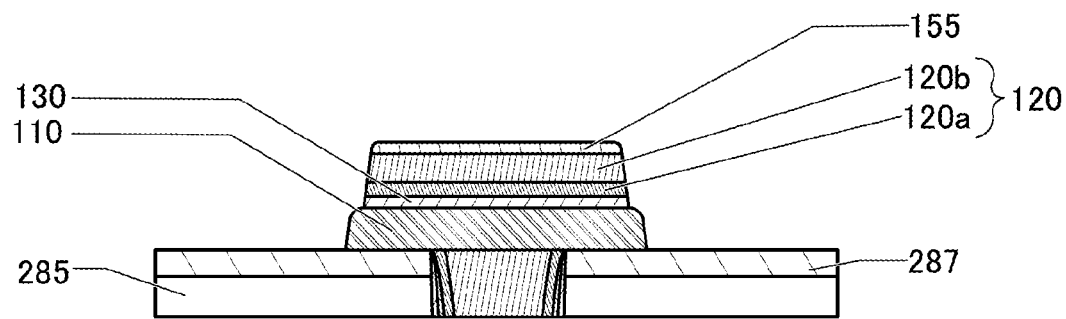

Next, the insulator 130, the conductor 120a, the conductor 120b, and the insulator 155 are formed into a pattern by a photolithography method or the like (see FIG. 23C). Thus, the side surfaces of the insulator 130, the conductor 120a, the conductor 120b, and the insulator 155 are positioned on the inner side of the side surface of the conductor 110. Accordingly, the polycrystalline region 131a and the polycrystalline region 131b formed in the insulator 130 can be removed, so that the insulator 130 containing many single crystals and having high crystallinity can be formed.

Figure 23D:
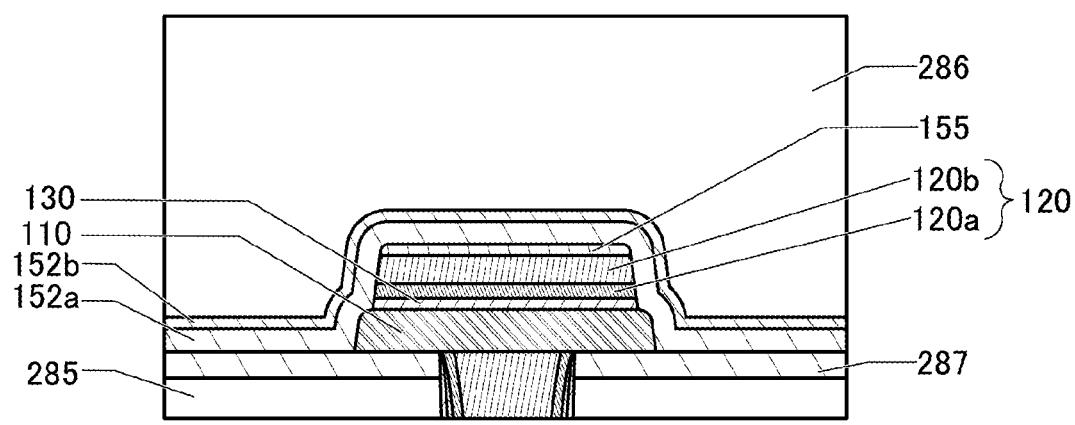

Next, the insulator 152a is deposited to cover the insulator 287, the conductor 110, the insulator 130, the conductor 120, and the insulator 155, and the insulator 152b is deposited over the insulator 152a (see FIG. 23D). As the insulator 152a and the insulator 152b, a barrier insulating film that can be used for the above-described insulator 283 or the like is used. Providing the insulator 152a and the insulator 152b in this manner can inhibit impurities such as hydrogen contained in the insulator 286 and the like from diffusing into the insulator 130 of the capacitor 100. Here, the thickness of the insulator 152a can be approximately greater than or equal to 10 nm and less than or equal to 40 nm, for example. The thickness of the insulator 152b can be approximately greater than or equal to 3 nm and less than or equal to 10 nm, for example.

The insulator 152a is deposited by a sputtering method. For example, silicon nitride deposited by a sputtering method can be used as the insulator 152a. A deposition gas in a sputtering method need not include molecules containing hydrogen, and therefore the hydrogen concentration in the insulator 152a can be reduced. Since the hydrogen concentration in the insulator 152a in contact with the conductor 112 and the insulator 285 is reduced in this manner, hydrogen can be inhibited from diffusing from the insulator 152a into the conductor 112 and the insulator 285.

The insulator 152b is preferably deposited by an ALD method, particularly a PEALD method. For example, silicon nitride deposited by a PEALD method can be used as the insulator 152b. Thus, the insulator 152b can be deposited with good coverage; therefore, even when a pinhole, disconnection, or the like is generated in the insulator 152a owing to unevenness of the base, the insulator 152b covers it, whereby hydrogen can be inhibited from diffusing into the conductor 112 and the insulator 285.

By forming the insulator 152a and the insulator 152b in this manner, the capacitor 100 can be sealed with the insulator 155, the insulator 152a, the insulator 152b, and the insulator 287.

Then, the insulator 286 is deposited over the insulator 152b (see FIG. 23D). An opening reaching the conductor 120 is formed in the insulator 286, the insulator 152b, the insulator 152a, and the insulator 155, and the conductor 288 and the insulator 289 are formed in the opening (see FIG. 22C).

Next, the conductor 162 is formed over the conductor 288 in a manner similar to that of the conductor 110, and the insulator 166 is formed over the conductor 162 in a manner similar to that of the insulator 155 (see FIG. 22C). The insulator 168a is deposited to cover the insulator 286, the conductor 162, and the insulator 166 in a manner similar to that of the insulator 152a, and the insulator 168b is deposited over the insulator 168a in a manner similar to that of the insulator 152b (see FIG. 22C).

Heat treatment is preferably performed after the deposition of the insulator 168b. For example, the substrate temperature during the heat treatment is set to be higher than or equal to 300° C., preferably higher than or equal to 325° C., further preferably higher than or equal to 350° C. Furthermore, the substrate temperature during the deposition is set to be lower than or equal to 600° C., preferably lower than or equal to 500° C., further preferably lower than or equal to 450° C., for example. For example, the substrate temperature is set at approximately 400° C. The heat treatment time is approximately longer than or equal to 1 hour and shorter than or equal to 10 hours, for example. The heat treatment can be performed in an atmosphere containing at least one of an oxygen gas, a nitrogen gas, and an inert gas. Note that the heat treatment is not necessarily performed after deposition of the insulator 168b, and can be performed as appropriate after deposition of the insulator 152b.

By such heat treatment, hydrogen diffusion from the outside of the insulator 152b and the insulator 287 into the capacitor 100 can be inhibited, and furthermore, hydrogen in the insulator 152b and the insulator 287 can be captured and fixed, so that the hydrogen concentration in the insulator 130 of the capacitor 100 can be reduced. Therefore, the ferroelectricity of the insulator 130 can be enhanced.

In addition, the insulator 166 having a function of capturing and fixing hydrogen is placed in a region interposed between the insulator 168a and the insulator 152b. Thus, hydrogen diffusion from the outside of the insulator 168b and the insulator 152a during the heat treatment can be inhibited, and furthermore, hydrogen in the insulator 168b and the insulator 152a can be captured and fixed, so that the hydrogen concentrations in the insulator 286, the conductor 288, the conductor 162, and the like can be reduced.

Although the storage device illustrated in FIG. 20A having a structure where the transistor 200 and the capacitor 100 are not electrically connected to each other is described above, the present invention is not limited thereto. In the structure illustrated in FIG. 20A, one or more of the wiring 1003, the wiring 1004, the wiring 1006, and the wiring 1008 that are electrically connected to the transistor 200 may be electrically connected to one or both of the wiring 1005 and the wiring 1009 that are electrically connected to the capacitor 100. In addition, part or whole of the description of the storage devices illustrated in FIG. 20A to FIG. 22C may be employed for devices illustrated in FIG. 18, FIG. 19, FIG. 24 to FIG. 27, and the like.

Variation Example 2 of Storage Device

Figure 24:
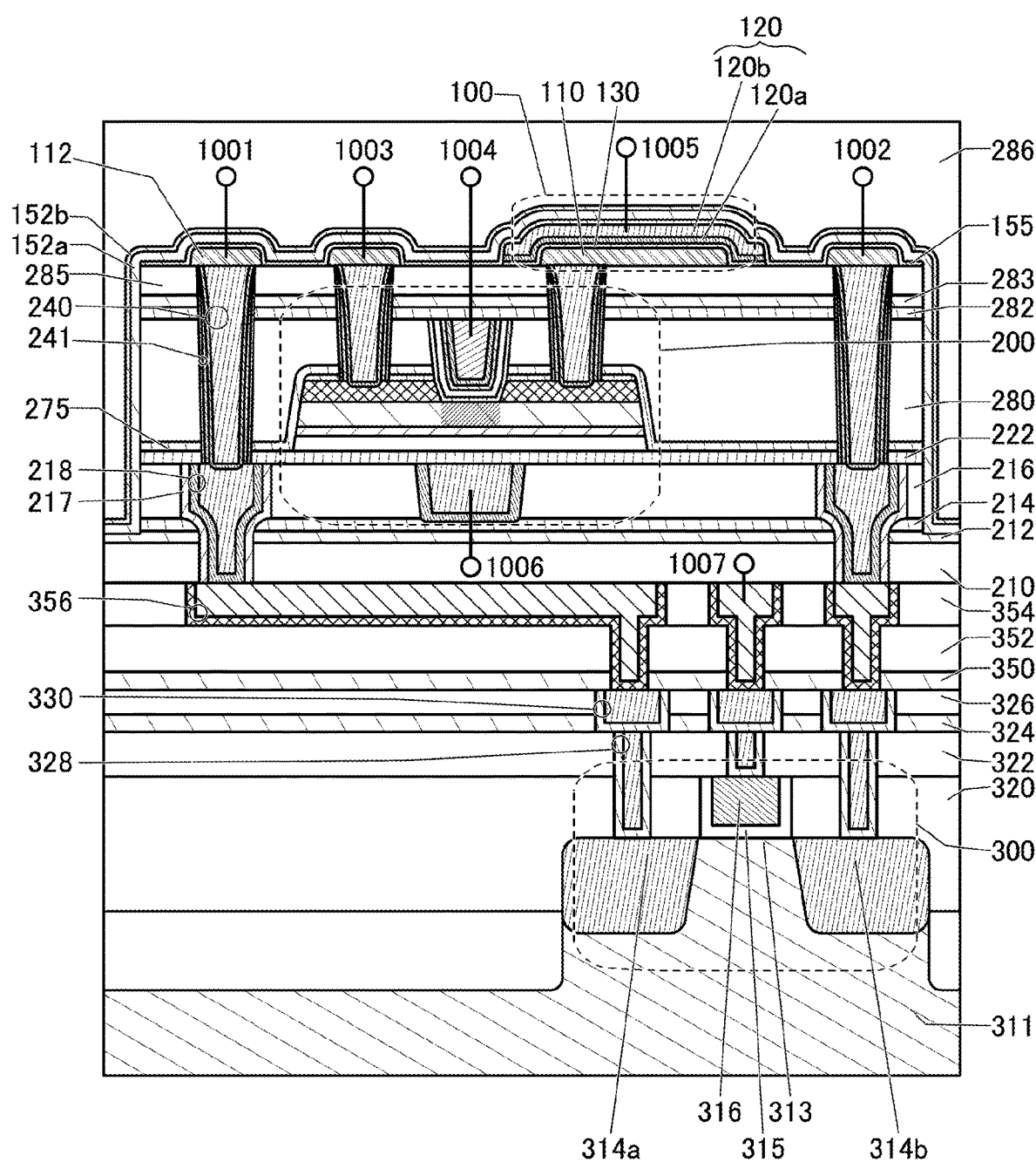
FIG. 24 is a cross-sectional view illustrating a structure of a storage device of one embodiment of the present invention.

Although the transistor 200 and the capacitor 100 are individually sealed with the barrier insulating films against hydrogen in the storage device illustrated in FIG. 19, the present invention is not limited thereto. As illustrated in FIG. 24, the transistor 200 and the capacitor 100 may be collectively sealed with the barrier insulating films against hydrogen (the insulator 212, the insulator 152a, and the insulator 152b).

In the storage device illustrated in FIG. 24, an opening reaching the insulator 212 is formed in the insulator 214, the insulator 216, the insulator 222, the insulator 275, the insulator 280, the insulator 282, the insulator 283, the insulator 285, and the insulator 155. The insulator 152a and the insulator 152b over the insulator 155 are formed along the side surface and the bottom surface of the opening. The insulator 152a is in contact with the top surface of the insulator 212 at the bottom surface of the opening.

With such a structure, the transistor 200 and the capacitor 100 can be collectively sealed with the insulator 212, the insulator 152a, and the insulator 152b. Thus, diffusion of hydrogen into the capacitor 100 and the transistor 200 from the outside of the insulator 212 and the insulator 152b can be inhibited to reduce the hydrogen concentrations in the insulator 130 of the capacitor 100 and the oxide semiconductor film of the transistor 200. Therefore, the ferroelectricity of the insulator 130 can be enhanced and the electrical characteristics and reliability of the transistor 200 can be improved.

Variation Example 3 of Storage Device

Figure 25:
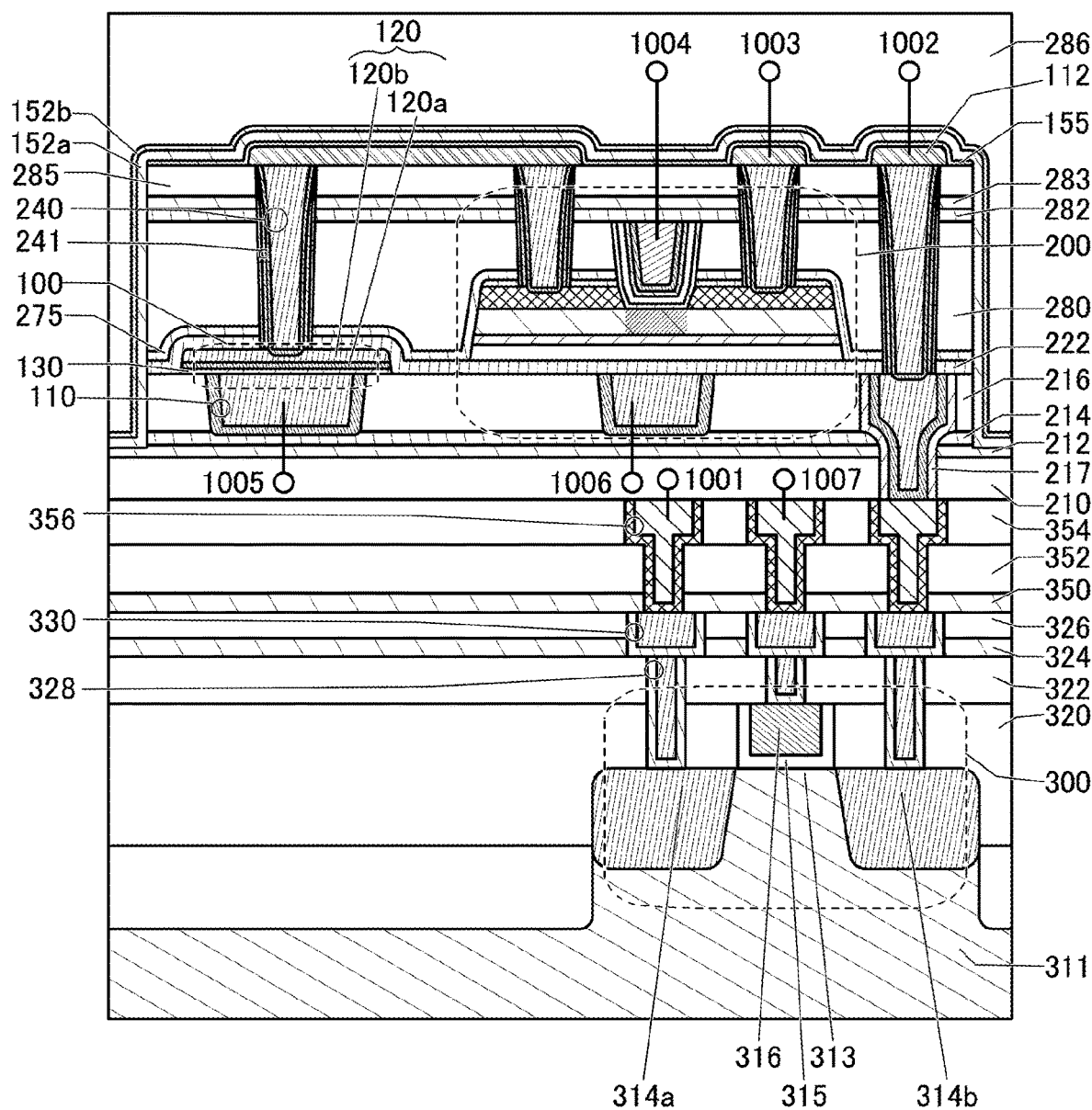
FIG. 25 is a cross-sectional view illustrating a structure of a storage device of one embodiment of the present invention.

Although the capacitor 100 is provided over the transistor 200 in the storage device illustrated in FIG. 24, the present invention is not limited thereto. As illustrated in FIG. 25, the capacitor 100 may be provided in the same layer as the transistor 200.

As illustrated in FIG. 25, the conductor 110 functioning as the lower electrode of the capacitor 100 is preferably formed using a conductor in the same layer as the conductor 205 functioning as the back gate of the transistor 200. The insulator 130 is placed over the conductor 110, and the conductor 120 (the conductor 120a and the conductor 120b) is placed over the insulator 130. Here, the insulator 130 preferably covers the top surface of the conductor 110 and separates the conductor 110 and the conductor 120. Note that the structures of the insulator 130 and the conductor 120 can be made similar to those illustrated in FIG. 19 and the like, and the description of [Structure example of storage device] and the above embodiments can be referred to for the details. The insulator 222 is placed to cover the insulator 130 and the conductor 120.

The conductor 240 is provided in contact with the top surface of the conductor 120a, and the conductor 112 is provided in contact with the top surface of the conductor 240. The conductor 112 is in contact with the conductor 240 electrically connected to one of the source and the drain of the transistor 200. In other words, the conductor 120 functioning as the upper electrode of the capacitor 100 illustrated in FIG. 25 is electrically connected to the one of the source and the drain of the transistor 200. Furthermore, the conductor 110 functioning as the lower electrode of the capacitor 100 is electrically connected to the wiring 1005.

As in the storage device illustrated in FIG. 24, the transistor 200 and the capacitor 100 can be collectively sealed with the insulator 212, the insulator 152a, and the insulator 152b. Thus, diffusion of hydrogen into the capacitor 100 and the transistor 200 from the outside of the insulator 212 and the insulator 152b can be inhibited to reduce the hydrogen concentrations in the insulator 130 of the capacitor 100 and the oxide semiconductor film of the transistor 200. Therefore, the ferroelectricity of the insulator 130 can be enhanced and the electrical characteristics and reliability of the transistor 200 can be improved.

Variation Example 4 of Storage Device

Figure 26A:
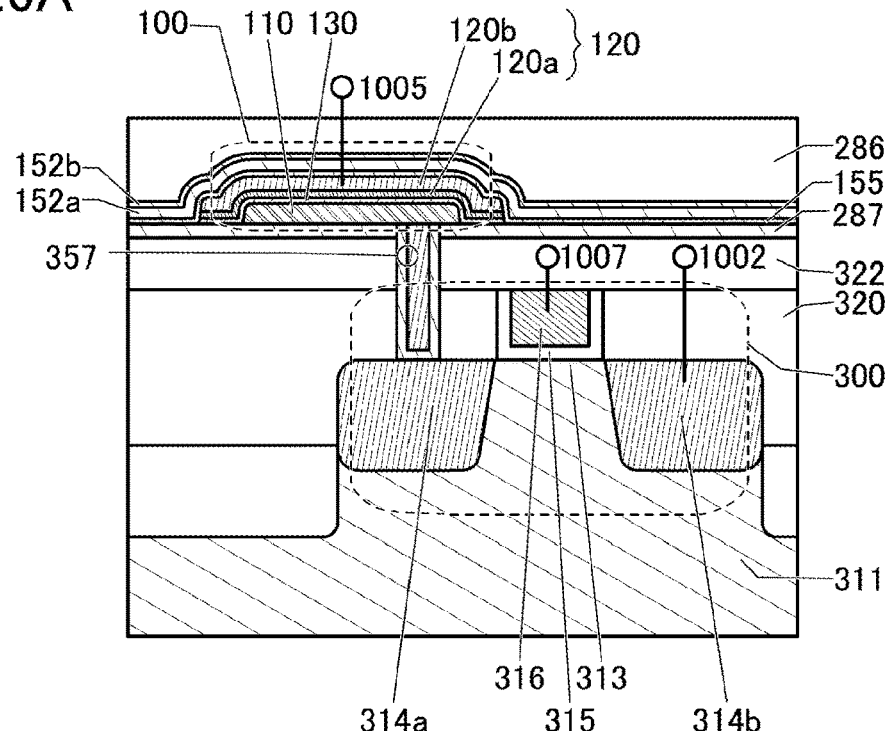
FIG. 26A and FIG. 26B are cross-sectional views illustrating structures of a storage device of one embodiment of the present invention.

Although the transistor 200 is provided over the transistor 300 and the capacitor 100 is connected to the transistor 200 in the storage device illustrated in FIG. 19 or the like, the present invention is not limited thereto. As illustrated in FIG. 26A, the capacitor 100 may be connected to the transistor 300 without provision of the transistor 200.

As illustrated in FIG. 26A, an opening reaching the low-resistance region 314a of the transistor 300 is formed in the insulator 320, the insulator 322, and the insulator 287, and a conductor 357 is formed to be embedded in the opening. As the conductor 357, a conductor similar to the conductor 328 and the like can be used. The top surface of the conductor 357 is in contact with the bottom surface of the conductor 110 of the capacitor 100. In this manner, the conductor 110 functioning as the lower electrode of the capacitor 100 and the low-resistance region 314a functioning as one of the source and the drain of the transistor 300 are connected to each other through the conductor 357. Note that the structures of the transistor 300, the capacitor 100, and the layers including them are similar to those in the structure illustrated in FIG. 19, and therefore the description of the structure illustrated in FIG. 19 can be referred to.

Furthermore, in the storage device illustrated in FIG. 26A, the capacitor 100 can be sealed with the insulator 287, the insulator 152a, and the insulator 152b as in the storage device illustrated in FIG. 19. Accordingly, diffusion of hydrogen into the capacitor 100 from the outside of the insulator 287 and the insulator 152b can be inhibited to reduce the hydrogen concentration in the oxide semiconductor film of the insulator 130 of the capacitor 100. Therefore, the ferroelectricity of the insulator 130 can be enhanced.

Figure 26B:
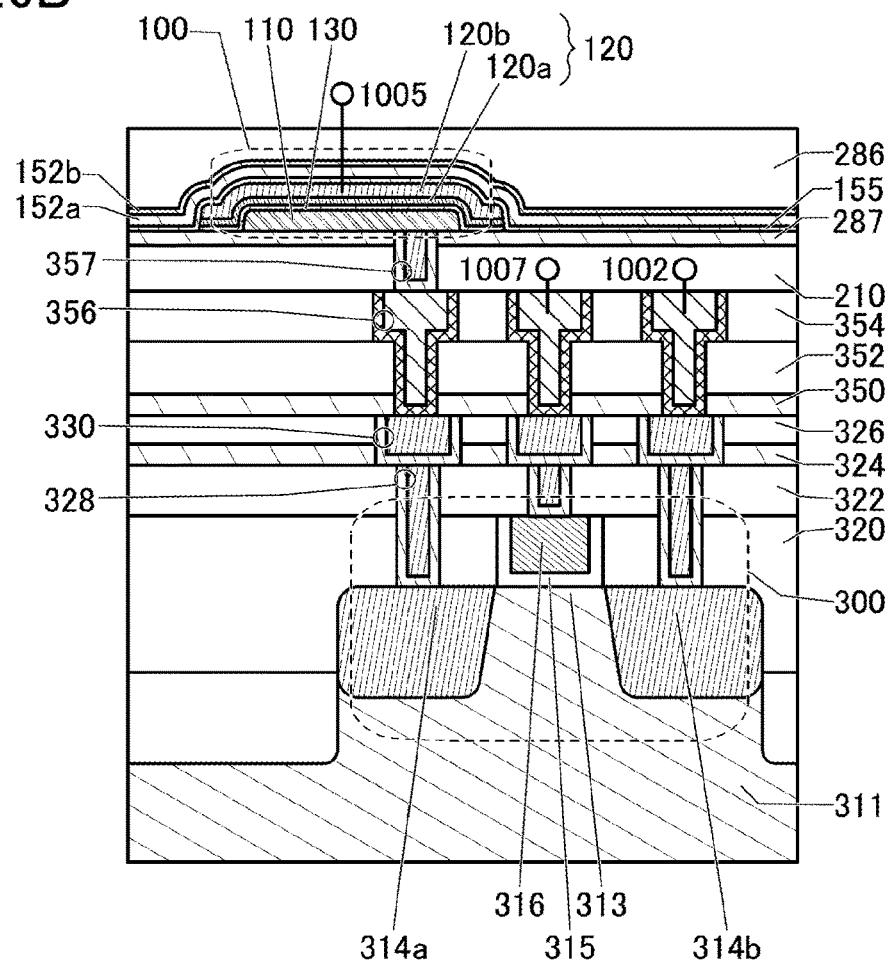

Although the low-resistance region 314a of the transistor 300 and the conductor 110 of the capacitor 100 are directly connected to each other with the conductor 357 in the structure illustrated in FIG. 26A, the present invention is not limited thereto. The plurality of wiring layers illustrated in FIG. 19 and the like may be provided between the capacitor 100 and the transistor 300. For example, as illustrated in FIG. 26B, the conductor 328 may be formed over the transistor 300, the conductor 330 may be formed over the conductor 328, the conductor 356 may be formed over the conductor 330, and the conductor 357 may be formed over the conductor 356. The low-resistance region 314a of the transistor 300 and the conductor 110 of the capacitor 100 are electrically connected to each other with the conductor 328, the conductor 330, the conductor 356, and the conductor 357. Note that the description of [Structure example of storage device] can be referred to for the conductor 328, the conductor 330, the conductor 356, and the wiring layers including them.

Variation Example of Transistor

Although the transistor 200 is connected to the capacitor 100 containing the material that can have ferroelectricity in the structure illustrated FIG. 19 and the like, the present invention is not limited thereto. For example, a material that can have ferroelectricity may be used for the transistor 200 and an insulator provided in the vicinity thereof. The transistor with such a structure is described with reference to FIG. 27A to FIG. 27C. Note that each of the transistors 200 illustrated in FIG. 27A to FIG. 27C is the one in which the conductor 240a, the conductor 240b, the conductor 246a, the conductor 246b, the insulator 241a, and the insulator 241b are provided in the transistor 200 illustrated in FIG. 11 instead of the capacitor 100.

Figure 27A:
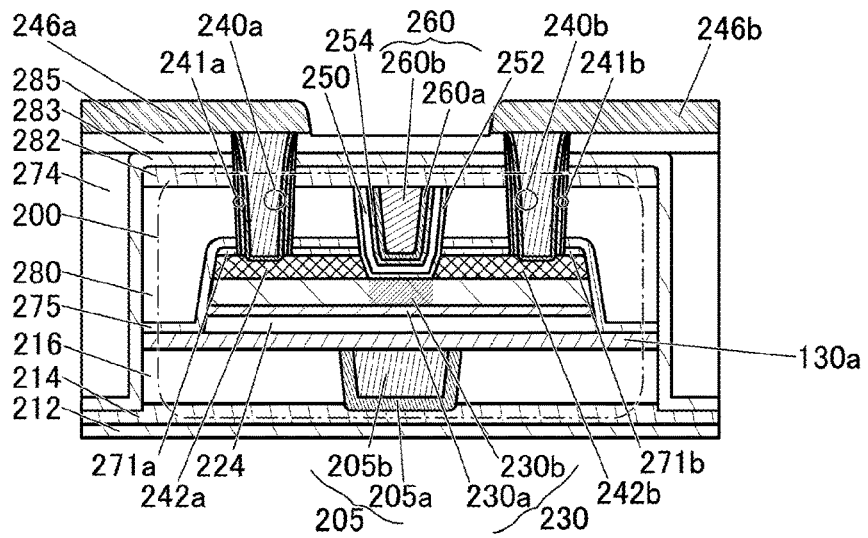
FIG. 27A to FIG. 27C are cross-sectional views of a semiconductor device of one embodiment of the present invention.

In the transistor 200 illustrated in FIG. 27A, an insulator 130a is used instead of the insulator 222. A material similar to that for the insulator 130, which can have ferroelectricity, can be used for the insulator 130a. That is, a material that can have ferroelectricity is used for the second gate insulator of the transistor 200 illustrated in FIG. 27A.

Figure 27B:
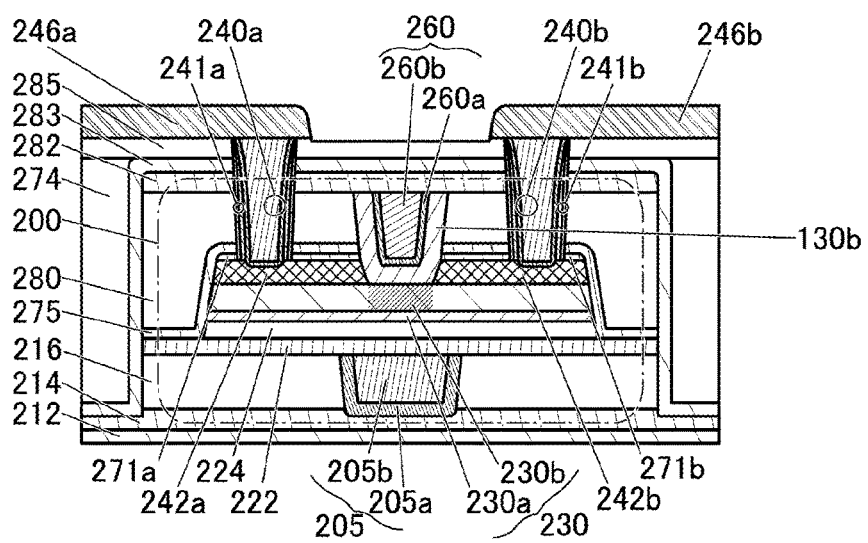

In the transistor 200 illustrated in FIG. 27B, an insulator 130b is used instead of the insulator 252, the insulator 250, and the insulator 254. A material similar to that for the insulator 130, which can have ferroelectricity, can be used for the insulator 130b. That is, a material that can have ferroelectricity is used for the first gate insulator in the transistor 200 illustrated in FIG. 27B. Such a structure allows the transistor 200 illustrated in FIG. 27B to function as an FeFET illustrated in FIG. 1B1. Note that although the whole first gate insulator is formed using a ferroelectric material in FIG. 27B, the present invention is not limited thereto. For example, a material that can have ferroelectricity may be used for one or more of the insulator 252, the insulator 250a, the insulator 250b, and the insulator 254, which are illustrated in FIG. 12B.

Figure 27C:
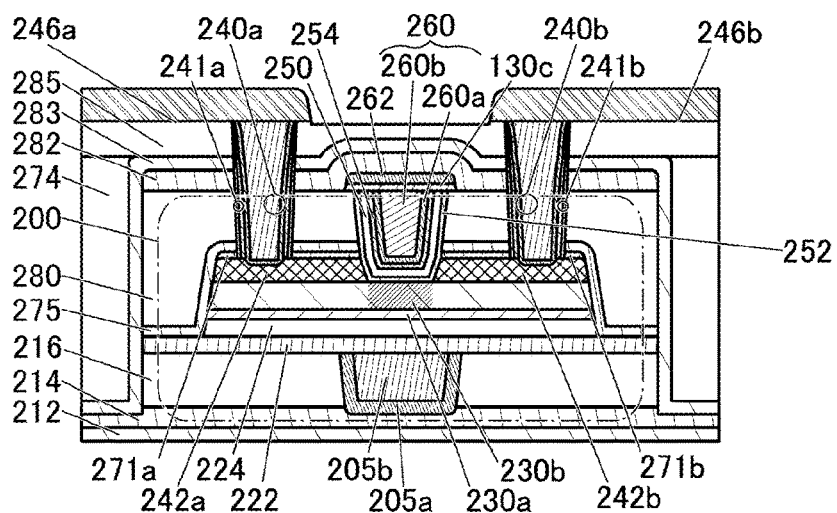

In the transistor 200 illustrated in FIG. 27C, an insulator 130c is provided over the insulator 260, and the conductor 262 is provided over the insulator 130c. A material similar to that for the insulator 130, which can have ferroelectricity, can be used for the insulator 130c. The conductive material that can be used for the conductor 260 can be used for the conductor 262. The insulator 282 is provided to cover the insulator 130c and the conductor 262. The semiconductor device illustrated in FIG. 27C can also be regarded as the semiconductor device in which the gate electrode of the transistor 200 is provided with one terminal of the ferroelectric capacitor.

Although an example of the transistor 200 is described above, the present invention is not limited thereto. For example, also in the transistor 300 illustrated in FIG. 26, a material that can have ferroelectricity can be used as in the transistor 200 illustrated in FIG. 27A to FIG. 27C. For example, when a silicon substrate is used as the substrate 311 of the transistor 300, the Si transistor can function as an FeFET.

At least part of the structure, method, and the like described in this embodiment can be implemented in appropriate combination with any of those in the other embodiments, the other examples, and the like described in this specification.

Embodiment 4

In this embodiment, a storage device of one embodiment of the present invention, which includes a transistor in which oxide is used for a semiconductor (hereinafter referred to as an OS transistor in some cases) and a ferroelectric capacitor, will be described with reference to FIG. 28A and FIG. 28B. The device of this embodiment is a storage device that includes at least a capacitor and an OS transistor controlling charging and discharging of the capacitor. The device of this embodiment functions as a one-transistor one-capacitor ferroelectric memory that includes a ferroelectric capacitor.

Structure Example of Storage Device

Figure 28A:
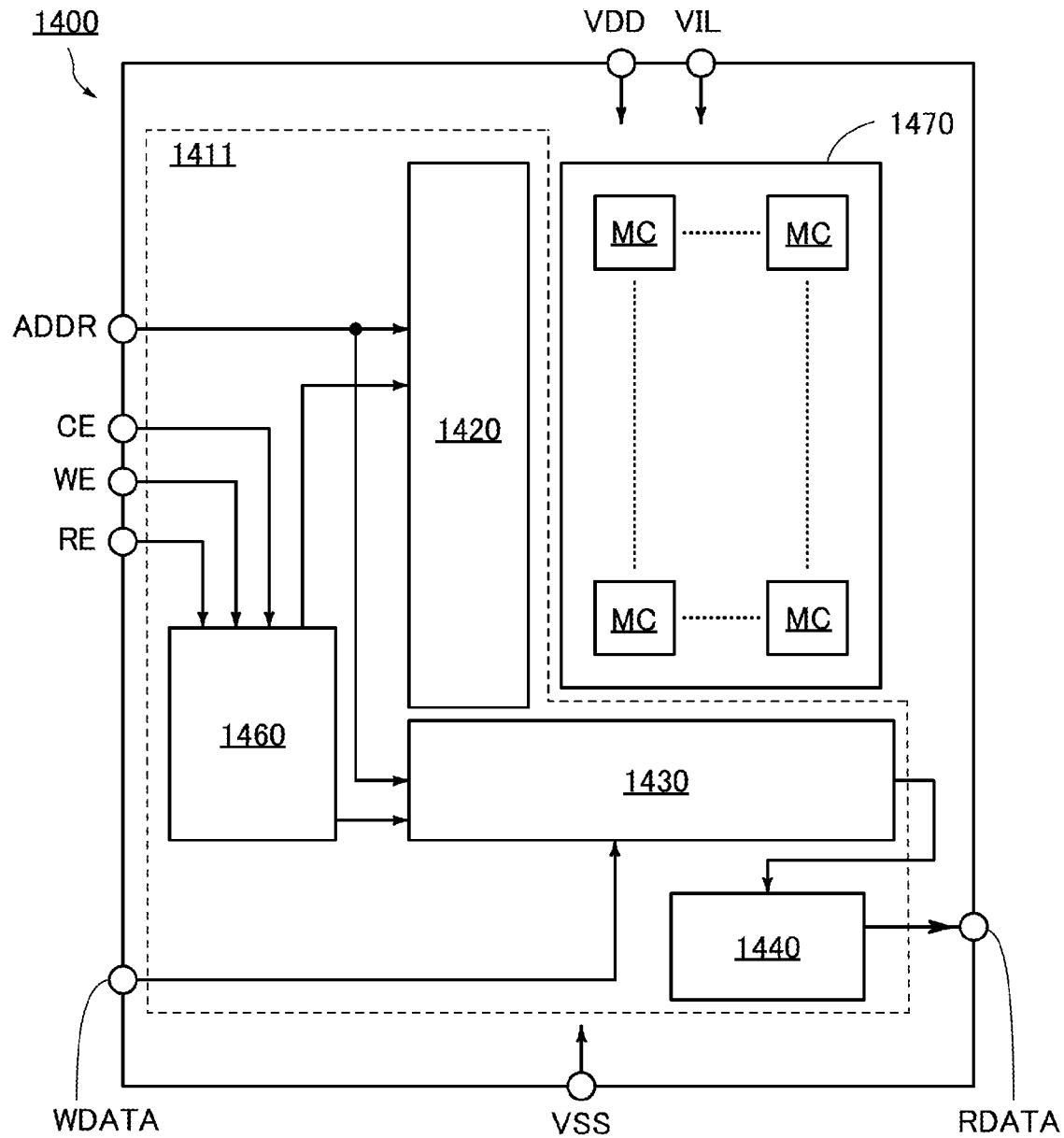
FIG. 28A is a block diagram illustrating a structure example of a storage device of one embodiment of the present invention.
Figure 28B:
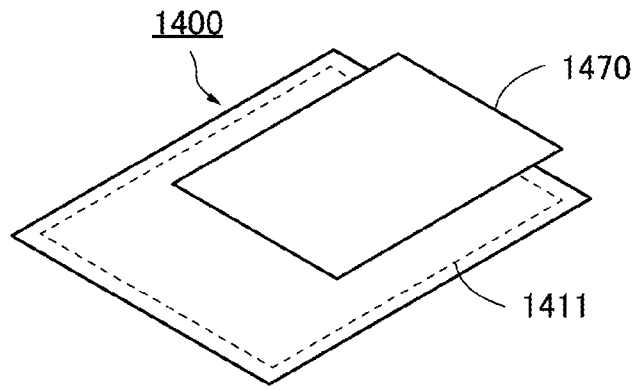
FIG. 28B is a perspective view illustrating a structure example of the storage device of one embodiment of the present invention.

FIG. 28A illustrates a structure example of a storage device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a bit line driver circuit, a precharge circuit, a sense amplifier, a write circuit, and the like. The precharge circuit has a function of precharging wirings. The sense amplifier has a function of amplifying a data signal read from a memory cell. Note that the wirings are connected to memory cells included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 and the row circuit 1420 depends on the structure of the memory cell MC, the number of memory cells MC in a column, and the like. The number of wirings that connect the memory cell array 1470 and the column circuit 1430 depends on the structure of the memory cell MC, the number of memory cells MC in a row, and the like.

Note that FIG. 28A illustrates an example where the peripheral circuit 1411 and the memory cell array 1470 are formed on the same plane; however, this embodiment is not limited thereto. For example, as illustrated in FIG. 28B, the memory cell array 1470 may be provided to overlap with part of the peripheral circuit 1411. For example, the sense amplifier may be provided below the memory cell array 1470 so that they overlap with each other.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed. The storage device of one embodiment of the present invention operates fast and can retain data for a long time.

Structure Example of Memory Cell

The circuit diagram in FIG. 29A shows a structure example of the memory cell MC described above. The memory cell MC includes a transistor Tr and a capacitor Fe. Here, as the memory cell MC, the semiconductor device including the transistor 200 and the capacitor 100, which is described in the above embodiment, can be used, for example. In this case, the transistor Tr and the capacitor Fe correspond to the transistor 200 and the capacitor 100, respectively. Note that the transistor Tr may have a back gate in addition to the gate or may have no back gate. The transistor Tr is illustrated as an n-channel transistor in FIG. 29A, but may be a p-channel transistor.

One of a source and a drain of the transistor Tr is electrically connected to a wiring BL. The other of the source and the drain of the transistor Tr is electrically connected to one electrode of the capacitor Fe. The gate of the transistor Tr is electrically connected to a wiring WL. The other electrode of the capacitor Fe is electrically connected to a wiring PL.

The wiring WL has a function of a word line and can control on/off of the transistor Tr by controlling the potential of the wiring WL. For example, setting the potential of the wiring WL to a high potential can bring the transistor Tr into an on state; setting the potential of the wiring WL to a low potential can bring the transistor Tr into an off state. The wiring WL is electrically connected to the word line driver circuit included in the row circuit 1420, and the potential of the wiring WL can be controlled by the word line driver circuit.

The wiring BL has a function of a bit line. When the transistor Tr is in an on state, a potential corresponding to the potential of the wiring BL is supplied to the one electrode of the capacitor Fe. The wiring BL is electrically connected to the bit line driver circuit of the column circuit 1430. The bit line driver circuit has a function of generating data to be written to the memory cell MC. Furthermore, the bit line driver circuit has a function of reading data output from the memory cell MC. Specifically, the sense amplifier is provided in the bit line driver circuit, and data output from the memory cell MC can be read using the sense amplifier.

The wiring PL has a function of a plate line, and the potential of the wiring PL can be set to the potential of the other electrode of the capacitor Fe.

An OS transistor is preferably used as the transistor Tr. An OS transistor has a feature of high withstand voltage. Thus, the transistor Tr is an OS transistor, whereby a high voltage can be applied to the transistor Tr even when the transistor Tr is miniaturized. The miniaturization of the transistor Tr can reduce the area occupied by the memory cell MC. For example, the area occupied by one memory cell MC illustrated in FIG. 29A can be ⅓ to ⅙ of the area occupied by one SRAM cell. Accordingly, the memory cells MC can be arranged at high density. Therefore, the storage device of one embodiment of the present invention can have large storage capacity.

The capacitor Fe contains a material that can have ferroelectricity as a dielectric layer between the two electrodes. The dielectric layer included in the capacitor Fe is referred to as a ferroelectric layer in the following description.

As the material that can have ferroelectricity, the above-described material that can be used for the insulator 130 is used. In particular, hafnium oxide or a material containing hafnium oxide and zirconium oxide is preferable as the material that can have ferroelectricity because they can have ferroelectricity when processed into a several-nanometer-thick thin film. With the ferroelectric layer that can be made to be a thin film, the storage device combined with a miniaturized transistor can be obtained.

The ferroelectric layer has hysteresis characteristics. FIG. 29B1 is a graph showing an example of the hysteresis characteristics. The horizontal axis in FIG. 29B1 represents a voltage applied to the ferroelectric layer. The voltage can be a difference between the potential of one electrode of the capacitor Fe and the potential of the other electrode of the capacitor Fe, for example.

The vertical axis in FIG. 29B1 represents the amount of polarization of the ferroelectric layer and shows that negative electric charge is biased to the one electrode of the capacitor Fe and positive electric charge is biased to the other electrode of the capacitor Fe when the amount of polarization has a positive value. In contrast, when the amount of polarization has a negative value, it shows that negative electric charge is biased to the other electrode of the capacitor Fe and positive electric charge is biased to the one electrode of the capacitor Fe.

Note that the voltage represented by the horizontal axis of the graph of FIG. 29B1 may be a difference between the potential of the other electrode of the capacitor Fe and the potential of the one electrode of the capacitor Fe. Moreover, the amount of polarization (also referred to as polarization) represented by the vertical axis of the graph of FIG. 29B1 may have a positive value when negative electric charge is biased to the other electrode of the capacitor Fe and positive electric charge is biased to the one electrode of the capacitor Fe, and may have a negative value when negative electric charge is biased to the one electrode of the capacitor Fe and positive electric charge is biased to the other electrode of the capacitor Fe.

As shown in FIG. 29B1, the hysteresis characteristics of the ferroelectric layer can be represented by a curve 51 and a curve 52. Voltages at intersection points of the curve 51 and the curve 52 are referred to as VSP and −VSP. VSP and −VSP have different polarities.

After a voltage lower than or equal to −VSP is applied to the ferroelectric layer, the voltage applied to the ferroelectric layer is increased, so that the amount of polarization of the ferroelectric layer is increased according to the curve 51. In contrast, after a voltage higher than or equal to VSP is applied to the ferroelectric layer, the voltage applied to the ferroelectric layer is reduced, so that the amount of polarization of the ferroelectric layer is decreased according to the curve 52. Therefore, VSP and −VSP can be referred to as saturated polarization voltages. For example, VSP and −VSP may be called a first saturated polarization voltage and a second saturated polarization voltage, respectively. Although the absolute value of the first saturated polarization voltage and the absolute value of the second saturated polarization voltage are equal to each other in FIG. 29B1, they may be different from each other.

Here, in the case where the amount of polarization of the ferroelectric layer is varied according to the curve 51, the voltage applied to the ferroelectric layer at the time when the amount of polarization of the ferroelectric layer is 0 is referred to as Vc. When the amount of polarization of the ferroelectric layer is varied according to the curve 52, the voltage applied to the ferroelectric layer at the time when the amount of polarization of the ferroelectric layer is 0 is referred to as −Vc. Vc and −Vc can be referred to as coercive voltages. The value of Vc and the value of −Vc can be values between −VSP and VSP. Note that Vc and −Vc may be called a first coercive voltage and a second coercive voltage, respectively. Although the absolute value of the first coercive voltage and the absolute value of the second coercive voltage are equal to each other in FIG. 29B1, they may be different from each other.

As described above, the voltage applied to the ferroelectric layer included in the capacitor Fe can be represented by the difference between the potential of the one electrode of the capacitor Fe and the potential of the other electrode of the capacitor Fe. In addition, as described above, the other electrode of the capacitor Fe is electrically connected to the wiring PL. Thus, it is possible to control the voltage applied to the ferroelectric layer included in the capacitor Fe by controlling the potential of the wiring PL. Note that FIG. 29B2 is a graph showing an example of ideal hysteresis characteristics showing the amount of polarization of the ferroelectric layer. A straight line 52$i$ and a straight line 51$i$ shown in FIG. 29B2 represent the ideal amount of polarization of the ferroelectric layer. In order to obtain the hysteresis characteristics shown in FIG. 29B2, crystallinity of the ferroelectric material is improved, leak component from the ferroelectric material and the vicinity of the material is eliminated, or the impurity concentration in the ferroelectric material is reduced, for example. The metal oxide film of one embodiment of the present invention has high purity, and thus can be expected to have the hysteresis characteristics close to the ideal ones showing the amount of polarization of the ferroelectric layer shown in FIG. 29B2.

Example of Method for Driving Memory Cell

An example of a method for driving the memory cell MC illustrated in FIG. 29A will be described below. In the following description, the voltage applied to the ferroelectric layer of the capacitor Fe represents a difference between the potential of one electrode of the capacitor Fe and the potential of the other electrode of the capacitor Fe (the wiring PL). The transistor Tr is an re-channel transistor.

FIG. 29C is a timing chart showing an example of a method for driving the memory cell MC in FIG. 29A. In the example shown in FIG. 29C, binary digital data is written to and read from the memory cell MC. Specifically, in the example shown in FIG. 29C, data "1" is written to the memory cell MC in a period from Time T01 to Time T02, reading and rewriting are performed in a period from Time T03 to Time T05, reading and writing of data "0" to the memory cell MC are performed in a period from Time T11 to Time T13, reading and rewriting are performed in a period from Tim T14 to Time T16, and reading and writing of data "1" to the memory cell MC are performed in a period from Time T17 to Time T19.

The sense amplifier electrically connected to the wiring BL is supplied with Vref as a reference potential. In the reading operation shown in FIG. 29C and the like, when the potential of the wiring BL is higher than Vref, data "1" is read by the bit line driver circuit. On the other hand, when the potential of the wiring BL is lower than Vref, data "0" is read by the bit line driver circuit.

In the period from Time T01 to Time T02, the potential of the wiring WL is set to a high potential. Thus, the transistor Tr is brought into an on state. In addition, the potential of the wiring BL is set to Vw. Since the transistor Tr is in an on state, the potential of the one electrode of the capacitor Fe becomes Vw. Furthermore, the potential of the wiring PL is set to GND. Thus, the voltage applied to the ferroelectric layer of the capacitor Fe becomes "Vw–GND". Accordingly, data "1" can be written to the memory cell MC. Consequently, the period from Time T01 to Time T02 can be referred to as a write operation period.

Here, Vw is preferably VSP or higher, for example, preferably equal to VSP. GND can be set to a ground potential, for example; however, GND is not necessarily a ground potential as long as the memory cell MC can be driven enough to achieve an object of one embodiment of the present invention. For example, when the absolute value of the first saturated polarization voltage and the absolute value of the second saturated polarization voltage are different from each other and the absolute value of the first coercive voltage and the absolute value of the second coercive voltage are different from each other, GND can be a potential other than a ground potential.

In the period from Time T02 to Time T03, the potential of the wiring BL and the potential of the wiring PL are each set to GND. Accordingly, the voltage applied to the ferroelectric layer of the capacitor Fe becomes 0 V. Since the voltage "Vw–GND" applied to the ferroelectric layer of the capacitor Fe can be higher than or equal to VSP in the period from Time T01 to Time T02, the amount of polarization of the ferroelectric layer of the capacitor Fe is varied according to the curve 52 shown in FIG. 29B in the period from Time T02 to Time T03. Thus, no polarization inversion occurs in the ferroelectric layer of the capacitor Fe in the period from Time T02 to Time T03.

After the potential of the wiring BL and the potential of the wiring PL are set to GND, the potential of the wiring WL is set to a low potential. Accordingly, the transistor Tr is brought into an off state. Thus, the writing operation is completed and data "1" is retained in the memory cell MC. Note that the potentials of the wiring BL and the wiring PL can each be any potential as long as no polarization inversion occurs in the ferroelectric layer of the capacitor Fe, i.e., the voltage applied to the ferroelectric layer of the capacitor Fe is higher than or equal to −Vc that is the second coercive voltage.

In the period from Time T03 to Time T04, the potential of the wiring WL is set to a high potential. Thus, the transistor Tr is turned on. Furthermore, the potential of the wiring PL is set to Vw. With the potential of the wiring PL set to Vw, the potential applied to the ferroelectric layer of the capacitor Fe becomes "GND–Vw". As described above, the voltage applied to the ferroelectric layer of the capacitor Fe is "Vw–GND" in the period from Time T01 to Time T02. Accordingly, polarization inversion occurs in the ferroelectric layer of the capacitor Fe. In the polarization inversion, a current flows through the wiring BL, whereby the potential of the wiring BL becomes higher than Vref. Thus, the bit line driver circuit can read the data "1" retained in the memory cell MC. Therefore, the period from Time T03 to Time T04 can be referred to as a read operation period. Note that although Vref is higher than GND and lower than Vw, Vref may be higher than Vw, for example.

Since the above-described reading is destructive reading, the data "1" retained in the memory cell MC is lost. Thus, the potential of the wiring BL is set to Vw and the potential of the wiring PL is set to GND in the period from Time T04 to Time T05. Thus, data "1" is rewritten to the memory cell MC. Consequently, the period from Time T04 to Time T05 can be referred to as a rewrite operation period.

The potential of the wiring BL and the potential of the wiring PL are set to GND in a period from Time T05 to Time T11. After that, the potential of the wiring WL is set to a low potential. Thus, the rewrite operation is completed, and the data "1" is retained in the memory cell MC.

The potential of the wiring WL is set to a high potential and the potential of the wiring PL is set to Vw in a period from Time T11 to Time T12. Since the data "1" is retained in the memory cell MC, the potential of the wiring BL becomes higher than Vref, and the data "1" retained in the memory cell MC is read. Accordingly, the period from Time T11 to Time T12 can be referred to as a read operation period.

The potential of the wiring BL is set to GND in a period from Time T12 to Time T13. Since the transistor Tr is in an on state, the potential of the one electrode of the capacitor Fe is GND. In addition, the potential of the wiring PL is Vw. Accordingly, the voltage applied to the ferroelectric layer of the capacitor Fe becomes "GND–Vw". Thus, data "0" can be written to the memory cell MC. Consequently, the period from Time T12 to Time T13 can be referred to as a write operation period.

In the period from Time T13 to Time T14, the potential of the wiring BL and the potential of the wiring PL are each set to GND. Accordingly, the voltage applied to the ferroelectric layer of the capacitor Fe becomes 0 V. Since the voltage "GND–Vw" applied to the ferroelectric layer of the capacitor Fe can be lower than or equal to −VSP in the period from Time T12 to Time T13, the amount of polarization of the ferroelectric layer of the capacitor Fe is varied according to the curve 51 shown in FIG. 29B in the period from Time T13 to Time T14. Thus, no polarization inversion occurs in the ferroelectric layer of the capacitor Fe in the period from Time T13 to Time T14.

After the potential of the wiring BL and the potential of the wiring PL are set to GND, the potential of the wiring WL is set to a low potential. Accordingly, the transistor Tr is turned off. Thus, the writing operation is completed and data "0" is retained in the memory cell MC. Note that the potentials of the wiring BL and the wiring PL can each be any potential as long as no polarization inversion occurs in the ferroelectric layer of the capacitor Fe, i.e., the voltage applied to the ferroelectric layer of the capacitor Fe is lower than or equal to Vc that is the first coercive voltage.

In a period from Time T14 to Time T15, the potential of the wiring WL is set to a high potential. Thus, the transistor Tr is brought into an on state. Furthermore, the potential of the wiring PL is set to Vw. With the potential of the wiring PL set to Vw, the potential applied to the ferroelectric layer of the capacitor Fe becomes "GND–Vw". As described above, the voltage applied to the ferroelectric layer of the capacitor Fe is "GND–Vw" in the period from Time T12 to Time T13. Accordingly, no polarization inversion occurs in the ferroelectric layer of the capacitor Fe. Thus, the amount of current flowing through the wiring BL is smaller than that in the case where polarization inversion occurs in the ferroelectric layer of the capacitor Fe. Accordingly, an increase in the potential of the wiring BL is smaller than that in the case where polarization inversion occurs in the ferroelectric layer of the capacitor Fe; specifically, the potential of the wiring BL becomes lower than or equal to Vref. Consequently, the bit line driver circuit can read the data "0" retained in the memory cell MC. Therefore, the period from Time T14 to Time T15 can be referred to as a read operation period.

The potential of the wiring BL is set to GND and the potential of the wiring PL is Vw in a period from Time T15 to Time T16. Thus, data "0" is rewritten to the memory cell MC. Therefore, the period from Time T15 to Time T16 can be referred to as a rewrite operation period.

The potential of the wiring BL and the potential of the wiring PL are set to GND in a period from Time T16 to Time T17. After that, the potential of the wiring WL is set to a low potential. Thus, the rewrite operation is completed, and the data "0" is retained in the memory cell MC.

The potential of the wiring WL is set to a high potential and the potential of the wiring PL is set to Vw in a period from Time T17 to Time T18. Since the data "0" is retained in the memory cell MC, the potential of the wiring BL becomes lower than Vref, and the data "0" retained in the memory cell MC is read. Therefore, the period from Time T17 to Time T18 can be referred to as a read operation period.

The potential of the wiring BL is set to Vw in a period from Time T18 to Time T19. Since the transistor Tr is in an on state, the potential of the one electrode of the capacitor Fe becomes Vw. In addition, the potential of the wiring PL is GND. Accordingly, the voltage applied to the ferroelectric layer of the capacitor Fe becomes "Vw−GND". Thus, data "1" can be written to the memory cell MC. Therefore, the period from Time T18 to Time T19 can be referred to as a write operation period.

From Time T19, the potential of the wiring BL and the potential of the wiring PL are set to GND. Then, the potential of the wiring WL is set to a low potential. Thus, the write operation is completed, and the data "1" is retained in the memory cell MC.

The structure, method, and the like described in this embodiment can be used in an appropriate combination with any of other structures, methods, and the like described in this embodiment or the other embodiments.

Embodiment 5

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 30A to FIG. 30E schematically illustrate some structure examples of removable storage devices. The semiconductor device described in the above embodiment is processed into a packaged memory chip and used in a variety of storage devices and removable memories, for example.

Figure 30A:
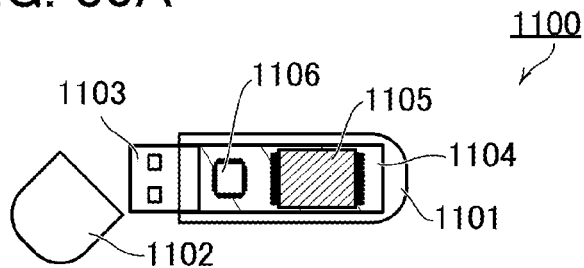
FIG. 30A to FIG. 30E are schematic views of storage devices of one embodiment of the present invention.

FIG. 30A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like. Therefore, the storage capacity of the USB memory 1100 can be further increased.

Figure 30B:
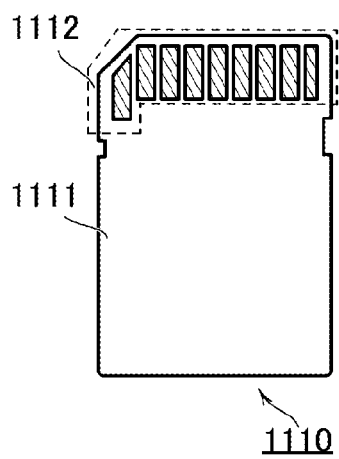
Figure 30C:
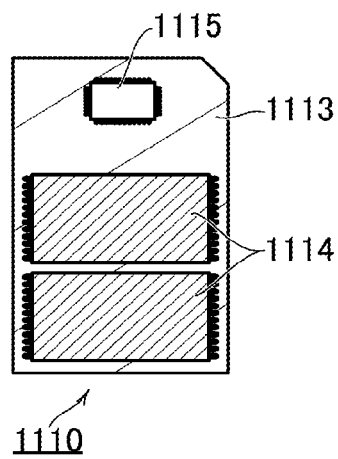

FIG. 30B is a schematic external view of an SD card, and FIG. 30C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like. Therefore, the storage capacity of the SD card 1110 can be further increased.

Figure 30D:
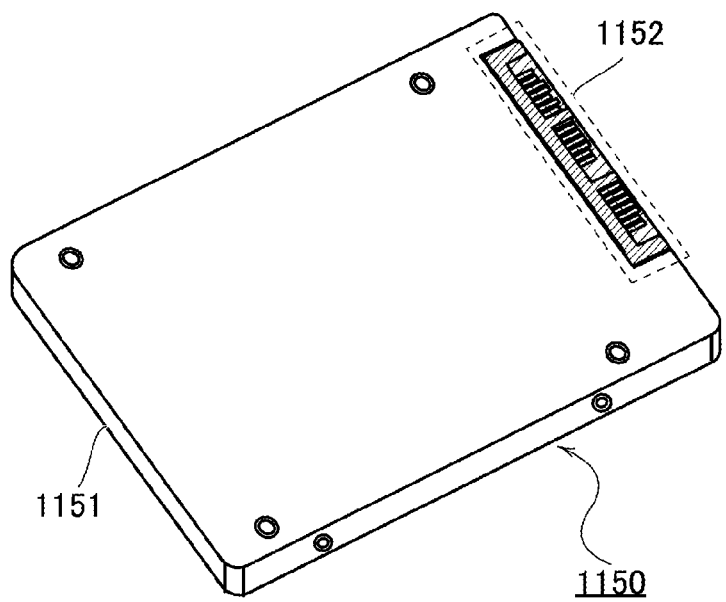
Figure 30E:
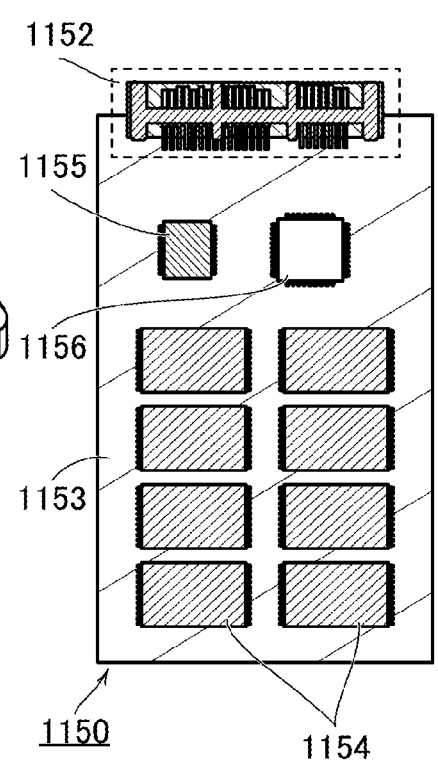

FIG. 30D is a schematic external view of an SSD, and FIG. 30E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like. Therefore, the storage capacity of the SSD 1150 can be further increased.

At least part of the structure, method, and the like described in this embodiment can be implemented in appropriate combination with any of those in the other embodiments and the other examples described in this specification.

Embodiment 6

The semiconductor device of one embodiment of the present invention can be used for processors such as CPUs or GPUs, or chips. When the semiconductor device described in the above embodiment is used for processors such as CPUs or GPUs, or chips, their sizes can be reduced and their storage capacities can be increased. FIG. 31A to FIG. 31H illustrate specific examples of electronic devices each including a processor such as a CPU or a GPU or a chip of one embodiment of the present invention.

<Electronic Devices and Systems>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 31A to FIG. 31H illustrate examples of electronic devices.

[Information Terminal]

Figure 31A:
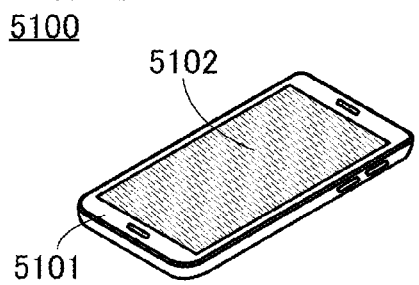
FIG. 31A to FIG. 31H are diagrams illustrating electronic devices of one embodiment of the present invention.

FIG. 31A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 31B:
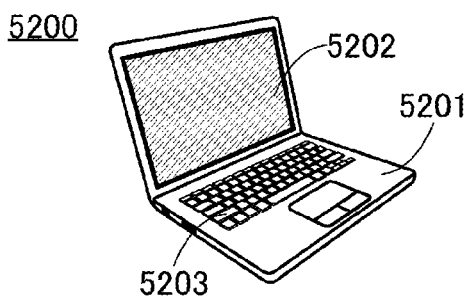

FIG. 31B illustrates a notebook information terminal 5200. The notebook information terminal 5200 includes a main body 5201 of the information terminal, a display portion 5202, and a keyboard 5203.

When the chip of one embodiment of the present invention is applied to the notebook information terminal 5200, the notebook information terminal 5200 can execute an application utilizing artificial intelligence like the information terminal 5100 described above. Examples of the application utilizing artificial intelligence include design-support software, text correction software, and software for automatic menu generation. Furthermore, with the use of the notebook information terminal 5200, novel artificial intelligence can be developed.

Note that although FIG. 31A and FIG. 31B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 31C:
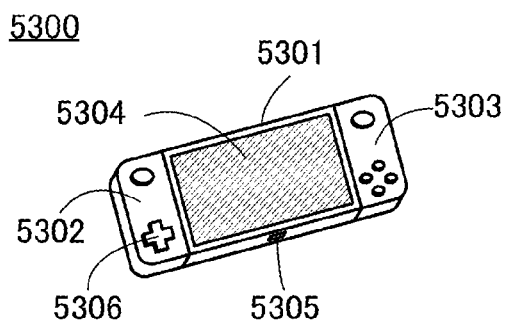

FIG. 31C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 31D:
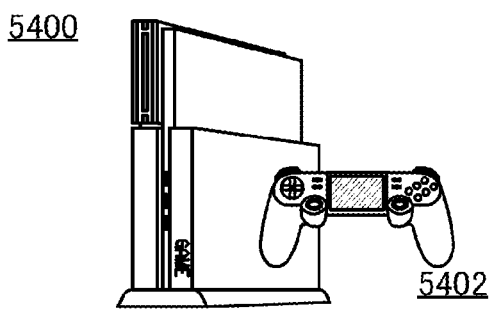

FIG. 31D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit itself, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 31C and FIG. 31D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 31E:
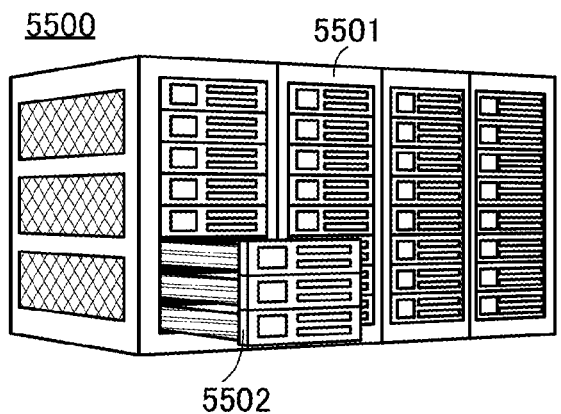
Figure 31F:
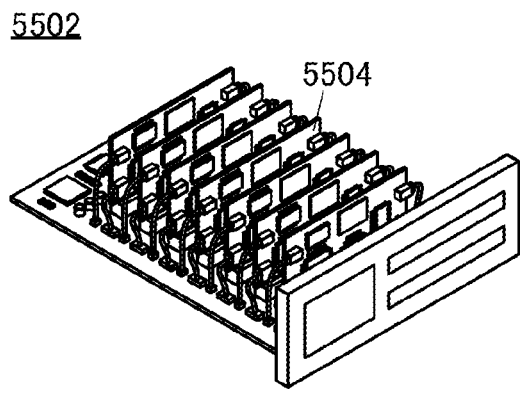

FIG. 31E illustrates a supercomputer 5500 as an example of a large computer. FIG. 31F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit itself, a peripheral circuit, and a module can be reduced.

Although a supercomputer is illustrated as an example of a large computer in FIG. 31E and FIG. 31F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 31G:
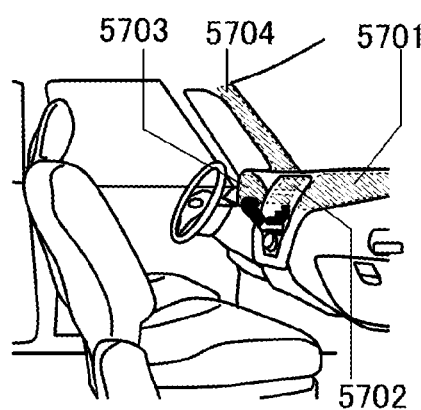

FIG. 31G illustrates an area around a windshield inside an automobile, which is an example of a moving vehicle. FIG. 31G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. Display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 31H:
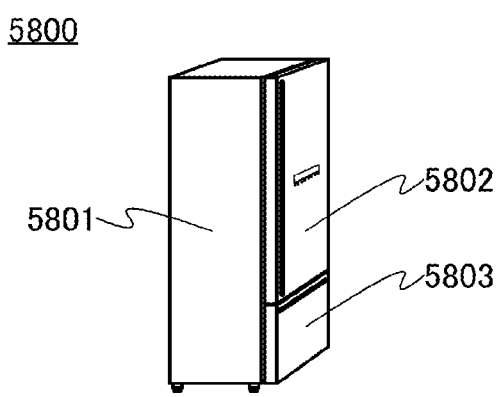

FIG. 31H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of those in the other embodiments and the other examples described in this specification.

Example 1

In this example, hafnium zirconium oxide (HfZrOx) was fabricated as an insulator exhibiting ferroelectricity, and measurement results of the voltage—polarization characteristics, the fatigue characteristics, and the like of the insulator are described.

<Sample Structure>

Figure 32A:
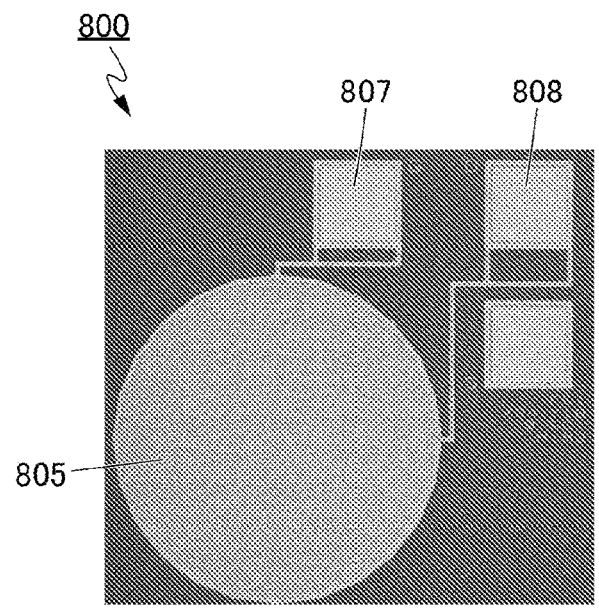
FIG. 32A is an optical micrograph showing an appearance of a sample.
Figure 32B:
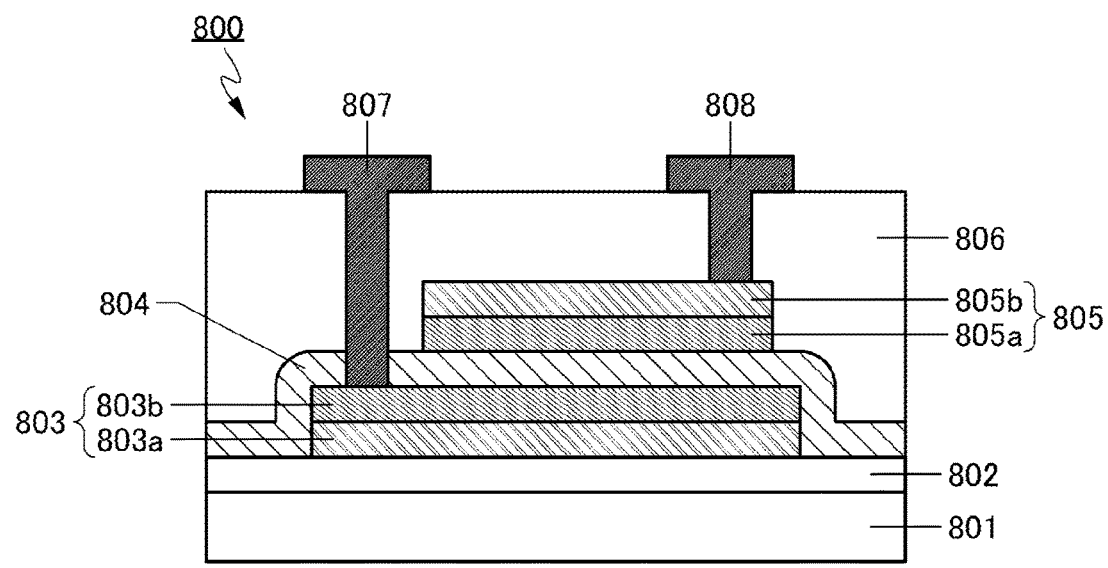
FIG. 32B is a schematic cross-sectional view of the sample.

FIG. 32A is an optical micrograph showing the appearance of a sample 800 used for evaluation. FIG. 32B is a schematic cross-sectional view of the sample 800.

The sample 800 was formed using single crystal silicon as a substrate 801. Specifically, a 100-nm-thick thermal oxide film was formed as an insulator 802 on the substrate 801, a conductor 803 (a conductor 803a and a conductor 803b) functioning as a lower electrode was formed over the insulator 802, an insulator 804 was formed over the conductor 803, and a conductor 805 (a conductor 805a and a conductor 805b) functioning as an upper electrode was formed over the insulator 804.

In addition, an insulator 806 was formed over the conductor 803, the insulator 804, and the conductor 805. Furthermore, a conductor 807 electrically connected to the conductor 803, and a conductor 808 electrically connected to the conductor 805 were formed over the insulator 806. The conductor 807 and the conductor 808 function as electrodes to which measurement signals are input.

Note that formation of the conductor 803, the conductor 805, the conductor 807, and the conductor 808, formation of a contact hole provided in the insulator 806 and the insulator 804, and the like were performed by a known photolithography method and a known etching method.

Three samples 800 (a sample 800A, a sample 800B, and a sample 800C) which differed in conditions of formation of the conductor 805 functioning as an upper electrode and conditions of heat treatment after the formation of the upper electrode were fabricated.

Table 1 shows deposition conditions of the conductor 803a, the conductor 803b, the insulator 804, the conductor 805a, and the conductor 805b, which are provided in each of the sample 800A, the sample 800B, and the sample 800C.

Although not shown in Table 1, 200-nm-thick silicon oxynitride was deposited as the insulator 806 by a PECVD method. Furthermore, a stacked-layer film of three layers of 50-nm-thick Ti, 200-nn-thick Al, and 50-nm-thick Ti was deposited as the conductor 807 and the conductor 808 by a sputtering (SP) method.

The conductor 805a of each of the sample 800A and the sample 800B was deposited by a sputtering method, and the conductor 805a of the sample 800C was deposited by a metal CVD (MCVD) method. In addition, after being fabricated, the sample 800B was subjected to heat treatment by an RTA method. Table 1 also shows conditions of the heat treatment.

field intensity E applied to the insulator 804 and the polarization P is shown for each sample. FIG. 34B shows GIXD measurement results. In FIG. 34B, the relationship between a diffraction angle (2θ) of X-ray and detected signal intensity is shown for each sample.

Figure 34A:
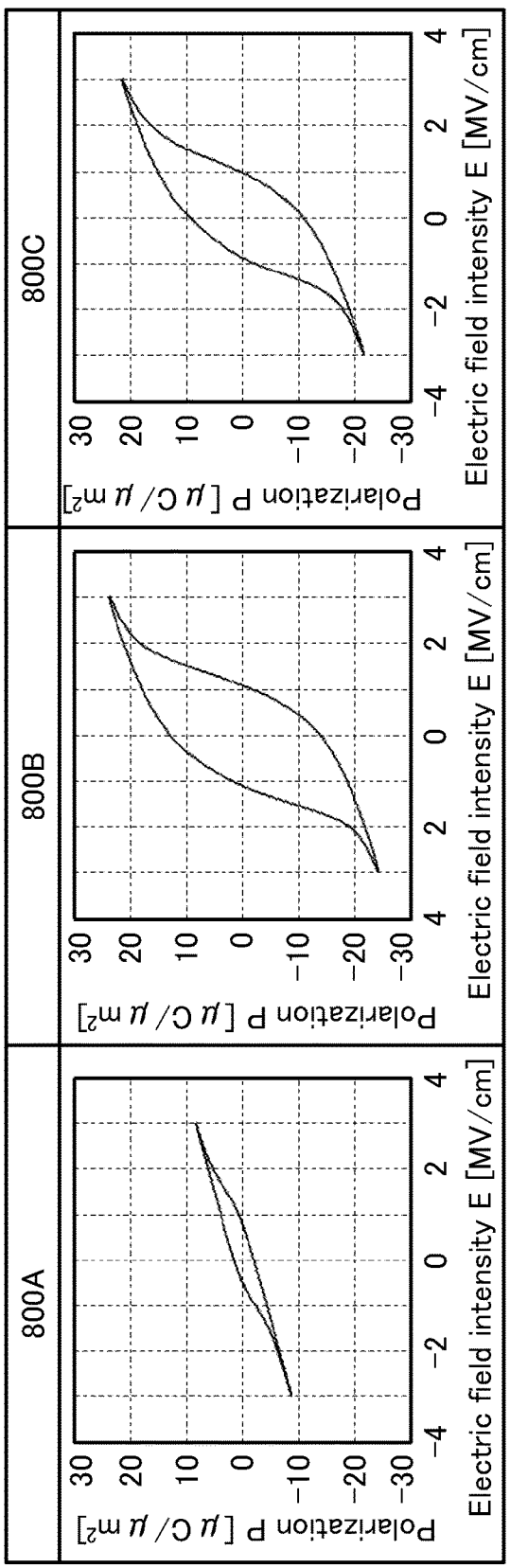
FIG. 34A is a diagram showing measurement results of P-E characteristics.
Figure 34B:
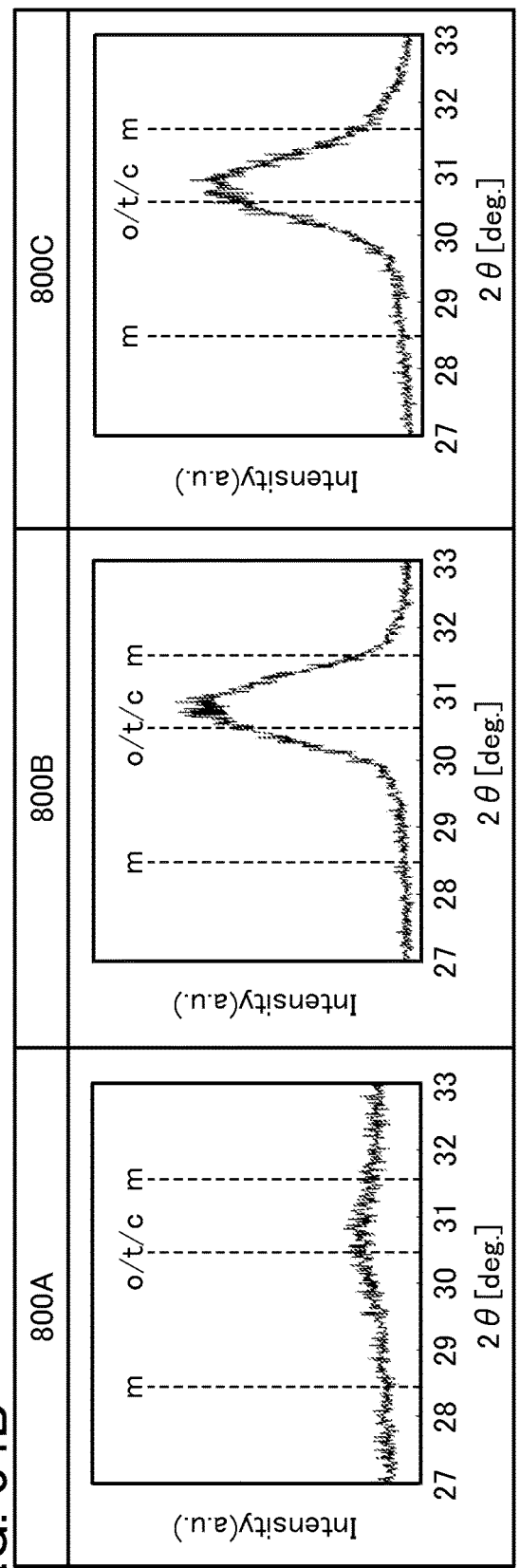
FIG. 34B is a diagram showing GIXD measurement results.

It is found from FIG. 34A that hysteresis characteristics are obtained in the three samples (the sample 800A, the sample 800B, and the sample 800C), and the three samples function as ferroelectrics. Note that the amount of polarization (the difference between the maximum polarization and

TABLE 1

| Sample name | 800A | 800B | 800C |
|---|---|---|---|
| Conditions of heat treatment after sample fabrication | Not performed | Heat treatment method: RTA<br>Heat treatment temperature: 500° C.<br>Heating atmosphere: nitrogen<br>Heating time: 60 sec | Not performed |
| 805b | | Deposition method: SP method, Composition: W, Thickness: 20 nm<br>Deposition temperature 130° C. | Deposition method: SP method<br>Composition: W, Thickness: 20 mm<br>Deposition temperature 130° C. |
| 805a | | Deposition method: SP method, Composition: TiNx Thickness: 10 nm<br>Deposition temperature: room temperature (not heated) | Deposition method: MCVD method<br>Composition: TiNx, Thickness: 10 nm<br>Deposition temperature: 400° C. |
| 804 | colspan="3" | Deposition method: ALD method, Composition: HfZrOx, Thickness: 10 nm<br>Precursor: cloride-based precursor, Oxidizer: H₂O, Deposition temperature: 300° C. | |
| 803b | colspan="3" | Deposition method: MCVD method, Composition: TiNx, Thickness: 10 nm<br>Deposition temperature: 400° C. | |
| 803a | colspan="3" | Deposition method: SP method, Composition: W, Thickness: 30 nm<br>Deposition temperature: 130° C. | |

<Measurement and Analysis>

Figure 32C:
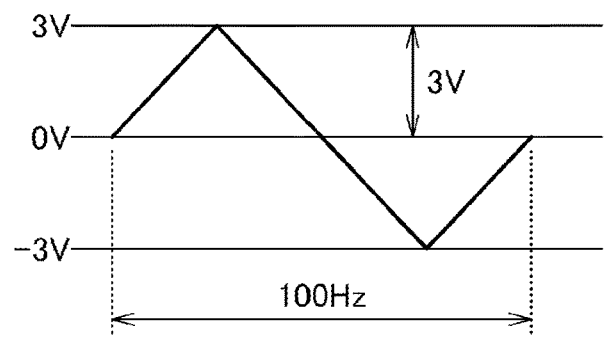
FIG. 32C is a diagram showing an input voltage waveform.

A triangular wave with a voltage amplitude of 3 V and a frequency of 100 Hz was applied between the conductor 807 and the conductor 803, and a change in spontaneous polarization (P-E characteristics) of the insulator 804 was measured. FIG. 32C shows a waveform of the input voltage. In addition, the crystal state of the HfZrOx film corresponding to the insulator 804 of each of the sample 800A, the sample 800B, and the sample 800C was investigated using grazing incident X-ray diffraction (GIXD), which is a kind of XRD analysis method.

Figure 33A:
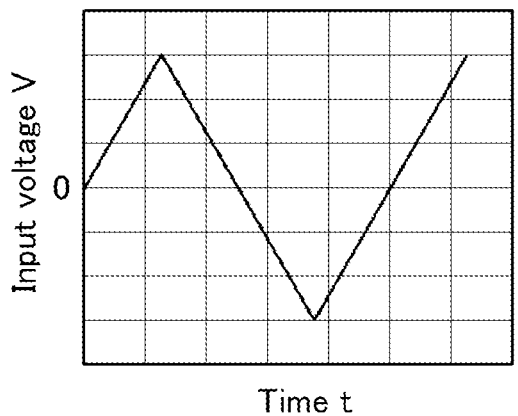
FIG. 33A to FIG. 33F are diagrams showing a method for obtaining P-E characteristics with the use of a triangular wave.
Figure 33B:
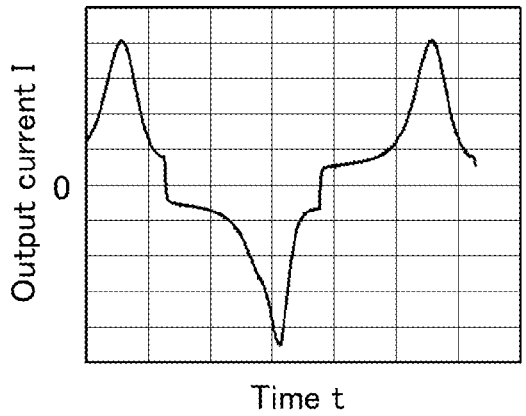
Figure 33C:
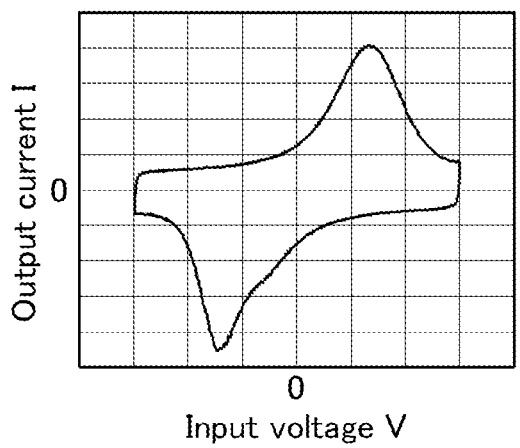

Here, a method for obtaining P-E characteristics using a triangular wave is described. First, an input voltage V, which is a triangular wave, is applied between two electrodes of a measurement target sample (capacitor) (FIG. 33A), and a current flowing between the electrodes (output current I) is measured (FIG. 33B). Note that the horizontal axis in FIG. 33A and FIG. 33B represents elapsed time t. Next, I-V characteristics showing the relationship between the input voltage V and the output current I are obtained (FIG. 33C).

Figure 33D:
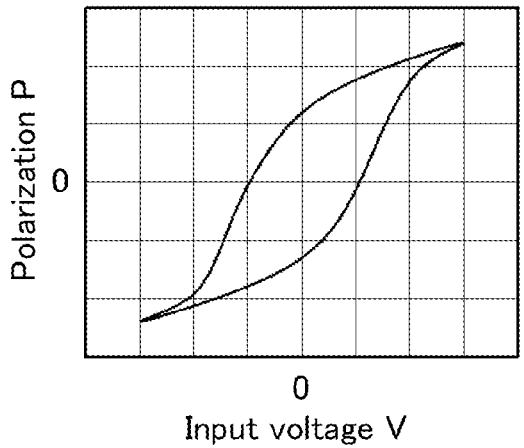

Next, the output current I is converted to polarization P using Formula 1 to obtain P-E characteristics (FIG. 33D).

[Formula 1]

$$P = \frac{1}{A} \int I(t)dt \quad (1)$$

In Formula 1, A represents the area where the two electrodes of the capacitor overlap with each other.

Figure 33E:
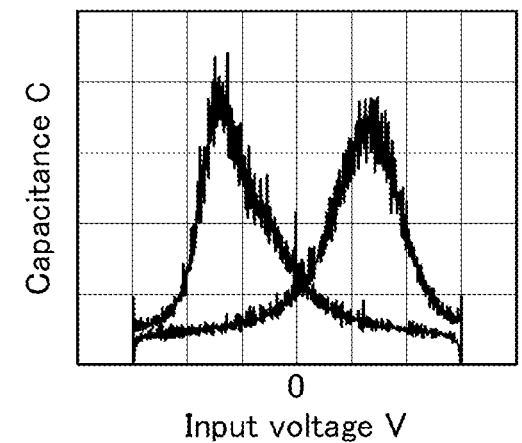
Figure 33F:
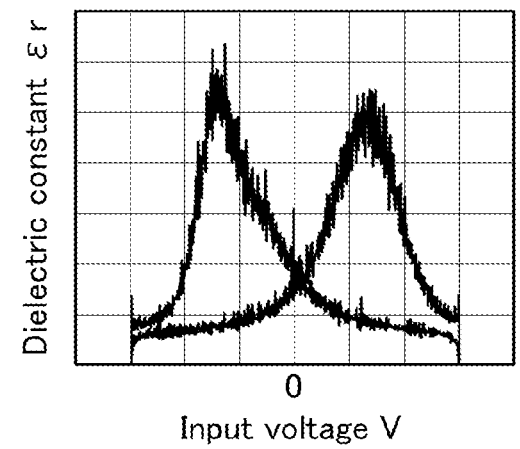

From Q=CV, the relationship between the input voltage V and a capacitance C can be obtained (FIG. 33E). In addition, the relationship between the input voltage V and the dielectric constant εr can be obtained (FIG. 33F).

FIG. 34A shows measurement results of the P-E characteristics of the sample 800A, the sample 800B, and the sample 800C. In FIG. 34A, the relationship between electric the minimum polarization at the time when the electric field intensity E is 0 in the P-E characteristics) of the sample 800A is smaller than those of the sample 800B and the sample 800C, which indicates that the sample 800A is close to a paraelectric.

It is found from FIG. 34B that in each of the three samples, no signal intensity peak is detected in the vicinity of a diffraction angle at which monoclinic crystal (m) is detected, and a signal intensity peak is observed in the vicinity of a diffraction angle indicating an orthorhombic crystal (o), a tetragonal crystal (t), or a cubit crystal (c). When the measurement results shown in FIG. 34A are taken into consideration, an orthorhombic crystal functioning as a ferroelectric is presumed to be detected. Furthermore, it is also found from FIG. 34B that the sample 800A is closer to a paraelectric than the sample 800B and the sample 800C are.

In general, a larger amount of polarization (hysteresis characteristics) is preferred in a ferroelectric. A comparison between the sample 800A and the sample 800B, in each of which the conductor 805a was deposited by a sputtering method, shows that the sample 800A not subjected to heat treatment after the fabrication does not have large hysteresis characteristics. Meanwhile, the sample 800C, in which the conductor 805a was deposited by a metal CVD method, has an amount of polarization (hysteresis characteristics) equivalent to that of the sample 800B subjected to heat treatment, even though heat treatment was not performed on the sample 800C after the fabrication. Deposition of the conductor 805a by a metal CVD method enables a reduction in the number of steps for fabricating the sample.

Figure 35A:
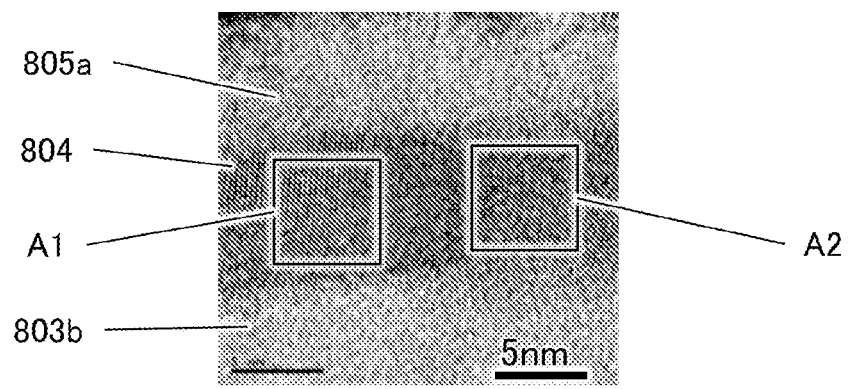
FIG. 35A is a cross-sectional TEM image of a sample.
Figure 36A:
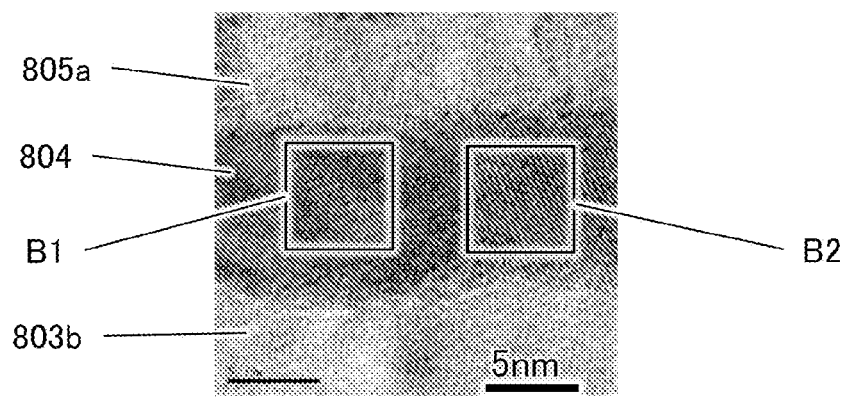
FIG. 36A is a cross-sectional TEM image of a sample.
Figure 37A:
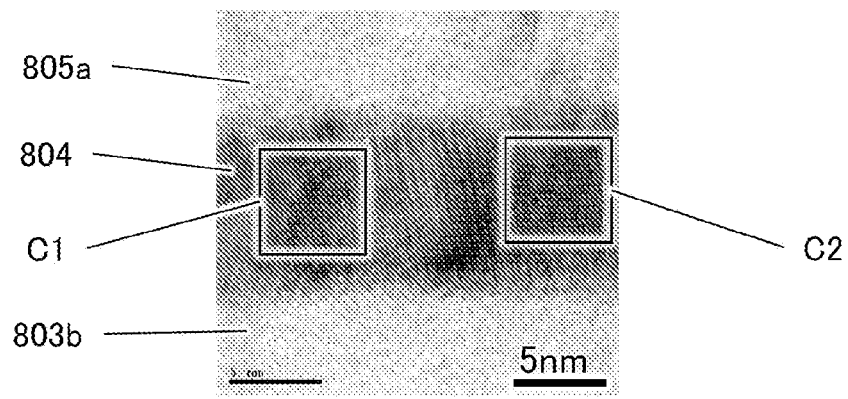
FIG. 37A is a cross-sectional TEM image of a sample.

Cross-sectional TEM images of the sample 800A to the sample 800C fabricated in the above manner were obtained with the use of "H-9500" manufactured by Hitachi High-Technologies Corporation at an accelerating voltage of 300 kV to show the respective insulators 804 and the vicinities thereof. FIG. 35A, FIG. 36A, and FIG. 37A are the cross-sectional TEM image of the sample 800A, the cross-sectional TEM image of the sample 800B, and the cross-sectional TEM image of the sample 800C, respectively.

Furthermore, a region A1 and a region A2 in the TEM image of FIG. 35A, a region B1 and a region B2 in the TEM image of FIG. 36A, and a region C1 and a region C2 in the TEM image of FIG. 37A were subjected to FFT (Fast Fourier Transform) analysis. FFT analysis on a TEM image yields an FFT figure having a pattern reflecting reciprocal lattice space information like an electron diffraction pattern. For example, in the case of a cross-sectional TEM image of an HfZrOx film, spots having high intensity are observed in the FFT figure in some cases.

Figure 35B:
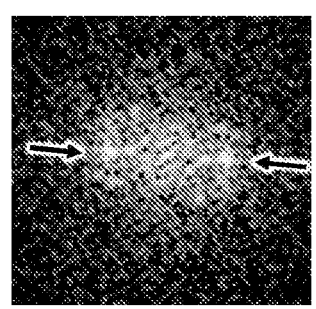
FIG. 35B and FIG. 35C are FFT figures of the sample.
Figure 35C:
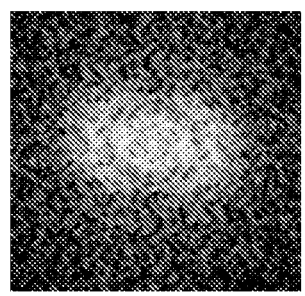
Figure 36B:
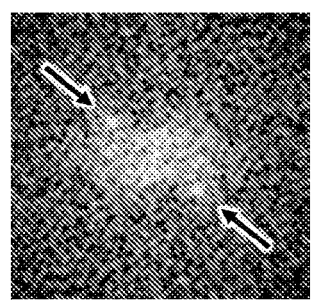
FIG. 36B and FIG. 36C are FFT figures of the sample.
Figure 36C:
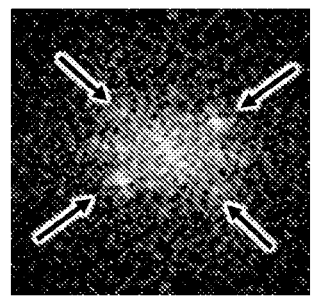
Figure 37B:
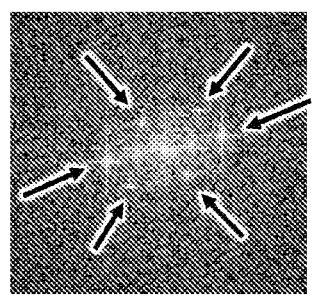
FIG. 37B and FIG. 37C are FFT figures of the sample.
Figure 37C:
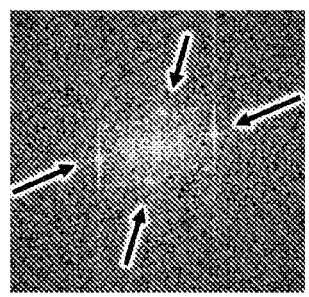

FIG. 35B, FIG. 36B, and FIG. 37B show the FFT analysis results. FIG. 35B is an FFT figure of the region A1, FIG. 35C is an FFT figure of the region A2, FIG. 36B is an FFT figure of the region B1, FIG. 36C is an FFT figure of the region B2, FIG. 37B is an FFT figure of the region C1, and FIG. 37C is an FFT figure of the region C2.

In the sample 800B, existence of a plurality of bright spots can be observed in the region B1 and the region B2. Similarly, in the sample 800C, a plurality of bright spots can be observed in the region C1 and the region C2. Meanwhile, in the sample 800A, a spot can be observed in the region A1 but no spot can be observed in the region A2. That is, the sample 800B and the sample 800C were found to have higher crystallinity than the sample 800A. Thus, the sample 800B and the sample 800C having a larger amount of polarization and higher ferroelectricity were found to have high crystallinity.

Figure 38A:
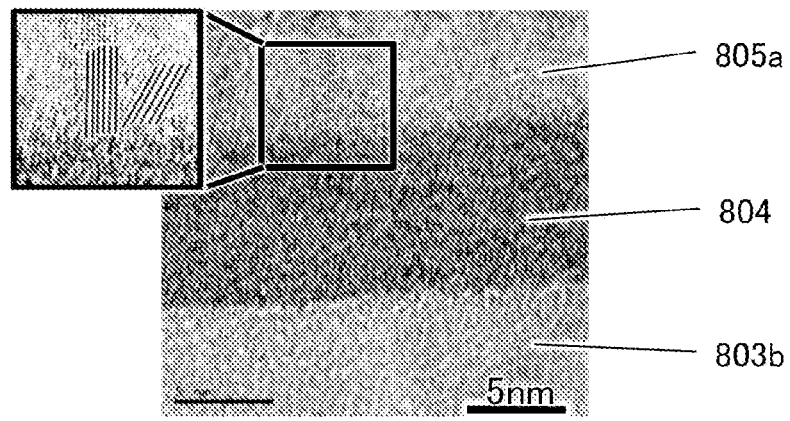
FIG. 38A to FIG. 38C are cross-sectional TEM images of samples.
Figure 38B:
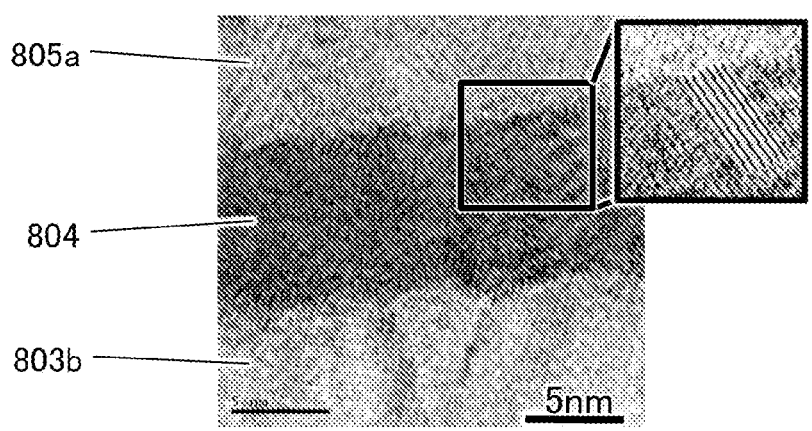
Figure 38C:
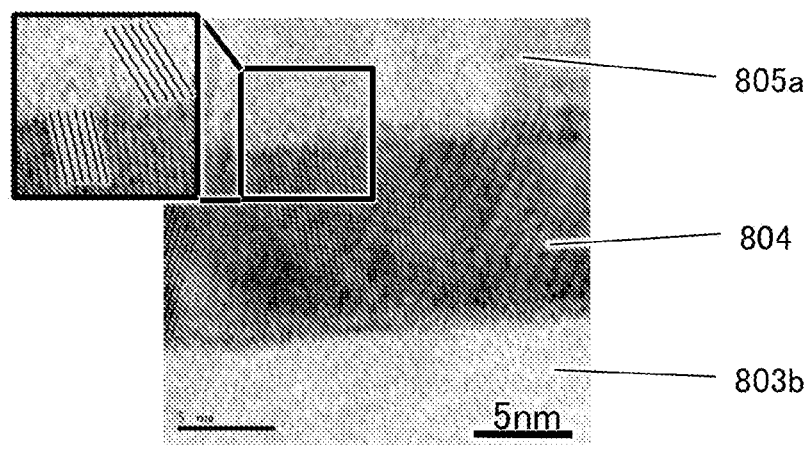

Next, cross-sectional TEM images of the sample 800A to the sample 800C were obtained with the use of "H-9500" manufactured by Hitachi High-Technologies Corporation at an accelerating voltage of 300 kV to show the respective vicinities of interfaces between the insulator 804 and the conductor 805a. FIG. 38A, FIG. 38B, and FIG. 38C are the cross-sectional TEM image of the sample 800A, the cross-sectional TEM image of the sample 800B, and the cross-sectional TEM image of the sample 800C, respectively. Note that in FIG. 38A to FIG. 38C, focused crystal lattice fringes are enlarged and shown by solid lines.

As shown in FIG. 38A, in the sample 800A, lattice fringes derived from crystals of TiNx were observed in the conductor 805a. As shown in FIG. 38B, in the sample 800B, lattice fringes derived from crystals of HfZrOx were observed in the insulator 804. As shown in FIG. 38C, in the sample 800C, lattice fringes derived from crystals of TiNx were observed in the conductor 805a and lattice fringes derived from crystals of HfZrOx were observed in the insulator 804. As described above, lattice fringes derived from crystals of TiNx or HfZrOx were observed in the vicinity of the interface between the insulator 804 and the conductor 805a in each of the sample 800A to the sample 800C. On the other hand, in the cross-sectional TEM images in FIG. 38A to FIG. 38C, no different layer (e.g., TiOx) was observed in the vicinity of the interface between the insulator 804 and the conductor 805a. Thus, it is considered that even when a different layer exists at the interface between the insulator 804 and the conductor 805a, the thickness of the different layer is less than or equal to 1 nm.

Then, in each of the sample 800A to the sample 800C, the vicinity of the interface between the insulator 804 and the conductor 805a and the vicinity of the interface between the insulator 804 and the conductor 803b were subjected to analysis by energy dispersive X-ray spectroscopy (EDX). The EDX analysis was performed on points on a straight line vertically crossing the interface. In this specification and the like, such EDX analysis is referred to as line EDX analysis in some cases. Note that the line EDX analysis was performed with the use of "HD-2700" manufactured by Hitachi High-Technologies Corporation at an accelerating voltage of 200 kV.

In this line EDX analysis, oxygen atoms [atomic %] and hafnium atoms [atomic %] were detected, and the half values of the oxygen atoms [atomic %] and the hafnium atoms [atomic %] in the vicinity of the interface between the insulator 804 and the conductor 805a and the vicinity of the interface between the insulator 804 and the conductor 803b were calculated. In the case where a different layer of TiOx or the like is not formed in the vicinity of the interface between the insulator 804 and the conductor 805a (or the vicinity of the interface between the insulator 804 and the conductor 803b), the half value of the oxygen atoms [atomic %] and the half value of the hafnium atoms [atomic %] are equal to each other. However, in the case where a different layer of TiOx or the like is formed at the interface, the half value of the oxygen atoms [atomic %] deviates to the conductor 805a (or the conductor 803b) side. That is, it is estimated that a difference between the half value of the oxygen atoms [atomic %] and the half value of the hafnium atoms [atomic %] corresponds to the thickness of the TiOx.

Figure 39:
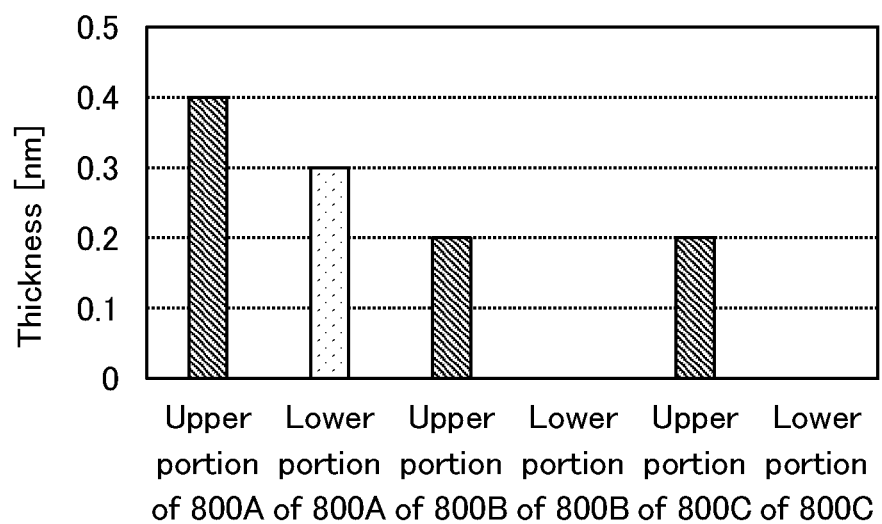
FIG. 39 is a diagram showing analysis results of line EDX analysis.

FIG. 39 shows the results of the line EDX analysis. The vertical axis of FIG. 39 represents the thickness of TiOx [nm]. In FIG. 39, the vicinities of the interfaces between the insulator 804 and the conductor 805a in the samples are denoted by an upper portion of 800A, an upper portion of 800B, and an upper portion of 800C. In FIG. 39, the vicinities of the interfaces between the insulator 804 and the conductor 803b in the samples are denoted by a lower portion of 800A, a lower portion of 800B, and a lower portion of 800C.

As shown in FIG. 39, in the sample 800B, the thickness of the TiOx film was 0.2 nm in the upper portion and the TiOx film as the different layer was not detected in the lower portion. Similarly, in the sample 800C, the thickness of the TiOx film was 0.2 nm in the upper portion and a different layer of the TiOx film was not detected in the lower portion. Meanwhile, in the sample 800A, the thickness of the TiOx film was 0.4 nm in the upper portion and the thickness of the TiOx film was 0.3 nm in the lower portion. That is, the different layer of the TiOx film tended to be thinner in the sample 800B and the sample 800C than in the sample 800A. Thus, the sample 800B and the sample 800C having a larger amount of polarization and higher ferroelectricity were founded to have the thinner TiOx film as the different layer in some cases.

Next, in the sample 800C, the surface roughness of the conductor 803b serving as a base of the insulator 804 was evaluated.

First, in the sample 800C, Z contrast images (ZC images) of a cross section N1 to a cross section N6 were obtained with the use of a dark field STEM function of "HD-2700" manufactured by Hitachi High-Technologies Corporation. The ZC images of the cross section N1 to the cross section N6 were subjected to image analysis and the line of interface between the insulator 804 and the conductor 803b was drawn on each of the ZC images. Note that for the image analysis, "Image J" was used as image processing software performing interface extraction. As for the interface lines of the cross section N1 to the cross section N6, arithmetic mean roughness (Ra) and root mean square roughness (RMS) were calculated.

Figure 40A:
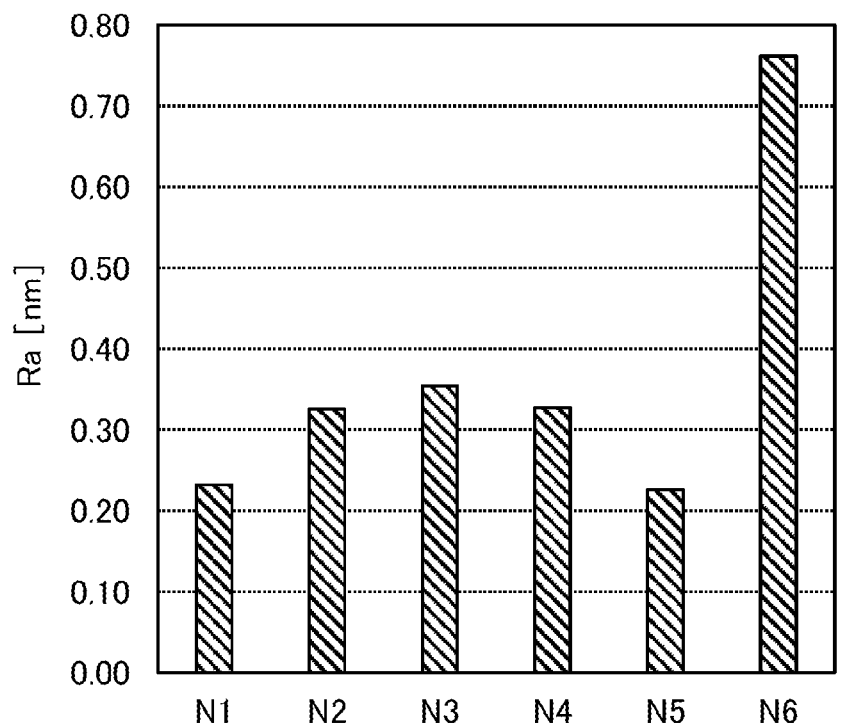
FIG. 40A is a diagram showing measurement results of Ra.
Figure 40B:
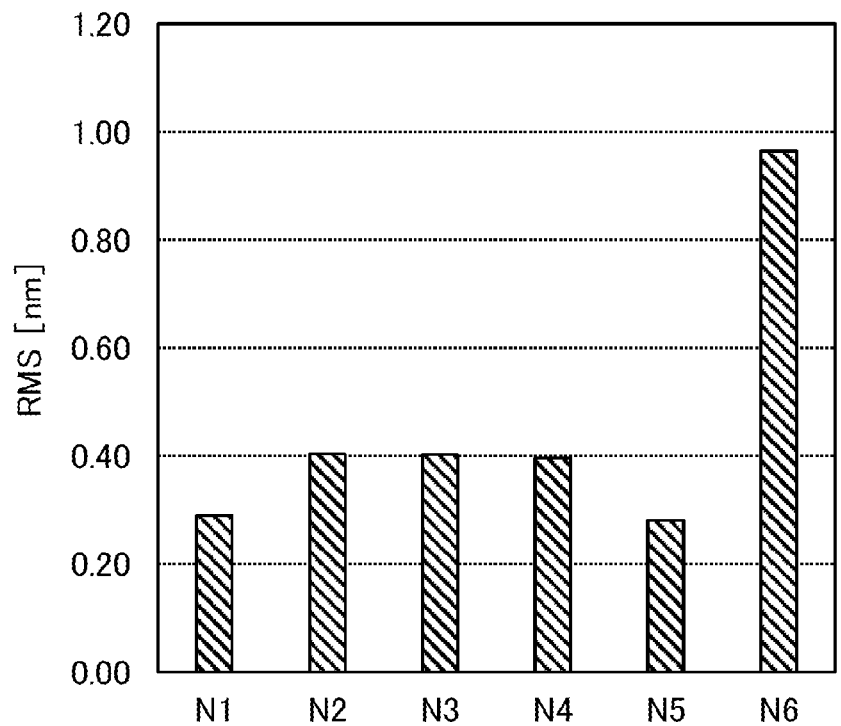
FIG. 40B is a diagram showing measurement results of RMS.

FIG. 40A shows Ra [nm] of the cross section N1 to the cross section N6, and FIG. 40B shows RMS [nm] of the cross section N1 to the cross section N6. As shown in FIG. 40A and FIG. 40B, the top surface roughness of the sample 800C represented by Ra and RMS is less than or equal to 1 nm in the cross section N1 to the cross section N6. Furthermore, the roughness represented by Ra and RMS is less than or equal to 0.4 nm in the cross section N1 to the cross section N5. Thus, in order to make the insulator 804 have higher crystallinity and exhibit ferroelectricity, the top surface roughness of the conductor 803b serving as the base is less than or equal to 2 nm, preferably less than or equal to 1 nm, further preferably less than or equal to 0.8 nm, still further preferably less than or equal to 0.5 nm, yet still further preferably less than or equal to 0.4 nm.

Next, the hydrogen (H) concentration, the carbon (C) concentration, the nitrogen (N) concentration, and the chlorine (Cl) concentration in the insulator 804 of each of the sample 800A, the sample 800B, and the sample 800C were measured by secondary ion mass spectrometry (SIMS).

Figure 41:
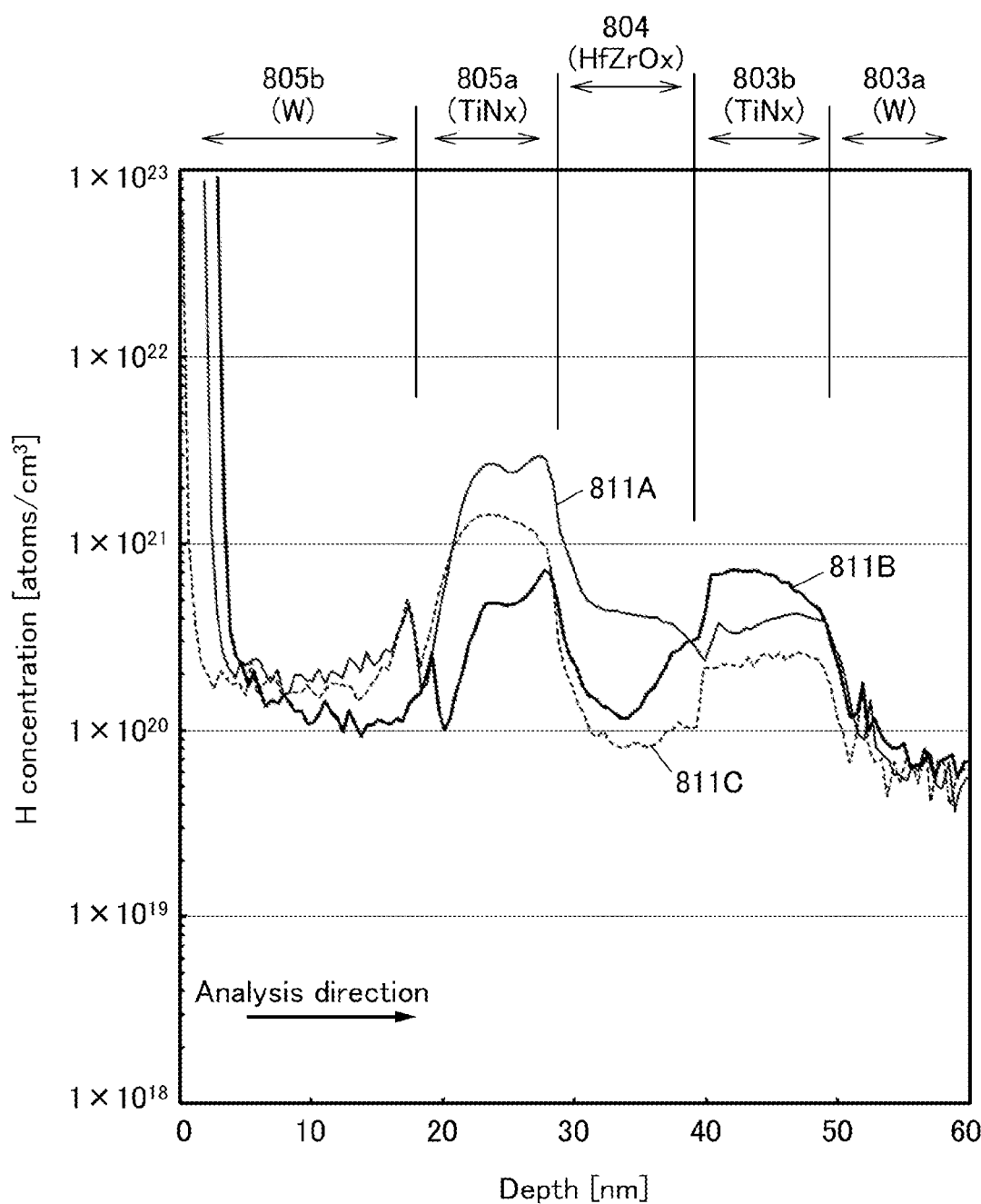
FIG. 41 is a diagram showing SIMS analysis results.
Figure 42:
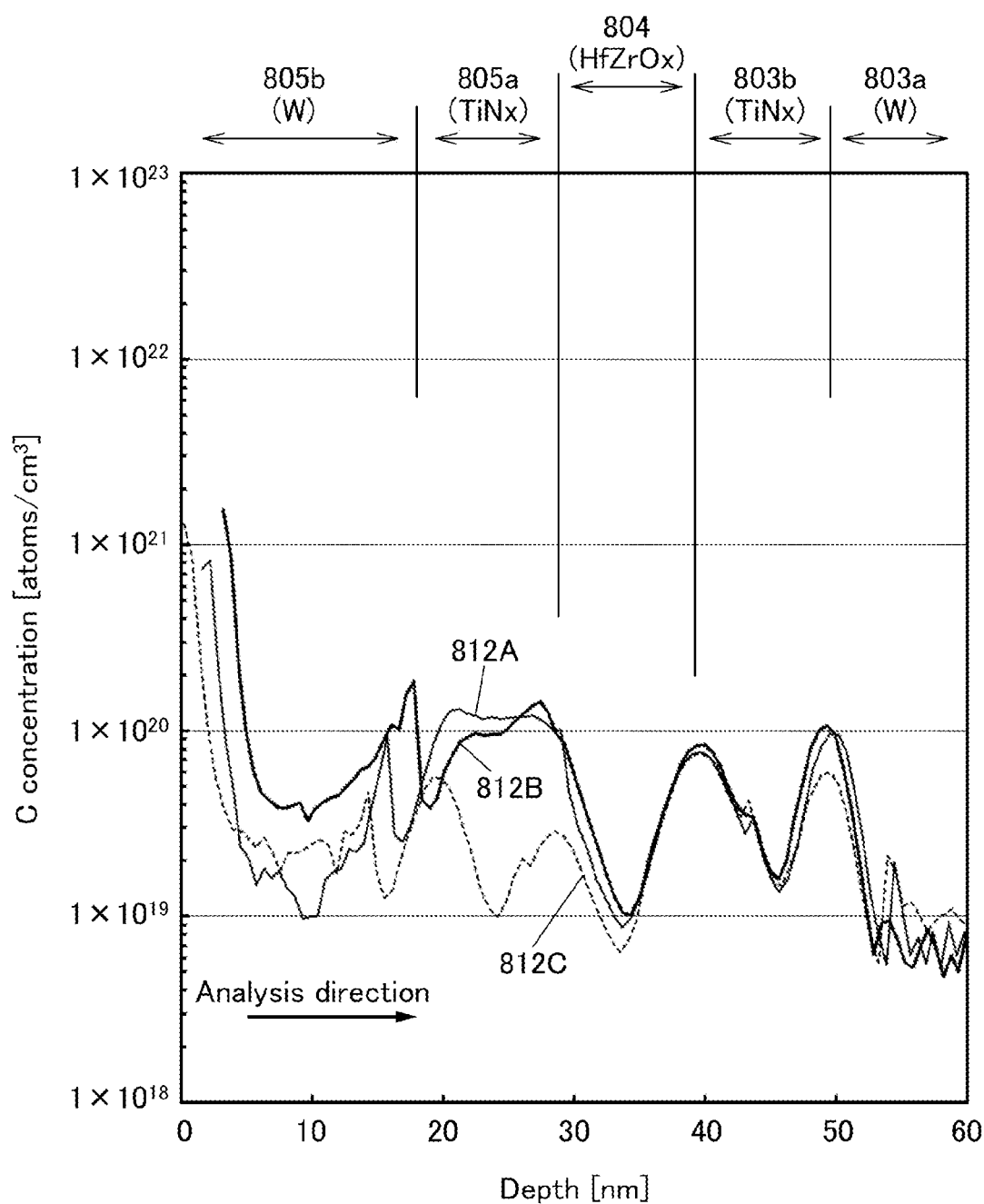
FIG. 42 is a diagram showing SIMS analysis results.
Figure 43:
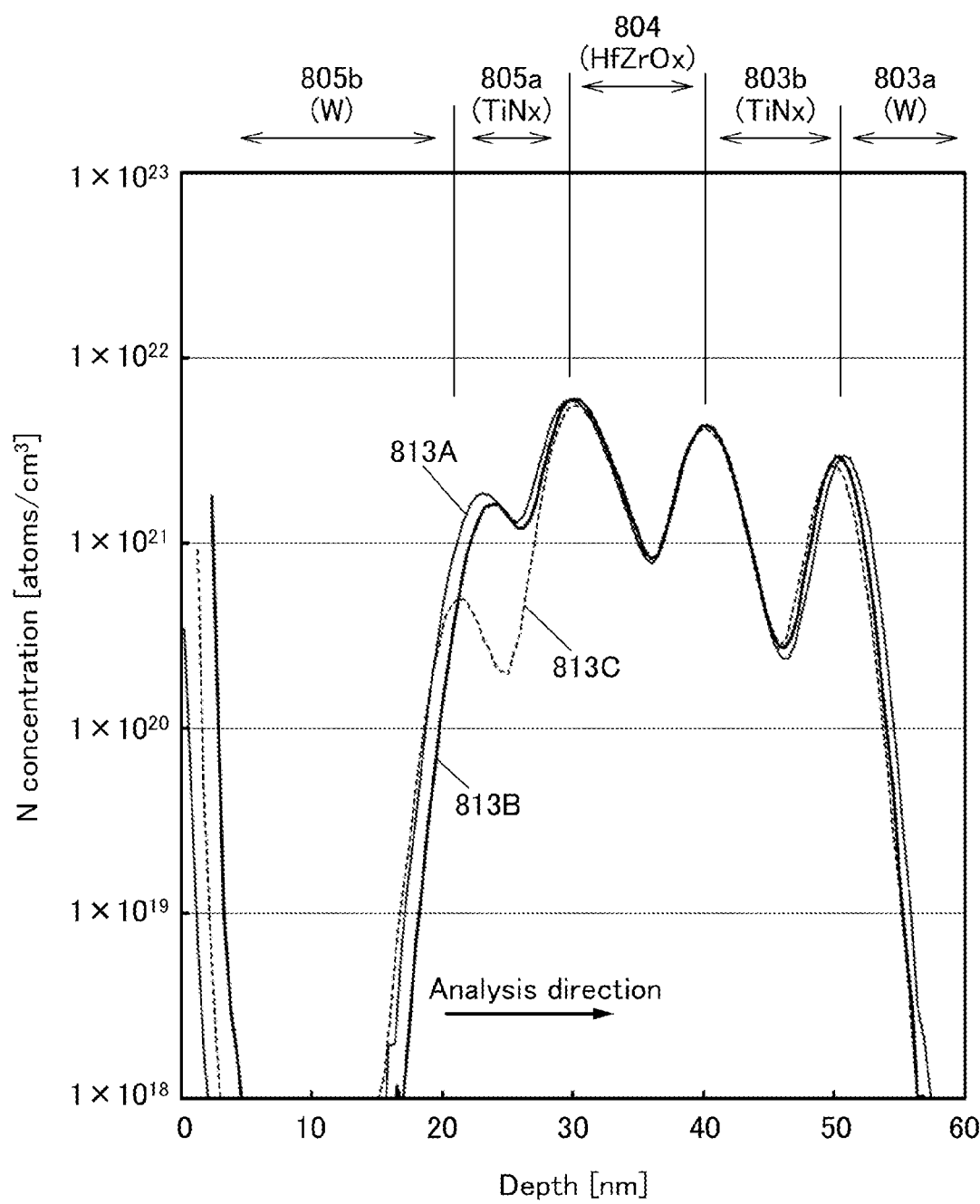
FIG. 43 is a diagram showing SIMS analysis results.
Figure 44:
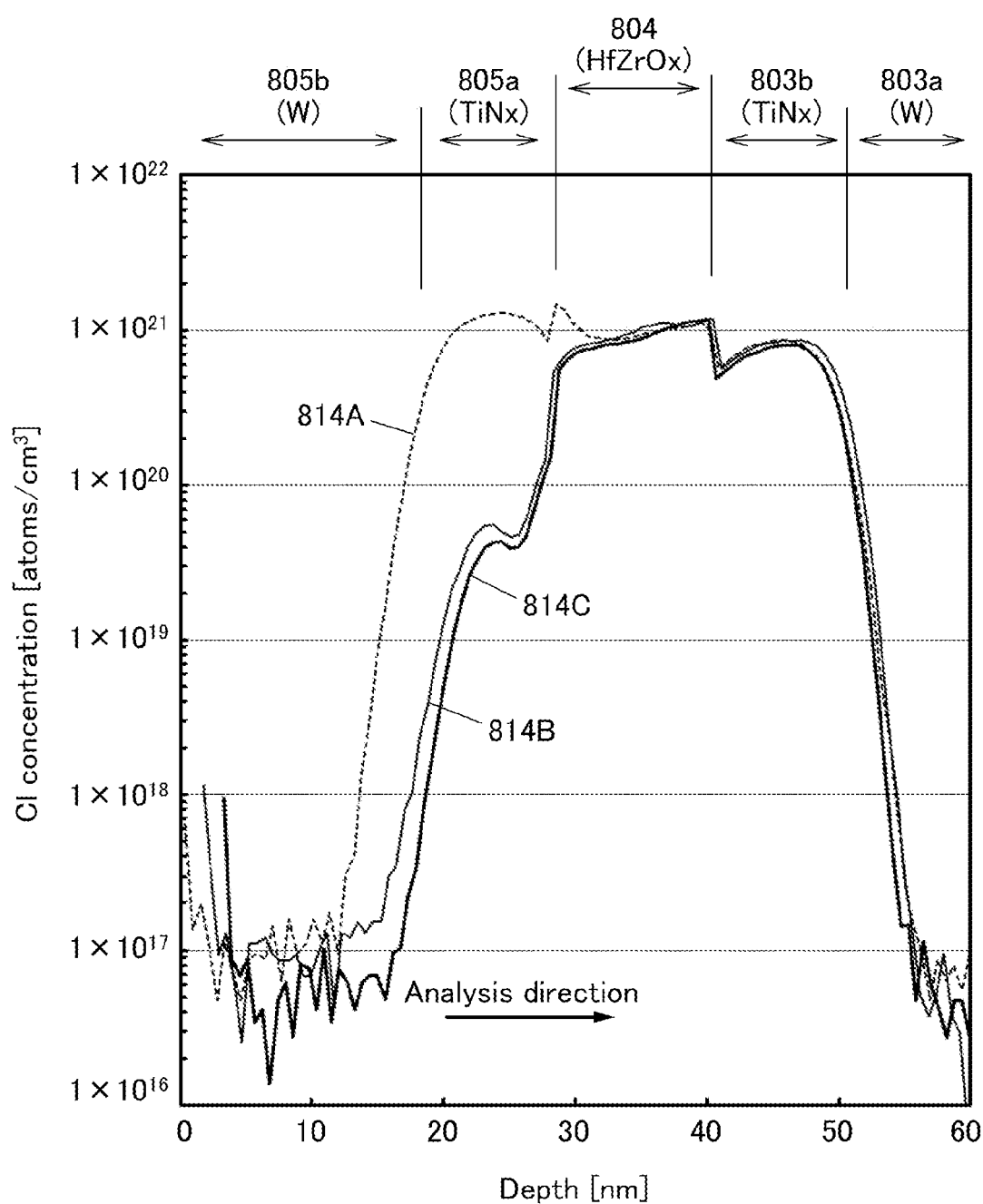
FIG. 44 is a diagram showing SIMS analysis results.

The SIMS analysis was conducted from the conductor 805b toward the conductor 803a. FIG. 41 to FIG. 44 show SIMS analysis results. The horizontal axes in FIG. 41 to FIG. 44 each represent the depth from the surface of the conductor 805b, the vertical axis in FIG. 41 represents the hydrogen concentration in the insulator 804, the vertical axis in FIG. 42 represents the carbon concentration in the insulator 804, the vertical axis in FIG. 43 represents the nitrogen concentration in the insulator 804, and the vertical axis in FIG. 44 represents the chlorine concentration in the insulator 804. Furthermore, the positions of the conductor 805b, the conductor 805a, the insulator 804, the conductor 803b, and the conductor 803a in the depth direction, which were specified from the thicknesses and the SIMS profiles, are shown in FIG. 41 to FIG. 44.

In FIG. 41, a curve 811A represents SIMS analysis results of the sample 800A, a curve 811B represents SIMS analysis results of the sample 800B, and a curve 811C represents SIMS analysis results of the sample 800C. The hydrogen concentration in the insulator 804 was approximately $4\times10^{20}$ atoms/cm$^3$ in the sample 800A, approximately $2\times10^{20}$ atoms/cm$^3$ in the sample 800B, and approximately $9\times10^{19}$ atoms/cm$^3$ in the sample 800C.

In FIG. 42, a curve 812A represents SIMS analysis results of the sample 800A, a curve 812B represents SIMS analysis results of the sample 800B, and a curve 812C represents SIMS analysis results of the sample 800C. The carbon concentration in the insulator 804 was approximately $9\times10^{18}$ atoms/cm$^3$ in the sample 800A, approximately $1\times10^{19}$ atoms/cm$^3$ in the sample 800B, and approximately $6\times10^{18}$ atoms/cm$^3$ in the sample 800C (see FIG. 42).

In FIG. 43, a curve 813A represents SIMS analysis results of the sample 800A, a curve 813B represents SIMS analysis results of the sample 800B, and a curve 813C represents SIMS analysis results of the sample 800C. The nitrogen concentration in the insulator 804 in each of the sample 800A, the sample 800B, and the sample 800C seems to be less than or equal to approximately $8\times10^{20}$ atoms/cm$^3$.

In FIG. 44, a curve 814A represents SIMS analysis results of the sample 800A, a curve 814B represents SIMS analysis results of the sample 800B, and a curve 814C represents SIMS analysis results of the sample 800C. The chlorine concentration in the insulator 804 in each of the sample 800A, the sample 800B, and the sample 800C was approximately $1\times10^{21}$ atoms/cm$^3$.

It is found from FIG. 41 and FIG. 42 that both the hydrogen concentration in the insulator 804 and the carbon concentration in the insulator 804 are the smallest in the sample 800C, in which the conductor 805a was deposited by a thermal ALD method. According to FIG. 43, although the nitrogen concentration in the insulator 804 is possibly influenced by adjacent titanium nitride (TiNx), it is less than or equal to approximately $8\times10^{20}$ atoms/cm$^3$. FIG. 44 and FIG. 34 show that the existence of chlorine in the insulator 804 at approximately $1\times10^{21}$ atoms/cm$^3$ is not a factor inhibiting the ferroelectricity exhibition.

The hydrogen concentration in the insulator 804 is preferably lower than or equal to $5\times10^{20}$ atoms/cm$^3$, further preferably lower than or equal to $1\times10^{20}$ atoms/cm$^3$. The carbon concentration in the insulator 804 is preferably lower than or equal to $5\times10^{19}$ atoms/cm$^3$, further preferably lower than or equal to $1\times10^{19}$ atoms/cm$^3$.

Example 2

In this example, results of fatigue characteristics measurement performed on the sample 800B and the sample 800C described in Example 1 are described. The measurement of fatigue characteristics was performed on two samples 800B (a sample 800B_1 and a sample 800B_2) and three samples 800C (a sample 800C_1, a sample 800C_2, and a sample 800C_3). Note that the sample 800B_1 and the sample 800B_2 are different elements fabricated over the same substrate under the same conditions as those for the sample 800B. The sample 800C_1, the sample 800C_2, and the sample 800C_3 are different elements fabricated over the same substrate under the same conditions as those for the sample 800B.

Figure 45A:
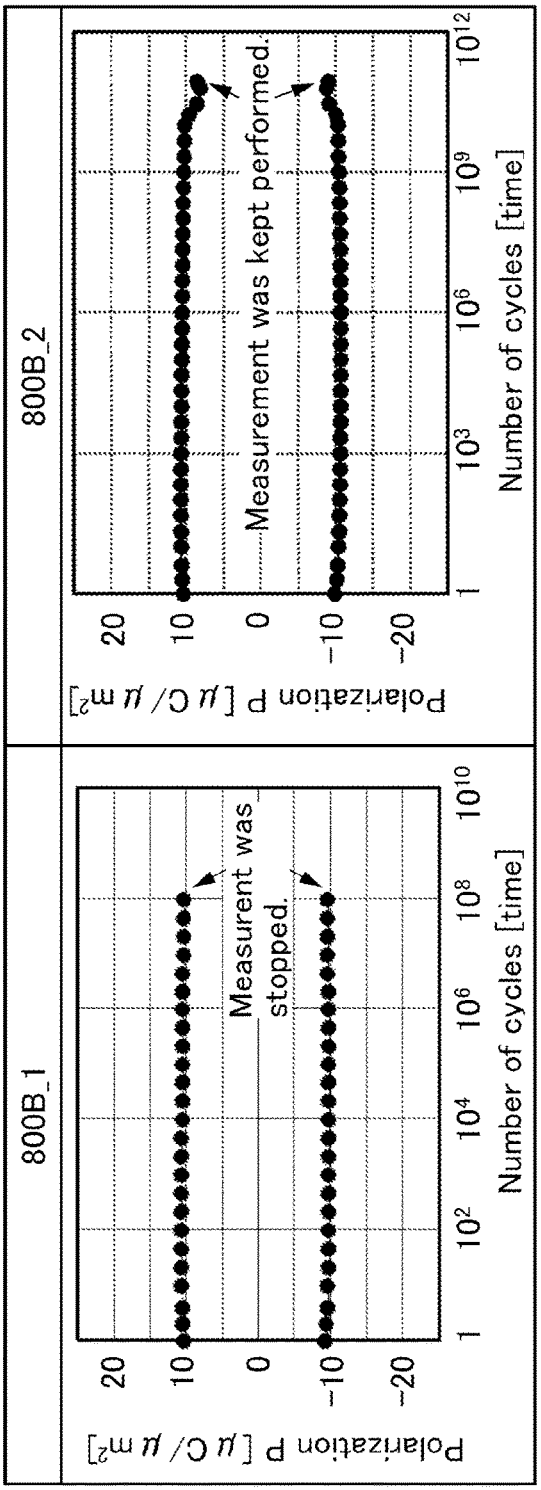
FIG. 45A and FIG. 45B are diagrams showing measurement results of fatigue characteristics.
Figure 45B:
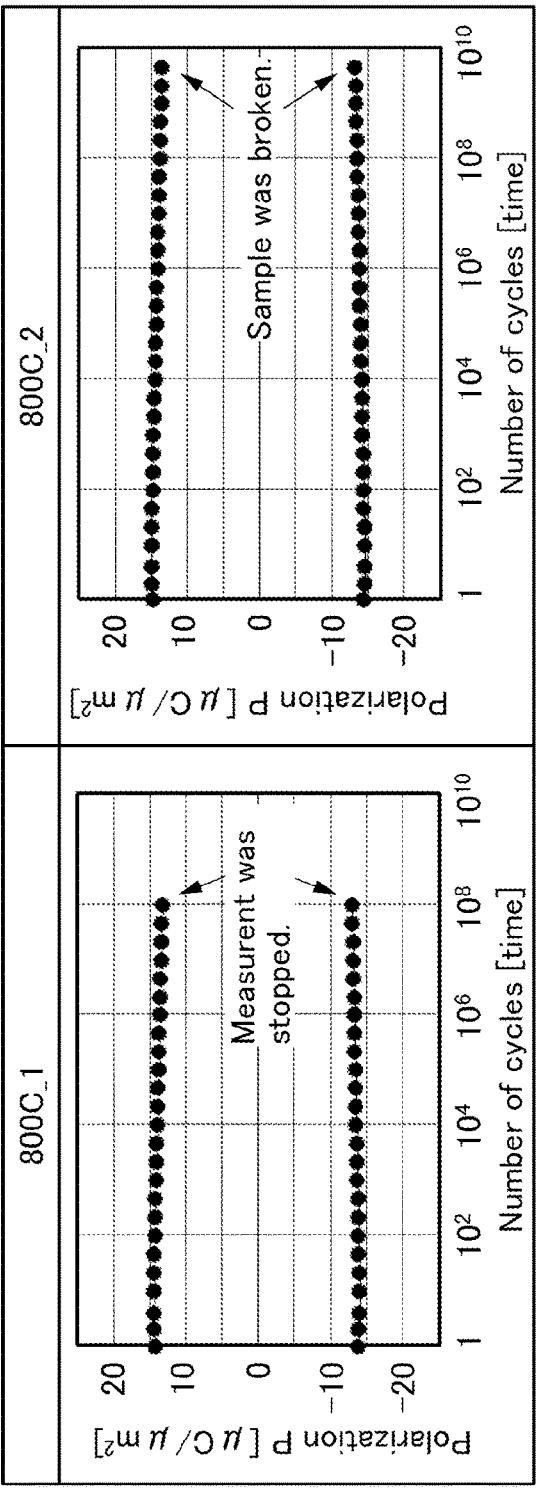
Figure 46A:
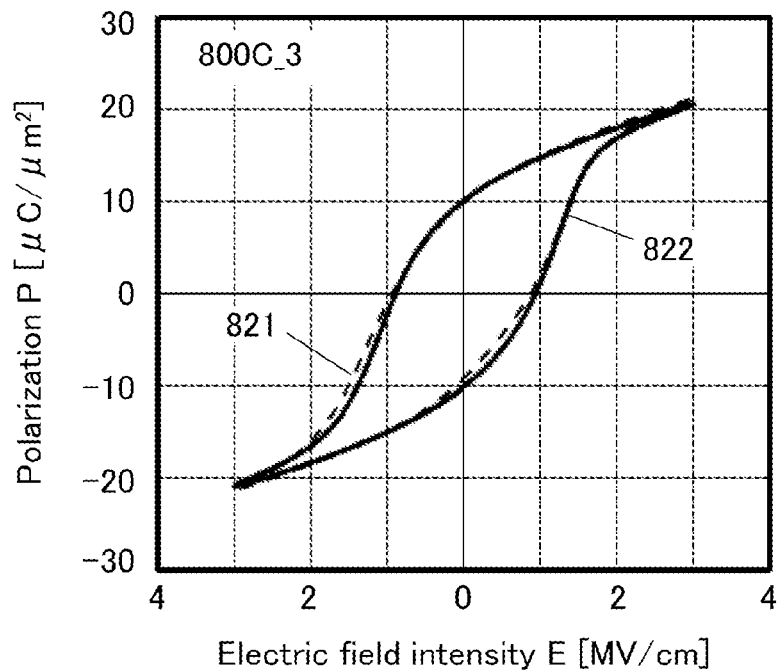
FIG. 46A is a diagram showing P-E characteristics.
Figure 46B:
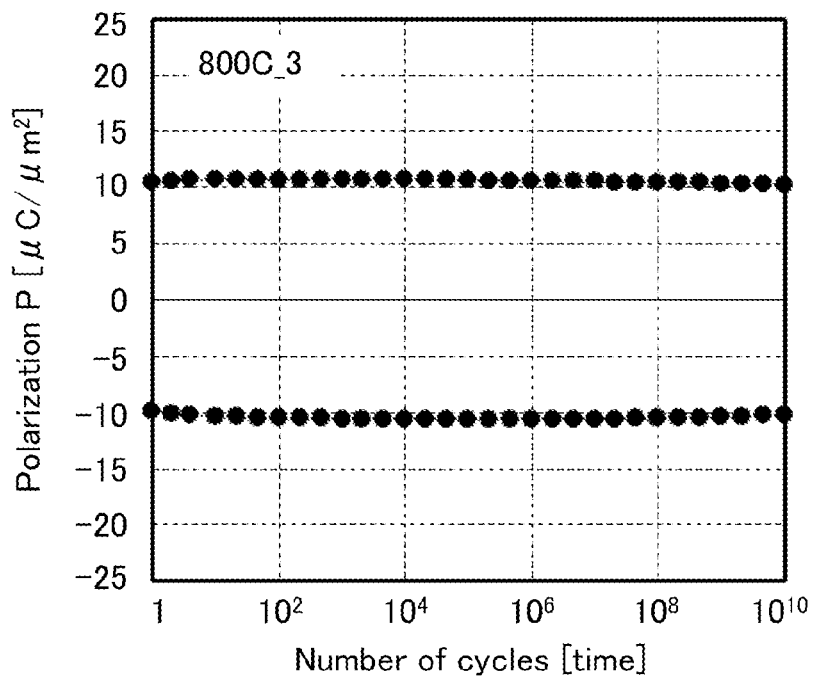
FIG. 46B is a diagram showing measurement results of fatigue characteristics.

FIG. 45A shows the measurement results of the fatigue characteristics of the sample 800B_1 and the sample 800B_2. FIG. 45B shows the measurement results of the fatigue characteristics of the sample 800C_1 and the sample 800C_2. FIG. 46B shows the measurement results of the fatigue characteristics of the sample 800C_3. In FIG. 45A, FIG. 45B, and FIG. 46B, the horizontal axis represents the number of cycles and the vertical axis represents the polarization P.

Specifically, with application of a one-cycle rectangular wave with a voltage amplitude of 3 V and a frequency of 100 Hz regarded as one cycle, P-E characteristics were measured every predetermined cycles using the triangular wave described in Example 1 to obtain the minimum polarization and the maximum polarization at the time when the electric field intensity was 0.

FIG. 45A and FIG. 45B show the values of the minimum polarization and the maximum polarization at an electric field intensity E of 0 which were obtained every predetermined cycles.

The measurement was stopped after $1\times10^8$ cycles in the sample 800B_1 and the sample 800C_1. The measurement was kept performed even after $1\times10^8$ cycles in the sample 800B_2 and the sample 800C_2. Although the shown measurement results of the sample 800B_2 are up to those of $8.6\times10^{10}$ cycles, the measurement was kept performed thereafter. The sample 800C_2 was broken after $4.6\times10^9$ cycles.

Figure 9:
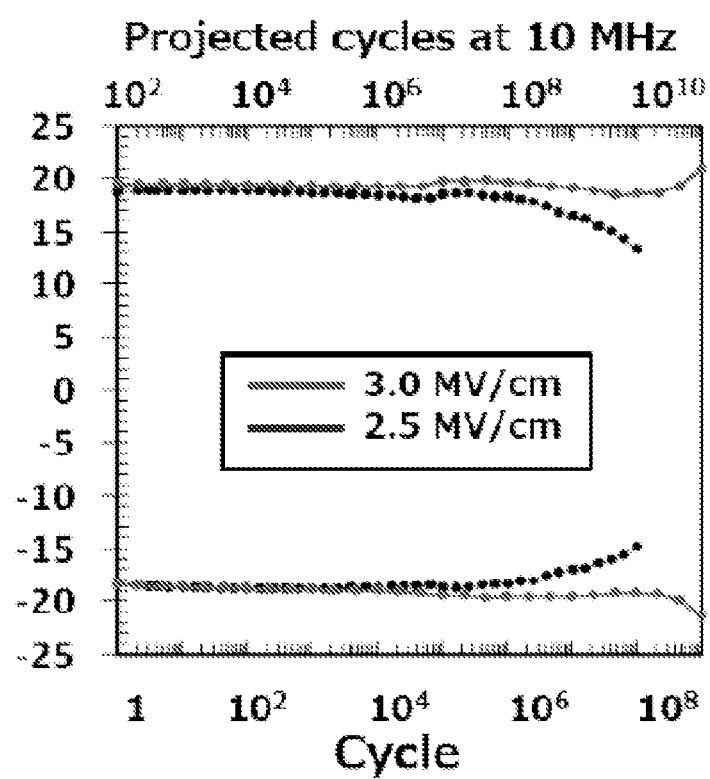
FIG. 9 is a diagram showing writing endurance of a ferroelectric, which is disclosed in Non-Patent Document 3.
Figure 10A:
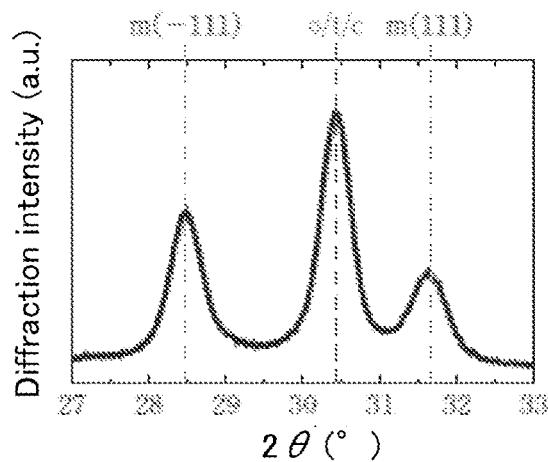
FIG. 10A to FIG. 10C are diagrams showing diffraction intensity, polarization, and crystal structures of HfO$_2$, which are disclosed in Non-Patent Document 4.
Figure 10B:
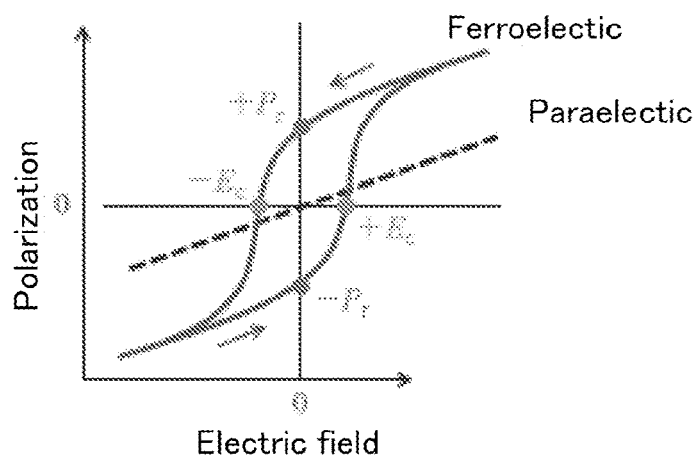
Figure 10C:
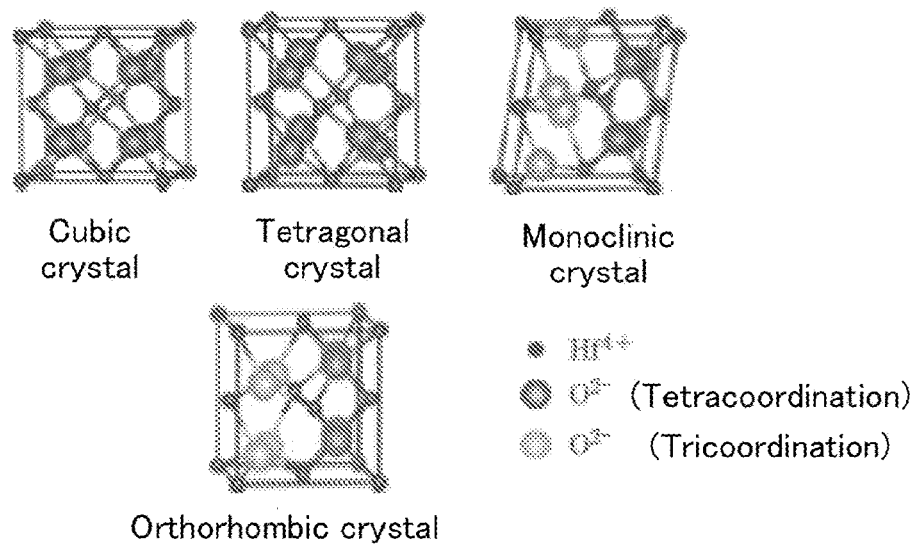

Measurement of the sample 800C_3 was stopped after $1\times10^{10}$ cycles. FIG. 46A shows initial P-E characteristics (a curve 821) of the sample 800C_3 and P-E characteristics after $1\times10^{10}$ cycles (a curve 822) thereof. It is found that the sample 800B_1, the sample 800B_2, the sample 800C_1, the sample 800C_2, and the sample 800C_3 have gentle changes in fatigue characteristics as compared with FIG. 9 (fatigue characteristics described in Non-Patent Document 2). Thus, achievement of tolerance to fatigue after $1\times10^{15}$ cycles or more can be expected.

Example 3

In this example, hafnium zirconium oxide (HfZrO$_X$) was fabricated as an insulator exhibiting ferroelectricity and measurement results of voltage—polarization characteristics, fatigue characteristics, and the like of the insulator are described.

<Sample Structure>

Since the description of the sample 800 in Example 1 can be referred to for the appearance and the schematic cross-sectional view of a sample 830 used for evaluation, the detailed description thereof is omitted.

The sample 830 was formed with the use of single crystal silicon as the substrate 801. Specifically, a 100-nm-thick thermal oxide film was formed as the insulator 802 on the substrate 801, the conductor 803 (the conductor 803a and the conductor 803b) functioning as a lower electrode was formed over the insulator 802, the insulator 804 was formed over the conductor 803, and the conductor 805 (the conductor 805a and the conductor 805b) functioning as an upper electrode was formed over the insulator 804.

Furthermore, the insulator 806 was formed over the conductor 803, the insulator 804, and the conductor 805. The conductor 807 electrically connected to the conductor 803, and the conductor 808 electrically connected to the conductor 805 were formed over the insulator 806. The conductor 807 and the conductor 808 function as electrodes to which measurement signals are input.

Note that formation of the conductor 803, the conductor 805, the conductor 807, and the conductor 808, formation of a contact hole provided in the insulator 806 and the insulator 804, and the like were performed by a known photolithography method and a known etching method.

As the sample 830, 16 samples (a sample 830A to a sample 830P) that differ in the formation conditions and thickness of the insulator 804, the formation conditions of the conductor 805 functioning as an upper electrode, and the heat treatment conditions after formation of the upper electrode were fabricated.

<Sample Fabrication Condition>

Table 2 to Table 5 show the deposition conditions of the conductor 803a, the conductor 803b, the insulator 804, the conductor 805a, and the conductor 805b, which are provided in each of the sample 830A to the sample 830P.

Although not shown in Table 2 to Table 5, 200-nm-thick silicon oxynitride was deposited as the insulator 806 by a PECVD method. Furthermore, a stacked-layer film of three layers of 50-nm-thick Ti, 200-nn-thick Al, and 50-nm-thick Ti was deposited as the conductor 807 and the conductor 808 by a sputtering (SP) method.

In the sample 830A to the sample 830H, the insulator 804 was deposited by an ALD method using an inorganic precursor. Specifically, in the sample 830A to the sample 830H, HfCl$_4$ (hafnium chloride) and ZrCl$_4$ (zirconium chloride) were used as inorganic precursors and H$_2$O (water) was used as an oxidizer.

In the sample 830I to the sample 830P, the insulator 804 was deposited by an ALD method using an organic precursor. Specifically, in the sample 830I to the sample 830P, Hf[N(CH$_3$)$_2$]$_4$ (TEMAH: Tetrakis(ethylmethylamino)hafnium) and Zr(Cp)[(N(CH$_3$)$_2$]$_3$ (Cyclopentadienyltris(dimethylamino)zirconium) were used as organic precursors and O$_3$ (ozone) was used as an oxidizer.

In the sample 830A, the sample 830E, the sample 830I, and the sample 830M, the thickness of the insulator 804 was 4 nm. In the sample 830B, the sample 830F, the sample 830J, and the sample 830N, the thickness of the insulator 804 was 6 nm. In the sample 830C, the sample 830G, the sample 830K, and the sample 830O, the thickness of the insulator 804 was 8 nm. In the sample 830D, the sample 830H, the sample 830L, and the sample 830P, the thickness of the insulator 804 was 10 nm.

In the sample 830A to the sample 830D and the sample 830I to the sample 830L, the conductor 805a was deposited by a metal CVD (MCVD) method. In the sample 830E to the sample 830H and the sample 830M to the sample 830P, the conductor 805a was deposited by a sputtering method. In addition, the sample 830E to the sample 830H and the sample 830M to the sample 830P were subjected to heat treatment by an RTA method after the sample fabrication. Table 2 to Table 5 also show the heat treatment conditions.

TABLE 2

| Sample name | 830A | 830B | 830C | 830D |
|---|---|---|---|---|
| Conditions of heat treatment after sample fabrication | Not performed | | | |
| 805b | Deposition method: SP method, Composition: W, Thickness: 20 nm Deposition temperature 130° C. | | | |
| 805a | Deposition method: MCVD method, Composition: TiNx, Thickness: 10 nm Deposition temperature: 400° C. | | | |
| 804 | Deposition method: ALD method, Composition: HfZrOx Precursor: inorganic precursor, Oxidizer: H$_2$O, Deposition temperature: 300° C. | | | |
| | Thickness: 4 nm | Thickness: 6 nm | Thickness: 8 nm | Thickness: 10 nm |
| 803b | Deposition method: MCVD method, Composition: TiNx, Thickness: 10 nm Deposition temperature: 400° C. | | | |
| 803a | Deposition method: SP method, Composition: W, Thickness: 30 nm Deposition temperature: 130° C. | | | |

TABLE 3

| Sample name | 830E | 830F | 830G | 830H |
|---|---|---|---|---|
| Conditions of heat treatment after sample fabrication | Heat treatment method: RTA, Heat treatment temperature: 500° C. Heating atmosphere: nitrogen, Heating time: 60 sec | | | |
| 805b | Deposition method: SP method, Composition: W, Thickness: 20 nm Deposition temperature 130° C. | | | |
| 805a | Deposition method: SP method, Composition: TiNx, Thickness: 10 nm Deposition temperature: room temperature (not heated) | | | |
| 804 | Deposition method: ALD method, Composition: HfZrOx Precursor: inorganic precursor, Oxidizer: $H_2O$, Deposition temperature: 300° C. | | | |
| | Thickness: 4 nm | Thickness: 6 nm | Thickness: 8 nm | Thickness: 10 nm |
| 803b | Deposition method: MCVD method, Composition: TiNx, Thickness: 10 nm Deposition temperature: 400° C. | | | |
| 803a | Deposition method: SP method, Composition: W, Thickness: 30 nm Deposition temperature: 130° C. | | | |

TABLE 4

| Sample name | 830I | 830J | 830K | 830L |
|---|---|---|---|---|
| Conditions of heat treatment after sample fabrication | Not performed | | | |
| 805b | Deposition method: SP method, Composition: W, Thickness: 20 nm Deposition temperature 130° C. | | | |
| 805a | Deposition method: MCVD method, Composition: TiNx, Thickness: 10 nm Deposition temperature: 400° C. | | | |
| 804 | Deposition method: ALD method, Composition: HfZrOx Precursor: organic precursor, Oxidizer: $O_3$, Deposition temperature: 250° C. | | | |
| | Thickness: 4 nm | Thickness: 6 nm | Thickness: 8 nm | Thickness: 10 nm |
| 803b | Deposition method: MCVD method, Composition: TiNx, Thickness: 10 nm Deposition temperature: 400° C. | | | |
| 803a | Deposition method: SP method, Composition: W, Thickness: 30 nm Deposition temperature: 130° C. | | | |

TABLE 5

| Sample name | 830M | 830N | 830O | 830P |
|---|---|---|---|---|
| Conditions of heat treatment after sample fabrication | Heat treatment method: RTA, Heat treatment temperature: 500° C. Heating atmosphere: nitrogen, Heating time: 60 sec | | | |
| 805b | Deposition method: SP method, Composition: W, Thickness: 20 nm Deposition temperature 130° C. | | | |
| 805a | Deposition method: SP method, Composition: TiNx, Thickness: 10 nm Deposition temperature: room temperature (not heated) | | | |
| 804 | Deposition method: ALD method, Composition: HfZrOx Precursor: organic precursor, Oxidizer: $O_3$, Deposition temperature: 250° C. | | | |
| | Thickness: 4 nm | Thickness: 6 nm | Thickness: 8 nm | Thickness: 10 nm |
| 803b | Deposition method: MCVD method, Composition: TiNx, Thickness: 10 nm Deposition temperature: 400° C. | | | |
| 803a | Deposition method: SP method, Composition: W. Thickness: 30 nm Deposition temperature: 130° C. | | | |

<P-E Characteristics>

A triangular wave with a voltage amplitude of 3 V and a frequency of 100 Hz was applied between the conductor 807 and the conductor 803, and a change in spontaneous polarization (P-E characteristics) of the insulator 804 was measured. Since the description in Example 1 can be referred to for the method for obtaining the input voltage waveform and the P-E characteristics, the detailed description thereof is omitted.

Figure 47:
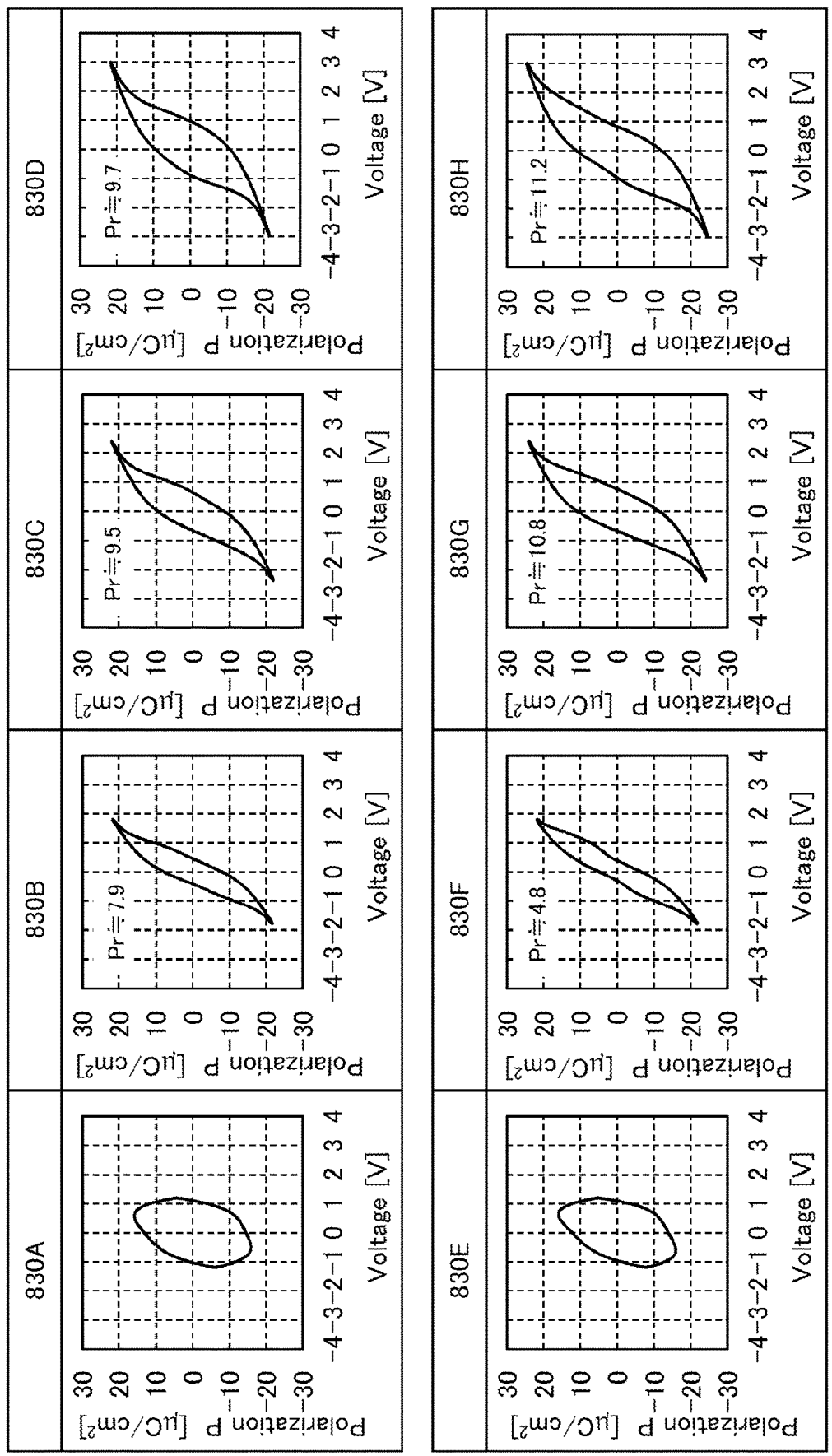
FIG. 47 shows diagrams showing P-E characteristics.
Figure 48:
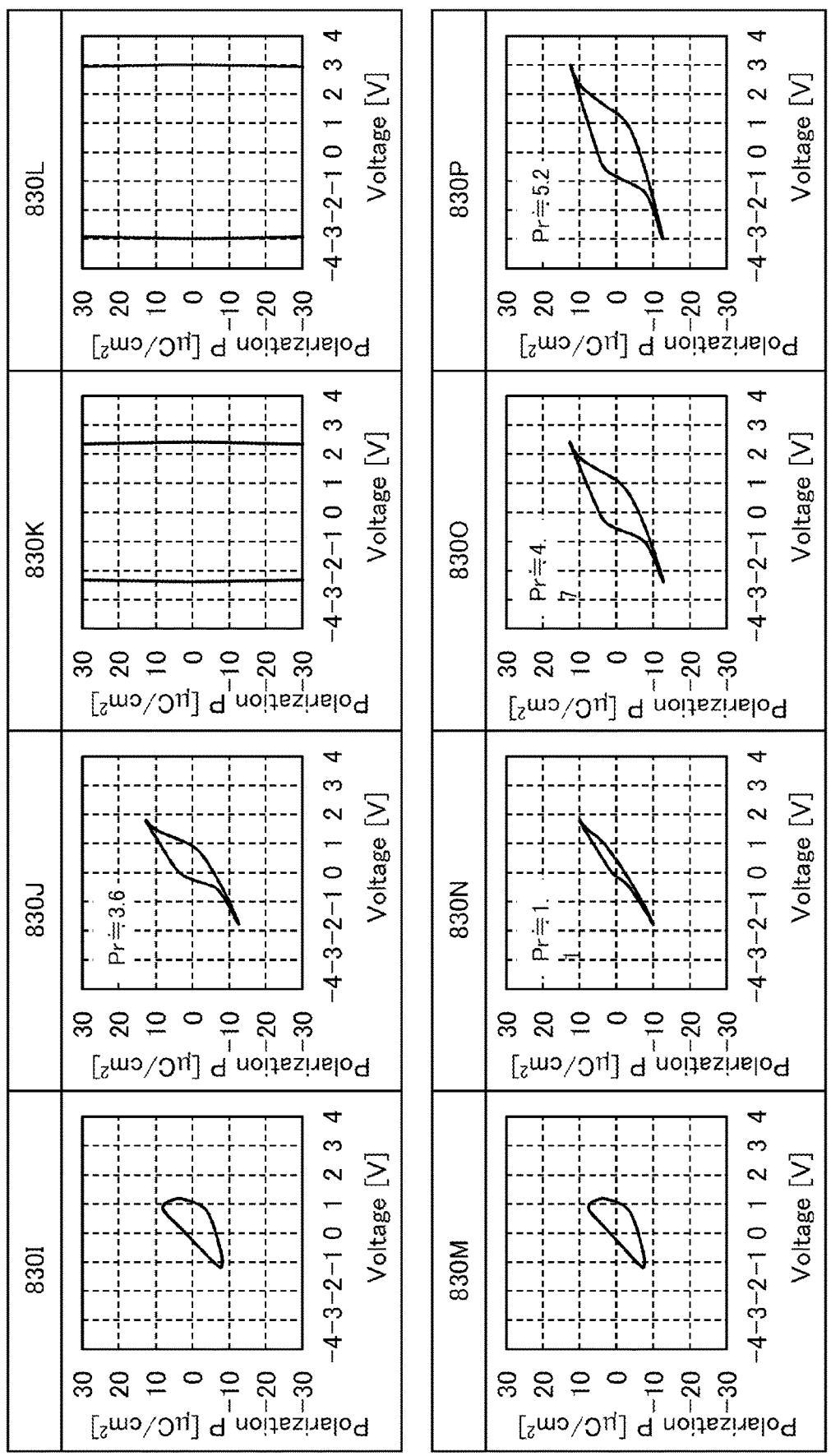
FIG. 48 shows diagrams showing I-V characteristics.

FIG. 47 shows the measurement results of the P-E characteristics of the sample 830A to the sample 830H. FIG. 48 shows the measurement results of the P-E characteristics of the sample 830I to the sample 830P. In each of FIG. 47 and FIG. 48, the relationship between the electric field intensity E applied to the insulator 804 and the polarization P is shown for each sample.

<I-V Characteristics>

A voltage was applied between the conductor 807 and the conductor 803, and a current flowing therebetween (I-V characteristics) was measured.

Figure 49:
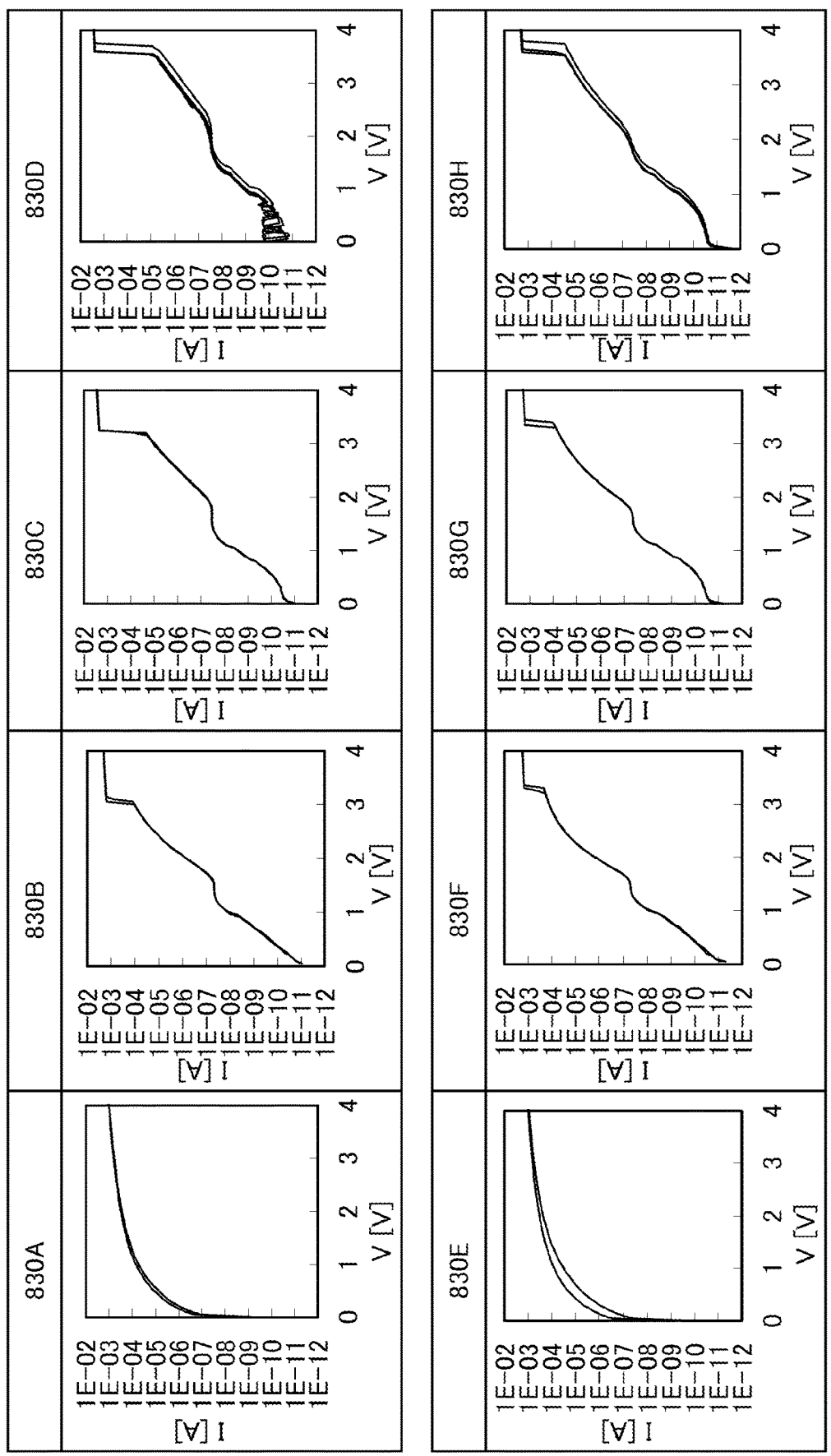
FIG. 49 shows diagrams showing XRD measurement results.
Figure 50:
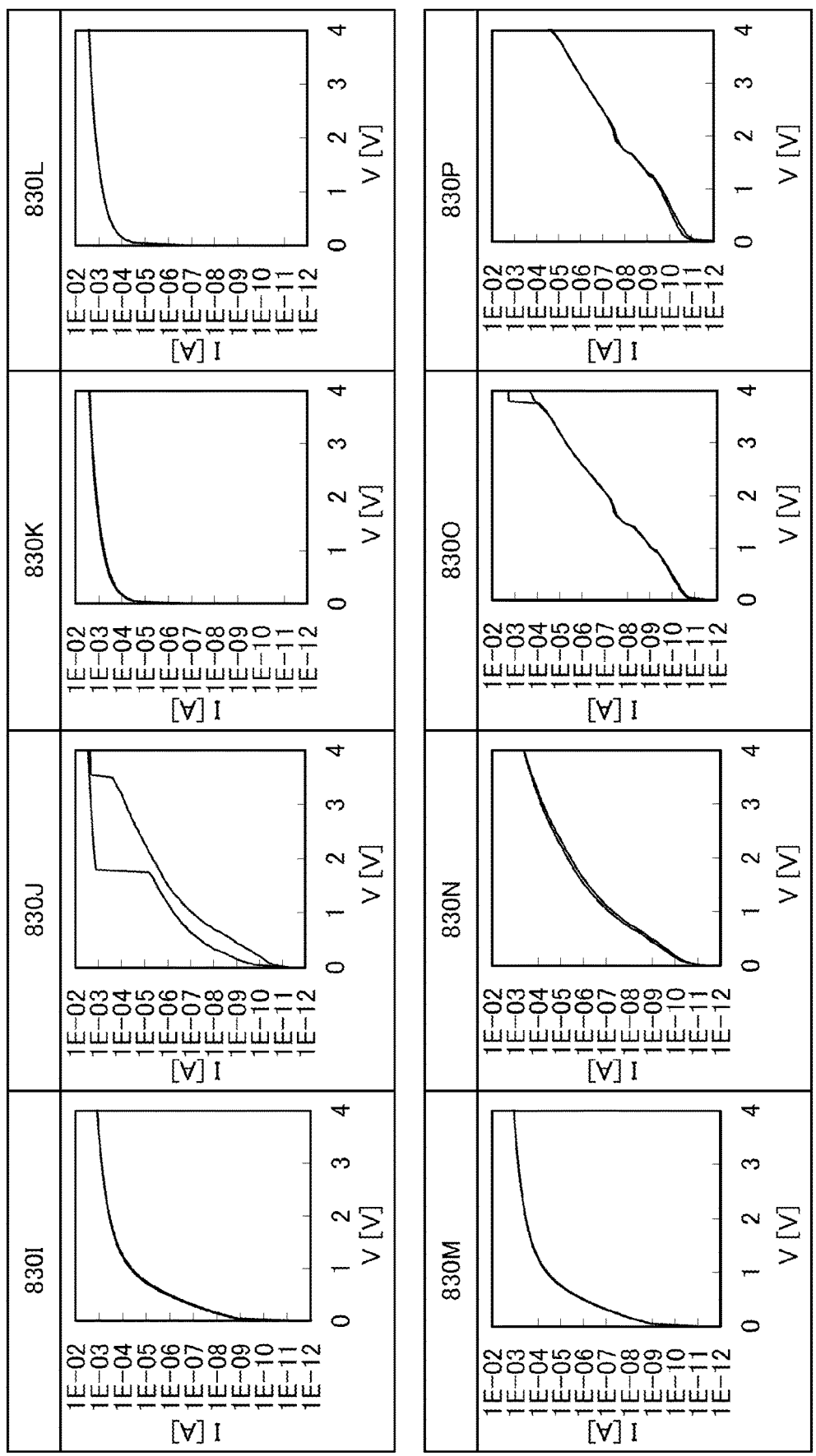
FIG. 50 shows diagrams showing P-E characteristics.

FIG. 49 shows the measurement results of the I-V characteristics of the sample 830A to the sample 830H. FIG. 50 shows the measurement results of the I-V characteristics of the sample 830I to the sample 830P. In each of FIG. 49 and FIG. 50, the relationship between the applied voltage and the flowed current is shown for each sample.

<GIXD>

The crystal state of the HfZrOx film corresponding to the insulator 804 of each of the sample 830A to the sample 830P was investigated using grazing incident X-ray diffraction (GIXD), which is a kind of XRD analysis method.

Figure 51:
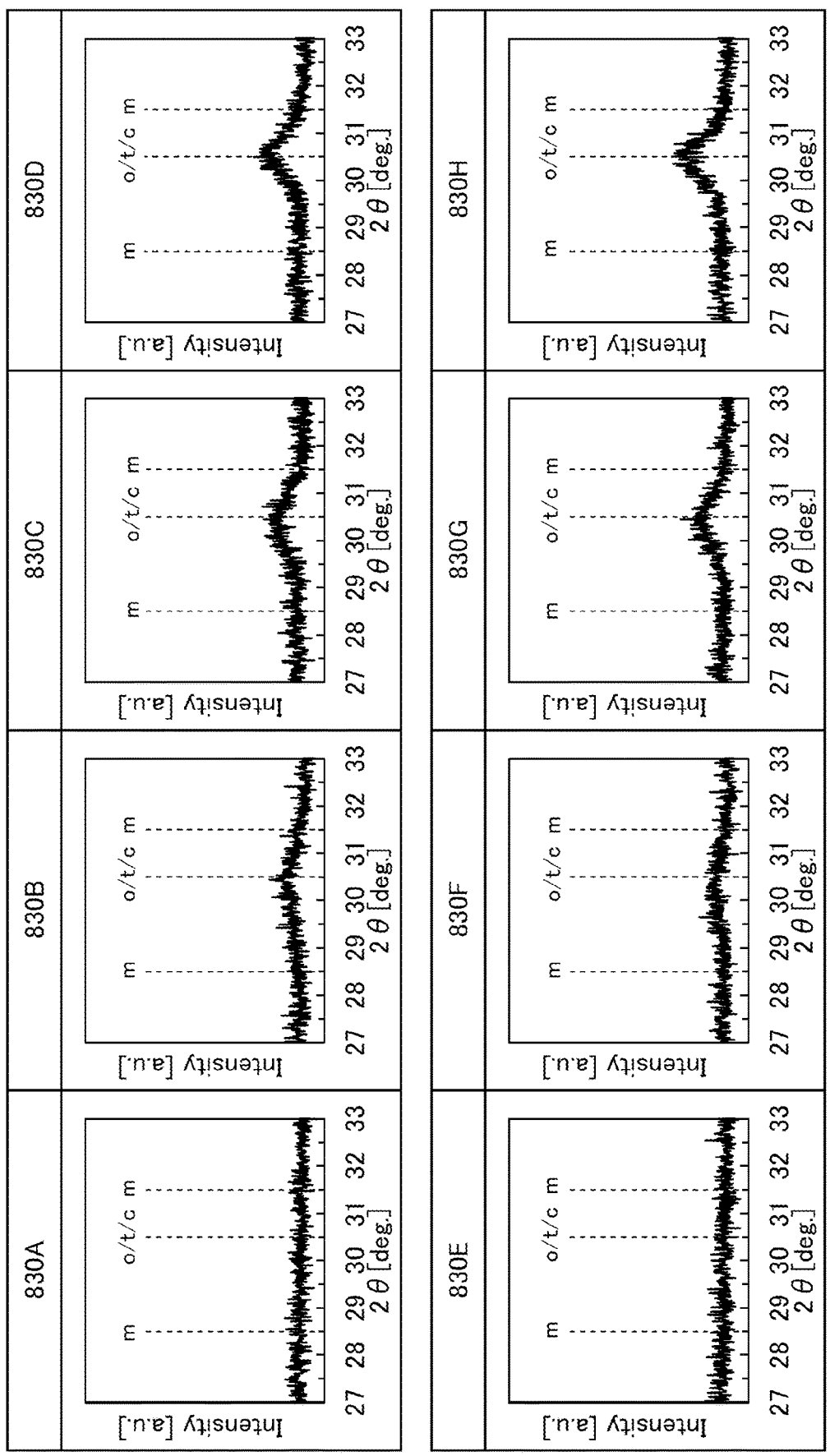
FIG. 51 shows diagrams showing I-V characteristics.
Figure 52:
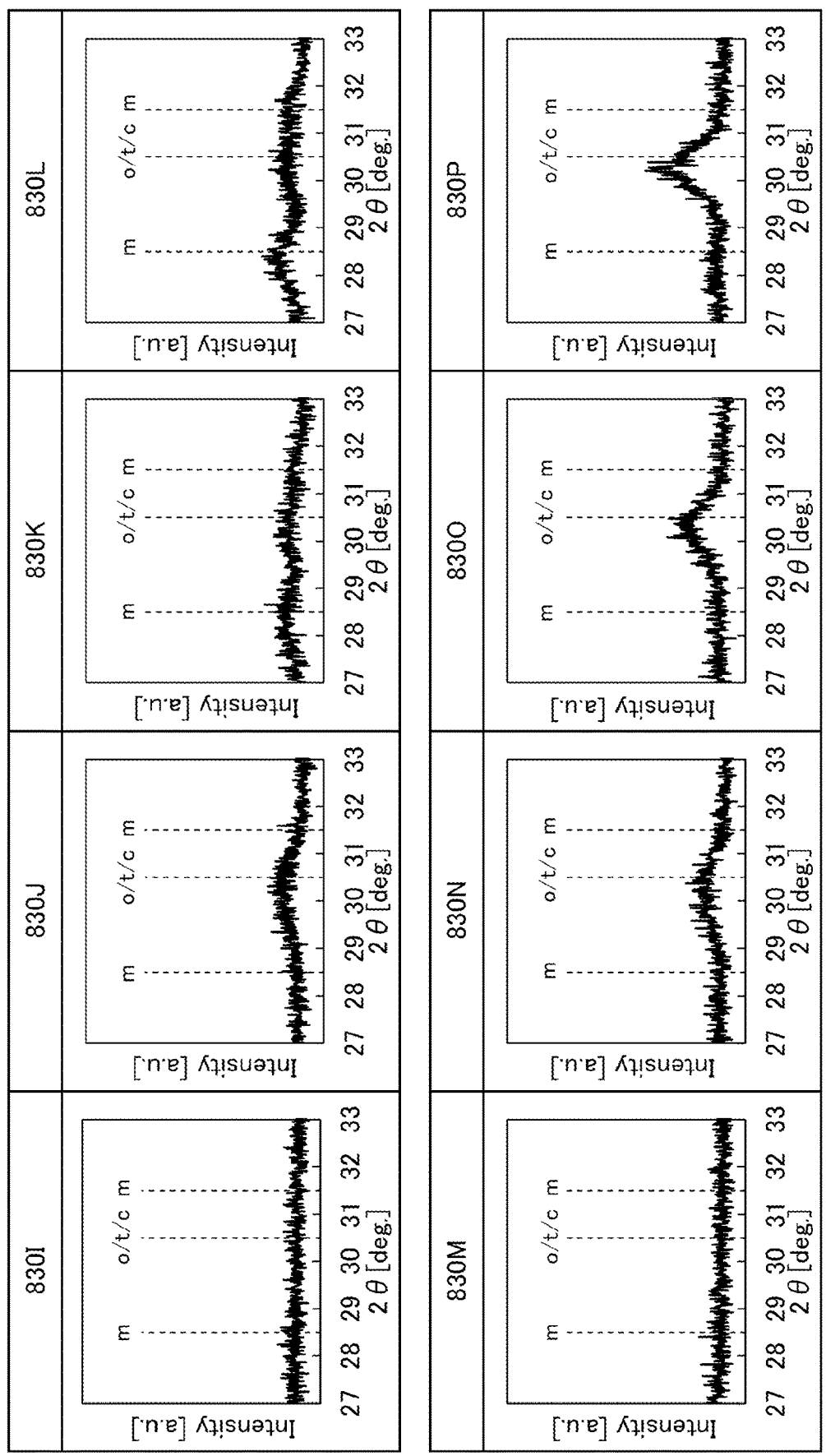
FIG. 52 shows diagrams showing XRD measurement results.

FIG. 51 shows the GIXD measurement results of the sample 830A to the sample 830H. FIG. 52 shows the GIXD measurement results of the sample 830I to the sample 830P. In each of FIG. 51 and FIG. 52, the relationship between an incidence angle (2θ) of X-ray and detected signal intensity is shown for each sample. In addition, in each of FIG. 51 and FIG. 52, the peak positions of crystals of HfZrOx are indicated by dashed lines, and the peak position of a monoclinic crystal, the peak position of an orthorhombic crystal, the peak position of a tetragonal crystal, and the peak position of a cubic crystal are indicated by m, o, t, and c, respectively. Note that it is difficult to distinguish an orthorhombic crystal (o), a tetragonal crystal (t), and a cubic crystal (c) from each other by XRD.

<Fatigue Characteristics>

The results of the above-mentioned fatigue characteristics measurement performed on the sample 830H and the sample 830P are described.

With application of a one-cycle rectangular wave with a voltage amplitude of 3 V and a frequency of 100 Hz regarded as one cycle, the fatigue characteristics were measured every predetermined cycles using the above-described triangular wave to obtain the minimum polarization and the maximum polarization at the time when the electric field intensity was 0.

Figure 53:
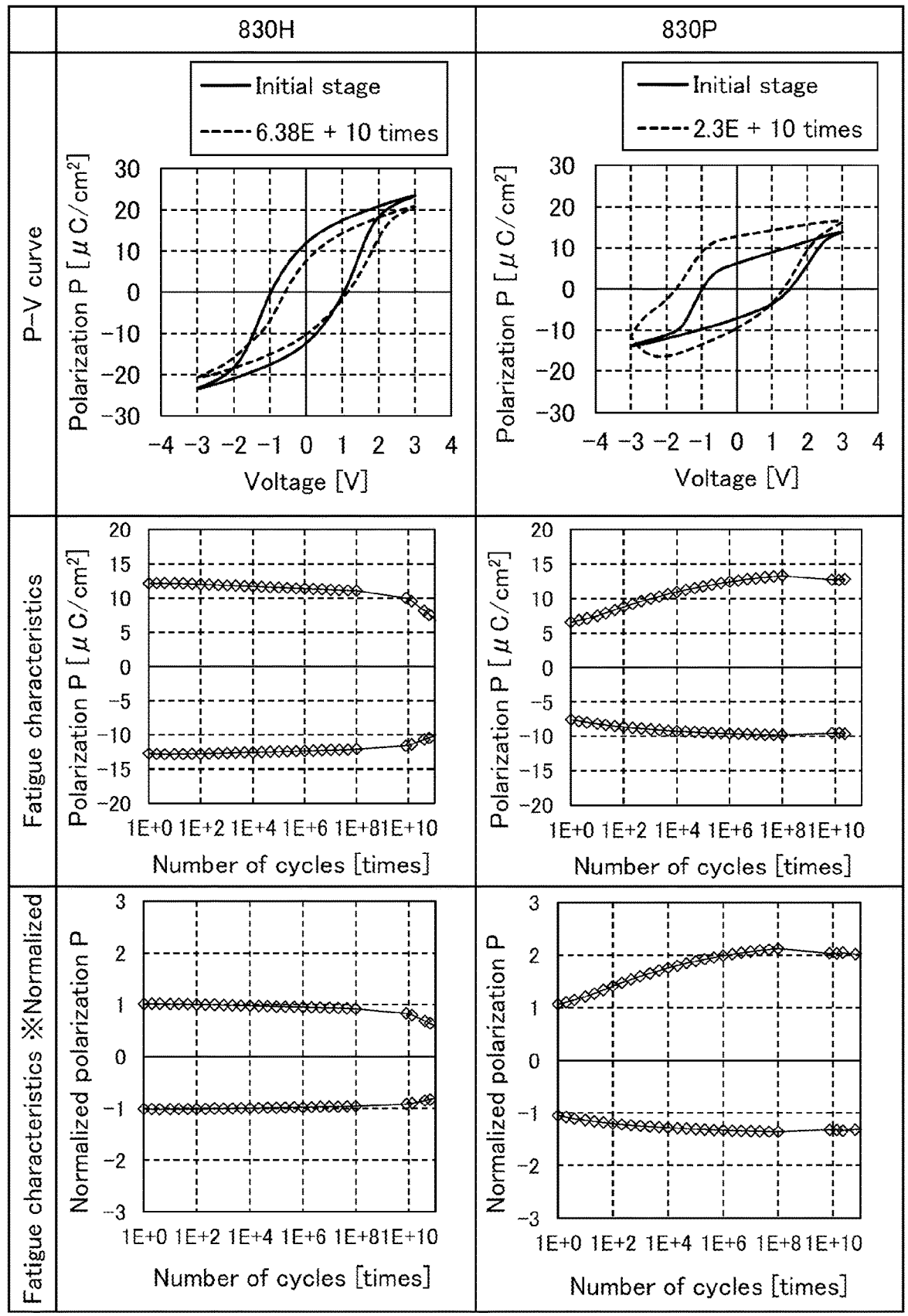
FIG. 53 shows diagrams showing fatigue characteristics.

FIG. 53 shows the measurement results of the fatigue characteristics of the sample 830H and the sample 830P. Note that the first row of FIG. 53 shows the P-E characteristics at the initial stage and at the end of the fatigue characteristics measurement. The second row of FIG. 53 shows the measurement results of the fatigue characteristics, with the horizontal axis representing the number of cycles and the vertical axis representing the polarization P. The third row of FIG. 53 shows values normalized by the polarization P at the initial stage of the fatigue characteristics measurement.

Example 4

In this example, hafnium zirconium oxide (HfZrOx) was fabricated as an insulator exhibiting ferroelectricity and evaluation results of frequency dependence of an input voltage (triangular wave) with respect to the voltage—polarization characteristics of the insulator are described.

<Sample Structure>

Since the description of the sample 800 in Example 1 can be referred to for the appearance and the schematic cross-sectional view of samples used for evaluation, the detailed description thereof is omitted.

The sample was formed with the use of single crystal silicon as the substrate 801. Specifically, a 100-nm-thick thermal oxide film was formed as the insulator 802 on the substrate 801, the conductor 803 (the conductor 803a and the conductor 803b) functioning as a lower electrode was formed over the insulator 802, the insulator 804 was formed over the conductor 803, and the conductor 805 (the conductor 805a and the conductor 805b) functioning as an upper electrode was formed over the insulator 804.

As the conductor 803a, 30-nm-thick W was deposited by a sputtering method. As the conductor 803b, 20-nm-thick TiNx was deposited by a metal CVD (MCVD) method.

As the insulator 804, 10-nm-thick hafnium zirconium oxide (HfZrOx) was deposited by an ALD method using an inorganic precursor. Specifically, $HfCl_4$ (hafnium chloride) and $ZrCl_4$ (zirconium chloride) were used as inorganic precursors and $H_2O$ was used as an oxidizer. The substrate temperature at the time of depositing the hafnium zirconium oxide (HfZrOx) was 300° C.

As the conductor 805a, 10-nm-thick TiNx was deposited by a sputtering (SP) method. As the conductor 805b, 20-nm-thick W was deposited by a sputtering (SP) method.

Furthermore, the insulator 806 was formed over the conductor 803, the insulator 804, and the conductor 805. The conductor 807 electrically connected to the conductor 803, and the conductor 808 electrically connected to the conductor 805 were formed over the insulator 806. The conductor 807 and the conductor 808 function as electrodes to which measurement signals are input.

Note that formation of the conductor 803, the conductor 805, the conductor 807, and the conductor 808, formation of a contact hole provided in the insulator 806 and the insulator 804, and the like were performed by a known photolithography method and a known etching method.

In addition, heat treatment by an RTA method was performed after the sample fabrication. The heat treatment was performed in a nitrogen atmosphere at 500° C. for 60 sec.

<P-E Characteristics>

A triangular wave with a voltage amplitude of 3 V and a frequency of 100 Hz was applied between the conductor 807 and the conductor 803, and a change in spontaneous polarization (P-E characteristics) of the insulator 804 was measured. The evaluation was performed at different triangular wave frequencies: 1 kHz, 100 Hz, and 10 Hz. Since the description in Example 1 can be referred to for the method for obtaining the input voltage waveform and the P-E characteristics, the detailed description thereof is omitted.

Figure 54:
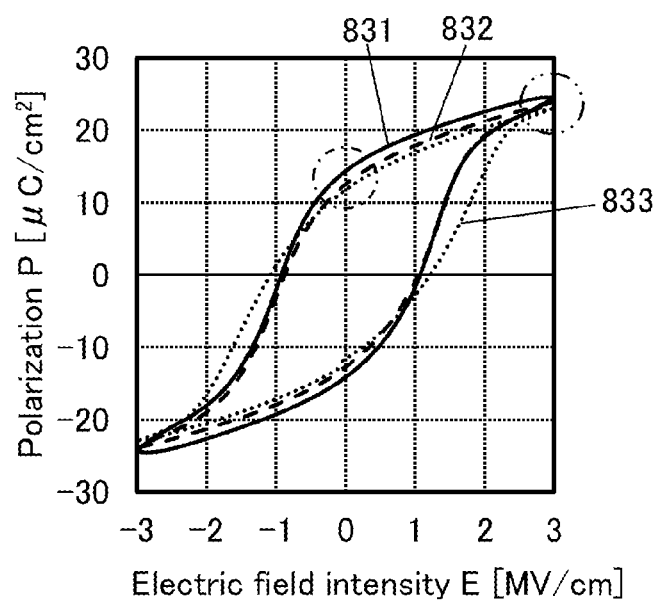
FIG. 54 is a diagram showing P-E characteristics.

FIG. 54 shows the measurement results of the P-E characteristics. In FIG. 54, the relationship between the electric field intensity E applied to the insulator 804 and the polarization P is shown for each sample. In FIG. 54, a solid line 831 represents data at a frequency of 10 Hz, a dashed line 832 represents data at 100 Hz, and a dotted line 833 represents data at 1 kHz.

Figure 55A:
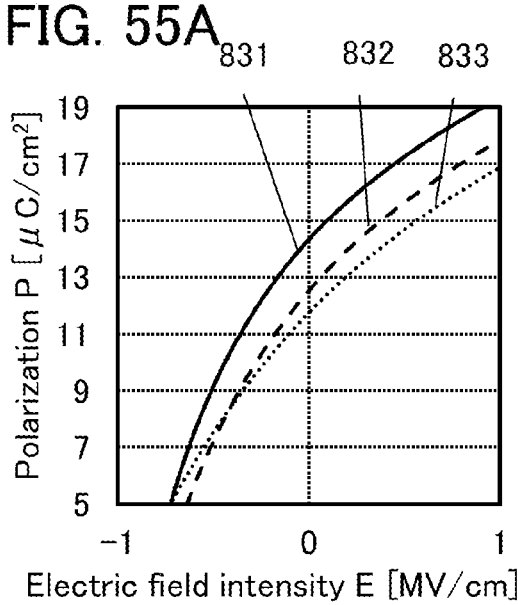
FIG. 55A and FIG. 55B are diagrams showing P-E characteristics.
Figure 55B:
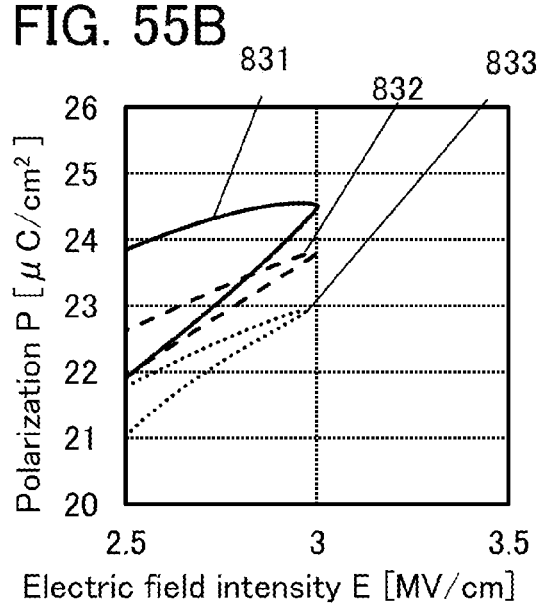
Figure 55C:
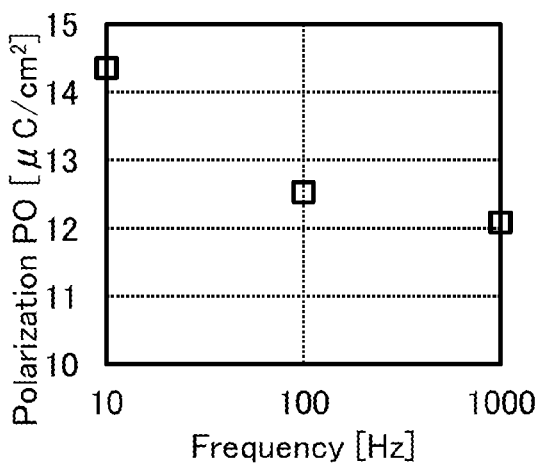
FIG. 55C and FIG. 55D are diagrams showing the relationship between polarization and a triangular wave frequency.
Figure 55D:
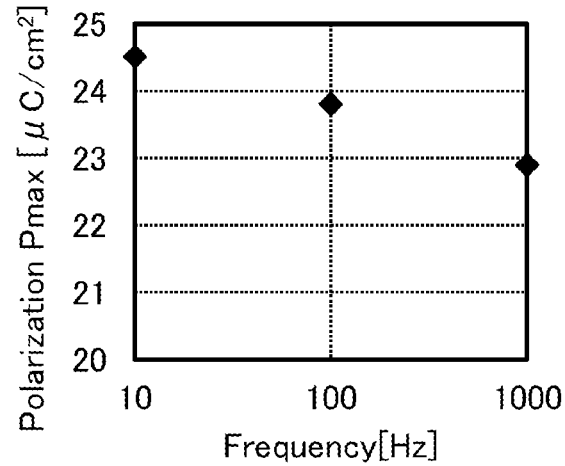

FIG. 55A and FIG. 55B are enlarged views of regions shown by dashed-dotted lines in FIG. 54. FIG. 55C and FIG. 55D show the relationship between the polarization P and the triangular wave frequency. FIG. 55C shows the polarization P at the time when the electric field E is 0 MV/cm, and FIG. 55D shows the polarization P at the time when the electric field E is 3 MV/cm (at a voltage of 3 V).

As shown in FIG. 54 and FIG. 55A to FIG. 55D, the polarization P tended to be smaller as the triangular wave frequency was higher.

Example 5

<Calculation of Influence of Carbon>

In this section, influence of carbon on hafnium zirconium oxide (HfZrOx) was evaluated by calculation.

Here, a calculation model used for the calculation is described.

First, a single crystal model of zirconium oxide having an orthorhombic crystal structure was prepared. Note that the orthorhombic crystal structure belongs to the space group of Pca21(29). In addition, the number of atoms in the single crystal model is 96.

Next, half of zirconium atoms included in the single crystal model was replaced with hafnium atoms. Accordingly, the composition of the single crystal model becomes Hf:Zr:O=1:1:4.

Figure 56A:
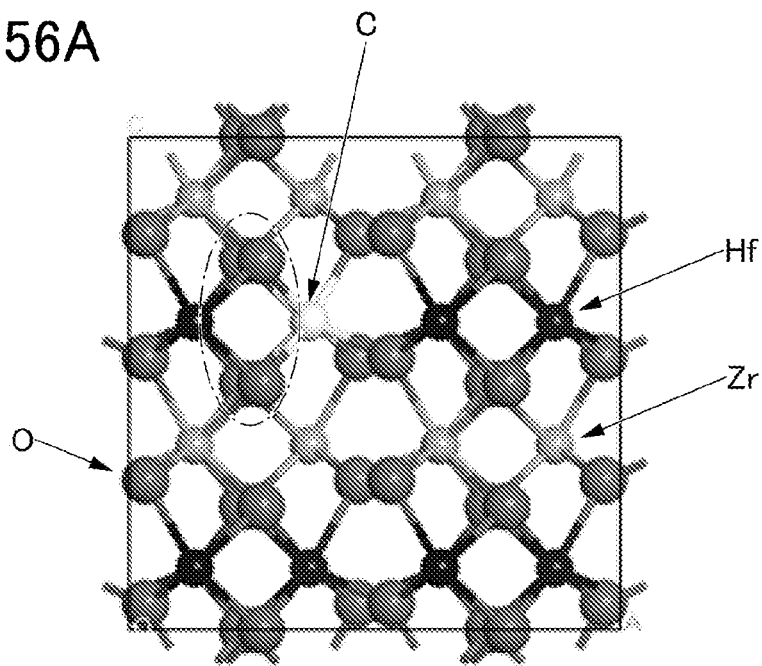
FIG. 56A is a diagram showing a calculation model.

Then, one hafnium atom in the single crystal model was replaced with a carbon atom. The single crystal model was used as a calculation model of first-principles calculation. FIG. 56A shows the calculation model. Note that some atoms are not illustrated for visibility of the diagram.

The atom arrangement was optimized by calculation using the calculation model shown in FIG. 56A. For the calculation, the first-principles calculation software VASP (The Vienna Ab initio simulation) was used. The calculation conditions are listed in Table 6.

TABLE 6

| Calculation program | VASP |
|---|---|
| Basis function | plane wave |
| Functional | GGA-PBE |
| Pseudopotential | PAW |
| Cut-off energy | 500 eV |
| k-point grid | 2 × 2 × 2 |

As a pseudopotential of electronic states, a potential generated by a Projector Augmented Wave (PAW) method was used, and as a functional, GGA/PBE (Generalized-Gradient-Approximation/Perdew-Burke-Emzerhof) was used. Note that the calculation model size (lattice constant and angle between axes) was constant.

Figure 56B:
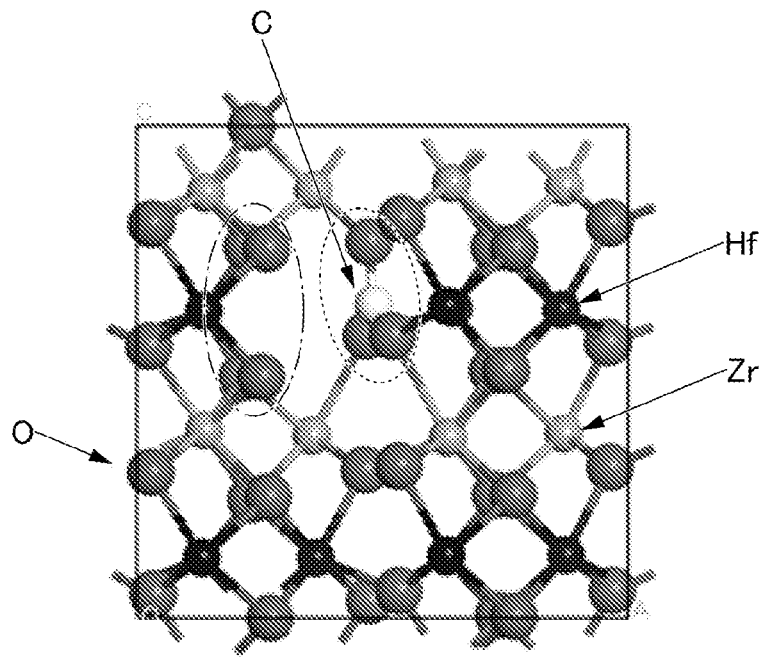
FIG. 56B is a diagram showing a calculation model after calculation.

FIG. 56B shows the calculation model after calculation for optimizing the atomic arrangement was performed. Note that some atoms are not illustrated for visibility of the diagram.

In the calculation model before the calculation (see FIG. 56A), seven oxygen atoms are coordinated to a hafnium atom before replacement with a carbon atom. Meanwhile, in the calculation model after the calculation (see FIG. 56B), three oxygen atoms (the oxygen atoms in a region surrounded by a dotted line in FIG. 56B) were coordinated to the carbon atom. In other words, it was found that the other four oxygen atoms coordinated to the hafnium atom before replacement with the carbon atom (the oxygen atoms in a region surrounded by a dashed-dotted line in FIG. 56A) were apart from the carbon atom after the calculation. Specifically, in the calculation model after the calculation, a distance between the carbon atom and each of the oxygen atoms coordinated to the carbon atom was approximately 0.13 nm, and a distance between the carbon atom and each of the four oxygen atoms apart from the carbon atom was greater than or equal to 0.30 nm and less than or equal to 0.35 nm.

The above results indicate that entry of carbon to the hafnium zirconium oxide breaks the structure of the hafnium zirconium oxide and makes it difficult to form an orthorhombic crystal structure.

The oxygen atoms coordinated to the carbon atom after the calculation (the oxygen atoms in the region surrounded by the dotted line in FIG. 56B) are oxygen atoms not having inversion symmetry, that is, causing ferroelectricity. When the oxygen atoms are strongly bound by the carbon atom, there might be influence of displacement by electric field.

The oxygen atoms apart from the carbon atom after the calculation (the oxygen atoms in the region surrounded by the dashed-dotted line in FIG. 56B) have a small number of bonds with a hafnium atom or a zirconium atom compared with the case of a single crystal model of hafnium zirconium oxide. It is thus presumed that the oxygen atoms are likely to form vacancies.

The above results indicate the possibility that entry of carbon to the hafnium zirconium oxide adversely affect ferroelectricity. In other words, it is indicated that in order to make the hafnium zirconium oxide exhibit ferroelectricity, the carbon concentration in the hafnium zirconium oxide is preferably low.

Example 6

<Retention Measurement>

In this example, results of fatigue characteristics measurement performed on the sample 800B described in Example 1 are described.

Figure 57A:
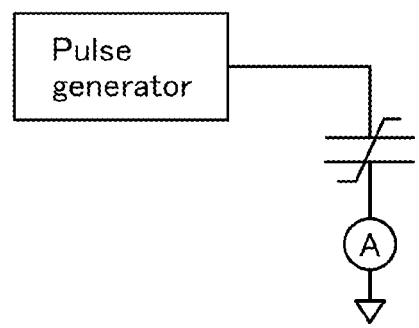
FIG. 57A and FIG. 57B are diagrams showing retention measurement.
Figure 57B:
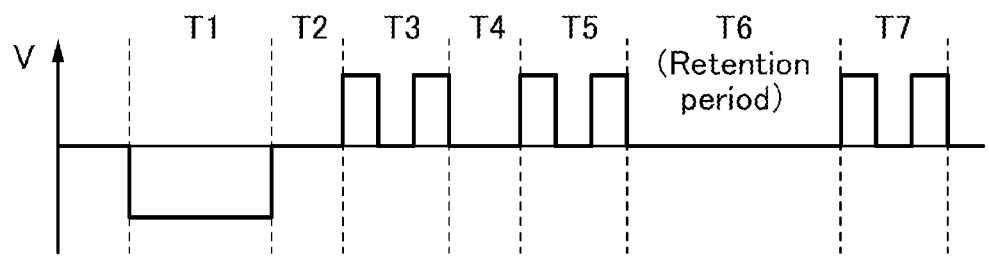
Figure 58A:
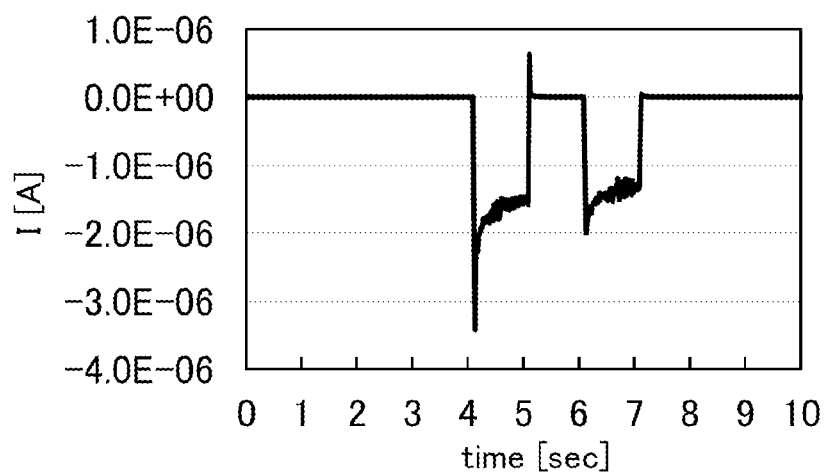
FIG. 58A to FIG. 58C are diagrams showing retention measurement results.
Figure 58B:
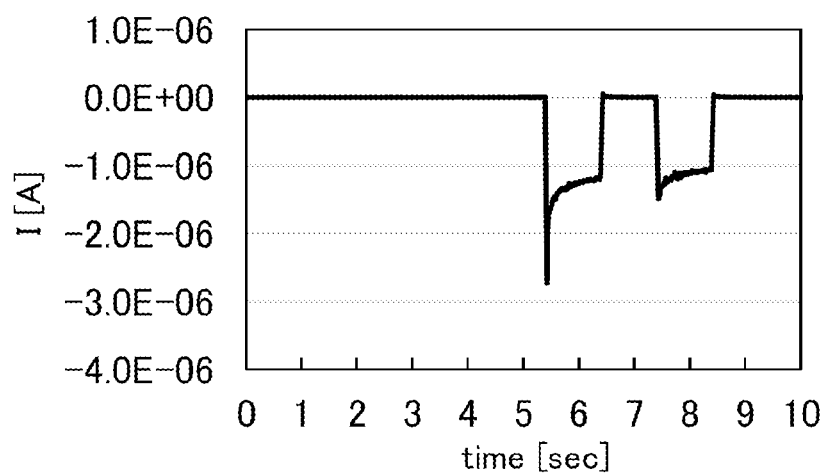
Figure 58C:
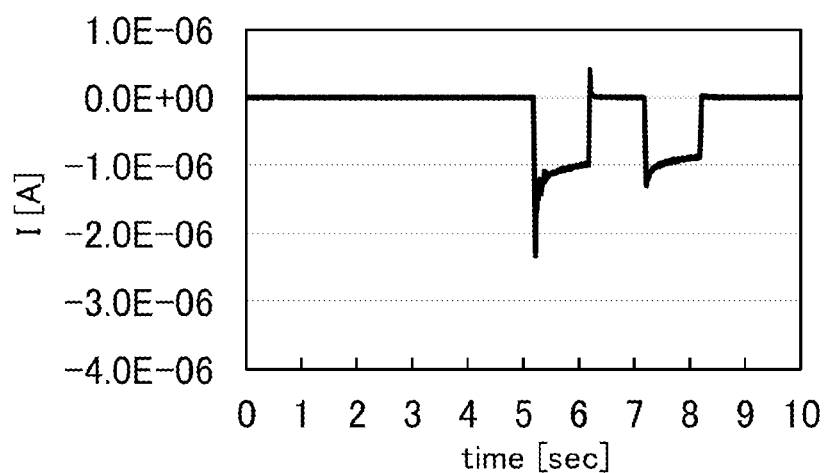

FIG. 57A shows the measurement system of the retention measurement. FIG. 57B shows the operation sequence of the retention measurement. FIG. 58A, FIG. 58B, and FIG. 58C show the results of the retention measurement.

As shown in FIG. 57A, the measurement system of the retention measurement includes at least a pulse generator and an ammeter. The measurement was performed at room temperature.

In the retention measurement, a potential is supplied to a sample using the pulse generator and a current flowing at that time is measured. The operation sequence of the retention measurement shown in FIG. 57B is described. In Period Ti, a negative potential is supplied to the sample to cause a polarization state on the negative potential side. After Period T2 with a potential of 0 V, a positive potential pulse (a rectangular wave of 3 V for 5 sec) is supplied twice in Period T3 to cause the polarization state on the negative potential side. Here, the pulse is supplied twice in Period T3 to cancel constant leakage. Then, after Period T4 with a potential of 0 V for approximately 10 seconds, a positive potential pulse similar to that in Period T3 is supplied twice in Period T5. Note that Period T4 is short and polarization of the sample is retained, and thus a current due to change in polarization does not flow in Period T5, but a current due to leakage flows. Next, in Period T6, for the retention measurement, retention at a potential of 0 V is performed under two retention period conditions, 10 seconds and 10 hours. Then, in Period T7, a positive potential pulse similar to that in Period T3 and Period T5 is supplied twice, and a current flowing in the sample is compared. In the case where a current flowing in Period T7 is larger than a current flowing in Period T5, it is highly possible that the amount of polarization is reduced in Period T6. Meanwhile, in the case where a current flowing in Period T5 and a current flowing in Period T7 are substantially equal to each other or in the case where a current flowing in Period T7 is smaller than a current flowing in Period T5, it is considered that polarization is retained in Period T6.

As the results of the retention measurement performed on the sample 800B, FIG. 58A shows current change in Period T5 and FIG. 58B shows current change in Period T7 after 10-minute retention in Period T6. FIG. 58C shows current change in Period T7 after 10-hour retention in Period T6. When FIG. 58A, FIG. 58B, and FIG. 58C are compared, a current does not increase in Period T7 even after 10-hour retention, which indicates that the sample 800B can retain the polarization state at least for 10 hours.

Example 7

In this example, an element having a structure of 1Tr1C (one transistor and one capacitor) was fabricated, and the measurement results of the electrical characteristics are described below.

Since the method for obtaining the P-V characteristics are described in Example 1, the details thereof are omitted here. A triangular wave with a voltage amplitude of 3 V and a frequency of 100 Hz was applied between a pair of electrodes of the one capacitor, and change in spontaneous polarization of an insulator or a dielectric (P-V characteristics) was measured. The horizontal axis represents the input voltage V that is a triangular wave, and the vertical axis represents a value obtained by converting the output current I into the polarization P with the use of Formula (1).

Figure 59A:
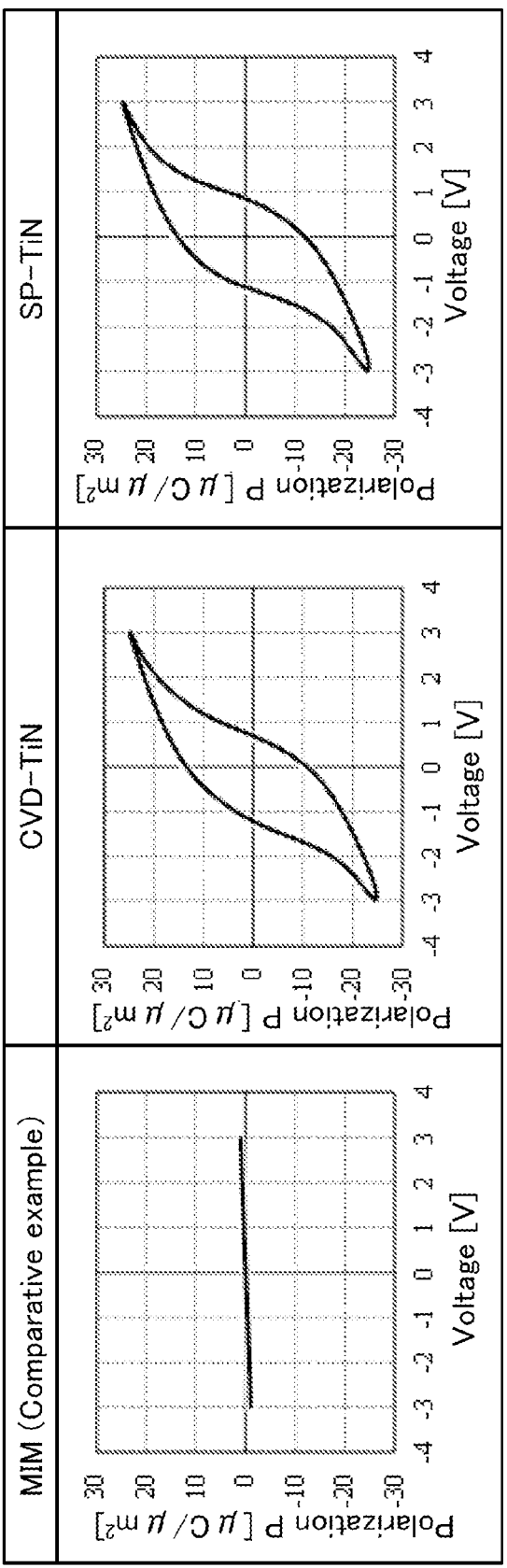
FIG. 59A shows diagrams showing P-V characteristics.
Figure 59B:
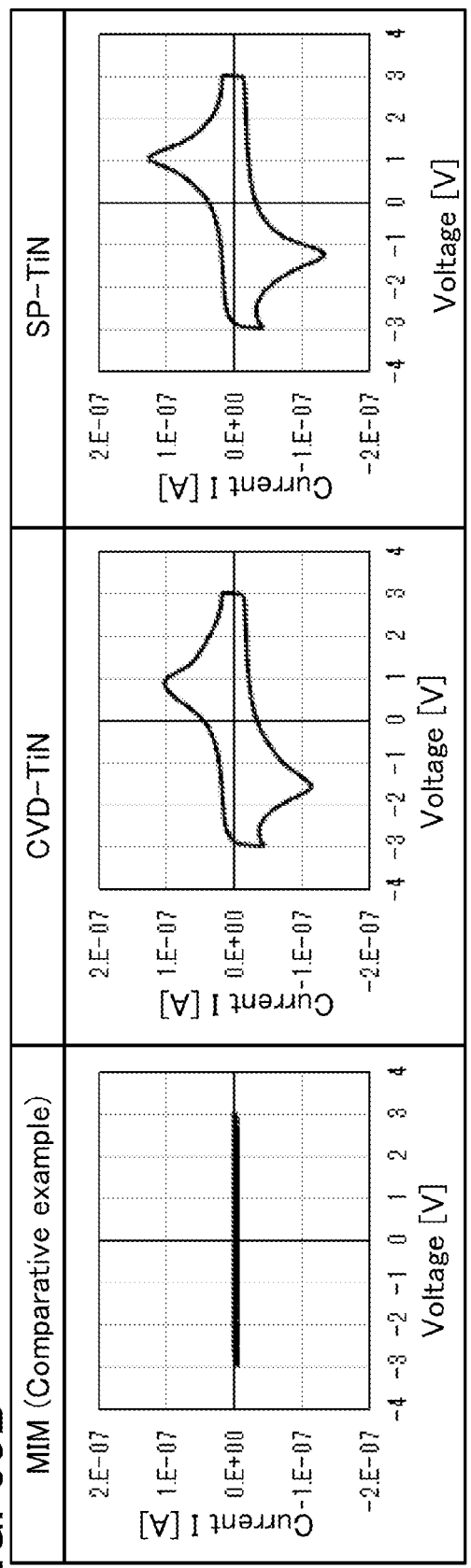
FIG. 59B shows diagrams showing I-V characteristics.

The transistor can be fabricated by a fabrication method described in Embodiment 2, and there is no particular limitation on the transistor structure. The transistor 200 illustrated in FIG. 20A, specifically a structure where the planar capacitor 100 is provided over the insulator 285 was used, and the measurement results of the P-V characteristics of a comparative example, CVD-TiN, and SP-TiN are shown in FIG. 59A. FIG. 59B shows the measurement results of the I-V characteristics.

Note that 300 electrodes each having a size of 1.265 μm×1.05 μm are arranged in parallel, so that the total size is 398.5 μm$^2$.

In the comparative example, a stack of a tungsten film obtained by a sputtering method (substrate temperature 130° C., thickness: 30 nm) and a titanium nitride film obtained by a metal CVD method (substrate temperature 400° C., thickness: 10 nm) is used as an lower electrode; a stack of an aluminum oxide film obtained by an ALD method (substrate temperature 250° C., film thickness: 14 nm) and a silicon oxynitride film obtained by a PECVD method (substrate temperature 350° C., thickness: 7 nm) is placed over the lower electrode; and a stack of a titanium nitride film obtained by a metal CVD method (substrate temperature 400° C., thickness: 10 nm) and a tungsten film obtained by a sputtering method (substrate temperature 130° C., thickness: 20 nm) is placed thereover as an upper electrode.

The sample denoted by CVD-TiN is different from the comparative example in a film interposed between the lower electrode and the upper electrode, and uses a 10-nm-thick HfZrOx film. The deposition conditions of the HfZrOx film are the same as those of the insulator 804 in Example 1; an ALD method is used, a chloride-based precursor is used, the substrate temperature is 300° C., and H$_2$O is used as an oxidizer. A remanent polarization amount Pr per unit area of the sample denoted by CVD-TiN is approximately 12.1.

In the sample denoted by SP-TiN, a film interposed between the lower electrode and the upper electrode is a 10-nm-thick HfZrOx film, and a stack of a titanium nitride film obtained by a sputtering method and a tungsten film obtained by a sputtering method (thickness: 20 nm) is placed thereover. As the deposition conditions of the titanium nitride film obtained by a sputtering method, the substrate temperature is set to room temperature. The remanent polarization amount Pr per unit area of the sample denoted by SP-TiN is approximately 12.8.

Figure 60A:
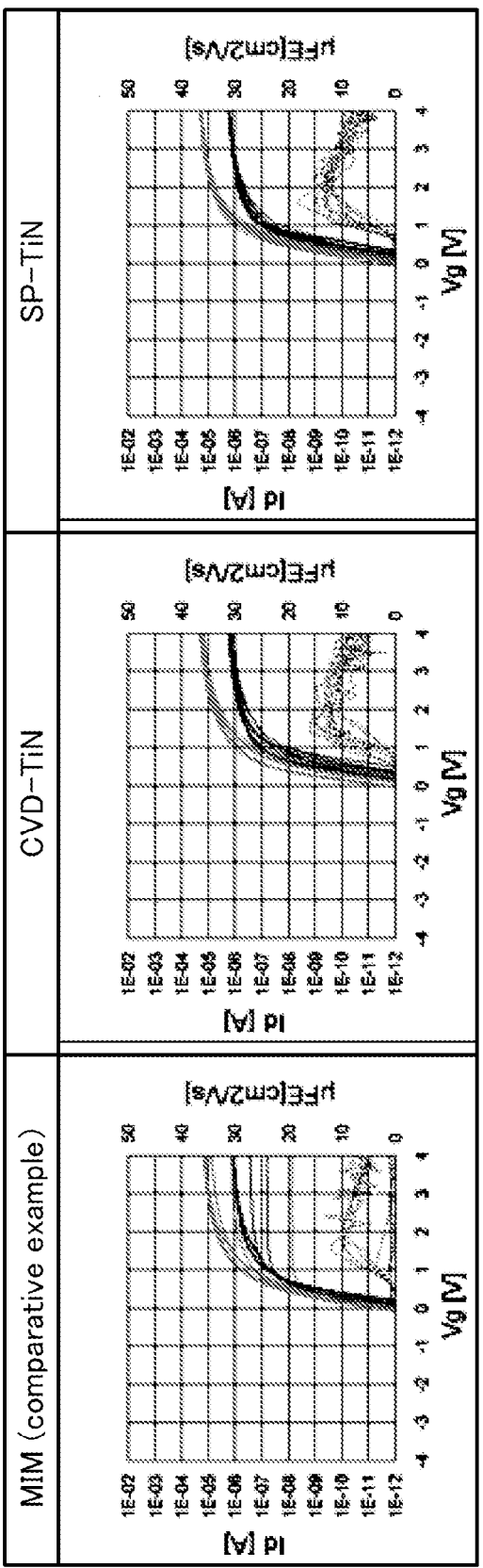
FIG. 60A and FIG. 60B are diagrams showing electrical characteristics of transistors.
Figure 60B:
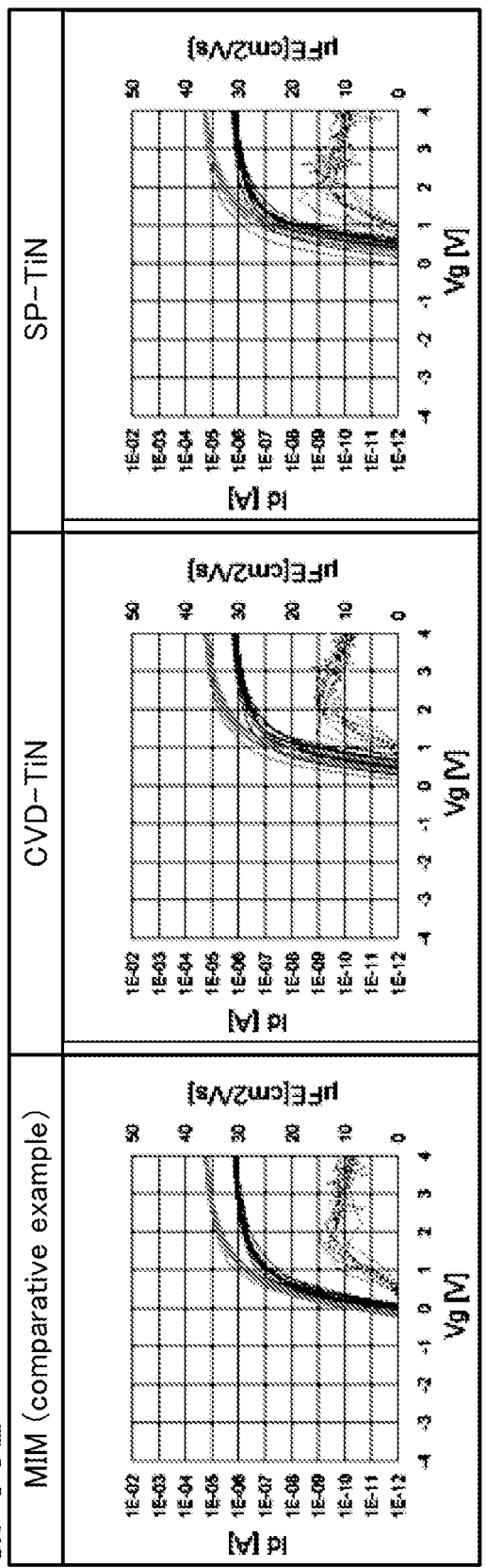

FIG. 60A and FIG. 60B show the measurement results of the I$_D$-V$_G$ characteristics of transistors used in the samples of the comparative example, CVD-TiN, and SP-TiN. In FIG. 60A and FIG. 60B, the horizontal axis represents a top gate potential V$_G$ [V], the first vertical axis represents a drain current I$_D$ [A], and the second vertical axis represents field-effect mobility μFE [cm$^2$/Vs] at V$_D$=0.1 V. The drain current at V$_D$=0.1 V is shown by a thin solid line, the drain current at V$_D$=1.2 V is shown by a thick dashed line, and the field-effect mobility at V$_D$=0.1 V is shown by a thin dotted line.

The shift voltage Vsh of each of the transistors was calculated from the above I$_D$-V$_G$ measurement results, and the standard deviation a (Vsh) was calculated. Here, the shift voltage Vsh is defined as, in the I$_D$-V$_G$ curve of the transistor, V$_G$ at which the tangent at a point where the slope of the curve is the steepest intersects the straight line of I$_D$=1 pA. The obtained standard deviation σ (Vsh) of the sample of SP-TiN in FIG. 60A was a favorable value, 64 mV. The field effect mobility μFE of the sample of SP-TiN in FIG. 60A was 14 cm$^2$/Vs.

A shift voltage (Vsh) and a subthreshold swing value (S value) of the transistor were calculated from the obtained I$_D$-V$_G$ curve. The shift voltage (Vsh) is defined as, in the I$_D$-V$_G$ curve of the transistor, V$_G$ at which the tangent at a point where the slope of the curve is the steepest intersects the straight line of I$_D$=1 pA. The S value of the sample of SP-TiN in FIG. 60A was 107 mV/dec.

FIG. 60B shows the electrical characteristics of one transistor in a measurement circuit in which 1Tr1C (one transistor and one capacitor) elements are arranged at a density of 8.4/μm$^2$. Note that FIG. 60A shows the electrical characteristics of one transistor of the case where the arrangement layout of the measurement circuit is different from that in FIG. 60B.

Example 8

In this example, an element having a structure of 3Tr1C (three transistors and one capacitor) was fabricated, writing operation and reading operation were performed, and the measurement results of the electrical characteristics are described below.

Figure 61A:
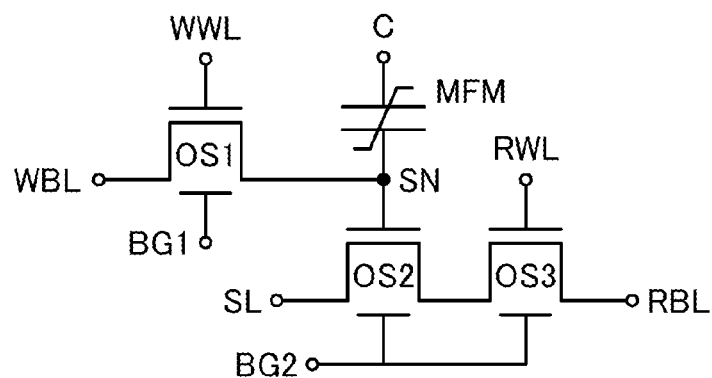
FIG. 61A is an example of an equivalent circuit diagram.
Figure 61B:
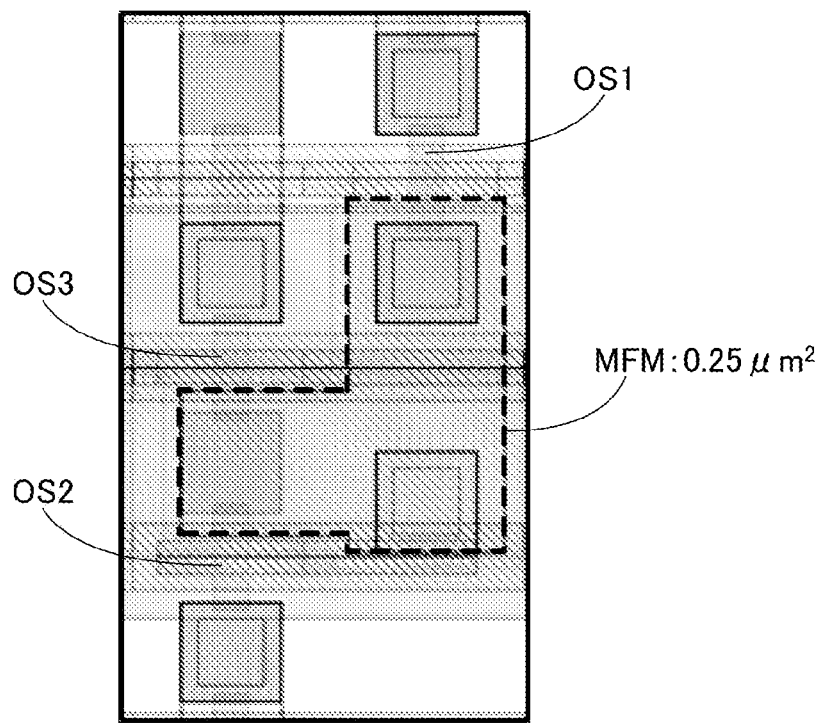
FIG. 61B is a top view illustrating a layout example.

In FIG. 61A, a transistor OS1 is electrically connected to a gate line WWL, a signal line WBL, and a node SN. A gate of a transistor OS2 is electrically connected to the node SN and connected to a source line SL. A transistor OS3 is electrically connected to a gate line RWL and a signal line RBL. A drain electrode (or source electrode) of the transistor OS2 and a source electrode (or drain electrode) of the transistor OS3 are electrically connected to each other. Note that a back gate potential BG1 of the transistor OS1 and a back gate potential BG2 of the transistor OS2 and the transistor OS3 are each a fixed potential, specifically 0 V.

FIG. 61A illustrates an example where a capacitor MFM is used as 1C. The capacitor MFM has a structure where a lower electrode, a 10-nm-thick HfZrOx film, and an upper electrode are stacked. The area of the capacitor MFM is 0.25 μm$^2$. The capacitor MFM is electrically connected to the node SN and a signal line C.

The lower electrode is a stack of a tungsten film obtained by a sputtering method (substrate temperature 130° C., thickness: 30 nm) and a titanium nitride film obtained by a metal CVD method (substrate temperature 400° C., thickness: 10 nm), and the upper electrode is a stack of a titanium nitride film obtained by a metal CVD method (substrate temperature 400° C., thickness: 10 nm) and a tungsten film obtained by a sputtering method (substrate temperature 130° C., thickness: 20 nm).

Note that the fabrication process of the transistor and the capacitor is the same as that for the sample denoted by CVD-TiN described in Example 7.

Next, measurement for determining the direction of remnant polarization of the capacitor MFM as a current difference in a reading transistor (the transistor OS3) was performed.

FIG. 62A shows an example of a timing chart of the measurement. Reference symbols WWL, WBL, C, RWL, SN, RBL, and the like in the timing chart denote the wirings supplied with the potentials shown in the timing chart. Although not shown in the timing chart, the source line SL is supplied with a predetermined potential (constant potential).

First, writing and reading to and from the capacitor MFM are described with reference to FIG. 62B1 and FIG. 62B2. Note that an equivalent circuit shown in FIG. 62B1 is the same as that in FIG. 61A; however, denotation of BG1 and BG2 is omitted because BG1 and BG2 are 0 V.

First, the potential of the gate line WWL is set to a potential that brings the transistor OS1 into an on state, so that the transistor OS1 is brought into an on state. Accordingly, the potential of the signal line WBL is supplied to the gate electrode of the transistor OS2. A voltage of 3 V is applied to the signal line C in 10 ms while the transistor OS1 is in an on state. The period in which 3 V is applied to the capacitor MFM is referred to as a Pr+set period. A predetermined electric charge is supplied to the gate electrode of the transistor OS2; as shown in the timing chart in FIG. 62A, the potential of the signal line WBL is always 0 V in this measurement method. Then, as shown in the right half of FIG. 62B2, a direction of a positive remanent polarization (Pr+) is given to the capacitor MFM (first writing). Note that the arrows shown in the right half of FIG. 62B2 correspond to the arrows in the Pr+set period in FIG. 62A.

After that, the potential of the gate line WWL is set to a potential that brings the transistor OS1 into an off state, so that the transistor OS1 is brought into an off state.

In order to obtain a function as a memory cell, the gate line RWL corresponds to a read word line, the gate line WWL corresponds to a write word line, the signal line WBL corresponds to a write bit line, and the signal line RBL corresponds to a read bit line. In the case where the transistor OS1 is in an off state and a potential that is not 0 V is supplied by the signal line WBL, the electric charge supplied to the gate electrode of the transistor OS2 can be retained (retention). In the case where a potential is supplied to the signal line WBL, the off-state current of the transistor OS1 is extremely small and thus the electric charge in the gate electrode of the transistor OS2 is retained for a long time.

The transistor OS3 is in an off state during the above writing operation.

Figure 63A:
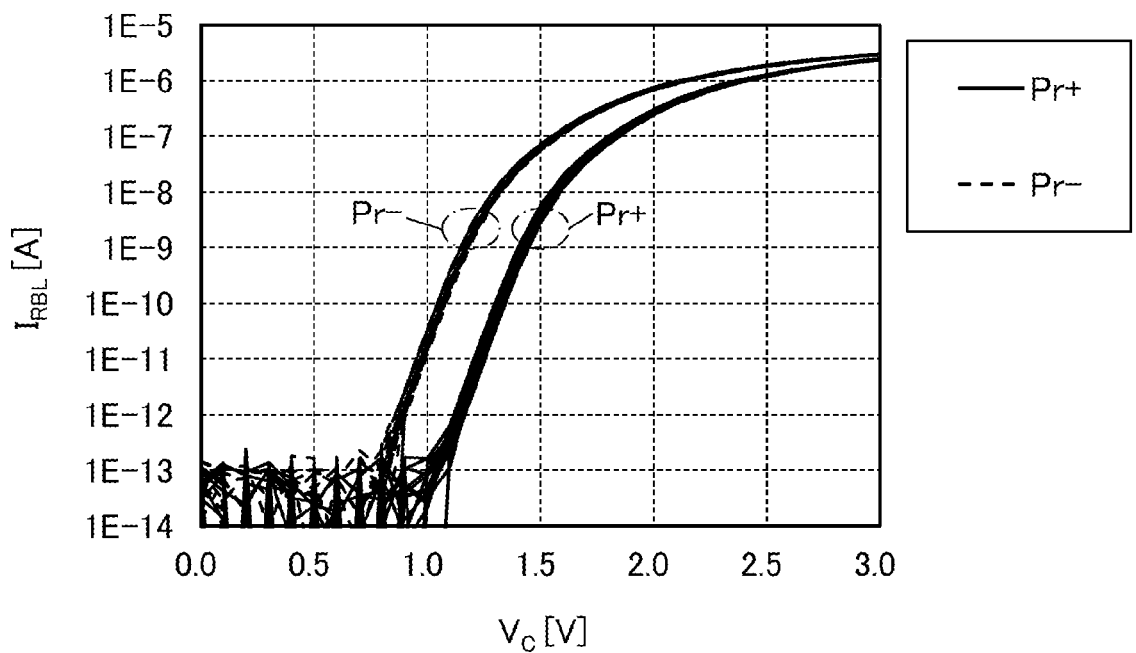
FIG. 63A is a diagram showing superimposed measurement results of a writing operation and a reading operation repeated 40 times.

Next, the transistor OS1 is brought into an off state to set the node SN at a floating potential, and the transistor OS3 is brought into an on state and the signal line C is swept from 0 V to 3 V (potential sweeping) to measure a current value $I_{RBL}$ of the signal line RBL; FIG. 63A shows the electrical characteristics (Pr+) at that time by solid lines with the vertical axis representing the current value $I_{RBL}$ and the horizontal axis representing a voltage Vc of the signal line C.

Next, the potential of the gate line WWL is set to a potential that brings the transistor OS1 into an on state, and −3 V is applied to the signal line C in 10 ms while the transistor OS1 is in an on state. The period in which −3 V is applied to the capacitor MFM is referred to as a Pr-set period. That is, a predetermined electric charge is supplied to the gate electrode of the transistor OS2, and a direction of a negative remanent polarization (Pr−) is given to the capacitor MFM as shown in the left half of FIG. 62B2 (second writing). Note that arrows shown in the left half of FIG. 62B2 correspond to the arrows in the Pr-set period in FIG. 62A.

The transistor OS3 is in an off state during the above writing operation.

Next, as shown in FIG. 62C1, the transistor OS1 is brought into an off state to set the node SN at a floating potential, and the transistor OS3 is brought into an on state and the signal line C is swept from 0 V to 3 V to measure the current value $I_{RBL}$ of the signal line RBL; FIG. 63A shows the electrical characteristics (Pr−) at that time by a dotted line with the vertical axis representing the current value $I_{RBL}$ and the horizontal axis representing the voltage Vc of the signal line C. Note that an equivalent circuit shown in FIG. 62C1 is the same as that in FIG. 61A; however, denotation of BG1 and BG2 is omitted because BG1 and BG2 are 0 V.

In FIG. 63A, 20 times of sweep after 3 V application to the capacitor MFM and 20 times of sweep after −3 V application to the capacitor MFM, 40 times of sweep in total, are superimposed.

A current difference is generated between the current value $I_{RBL}$ read after 3 V application to the signal line C and the current value $I_{RBL}$ read after −3 V application to the signal line C. The direction of the positive remanent polarization in the capacitor MFM shown in FIG. 62C2 and the direction of the negative remanent polarization in the capacitor MFM shown in FIG. 62C2 can be regarded as the current difference in the reading transistor (the transistor OS3). Thus, from the measurement results shown in FIG. 63A, the direction of remanent polarization in the capacitor MFM can be determined as the current difference in the reading transistor (the transistor OS3).

Since the leak current of the transistor OS1 in an off state is extremely low in the element structure of 3Tr1C illustrated in FIG. 61A, information can be written, retained, and read by taking advantage of the feature that the potential of the node SN can be retained.

Although one memory cell with only one element structure is illustrated here, it is also possible to form a memory cell array including a plurality of memory cells arranged inn (rows) x m (columns).

Figure 63B:
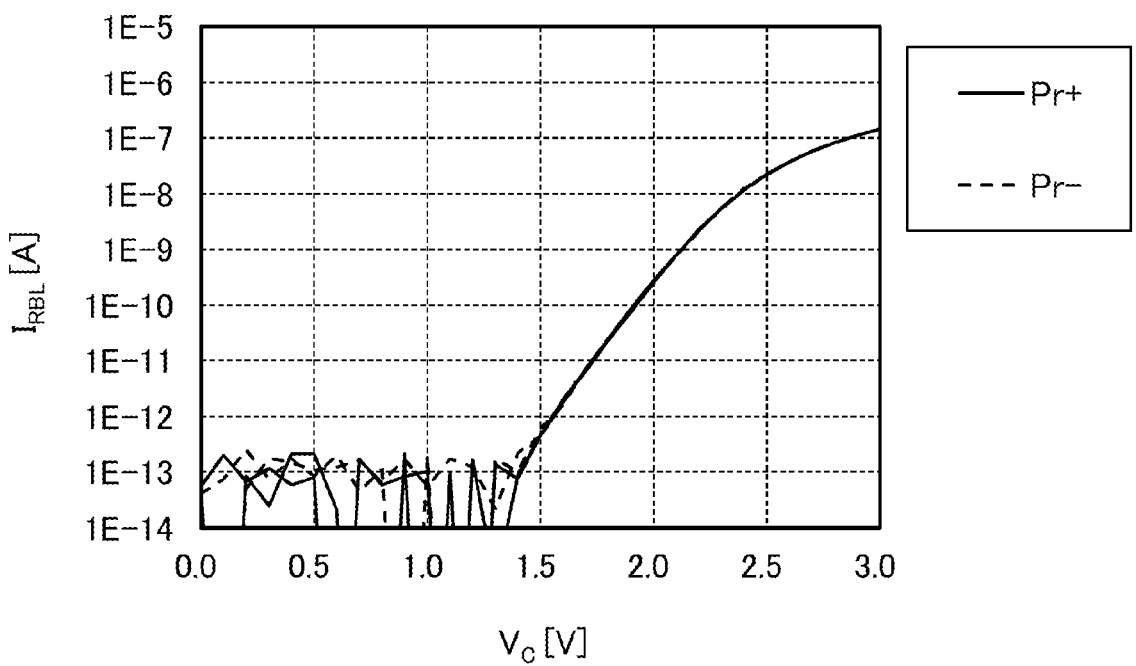
FIG. 63B shows a comparative example.

FIG. 63B shows the results obtained by using the same measurement method as the above and the same element structure as the comparative example in Example 7. In the comparative example, the measurement results of two times of sweep after 3 V application to the capacitor MFM and two times of sweep after −3 V application to the capacitor MFM, four times of sweep in total, are superimposed. The electrical characteristics (Pr+) are denoted by solid lines, and the electrical characteristics (Pr−) are denoted by dotted lines in FIG. 63A.

A comparative example employs the same process as the comparative example described in Example 7. A stack of a tungsten film obtained by a sputtering method (substrate temperature 130° C., thickness: 30 nm) and a titanium nitride film obtained by a metal CVD method (substrate temperature 400° C., thickness: 10 nm) is used as the lower electrode; a stack of an aluminum oxide film obtained by an ALD method (substrate temperature 250° C., thickness: 14 nm) and a silicon oxynitride film obtained by a PECVD method (substrate temperature 350° C., thickness: 7 nm) is placed over the lower electrode; and a stack of a titanium nitride film obtained by a metal CVD method (substrate temperature 400° C., thickness: 10 nm) and a tungsten film obtained by a sputtering method (substrate temperature 130° C., thickness: 20 nm) is placed thereover as the upper electrode.

As shown in FIG. 63B, no current difference was observed in the comparative example.

Example 9

<Measurement Off Characteristics>

In this example, results of measurement of f characteristics performed using a sample fabricated in a manner similar to that in Example 7 are described.

The sample subjected to the f characteristics measurement has a structure of the capacitor 100 illustrated in FIG. 20; 300 elements each having an electrode size of 1.265 μm×1.05 μm are connected through wiring layers, and the total area A is 398.5 μm$^2$.

Figure 64A:
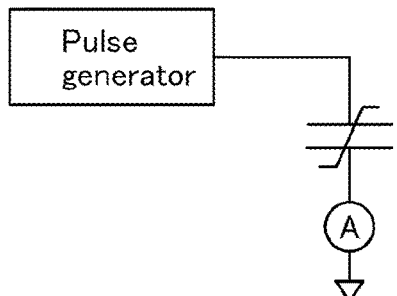
FIG. 64A, FIG. 64B, FIG. 64C, and FIG. 64D are diagrams showing a method for measuring f characteristics.
Figure 64B:
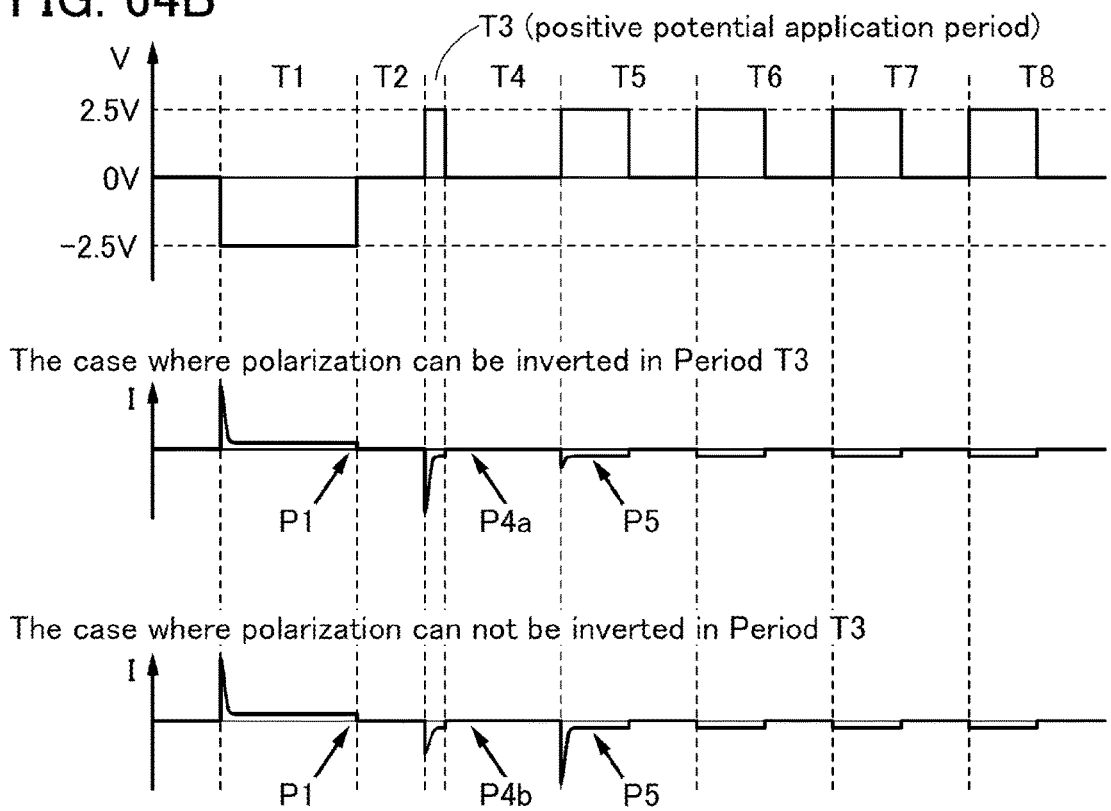
Figure 64C:
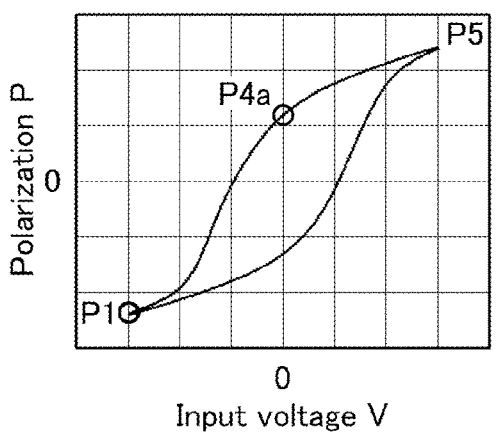
Figure 64D:
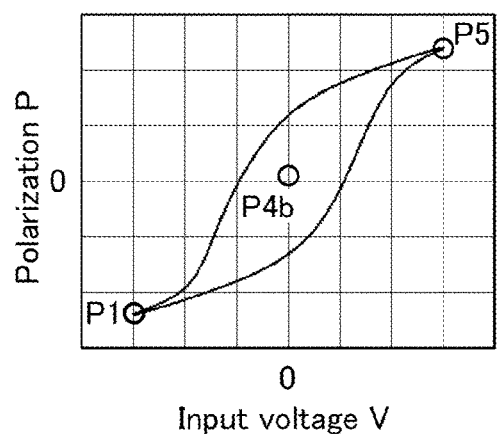
Figure 65:
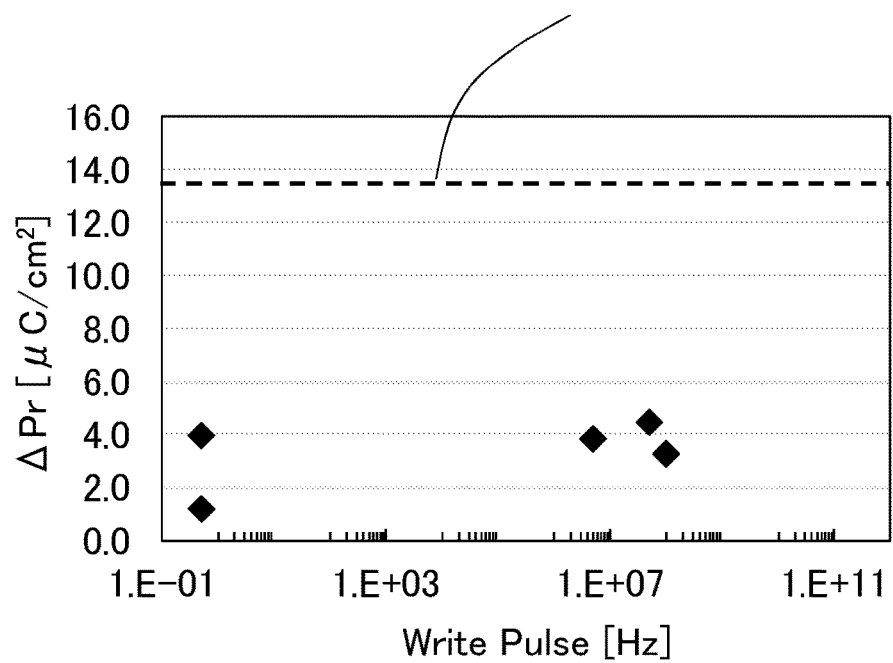
FIG. 65 is a diagram showing measurement results off characteristics.

FIG. 64A shows the measurement system of the f characteristics. FIG. 64B shows the operation sequence of the f characteristics measurement. FIG. 64C and FIG. 64D are diagrams showing assumed change in polarization. FIG. 65 shows the results of the retention measurement.

As shown in FIG. 64A, the measurement system of the f characteristics includes at least a pulse generator and an ammeter. The measurement was performed at room temperature. In this example, DG2020A manufactured by TEKTRONIX Inc. was used as the pulse generator and a semiconductor parameter analyzer B1500A manufactured by KEYSIGHT was used as the ammeter.

In the f characteristics measurement, a potential is supplied to the sample with the use of the pulse generator, and a current flowing at that time is measured. The operation sequence of the f characteristics measurement shown in FIG. 64B is described. In Period T1, a negative potential pulse is supplied to the sample to cause a polarization state on the negative potential side. Next, after Period T2 with a potential of 0 V, a positive potential pulse is supplied in Period T3 to measure a current flowing at that time. Here, the pulse width (time) of the positive potential supplied in Period T3 is measured under a plurality of conditions, whereby time needed for inverting polarization can be evaluated. The time needed for inverting polarization is preferably shorter because a storage element can perform higher-speed rewriting and power consumption can be lower. In this example, the measurement was performed employing a plurality of conditions as the conditions in Period T3: the pulse width of a rectangular wave of a positive potential was swept from 1 sec to 5 nsec. When the rectangular wave pulse is regarded as a half period, the condition of 1 sec and the condition of 5 nsec can be referred to as 0.5 Hz and 100 MHz, respectively. Next, after Period T4 with a potential of 0 V, a positive potential pulse with a sufficient length is supplied in Period T5 to measure a current flowing in the sample. The sufficient length here means the time until the value change in the current flowing in the sample substantially disappears, and is 1 sec in this example. Subsequently, in Period T6, a positive potential pulse similar to that in Period T5 is supplied to measure a current flowing in the sample. Here, a difference ΔC between the amount of electric charge flowing in Period T5 and the amount of electric charge flowing in Period T6 is obtained, whereby the amount of electric charge derived from polarization inversion in Period T5 and the amount of electric charge derived from another factor such as a leakage component can be distinguished from each other. By dividing the difference ΔC by the area A, ΔPr that is an indicator of polarization can be obtained. Here, the area A is an area where two electrodes of the capacitor overlap with each other. By graphing the value of ΔPr obtained by measurement data analysis and the pulse width (time) of Period T3, the length of period needed for inverting polarization can be known. Although not used in the measurement data analysis in this example, measurement of Period T7 and/or Period T8 may be performed after Period T6 to improve the measurement accuracy of the difference ΔC. The specific conditions of the operation sequence of the f characteristics measurement are shown in Table 7.

TABLE 7

| Period | Voltage | | Time | Remark |
|---|---|---|---|---|
| T1 | −2.5 V | | 5 sec | |
| T2 | 0 V | | 5 sec | |
| T3 | 2.5 V | | 1 sec, 100 msec, 10 nsec, 5 nsec | 0.5 Hz, 5 MHz, 50 MHz, 100 MHz |
| T4 | 0 V | | 5 sec | |
| T5 | High | 2.5 V | 1 sec | |
| | Low | 0 V | 1 sec | |
| T6 | High | 2.5 V | 1 sec | |
| | Low | 0 V | 1 sec | |
| T7 | High | 2.5 V | 1 sec | |
| | Low | 0 V | 1 sec | |
| T8 | High | 2.5 V | 1 sec | |
| | Low | 0 V | 1 sec | |

The case where polarization can be inverted and the case where polarization cannot be inverted in the f characteristics measurement are described with reference to FIG. 64B, FIG. 64C, and FIG. 64D. FIG. 64C is a diagram showing assumed change in polarization from Period T1 to Period T5 of the case where polarization can be inverted in Period T3, and shows a positive polarization state in Period T4 as denoted by P4a. FIG. 64D is a diagram showing assumed change in polarization from Period T1 to Period T5 of the case where polarization cannot be inverted in Period T3, and shows a state where polarization fails to be inverted into a positive polarization state in Period T4 as denoted by P4b. Whether polarization is inverted or not in Period T3 can be determined by the amount of electric charge flowing in Period T5; the amount of electric charge flowing in Period T5 is small when polarization can be retained and the amount of electric charge flowing in Period T5 is large when polarization cannot be retained.

FIG. 65 shows the measurement results the f characteristics. Measurement was performed employing four conditions as the conditions of Period T3: 1 sec (0.5 Hz), 100 nsec (5 MHz), 10 nsec (50 MHz), and 5 nsec (100 MHz). As for 1 sec (0.5 Hz), measurement results of N=2 are shown. In addition, the measurement results of the case where writing was not performed in Period T3 are also shown. In each measurement, as compared with the case where writing was not performed, the value of ΔPr was small enough to determine that polarization was inverted in writing in Period T3. The results suggest that the sample of this example can perform writing operation at 100 MHz at the lowest.

Example 10

<Retention Measurement>

In this example, results of retention measurement performed on the sample 800B described in Example 1 are described.

In this example, measurement was performed by a method different from that of the retention measurement described in Example 6. FIG. 66A shows the measurement system of the retention measurement. FIG. 66B shows the operation sequence of the retention measurement. FIG. 66C and FIG. 66D are diagrams showing assumed change in polarization. FIG. 67A shows the results of the retention measurement.

As shown in FIG. 66A, the measurement system of the retention measurement includes at least a pulse generator and an ammeter. The measurement was performed at room temperature. In this example, M9185B manufactured by KEYSIGHT was used as the pulse generator and a semiconductor parameter analyzer B1500A manufactured by KEYSIGHT was used as the ammeter. In this example, a prover provided with a stage having a temperature adjustment function was used to perform the retention measurement under a plurality of temperature conditions.

In the retention measurement, a potential is supplied to a sample with the use of the pulse generator, and a current flowing at that time is measured. The operation sequence of the retention measurement shown in FIG. 66B is described. In Period T1, a negative potential pulse is supplied to the sample to cause the polarization state on the negative potential side. Next, in Period T2, retention at a potential of 0 V is performed for a later-described period to perform retention measurement. Then, in Period T3, a positive potential pulse is supplied to measure a current flowing in the sample. Next, in Period T4, a positive potential pulse similar to that in Period T3 is supplied to measure a current flowing in the sample. Here, the difference ΔC between the amount of electric charge flowing in Period T3 and the amount of electric charge flowing in Period T4 is obtained, whereby the amount of electric charge derived from polarization inversion in Period T3 and the amount of electric charge derived from another factor such as leakage component can be distinguished from each other. By dividing the difference ΔC by the area A, ΔPr that is an indicator of polarization can be obtained. Here, the area A is an area where two electrodes of the capacitor overlap with each other. By graphing the value of ΔPr obtained by measurement data analysis and the length of the retention time of Period T2, the length of a period needed for inverting polarization can be known. Although not used in the measurement data analysis in this example, measurement of Period T5 and/or Period T6 may be performed after Period T4 to improve the measurement accuracy of the difference ΔC. The specific conditions of the operation sequence of the f characteristics measurement are shown in Table 8.

TABLE 8

| Period | Voltage | | Time | Remark |
|---|---|---|---|---|
| T1 | −2.5 V | | 5 sec | |
| T2 | 0 V | | 1, 10, 100, 1000, 259200 sec | Measured at 85° C. |
| T2 | 0 V | | 1, 10, 100, 1000 sec | Measured at 150° C., 200° C. |
| T3 | High | 2.5 V | 1 sec | |
| | Low | 0 V | 1 sec | |
| T4 | High | 2.5 V | 1 sec | |
| | Low | 0 V | 1 sec | |
| T5 | High | 2.5 V | 1 sec | |
| | Low | 0 V | 1 sec | |
| T6 | High | 2.5 V | 1 sec | |
| | Low | 0 V | 1 sec | |

The case where polarization can be retained and the case where polarization cannot be retained in the f characteristics measurement are described with reference to FIG. 66B, FIG. 66C and FIG. 66D. FIG. 66C is a diagram showing assumed change in polarization from Period T1 to Period T3 of the case where polarization can be retained in Period T2, and polarization is retained even at the end of Period T2 as shown by P2a. FIG. 66D is a diagram showing assumed change in polarization from Period T1 to Period T3 of the case where polarization cannot be retained in Period T2, and the amount of polarization is reduced at the end of Period T2 as shown by P2b. Whether polarization is retained or not in Period T2 can be determined by the amount of electric charge flowing in Period T3; the amount of electric charge flowing in Period T3 is small when polarization can be retained and the amount of electric charge flowing in Period T3 is large when polarization cannot be retained.

Figure 67:
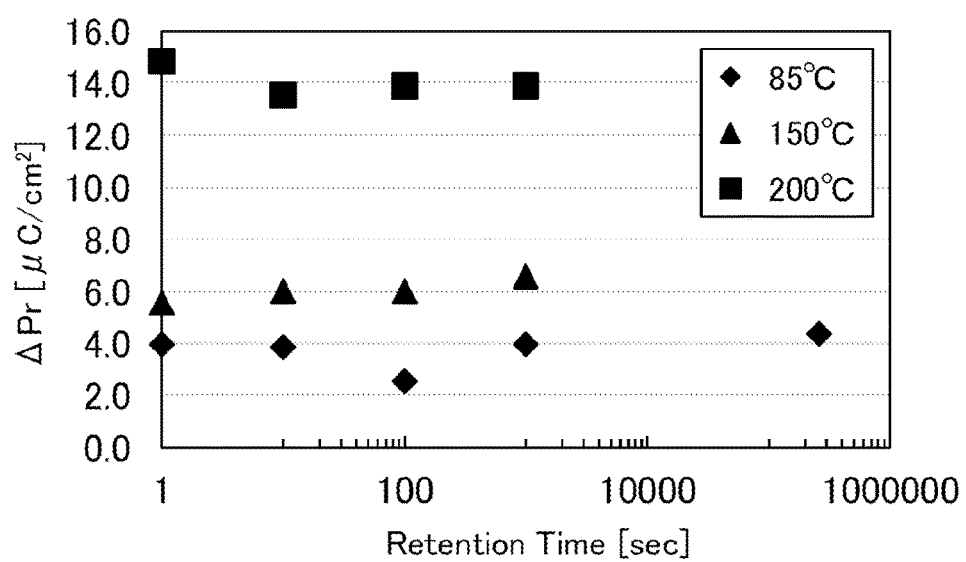
FIG. 67 is a diagram showing results of retention measurement.

FIG. 67 shows the results of the retention measurement performed on the sample 800B. The temperature conditions are the following three conditions: 85° C., 150° C., and 200° C. Measurement was performed employing, as the conditions of Period T2, five conditions of 1 sec, sec, 100 sec, 1000 sec, and 259200 sec (3 days) at 85° C. and four conditions of 1 sec, 10 sec, 100 sec, and 1000 sec at 150° C. and 200° C. In each measurement, the value of ΔPr allowed determining that polarization was retained.

REFERENCE NUMERALS

51: curve, 51*i*: straight line, 52: curve, 52*i*: straight line, 61: point, 62: point, 100: capacitor, 110: conductor, 112: conductor, 115*a*: insulator, 115*b*: insulator, 120: conductor, 120*a*: conductor, 120*b*: conductor, 130: insulator, 130*a*: insulator, 130*b*: insulator, 130*c*: insulator, 131*a*: polycrystalline region, 131*b*: polycrystalline region, 132: c-axis, 134: normal, 136: grain, 138*a*: layer, 138*b*: layer, 150: insulator, 152*a*: insulator, 152*b*: insulator, 154*a*: insulator, 154*b*: insulator, 155: insulator, 162: conductor, 166: insulator, 168*a*: insulator, 168*b*: insulator, 200: transistor, 205: conductor, 205*a*: conductor, 205*b*: conductor, 210: insulator, 212: insulator, 214: insulator, 216: insulator, 217: insulator, 218: conductor, 222: conductor, 224: insulator, 230: oxide, 230*a*: oxide, 230*b*: oxide, 230*ba*: region, 230*bb*: region, 230*bc*: region, 240: conductor, 240*a*: conductor, 240*b*: conductor, 241: insulator, 241*a*: insulator, 241*b*: insulator, 242: conductor, 242*a*: conductor, 242*b*: conductor, 245: insulator, 246: conductor, 246*a*: conductor, 246*b*: conductor, 250: insulator, 250*a*: insulator, 250*b*: insulator, 252: insulator, 254: insulator, 255: conductor, 260: conductor, 260*a*: conductor, 260*b*: conductor, 262: conductor, 265: sealing portion, 271: insulator, 271*a*: insulator, 271*b*: insulator, 274: insulator, 275: insulator, 280: insulator, 282: insulator, 283: insulator, 285: insulator, 286: insulator, 287: insulator, 288: conductor, 289: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 357: conductor, 400: opening region, 401: precursor, 402: precursor, 403: oxidizing gas, 404: carrier purge gas, 411: precursor, 412: precursor, 413: precursor, 414: oxidizing gas, 500: semiconductor device, 800: sample, 800A: sample, 800B: sample, 800B_1: sample, 800B_2: sample, 800C: sample, 800C_1: sample, 800C_2: sample, 800C_3: sample, 801: substrate, 802: insulator, 803: conductor, 803*a*: conductor, 803*b*: conductor, 804: insulator, 805: conductor, 805*a*: conductor, 805*b*: conductor, 806: insulator, 807: conductor, 808: conductor, 811A: curve, 811B: curve, 811C: curve, 812A: curve, 812B: curve, 812C: curve, 813A: curve, 813B: curve, 813C: curve, 814A: curve, 814B: curve, 814C: curve, 821: curve, 822: curve, 830: sample, 830A: sample, 830B: sample, 830C: sample, 830D:

sample, 830E: sample, 830F: sample, 830G: sample, 830H: sample, 830I: sample, 830J: sample, 830K: sample, 830L: sample, 830M: sample, 830N: sample, 830O: sample, 830P: sample, 831: solid line, 832: dashed line, 833: dotted line, 900: manufacturing apparatus, 901: reaction chamber, 903: gas inlet, 904: entrance, 905: exhaust port, 907: wafer stage, 908: shaft, 950: wafer, 1001: wiring, 1002: wiring, 1003: wiring, 1004: wiring, 1005: wiring, 1006: wiring, 1007: wiring, 1008: wiring, 1009: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: memory device, 1411: peripheral circuit, 1420: row circuit, 1430: column circuit, 1440: output circuit, 1460: control logic circuit, 1470: memory cell array, 2020A: DG, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: control key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising a transistor and a capacitor electrically connected to the transistor,
    wherein the capacitor comprises:
        a first conductor;
        an insulator over the first conductor; and
        a second conductor over the insulator,
    wherein the insulator comprises ferroelectricity,
    wherein the insulator comprises a crystal structure,
    wherein the crystal structure comprises a first layer and a second layer,
    wherein the first layer comprises first oxygen and hafnium,
    wherein the second layer comprises second oxygen and zirconium,
    wherein the hafnium and the zirconium are bonded to each other through the first oxygen, and
    wherein the second oxygen is bonded to the zirconium.

2. The semiconductor device according to claim 1,
    wherein the transistor comprises:
        an oxide semiconductor in a channel formation region; and
        a source electrode and a drain electrode each of which is electrically connected to the oxide semiconductor, and
    wherein the first conductor is configured to be one of the source electrode and the drain electrode.

3. The semiconductor device according to claim 1, wherein a concentration of at least one of hydrogen and carbon contained in the insulator obtained by SIMS analysis is lower than or equal to $5\times10^{20}$ atoms/cm$^3$.

4. The semiconductor device according to claim 1, wherein a concentration of at least one of hydrogen and carbon contained in the insulator obtained by SIMS analysis is lower than or equal to $1\times10^{20}$ atoms/cm$^3$.

5. The semiconductor device according to claim 1, wherein a concentration of chlorine contained in the insulator obtained by SIMS analysis is lower than or equal to $5\times10^{21}$ atoms/cm$^3$.

6. The semiconductor device according to claim 1, wherein a concentration of chlorine contained in the insulator obtained by SIMS analysis is lower than or equal to $1\times10^{21}$ atoms/cm$^3$.

7. A semiconductor device comprising:
    a semiconductor film;
    an insulator over the semiconductor film; and
    a first conductor over the insulator,
    wherein the insulator comprises ferroelectricity,
    wherein the insulator comprises a crystal structure,
    wherein the crystal structure comprises a first layer and a second layer,
    wherein the first layer comprises first oxygen and hafnium,
    wherein the second layer comprises second oxygen and zirconium,
    wherein the hafnium and the zirconium are bonded to each other through the first oxygen, and
    wherein the second oxygen is bonded to the zirconium.

8. The semiconductor device according to claim 7,
    wherein the semiconductor film comprises an oxide semiconductor, and
    wherein the semiconductor device comprises a source electrode and a drain electrode each of which is electrically connected to the semiconductor film.

9. The semiconductor device according to claim 7, wherein a concentration of at least one of hydrogen and carbon contained in the insulator obtained by SIMS analysis is lower than or equal to $5\times10^{20}$ atoms/cm$^3$.

10. The semiconductor device according to claim 7, wherein a concentration of at least one of hydrogen and carbon contained in the insulator obtained by SIMS analysis is lower than or equal to $1\times10^{20}$ atoms/cm$^3$.

11. The semiconductor device according to claim 7, wherein a concentration of chlorine contained in the insulator obtained by SIMS analysis is lower than or equal to $5\times10^{21}$ atoms/cm$^3$.

12. The semiconductor device according to claim 7, wherein a concentration of chlorine contained in the insulator obtained by SIMS analysis is lower than or equal to $1\times10^{21}$ atoms/cm$^3$.

13. A semiconductor device comprising:
    a first conductor;
    a first insulator over the first conductor;
    a second conductor over the first insulator; and
    a second insulator positioned at one or both of a top surface of the first conductor and a bottom surface of the second conductor,
    wherein the first insulator comprises ferroelectricity,
    wherein the first insulator comprises a crystal structure,
    wherein the crystal structure comprises a first layer and a second layer,
    wherein the first layer comprises first oxygen and hafnium,
    wherein the second layer comprises second oxygen and zirconium,
    wherein the hafnium and the zirconium are bonded to each other through the first oxygen, and
    wherein the second oxygen is bonded to the zirconium.

14. The semiconductor device according to claim 13, wherein the second insulator comprises nitrogen and silicon.

15. The semiconductor device according to claim 13, wherein a concentration of at least one of hydrogen and carbon contained in the first insulator obtained by SIMS analysis is lower than or equal to $5\times10^{20}$ atoms/cm$^3$.

16. The semiconductor device according to claim 13, wherein a concentration of at least one of hydrogen and carbon contained in the first insulator obtained by SIMS analysis is lower than or equal to $1\times10^{20}$ atoms/cm$^3$.

17. The semiconductor device according to claim 13, wherein a concentration of chlorine contained in the first insulator obtained by SIMS analysis is lower than or equal to $5\times10^{21}$ atoms/cm$^3$.

18. The semiconductor device according to claim 13, wherein a concentration of chlorine contained in the first insulator obtained by SIMS analysis is lower than or equal to $1\times10^{21}$ atoms/cm$^3$.

19. The semiconductor device according to claim 13, wherein the second insulator comprises indium, an element M, zinc, and oxygen.

* * * * *